(12) United States Patent
Inoue et al.

(10) Patent No.: US 11,886,119 B2
(45) Date of Patent: Jan. 30, 2024

(54) MATERIAL FOR FORMING UNDERLAYER FILM, RESIST UNDERLAYER FILM, METHOD OF PRODUCING RESIST UNDERLAYER FILM, AND LAMINATE

(71) Applicant: MITSUI CHEMICALS, INC., Tokyo (JP)

(72) Inventors: Koji Inoue, Ichihara (JP); Takashi Oda, Ichihara (JP); Keisuke Kawashima, Ichihara (JP)

(73) Assignee: MITSUI CHEMICALS, INC., Tokyo (JP)

( * ) Notice: Subject to any disclaimer, the term of this patent is extended or adjusted under 35 U.S.C. 154(b) by 0 days.

(21) Appl. No.: 18/168,261

(22) Filed: Feb. 13, 2023

(65) Prior Publication Data

US 2023/0185195 A1  Jun. 15, 2023

Related U.S. Application Data

(63) Continuation of application No. 16/617,297, filed as application No. PCT/JP2018/020744 on May 30, 2018, now abandoned.

(30) Foreign Application Priority Data

May 31, 2017 (JP) .................. 2017-108506
Oct. 6, 2017 (JP) .................. 2017-196260

(51) Int. Cl.
*G03F 7/11* (2006.01)
*C08G 61/08* (2006.01)
(Continued)

(52) U.S. Cl.
CPC ............... *G03F 7/11* (2013.01); *C08G 61/08* (2013.01); *C09D 165/00* (2013.01); *G03F 7/094* (2013.01);
(Continued)

(58) Field of Classification Search
CPC . G03F 7/11; G03F 7/094; G03F 7/168; C08G 61/08; C08G 2261/228; C08G 2261/3325; C08G 2261/418; C09D 165/00
See application file for complete search history.

(56) References Cited

U.S. PATENT DOCUMENTS 6,875,819 B2  4/2005 Sunaga et al.
7,238,462 B2  7/2007 Nakamura et al.
(Continued)

FOREIGN PATENT DOCUMENTS

JP  2004177668 A  6/2004
JP  2006098807 A  4/2006
(Continued)

OTHER PUBLICATIONS

International Search Report (PCT/ISA/210) dated Aug. 28, 2018, by the Japanese Patent Office as the International Searching Authority for International Application No. PCT/JP2018/020744.
(Continued)

*Primary Examiner* — Shane Fang
(74) *Attorney, Agent, or Firm* — BUCHANAN INGERSOLL & ROONEY PC

(57) ABSTRACT

A material for forming an underlayer film according to the present invention is a material for forming an underlayer film which is used to form a resist underlayer film used in a multi-layer resist process, the material including a cyclic olefin polymer which has a repeating structural unit [A] represented by Formula (1) and a repeating structural unit [B] represented by Formula (2), in which a molar ratio [A]/[B] of the structural unit [A] to the structural unit [B] in the cyclic olefin polymer is greater than or equal to 5/95 and less than or equal to 95/5.

(Continued)

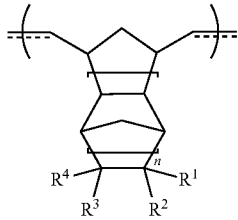

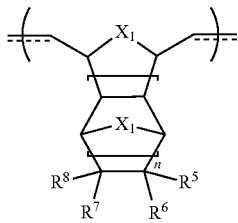

5 Claims, 4 Drawing Sheets

(51) Int. Cl.
    *C09D 165/00*     (2006.01)
    *G03F 7/09*     (2006.01)
    *G03F 7/16*     (2006.01)

(52) U.S. Cl.
    CPC ....... *G03F 7/168* (2013.01); *C08G 2261/228* (2013.01); *C08G 2261/3325* (2013.01); *C08G 2261/418* (2013.01)

(56) References Cited

U.S. PATENT DOCUMENTS

| | | |
|---|---|---|
| 2003/0187168 A1 | 10/2003 | Sunaga et al. |
| 2005/0074695 A1 | 4/2005 | Nakamura et al. |
| 2016/0053132 A1 | 2/2016 | Lee et al. |
| 2020/0264511 A1 | 8/2020 | Inoue et al. |

FOREIGN PATENT DOCUMENTS

| | | |
|---|---|---|
| JP | 2006098984 A | 4/2006 |
| JP | 2006106214 A | 4/2006 |
| JP | 2008026600 A | 2/2008 |
| JP | 2010519594 A | 6/2010 |
| JP | 2014174428 A | 9/2014 |
| KR | 1020140117769 A | 10/2014 |
| TW | 575596 B | 2/2004 |
| WO | 2008140846 A1 | 11/2008 |
| WO | 2009008446 A1 | 1/2009 |

OTHER PUBLICATIONS

Office Action dated Jan. 4, 2021, by the Korean Patent Office in corresponding Korean Patent Application No. 10-2019-7035257. (10 pages).

Office Action dated Jun. 30, 2020, by the Japanese Patent Office in corresponding Japanese Patent Application No. 2019-521264. (2 pages).

Written Opinion (PCT/ISA/237) dated Aug. 28, 2018, by the Japanese Patent Office as the International Searching Authority for International Application No. PCT/JP2018/020744.

MATERIAL FOR FORMING UNDERLAYER FILM, RESIST UNDERLAYER FILM, METHOD OF PRODUCING RESIST UNDERLAYER FILM, AND LAMINATE

CROSS-REFERENCE TO RELATED APPLICATIONS

This application is a continuation of U.S. application Ser. No. 16/617,297, filed Nov. 26, 2019, which is a U.S. national stage application of PCT/JP2018/020744, filed May 30, 2018, which claims priority to Japanese Patent Application No. 2017-196260, filed Oct. 6, 2017, and Japanese Patent Application No. 2017-108506, filed May 31, 2017, the entire contents of all of which are hereby incorporated by reference.

TECHNICAL FIELD

The present invention relates to a material for forming an underlayer film, a resist underlayer film, a method of producing a resist underlayer film, and a laminate.

BACKGROUND ART

In production of a semiconductor device, a multi-layer resist process has been used to achieve a high degree of integration. In this process, typically, a resist underlayer film is firstly formed on a substrate using a material for forming an underlayer film, a resist layer is formed on an upper surface side of the resist underlayer film, and the resist layer is baked and exposed to form a resist pattern. Next, a desired pattern can be obtained by transferring the resist pattern to the resist underlayer film through etching and transferring the resist underlayer film pattern to the substrate.

A shape of a circuit whose dimension size is large is further processed using not only a substrate having a flat shape but also a substrate having an uneven structure preliminarily formed in a large circuit shape in order to form a more complicated circuit, and a multi-patterning method for forming a fine circuit is introduced to the most advanced circuit forming process.

Such a resist underlayer film used in the multi-layer resist process is required to have characteristics such as an embedding property for an uneven portion of a substrate having an uneven structure, the flatness of a surface on a side where a resist is applied, a moderate refractive index, and an extinction coefficient, and characteristics such as excellent etching resistance.

In recent years, pattern refinement has been further promoted in order to increase the degree of integration. In order to deal with such refinement, various examinations have been conducted on structures, functional groups, and the like of compounds used in materials for forming underlayer films (for example, see Patent Document 1).

Meanwhile, in the refinement for pattern formation in order to obtain a high degree of integration, the influence of irregular reflection or stationary waves from a semiconductor substrate in a lithography step carried out using an ArF excimer laser which is a current mainstream has been a major problem. In order to solve this problem, materials with an anti-reflection function as a function required for an underlayer film have been widely examined. As a form in which the anti-reflection function is imparted to an underlayer film, a form in which an uneven structure of a surface of a substrate is embedded with a certain kind of a material and a bottom anti-reflective coating (BARC) is provided on a layer having a flatness or a form in which an anti-reflection function is imparted to a material embedding an uneven structure of a surface of a substrate has been examined.

Particularly in the former material for forming an anti-reflective film, various examinations have been conducted on an organic anti-reflective film formed of a polymer and the like having a light absorbing site. For example, Patent Document 2 discloses a resist underlayer film (anti-reflective film) which is not intermixed with a resist film formed on an upper layer and in which desired optical constants (a refractive index and an extinction coefficient) are obtained and a selection ratio of a large dry etching rate with respect to a resist film is obtained in a case of being exposed to an ArF excimer laser.

RELATED DOCUMENT

Patent Document

[Patent Document 1] Japanese Unexamined Patent Publication No. 2004-177668
[Patent Document 2] International Publication No. WO2009/008446

SUMMARY OF THE INVENTION

Technical Problem

Recently, the number of cases of forming finer patterns with multi-patterning according to a multi-layer resist method, using a substrate that has a plurality of kinds of trenches and particularly trenches having aspect ratios different from one another, that is, a substrate that has a finer uneven structure, has been increasing. In such cases, a resist layer formed on the uppermost layer is required to have a high flatness in order to accurately transfer the pattern on a reticle. In the recent trend of the pattern refinement, the film thickness of the resist layer has been decreased in order to avoid pattern collapse in a resist development step, and thus the resist layer is more strongly affected by the flatness of the underlayer film. Therefore, a resist underlayer film formed on a substrate having a surface structure into which a resin is unlikely to infiltrate as described above is formed such that these trenches are sufficiently embedded and is required to have a high flatness. In addition, it is considered that a material that does not generate volatile components (outgas) in a baking step after application is preferable.

According to the examination conducted by the present inventors, it was found that a material which satisfies the requirement for the flatness and does not generate volatile components is unlikely to be realized in materials for forming a resist underlayer film of the related art.

In the lithography that employs EUV (abbreviation for extreme ultraviolet, a wavelength of 13.5 nm) which is another fine processing technology, particularly, generation of volatile components (outgas) of a material that forms a resist underlayer film for exposure to high energy ray of EUV light may become a major problem, in addition to the embedding property of the related art even though there is no reflection from a substrate.

Further, in a case where a circuit view is drawn with a line width less than or equal to the wavelength of exposure light, a method of forming a plurality of uneven layers and combining the formed layers has been known. In order to realize such an aspect, a method of forming an intermediate layer on an underlayer film for the purpose of smoothing the uneven layer and further forming a new resist layer thereon can be exemplified.

According to the examination conducted by the present inventors, for example, in a case where this intermediate layer is formed according to a spin coating method or the like, a wrong choice of a solvent may lead to intermixing of the underlayer film with the intermediate film. As the result, it was found that the interface strength between the underlayer film and the intermediate layer may be degraded or the smoothness of the underlayer film may be lost.

The first present invention has been made in consideration of the above-described circumstances, and an object thereof is to provide a material for forming an underlayer film which enables realization of a resist underlayer film having sufficient optical characteristics, etching resistance, excellent flatness, and a suppressed generation of volatile components.

Further, another object of the first present invention is to provide a material for forming an underlayer film, which enables formation of a resist underlayer film having an excellent embedding property for an uneven structure, sufficient optical characteristics, etching resistance, excellent flatness, and a suppressed generation of volatile components on a substrate having a complicated shape.

Further, the second present invention has been made in consideration of the above-described circumstances, and an object thereof is to provide a material for forming an underlayer film which enables realization of a laminate having excellent adhesiveness and excellent flatness without causing intermixing of an intermediate layer with a resist underlayer film.

Solution to Problem

According to the present invention, provided are a material for forming an underlayer film, a resist underlayer film, a method of producing a resist underlayer film, and a laminate described below.

[1]

A material for forming an underlayer film which is used to form a resist underlayer film used in a multi-layer resist process, the material including: a cyclic olefin polymer which has a repeating structural unit [A] represented by Formula (1) and a repeating structural unit [B] represented by Formula (2), in which a molar ratio [A]/[B] of the structural unit [A] to the structural unit [B] in the cyclic olefin polymer is greater than or equal to 5/95 and less than or equal to 95/5.

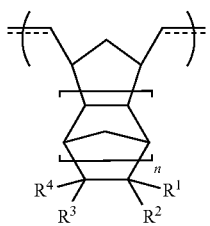

(1)

(in Formula (1), at least one of $R^1$ to $R^4$ is selected from hydrogen, an alkyl group having 1 to 10 carbon atoms, an aryl group having 6 to 20 carbon atoms, an alkoxy group having 1 to 10 carbon atoms, an aryloxy group having 6 to 20 carbon atoms, an alkoxyalkyl group having 2 to 10 carbon atoms, an aryloxyalkyl group having 7 to 20 carbon atoms, an alkoxycarbonyl group having 2 to 20 carbon atoms, a dialkylaminocarbonyl group having 3 to 10 carbon atoms, an aryloxycarbonyl group having 7 to 20 carbon atoms, an alkylarylaminocarbonyl group having 8 to 20 carbon atoms, an alkoxycarbonylalkyl group having 3 to 30 carbon atoms, an alkoxycarbonylaryl group having 8 to 30 carbon atoms, an aryloxycarbonylalkyl group having 8 to 20 carbon atoms, an alkoxyalkyloxycarbonyl group having 3 to 20 carbon atoms, and an alkoxycarbonylalkyloxycarbonyl group having 4 to 30 carbon atoms, $R^1$ to $R^4$ may be bonded to one another to form a ring structure, and n represents an integer of 0 to 2), and

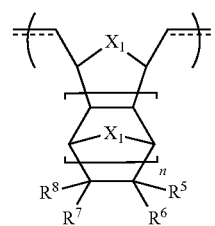

(2)

(in Formula (2), at least one of $R^5$ to $R^8$ is selected from hydrogen, an alkyl group having 1 to 10 carbon atoms, an aryl group having 6 to 20 carbon atoms, an alkoxy group having 1 to 10 carbon atoms, an aryloxy group having 6 to 20 carbon atoms, an alkoxyalkyl group having 2 to 10 carbon atoms, an aryloxyalkyl group having 7 to 20 carbon atoms, an alkoxycarbonyl group having 2 to 20 carbon atoms, a dialkylaminocarbonyl group having 3 to 10 carbon atoms, an aryloxycarbonyl group having 7 to 20 carbon atoms, an alkylarylaminocarbonyl group having 8 to 20 carbon atoms, an alkoxycarbonylalkyl group having 3 to 30 carbon atoms, an alkoxycarbonylaryl group having 8 to 30 carbon atoms, an aryloxycarbonylalkyl group having 8 to 20 carbon atoms, an alkoxyalkyloxycarbonyl group having 3 to 20 carbon atoms, and an alkoxycarbonylalkyloxycarbonyl group having 4 to 30 carbon atoms, $R^5$ to $R^8$ may be bonded to one another to form a ring structure, n represents an integer of 0 to 2, and $X_1$ represents —O— or —S—)

[2]

The material for forming an underlayer film according to [1], in which a temperature showing an intersection between a storage modulus (G') curve and a loss modulus (G") curve in a solid viscoelasticity of the cyclic olefin polymer which is measured under conditions of a measurement temperature range of 30° C. to 300° C., a heating rate of 3° C./min, and a frequency of 1 Hz in a nitrogen atmosphere in a shear mode using a rheometer is higher than or equal to 40° C. and lower than or equal to 200° C.

[3]

The material for forming an underlayer film according to [1], in which a temperature showing an intersection between a storage modulus (G') curve and a loss modulus (G") curve in a solid viscoelasticity of the material for forming an underlayer film which is measured under conditions of a measurement temperature range of 30° C. to 300° C., a heating rate of 3° C./min, and a frequency of 1 Hz in a nitrogen atmosphere in a shear mode using a rheometer is higher than or equal to 40° C. and lower than or equal to 200° C.

[4]

The material for forming an underlayer film according to [2] or [3], in which the temperature showing the intersection between the storage modulus (G') curve and the loss modulus (G") curve in the solid viscoelasticity is higher than or equal to 80° C. and lower than or equal to 200° C.

[5]

The material for forming an underlayer film according to any one of [1] to [4], in which an amount of a volatile component in the cyclic olefin polymer which is measured using the following method 1 is greater than or equal to 0.0% by mass to 1.0% by mass in a case where a total amount of the cyclic olefin polymer is set to 100% by mass.
(method 1: the cyclic olefin polymer is dissolved in tetrahydrofuran to prepare a solution having a solid content concentration of 20% by mass, the obtained solution is weighed using an aluminum plate, heated at 200° C. for 3 minutes in a nitrogen flow such that the tetrahydrofuran is removed, and cooled to room temperature such that the cyclic olefin polymer is solidified, the cyclic olefin polymer is heated in a temperature range of 30° C. to 300° C. at a heating rate of 10° C./min in a nitrogen atmosphere, and the amount of the volatile component in the cyclic olefin polymer is calculated based on a weight reduction amount in a temperature range of 100° C. to 250° C.)

[6]

The material for forming an underlayer film according to any one of [1] to [5], in which a weight-average molecular weight (Mw) of the cyclic olefin polymer in terms of polystyrene which is measured using gel permeation chromatography is greater than or equal to 1000 and less than or equal to 20000.

[7]

The material for forming an underlayer film according to any one of [1] to [6], in which a refractive index (n value) of the cyclic olefin polymer at a wavelength of 193 nm which is measured using the following method 2 is greater than or equal to 1.5 and less than or equal to 2.0.
(method 2: a coating film which is formed of the cyclic olefin polymer and has a thickness of 250 nm is formed on a silicon wafer, and the refractive index (n value) of the obtained coating film at a wavelength of 193 nm is set as the refractive index (n value) of the cyclic olefin polymer)

[8]

The material for forming an underlayer film according to any one of [1] to [6], in which a refractive index (n value) of the material for forming an underlayer film at a wavelength of 193 nm which is measured using the following method 2 is greater than or equal to 1.5 and less than or equal to 2.0.
(method 2: a coating film which is formed of the material for forming an underlayer film and has a thickness of 250 nm is formed on a silicon wafer, and the refractive index (n value) of the obtained coating film at a wavelength of 193 nm is set as the refractive index (n value) of the material for forming an underlayer film)

[9]

The material for forming an underlayer film according to any one of [1] to [8], in which an extinction coefficient (k value) of the cyclic olefin polymer which is measured using the following method 3 is greater than or equal to 0.0001 and less than or equal to 0.5.
(method 3: a coating film which is formed of the cyclic olefin polymer and has a thickness of 250 nm is formed on a silicon wafer, and the extinction coefficient (k value) of the obtained coating film is set as the extinction coefficient (k value) of the cyclic olefin polymer)

[10]

The material for forming an underlayer film according to any one of [1] to [8], in which an extinction coefficient (k value) of the material for forming an underlayer film which is measured using the following method 3 is greater than or equal to 0.0001 and less than or equal to 0.5.
(method 3: a coating film which is formed of the material for forming an underlayer film and has a thickness of 250 nm is formed on a silicon wafer, and the extinction coefficient (k value) of the obtained coating film is set as the extinction coefficient (k value) of the material for forming an underlayer film)

[11]

The material for forming an underlayer film according to any one of [1] to [10], which is formed on an uneven structure of a substrate having the uneven structure and is used for an underlayer film for embedding a recess in the uneven structure.

[12]

The material for forming an underlayer film according to any one of [1] to [11], in which a content of a crosslinking agent in the material for forming an underlayer film is less than 5 parts by mass in a case where a total content of polymer components contained in the material for forming an underlayer film is set to 100 parts by mass.

The material for forming an underlayer film according to any one of [1] to [12], in which a content of the cyclic olefin polymer in the material for forming an underlayer film is greater than or equal to 50% by mass and less than or equal to 100% by mass in a case where a total content of the material for forming an underlayer film is set to 100% by mass.

[14]

A material for forming an underlayer film which is used to form a resist underlayer film used in a multi-layer resist process, in which the material for forming an underlayer film is a material of a film containing a cyclic olefin polymer, the cyclic olefin polymer is soluble in an organic solvent at any concentration of at least greater than or equal to 0.01% by mass and less than or equal to 50% by mass, and a residual film rate of the cyclic olefin polymer in the film which is measured using the following method 4 is greater than or equal to 50% and less than or equal to 100%.
(method 4: a coating film which is formed of the cyclic olefin polymer and has a thickness ($\alpha$) of greater than or equal to 200 nm and less than or equal to 500 nm is formed on a silicon wafer, the obtained coating film is treated at 200° C. for 10 minutes, immersed in propylene glycol-1-monomethyl ether-2-acetate at 23° C. for 10 minutes, and dried under conditions of 150° C. for 3 minutes, and a remaining solvent in the coating film is removed, and a thickness ($\beta$) of the coating film obtained by removing the remaining solvent is measured, and the residual film rate ($=\beta/\alpha \times 100$)(%) is calculated)

[15]

A material for forming an underlayer film which is used to form a resist underlayer film used in a multi-layer resist process, the material including: a cyclic olefin polymer, in which a residual film rate of the material for forming an underlayer film which is measured using the following method 4 is greater than or equal to 50% and less than or equal to 100%.
(method 4: a coating film which is formed of the material for forming an underlayer film and has a thickness ($\alpha$) of greater than or equal to 200 nm and less than or equal to 500 nm is formed on a silicon wafer, the obtained coating film is treated at 200° C. for 10 minutes, immersed in propylene glycol-1-monomethyl ether-2-acetate at 23° C. for 10 minutes, and dried under conditions of 150° C. for 3 minutes, and a remaining solvent in the coating film is removed, and a thickness (β) of the coating film obtained by removing the remaining solvent is measured, and the residual film rate (=β/α×100)(%) is calculated)

[16]

The material for forming an underlayer film according to [14] or [15], in which the cyclic olefin polymer has a repeating structural unit [A] represented by Formula (1) and a repeating structural unit [B] represented by Formula (2), a molar ratio [A]/[B] of the structural unit [A] to the structural unit [B] in the cyclic olefin polymer is greater than or equal to 5/95 and less than or equal to 95/5.

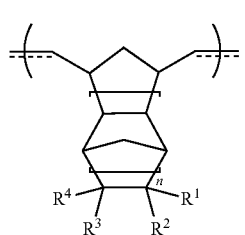

(1)

(in Formula (1), at least one of $R^1$ to $R^4$ is selected from hydrogen, an alkyl group having 1 to 10 carbon atoms, an aryl group having 6 to 20 carbon atoms, an alkoxy group having 1 to 10 carbon atoms, an aryloxy group having 6 to 20 carbon atoms, an alkoxyalkyl group having 2 to 10 carbon atoms, an aryloxyalkyl group having 7 to 20 carbon atoms, an alkoxycarbonyl group having 2 to 20 carbon atoms, a dialkylaminocarbonyl group having 3 to 10 carbon atoms, an aryloxycarbonyl group having 7 to 20 carbon atoms, an alkylarylaminocarbonyl group having 8 to 20 carbon atoms, an alkoxycarbonylalkyl group having 3 to 30 carbon atoms, an alkoxycarbonylaryl group having 8 to 30 carbon atoms, an aryloxycarbonylalkyl group having 8 to 20 carbon atoms, an alkoxyalkyloxycarbonyl group having 3 to 20 carbon atoms, and an alkoxycarbonylalkyloxycarbonyl group having 4 to 30 carbon atoms, $R^1$ to $R^4$ may be bonded to one another to form a ring structure, and n represents an integer of 0 to 2), and

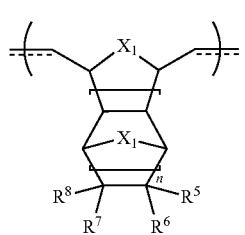

(2)

(in Formula (2), at least one of $R^5$ to $R^8$ is selected from hydrogen, an alkyl group having 1 to 10 carbon atoms, an aryl group having 6 to 20 carbon atoms, an alkoxy group having 1 to 10 carbon atoms, an aryloxy group having 6 to 20 carbon atoms, an alkoxyalkyl group having 2 to 10 carbon atoms, an aryloxyalkyl group having 7 to 20 carbon atoms, an alkoxycarbonyl group having 2 to 20 carbon atoms, a dialkylaminocarbonyl group having 3 to 10 carbon atoms, an aryloxycarbonyl group having 7 to 20 carbon atoms, an alkylarylaminocarbonyl group having 8 to 20 carbon atoms, an alkoxycarbonylalkyl group having 3 to 30 carbon atoms, an alkoxycarbonylaryl group having 8 to 30 carbon atoms, an aryloxycarbonylalkyl group having 8 to 20 carbon atoms, an alkoxyalkyloxycarbonyl group having 3 to 20 carbon atoms, and an alkoxycarbonylalkyloxycarbonyl group having 4 to 30 carbon atoms, $R^5$ to $R^8$ may be bonded to one another to form a ring structure, n represents an integer of 0 to 2, and $X_1$ represents —O— or —S—)

[17]

The material for forming an underlayer film according to any one of [14] to [16], in which a weight-average molecular weight (Mw) of the cyclic olefin polymer in terms of polystyrene which is measured using gel permeation chromatography is greater than or equal to 1000 and less than or equal to 20000.

[18]

The material for forming an underlayer film according to any one of [14] to [17], in which a refractive index (n value) of the cyclic olefin polymer at a wavelength of 193 nm which is measured using the following method 2 is greater than or equal to 1.5 and less than or equal to 2.0.

(method 2: a coating film which is formed of the cyclic olefin polymer and has a thickness of 250 nm is formed on a silicon wafer, and the refractive index (n value) of the obtained coating film at a wavelength of 193 nm is set as the refractive index (n value) of the cyclic olefin polymer)

[19]

The material for forming an underlayer film according to any one of [14] to [17], in which a refractive index (n value) of the material for forming an underlayer film at a wavelength of 193 nm which is measured using the following method 2 is greater than or equal to 1.5 and less than or equal to 2.0.

(method 2: a coating film which is formed of the material for forming an underlayer film and has a thickness of 250 nm is formed on a silicon wafer, and the refractive index (n value) of the obtained coating film at a wavelength of 193 nm is set as the refractive index (n value) of the material for forming an underlayer film)

[20]

The material for forming an underlayer film according to any one of [14] to [19], in which an extinction coefficient (k value) of the cyclic olefin polymer which is measured using the following method 3 is greater than or equal to 0.0001 and less than or equal to 0.5.

(method 3: a coating film which is formed of the cyclic olefin polymer and has a thickness of 250 nm is formed on a silicon wafer, and the extinction coefficient (k value) of the obtained coating film is set as the extinction coefficient (k value) of the cyclic olefin polymer)

[21]

The material for forming an underlayer film according to any one of [14] to [19], in which an extinction coefficient (k value) of the material for forming an underlayer film which is measured using the following method 3 is greater than or equal to 0.0001 and less than or equal to 0.5.

(method 3: a coating film which is formed of the material for forming an underlayer film and has a thickness of 250 nm is formed on a silicon wafer, and the extinction coefficient (k value) of the obtained coating film is set as the extinction coefficient (k value) of the material for forming an underlayer film)

[22]

The material for forming an underlayer film according to any one of [14] to [21], which is formed on an uneven structure of a substrate having the uneven structure and is used for an underlayer film for embedding a recess in the uneven structure.

[23]

The material for forming an underlayer film according to any one of [14] to [22], in which a content of a crosslinking agent in the material for forming an underlayer film is less than 5 parts by mass in a case where a total content of polymer components contained in the material for forming an underlayer film is set to 100 parts by mass.

[24]

The material for forming an underlayer film according to any one of [14] to [23], in which a content of the cyclic olefin polymer in the material for forming an underlayer film is greater than or equal to 50% by mass and less than or equal to 100% by mass in a case where a total content of the material for forming an underlayer film is set to 100% by mass.

[25]

A resist underlayer film including: the material for forming an underlayer film according to any one of [1] to [24].

[26]

A method of producing a resist underlayer film, including: a step of forming a coating film which contains the material for forming an underlayer film according to any one of [1] to [24] on a substrate.

[27]

The method of producing a resist underlayer film according to [26], further including: heating the coating film.

[28]

A laminate including: a substrate; and a resist underlayer film containing the material for forming an underlayer film according to anyone of [1] to [24], which is formed on one surface of the substrate.

The laminate according to [28], in which a flatness ΔFT of a surface (α) of the resist underlayer film on a side opposite to the substrate which is calculated using the following equation is greater than or equal to 0% and less than or equal to 5%.

flatness $(\Delta FT)=[(H_{max}-H_{min})/H_{av}]\times 100(\%)$ (where film thicknesses of the resist underlayer film are measured in ten optional sites of the surface (α), an average value of these measured values is set as $H_{av}$, a maximum value in the film thicknesses of the resist underlayer film is set as $H_{max}$, and a minimum value in the film thicknesses of the resist underlayer film is set as $H_{min}$)

[30]

The laminate according to [28] or [29], in which an average value $H_{av}$ of the film thickness of the resist underlayer film is greater than or equal to 5 nm and less than or equal to 1000 nm.

(where film thicknesses of the resist underlayer film are measured in ten optional sites of the surface (α) of the resist underlayer film on the side opposite to the substrate, and the average value of these measured values is set as Hav)

[31]

The laminate according to any one of [28] to [30], in which the substrate has an uneven structure on at least one surface thereof, the resist underlayer film is formed on the uneven structure, the uneven structure has a height of greater than or equal to 5 nm and less than or equal to 500 nm, and an interval between projections is greater than or equal to 1 nm and less than or equal to 10 mm.

Advantageous Effects of Invention

According to the first present invention, it is possible to provide a material for forming an underlayer film which enables realization of a resist underlayer film having sufficient optical characteristics, etching resistance, excellent flatness, and a suppressed generation of volatile components.

Further, according to the present invention, since the material for forming an underlayer film of the first present invention has an excellent embedding property for an uneven structure, it is possible to form a resist underlayer film having an excellent embedding property for an uneven structure, sufficient optical characteristics, etching resistance, excellent flatness, and a suppressed generation of volatile components on a substrate having a complicated shape.

Further, according to the second present invention, it is possible to provide a material for forming an underlayer film which enables realization of a laminate having excellent adhesiveness and excellent flatness without causing intermixing of an intermediate layer with a resist underlayer film.

BRIEF DESCRIPTION OF THE DRAWINGS

The above-described objects, other objects, features, and advantages will become more apparent based on preferred embodiments described below and the accompanying drawings.

FIGS. 3-1 and 3-2 are a schematic view for describing an uneven structure in which the intervals between recesses and projections, the heights of the projections, and the widths of the projections according to an embodiment of the present invention are not uniform.

DESCRIPTION OF EMBODIMENTS

Figure 1:
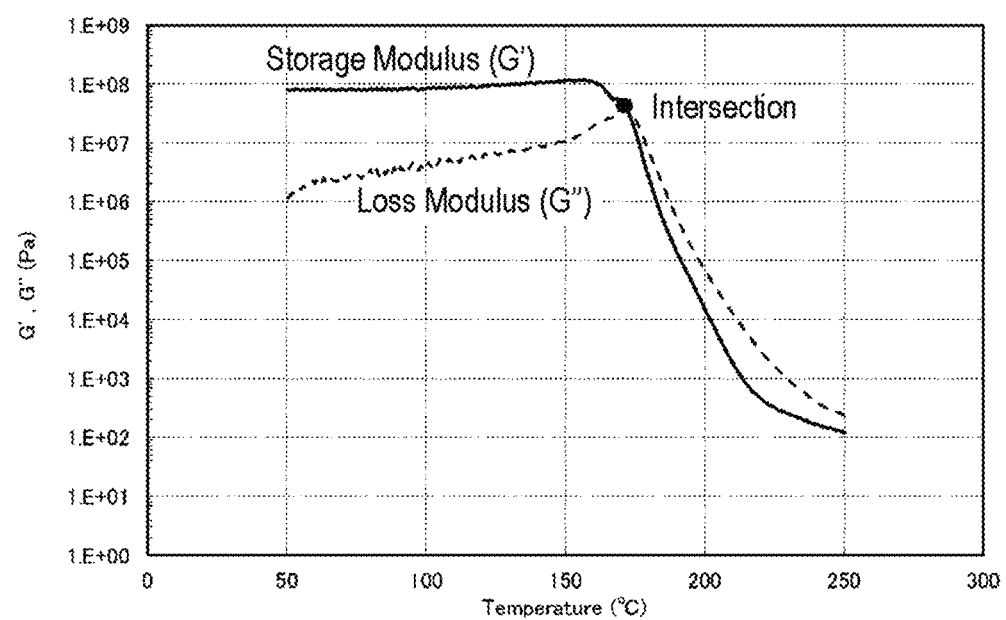
FIG. 1 shows a storage modulus (G') curve, a loss modulus (G") curve, and an intersection of these curves in measurement of the solid viscoelasticity of a polymer 1 described in Example 1.

Hereinafter, embodiments of the present invention will be described.

A numerical range of "A to B" indicates greater than or equal to A and less than or equal to B unless otherwise specified.

[First Invention]

Hereinafter, an embodiment according to the first invention will be described.

<Material for Forming Underlayer Film>

A material for forming an underlayer film according to the present embodiment is a material for forming an underlayer film which is used to form a resist underlayer film used in a multi-layer resist process. The material includes a cyclic olefin polymer which has a repeating structural unit [A] represented by Formula (1) and a repeating structural unit [B] represented by Formula (2), and the molar ratio [A]/[B] of the structural unit [A] to the structural unit [B] in the cyclic olefin polymer is greater than or equal to 5/95 and less than or equal to 95/5.

The material for forming an underlayer film according to the present embodiment is a material for forming a layer disposed between a resist layer and a substrate (preferably a substrate having an uneven structure) in a step of producing a semiconductor device. The layer disposed between the resist layer and the substrate is typically referred to as a resist underlayer film, based on a resist layer formed of a resist material that transfers a mask pattern in a photolithography process. The surface of the substrate which comes into contact with the resist underlayer film may be in a state in which a coating film is formed of a low dielectric material, such as a silica ($SiO_2$) film, a SiCN film, a SiOC film obtained by doping silica ($SiO_2$) with carbon (C), a methylsiloxane-based organic film (SOG), or a silica insulating film in which minute holes having a size of several nanometers or less are uniformly distributed.

In a case where the material for forming an underlayer film according to the present embodiment contains a cyclic olefin polymer having a repeating structural unit [A] represented by Formula (1) and a repeating structural unit [B] represented by Formula (2), a resist underlayer film having sufficient optical characteristics, etching resistance, excellent flatness, and a suppressed generation of volatile components can be formed. In other words, the material for forming an underlayer film according to the present embodiment can be suitably used for forming a resist underlayer film.

In the material for forming an underlayer film according to the present embodiment, the content of the cyclic olefin polymer having a repeating structural unit [A] represented by Formula (1) and a repeating structural unit [B] represented by Formula (2) is preferably greater than or equal to 50% by mass and less than or equal to 100% by mass, more preferably greater than or equal to 70% and less than or equal to 100% by mass, still more preferably greater than or equal to 80% and less than or equal to 100% by mass, and particularly preferably greater than or equal to 90% by mass and less than or equal to 100% by mass with respect to 100% by mass which is the total content of the material for forming an underlayer film.

It is preferable that the same applies to a cyclic olefin polymer in the second invention described below.

The molar ratio [A]/[B] of the structural unit [A] to the structural unit [B] in the cyclic olefin polymer is greater than or equal to 5/95 and less than or equal to 95/5, preferably greater than or equal to 7/93 and less than or equal to 93/7, more preferably greater than or equal to 10/90 and less than or equal to 90/10, and still more preferably greater than or equal to 15/85 and less than or equal to 85/15.

According to the present inventors, it is considered that in a case where the composition of the cyclic olefin polymer is in the above-described range, the density of elements such as oxygen and sulfur in the main chain of the polymer is in a suitable range, appropriate adhesiveness to the interface of the substrate can be exhibited at the time of embedding the uneven structure of the substrate, occurrence of voids and the like can be suppressed, and the embedding property in an excellent state while maintaining high flatness can be realized. Further, the interaction with the substrate due to the presence of elements such as oxygen and sulfur in the main chain of the cyclic olefin polymer is assumed to become a driving force for the cyclic olefin polymer to enter the fine uneven structure.

In other words, the material for forming an underlayer film according to the present embodiment is formed on the uneven structure of the substrate having the uneven structure and can be particularly suitably used to form an underlayer film for embedding recesses in the uneven structure.

In a case where the ratio [A]/[B] is out of the above-described ranges of the upper limit and the lower limit, the adhesiveness to the interface of the substrate is not exhibited in a cooling process after application to the uneven substrate and baking, and the material is contracted and this may cause defects such as voids.

In the present embodiment, the repeating structural unit [A] represented by Formula (1) and the repeating structural unit [B] represented by Formula (2) are represented by the following formulae. Here, the dotted lines in the main chain portions in Formulae (1) and (2) each indicate one covalent bond constituting a double bond or a state in which a double bond is hydrogenated and one covalent bond constituting the double bond is lost.

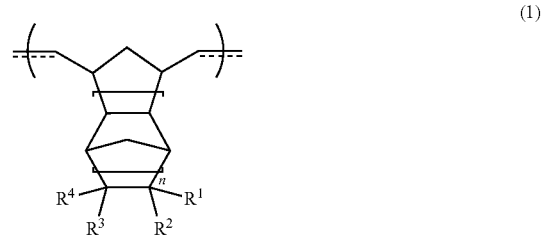

(1)

(In Formula (1), at least one of $R^1$ to $R^4$ is selected from hydrogen, an alkyl group having 1 to 10 carbon atoms, an aryl group having 6 to 20 carbon atoms, an alkoxy group having 1 to 10 carbon atoms, an aryloxy group having 6 to 20 carbon atoms, an alkoxyalkyl group having 2 to 10 carbon atoms, an aryloxyalkyl group having 7 to 20 carbon atoms, an alkoxycarbonyl group having 2 to 20 carbon atoms (preferably 2 to 10 carbon atoms), a dialkylaminocarbonyl group having 3 to 10 carbon atoms, an aryloxycarbonyl group having 7 to 20 carbon atoms, an alkylarylaminocarbonyl group having 8 to 20 carbon atoms, an alkoxycarbonylalkyl group having 3 to 30 carbon atoms (preferably 3 to 20 carbon atoms), an alkoxycarbonylaryl group having 8 to 30 carbon atoms, an aryloxycarbonylalkyl group having 8 to 20 carbon atoms, an alkoxyalkyloxycarbonyl group having 3 to 20 carbon atoms, and an alkoxycarbonylalkyloxycarbonyl group having 4 to 30 carbon atoms (preferably 4 to 20 carbon atoms), $R^1$ to $R^4$ may be bonded to one another to form a ring structure, and n represents an integer of 0 to 2.)

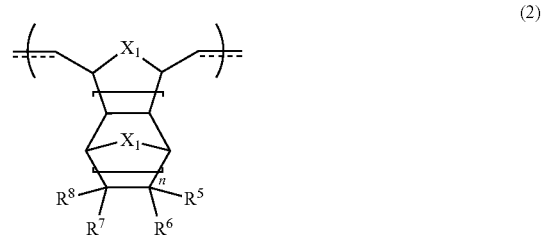

(2)

(In Formula (2), at least one of $R^5$ to $R^8$ is selected from hydrogen, an alkyl group having 1 to 10 carbon atoms, an aryl group having 6 to 20 carbon atoms, an alkoxy group having 1 to 10 carbon atoms, an aryloxy group having 6 to 20 carbon atoms, an alkoxyalkyl group having 2 to 10 carbon atoms, an aryloxyalkyl group having 7 to 20 carbon atoms, an alkoxycarbonyl group having 2 to 20 carbon atoms (preferably 2 to 10 carbon atoms), a dialkylaminocarbonyl group having 3 to 10 carbon atoms, an aryloxycarbonyl group having 7 to 20 carbon atoms, an alkylarylaminocarbonyl group having 8 to 20 carbon atoms, an alkoxycarbonylalkyl group having 3 to 30 carbon atoms (preferably 3 to 20 carbon atoms), an alkoxycarbonylaryl group having 8 to 30 carbon atoms, an aryloxycarbonylalkyl group having 8 to 20 carbon atoms, an alkoxyalkyloxycarbonyl group having 3 to 20 carbon atoms, and an alkoxycarbonylalkyloxycarbonyl group having 4 to 30 carbon atoms (preferably 4 to 20 carbon atoms), $R^5$ to $R^8$ may be bonded to one another to form a ring structure, n represents an integer of 0 to 2, and $X_1$ represents —O— or —S—.)

Examples of the alkyl group having 1 to 10 carbon atoms as $R^1$ to $R^4$ in Formula (1) include a methyl group, an ethyl group, an n-propyl group, an i-propyl group, an n-butyl group, a tert-butyl group, an n-pentyl group, a cyclopentyl group, a cyclohexyl group, and a cyclooctyl group. Examples of the aryl group having 6 to 20 carbon atoms include a phenyl group, a naphthyl group, an anthracenyl group, an o-tolyl group, an m-tolyl group, a p-tolyl group, a biphenyl group, and a phenol group. Examples of the alkoxy group having 1 to 10 carbon atoms include a methoxy group, an ethoxy group, an n-propoxy group, an i-propoxy group, an n-butoxy group, a tert-butoxy group, an n-pentoxy group, a cyclopentoxy group, a cyclohexyloxy group, and a cyclooctyloxy group. Examples of the aryloxy group having 6 to 20 carbon atoms include a phenyloxy group, a naphthyloxy group, an anthracenyloxy group, an o-tolyloxy group, an m-tolyloxy group, a p-tolyloxy group, a 4-oxy-1,1'-biphenyl group, and a 4-hydroxyphenyloxy group. Examples of the alkoxyalkyl group having 2 to 10 carbon atoms include a methoxymethyl group, a methoxyethyl group, an ethoxymethyl group, an ethoxyethyl group, an n-propoxymethyl group, an isopropoxymethyl group, an n-butoxymethyl group, an isobutoxymethyl group, a tert-butoxymethyl group, a cyclopentyloxymethyl group, a cyclohexyloxymethyl group, and a cyclooctyloxymethyl group. Examples of the aryloxyalkyl group having 7 to 20 carbon atoms include a phenyloxymethyl group, a naphthyloxymethyl group, an anthracenyloxymethyl group, an o-tolyloxymethyl group, an m-tolyloxymethyl group, a p-tolyloxymethyl group, a 4-oxy-1,1'-biphenylmethyl group, and a 4-hydroxyphenyloxymethyl group. Examples of the alkoxycarbonyl group having 2 to 20 carbon atoms include a methoxycarbonyl group, an ethoxycarbonyl group, an n-propoxycarbonyl group, an n-butoxycarbonyl group, an isobutoxycarbonyl group, a tert-butoxycarbonyl group, an n-pentyloxycarbonyl group, a cyclopentyloxycarbonyl group, an n-hexyloxycarbonyl group, a cyclohexyloxycarbonyl group, a 3-methylbutoxycarbonyl group, a 2-methylpentoxycarbonyl group, a 3-methylpentoxycarbonyl group, a 4-methylpentoxycarbonyl group, a 1-ethylcyclopentyloxycarbonyl group, a 1-methylcyclohexyloxycarbonyl group, a norbornyloxycarbonyl group, and an adamantyloxycarbonyl group. Examples of the dialkylaminocarbonyl group having 3 to 10 carbon atoms include a dimethylaminocarbonyl group, a diethylaminocarbonyl group, an ethylmethylaminocarbonyl group, a methylbutylaminocarbonyl group, a butylethylaminocarbonyl group, and a cyclohexylmethylaminocarbonyl group. Examples of the aryloxycarbonyl group having 7 to 20 carbon atoms include a phenoxycarbonyl group, a benzyloxycarbonyl group, a 4-methylphenoxycarbonyl group, a 3,4-dimethylphenoxycarbonyl group, a 1-naphthoxycarbonyl group, a 2-naphthoxycarbonyl group, and a 1-anthracenoxycarbonyl group. Examples of the alkylarylaminocarbonyl group having 8 to 20 carbon atoms include a methylphenylaminocarbonyl group, an ethylphenylaminocarbonyl group, a butylphenylaminocarbonyl group, and a cyclohexylphenylaminocarbonyl group.

Examples of the alkoxycarbonylalkyl group having 3 to 30 carbon atoms include a methoxycarbonylmethyl group, a methoxycarbonylethyl group, an ethoxycarbonylmethyl group, an ethoxycarbonylethyl group, an n-propoxycarbonylmethyl group, an i-propoxycarbonylmethyl group, an n-butoxycarbonylmethyl group, a tert-butoxycarbonylmethyl group, an n-pentyloxycarbonylmethyl group, a cyclopentyloxycarbonylmethyl group, an n-hexyloxycarbonylmethyl group, a cyclohexyloxycarbonylmethyl group, an n-octyloxycarbonylmethyl group, a cyclooctyloxycarbonylmethyl group, a 1-ethylcyclopentyloxycarbonylmethyl group, and a 1-methylcyclohexyloxycarbonylmethyl group. Examples of the alkoxycarbonylaryl group having 8 to 30 carbon atoms include a methoxycarbonylphenyl group, a methoxycarbonyl-o-tolyl group, a methoxycarbonyl-m-tolyl group, a methoxycarbonyl-p-tolyl group, a methoxycarbonylsilyl group, a methoxycarbonyl-α-naphthyl group, a methoxycarbonyl-β-naphthyl group, an ethoxycarbonylphenyl group, a propoxycarbonylphenyl group, a butoxycarbonylphenyl group, an ethoxycarbonylphenyl group, an n-propoxycarbonylphenyl group, an i-propoxycarbonylphenyl group, an n-butoxycarbonylphenyl group, a tert-butoxycarbonylphenyl group, an n-pentyloxycarbonylphenyl group, a cyclopentyloxycarbonylphenyl group, an n-hexyloxycarbonylphenyl group, a cyclohexyloxycarbonylphenyl group, an n-octyloxycarbonylphenyl group, a cyclooctyloxycarbonylphenyl group, a 1-ethylcyclopentyloxycarbonylphenyl group, a 1-methylcyclohexyloxycarbonylphenyl group, a methoxycarbonylnaphthyl group, a methoxycarbonylethyl group, an ethoxycarbonylnaphthyl group, an n-propoxycarbonylnaphthyl group, an i-propoxycarbonylnaphthyl group, an n-butoxycarbonylnaphthyl group, a tert-butoxycarbonylnaphthyl group, an n-pentyloxycarbonylnaphthyl group, a cyclopentyloxycarbonylnaphthyl group, an n-hexyloxycarbonylnaphthyl group, a cyclohexyloxycarbonylnaphthyl group, an n-octyloxycarbonylnaphthyl group, a cyclooctyloxycarbonylnaphthyl group, a 1-ethylcyclopentyloxycarbonylnaphthyl group, and a 1-methylcyclohexyloxycarbonylnaphthyl group. Examples of the aryloxycarbonylalkyl group having 8 to 20 carbon atoms include a phenoxycarbonylmethyl group, a benzyloxycarbonylmethyl group, a 4-methylphenoxycarbonylmethyl group, a 3,4-dimethylphenoxycarbonylmethyl group, a 1-naphthoxycarbonylmethyl group, a 2-naphthoxycarbonylmethyl group, and a 1-anthracenoxycarbonylmethyl group. Examples of the alkoxyalkyloxycarbonyl group having 3 to 20 carbon atoms include a methoxymethyloxycarbonyl group, an ethoxymethyloxycarbonyl group, an n-propoxymethyloxycarbonyl group, an isopropoxymethyloxycarbonyl group, an n-butoxymethyloxycarbonyl group, a tert-butoxymethyloxycarbonyl group, a cyclopentyloxymethyloxycarbonyl group, a cyclohexyloxymethyloxycarbonyl group, a cyclooctyloxymethyloxycarbonyl group, a norbornyloxymethyloxycarbonyl group, a 1-methylcyclopentyloxymethyloxycarbonyl group, a 1-ethylcyclopentyloxymethyloxycarbonyl group, a 1-methylcyclohexyloxymethyloxycarbonyl group, a 1-methylnorbornyloxymethyloxycarbonyl group, a 1-ethylnorbornyloxymethyloxycarbonyl group, a 1-ethoxypropyloxymethyloxycarbonyl group, a 1-ethoxy-1-methylethyloxymethyloxycarbonyl group, a tetrahydrofuran-2-yloxymethyloxycarbonyl group, a tetrahydropyran-2-yloxymethyloxycarbonyl group, a 1-adamantyloxymethyloxycarbonyl group, and a 2-adamantyloxymethyloxycarbonyl group. Examples of the alkoxycarbonylalkyloxycarbonyl group having 4 to 30 carbon atoms include a methoxycarbonylmethyloxycarbonyl group, an ethoxycarbonylmethyloxycarbonyl group, an n-propoxycarbonylmethyloxycarbonyl group, an isopropoxycarbonylmethyloxycarbonyl group, an n-butoxycarbonylmethyloxycarbonyl group, a tert-butoxycarbonylmethyloxycarbonyl group, a cyclopentyloxycarbonylmethyloxycarbonyl group, a cyclohexyloxycarbonylmethyloxycarbonyl group, a cyclooctyloxycarbonylmethyloxycarbonyl group, a norbornyloxycarbonylmethyloxycarbonyl group, a 1-methylcyclopentyloxycarbonylmethyloxycarbonyl group, a 1-ethylcyclopentyloxycarbonylmethyloxycarbonyl group, a 1-methylcyclohexyloxycarbonylmethyloxycarbonyl group, a 1-methylnorbornyloxycarbonylmethyloxycarbonyl group, a 1-ethylnorbornyloxycarbonylmethyloxycarbonyl group, a 1-ethoxypropyloxycarbonylmethyloxycarbonyl group, a 1-ethoxy-1-methylethyloxycarbonylmethyloxycarbonyl group, a tetrahydrofuran-2-yloxycarbonylmethyloxycarbonyl group, a tetrahydropyran-2-yloxycarbonylmethyloxycarbonyl group, a 1-adamantyloxycarbonylmethyloxycarbonyl group, and a 2-adamantyloxycarbonylmethyloxycarbonyl group.

Further, $R^1$ to $R^4$ may form a ring structure. Specifically, $R^1$ to $R^4$ are each independently bonded to one another or at least two of these are bonded to each other to form a ring structure optionally through a —C— bond, a —O— bond, or a —$NR^9$— bond. Examples thereof include a cyclic alkyl structure, a cyclic ester structure, a cyclic acid anhydride structure, a cyclic amide structure, and a cyclic imide structure.

In a case where at least two of $R^1$ to $R^4$ form a cyclic alkyl structure through a —C— bond, examples of the structure include cyclopentyl and cyclohexyl. In a case where a cyclic ester structure is formed through a —O— bond, examples of the structure include γ-butyrolactone and δ-valerolactone. In a case of a cyclic acid anhydride structure, a maleic anhydride structure is exemplified. In a case where a lactam ring is formed through a —$NR^9$— bond, γ-lactam and δ-lactam are exemplified. In a case where a maleimide ring which is a lactam ring or a cyclic imide structure is formed, $R^9$ on a nitrogen atom may represent an alkyl group having 1 to 10 carbon atoms or an aryl group having 6 to 20 carbon atoms. Examples of the alkyl group having 1 to 10 carbon atoms include a methyl group, an ethyl group, an n-propyl group, an i-propyl group, an n-butyl group, a tert-butyl group, a 1-methylbutyl group, a 2-methylbutyl group, a n-pentyl group, a 1-methylpentyl group, a 1-ethylbutyl group, a 2-methylhexyl group, a 2-ethylhexyl group, a 4-methylheptyl group, a cyclopentyl group, a cyclohexyl group, and a cyclooctyl group. Examples of the aryl group having 6 to 20 carbon atoms include phenyl, naphthyl, anthracenyl, o-tolyl, m-tolyl, p-tolyl, biphenyl, and phenol.

Among these, it is preferable that $R^1$ to $R^4$ in Formula (1) represent an alkoxycarbonyl group, an aryloxycarbonyl group, an alkoxycarbonylalkyl group, an alkoxycarbonylaryl group, an alkoxyalkyloxycarbonyl group, an alkoxycarbonylalkyloxycarbonyl group, a γ-butyrolactone ring, maleic anhydride, or a maleimide ring.

Further, $X_1$ indicates a structure derived from an element selected from oxygen and sulfur. A structure derived from oxygen is preferable. As described above, it is considered that the material for forming an underlayer film according to the present embodiment, which contains a cyclic olefin polymer having the repeating structural unit [B] represented by Formula (2) in which $X_1$ satisfies the above-described definition, is capable of exhibiting appropriate adhesiveness to the interface of the substrate at the time of embedding the uneven structure of the substrate, suppressing occurrence of voids and the like, and realizing the embedding property in an excellent state while maintaining high flatness. Further, the interaction with the substrate due to the presence of elements such as oxygen and sulfur in the main chain of the cyclic olefin polymer is assumed to become a driving force for the cyclic olefin polymer to enter the fine uneven structure.

The cyclic olefin polymer according to the present embodiment may have two or more structural units in which at least one of $R^1$ to $R^4$ in the repeating structural unit [A] represented by Formula (1) is different from the rest.

In the repeating structural unit [A] represented by Formula (1) according to the present embodiment, examples of the cyclic olefin polymer in which n represents 0 include poly(bicycle[2.2.1]hept-2-ene) in a case where all of $R^1$ to $R^4$ represent hydrogen; poly(5-methyl-bicyclo[2.2.1]hept-2-ene),
poly(5-ethyl-bicyclo[2.2.1]hept-2-ene),
poly(5-(n-propyl)-bicyclo[2.2.1]hept-2-ene),
poly(5-(i-propyl)-bicyclo[2.2.1]hept-2-ene),
poly(5-(n-butyl)-bicyclo[2.2.1]hept-2-ene),
poly(5-(tert-butyl)-bicyclo[2.2.1]hept-2-ene),
poly(5-(n-pentyl)-bicyclo[2.2.1]hept-2-ene),
poly(5-cyclopentyl-bicyclo[2.2.1]hept-2-ene),
poly(5-cyclohexyl-bicyclo[2.2.1]hept-2-ene), and
poly(5-cyclooctyl-bicyclo[2.2.1]hept-2-ene) in a case where at least one of $R^1$ to $R^4$ represents an alkyl group;
poly(5-phenyl-bicyclo[2.2.1]hept-2-ene),
poly(5-naphthyl-bicyclo[2.2.1]hept-2-ene),
poly(5-anthracenyl-bicyclo[2.2.1]hept-2-ene),
poly(5-(o-tolyl)-bicyclo[2.2.1]hept-2-ene),
poly(5-(m-tolyl)-bicyclo[2.2.1]hept-2-ene),
poly(5-p-tolyl)-bicyclo[2.2.1]hept-2-ene),
poly(5-biphenyl-bicyclo[2.2.1]hept-2-ene), and
poly(5-(4-hydroxyphenyl)-bicyclo[2.2.1]hept-2-ene) in a case where at least one of $R^1$ to $R^4$ represents an aryl group;
poly(5-methoxy-bicyclo[2.2.1]hept-2-ene),
poly(5-ethoxy-bicyclo[2.2.1]hept-2-ene),
poly(5-(n-propoxy)-bicyclo[2.2.1]hept-2-ene),
poly(5-(i-propoxy)-bicyclo[2.2.1]hept-2-ene),
poly(5-(n-butoxy)-bicyclo[2.2.1]hept-2-ene),
poly(5-(tert-butoxy)-bicyclo[2.2.1]hept-2-ene),
poly(5-(n-pentoxy)-bicyclo[2.2.1]hept-2-ene),
poly(5-cyclopentyloxy-bicyclo[2.2.1]hept-2-ene),
poly(5-cyclohexyloxy-bicyclo[2.2.1]hept-2-ene), and
poly(5-cyclooctyloxy-bicyclo[2.2.1]hept-2-ene) in a case where at least one of $R^1$ to $R^4$ represents an alkoxy group;
poly(5-phenyloxy-bicyclo[2.2.1]hept-2-ene),
poly(5-naphthyloxy-bicyclo[2.2.1]hept-2-ene),
poly(5-anthracenyloxy-bicyclo[2.2.1]hept-2-ene),
poly(5-(o-tolyloxy)-bicyclo[2.2.1]hept-2-ene),
poly(5-(m-tolyloxy)-bicyclo[2.2.1]hept-2-ene),
poly(5-(p-tolyloxy)-bicyclo[2.2.1]hept-2-ene),
poly(5-(4-oxy-1,1'-biphenyl)-bicyclo[2.2.1]hept-2-ene), and
(5-(4-hydroxyphenyloxy)-bicyclo[2.2.1]hept-2-ene) in a case where at least one of $R^1$ to $R^4$ represents an aryloxy group;
poly(5-methoxymethyl-bicyclo[2.2.1]hept-2-ene),
poly(5-methoxyethyl-bicyclo[2.2.1]hept-2-ene),
poly(5-ethoxymethyl-bicyclo[2.2.1]hept-2-ene),
poly(5-ethoxyethyl-bicyclo[2.2.1]hept-2-ene),
poly(5-(n-propoxymethyl)-bicyclo[2.2.1]hept-2-ene),
poly(5-isopropoxymethyl-bicyclo[2.2.1]hept-2-ene),
poly(5-(n-butoxymethyl)-bicyclo[2.2.1]hept-2-ene),
poly(5-isobutoxymethyl-bicyclo[2.2.1]hept-2-ene),
poly(5-(tert-butoxymethyl)-bicyclo[2.2.1]hept-2-ene),
poly(5-cyclopentyloxymethyl-bicyclo[2.2.1]hept-2-ene),
poly(5-cyclohexyloxymethyl-bicyclo[2.2.1]hept-2-ene), poly(5-cyclooctyloxymethyl-bicyclo[2.2.1]hept-2-ene) in a case where at least one of $R^1$ to $R^4$ represents an alkoxyalkyl group;
poly(5-phenyloxymethyl-bicyclo[2.2.1]hept-2-ene),
poly(5-naphthyloxymethyl-bicyclo[2.2.1]hept-2-ene),
poly(5-anthracenyloxymethyl-bicyclo[2.2.1]hept-2-ene),
poly(5-(o-tolyloxymethyl)-bicyclo[2.2.1]hept-2-ene),
poly(5-(m-tolyloxymethyl)-bicyclo[2.2.1]hept-2-ene),
poly(5-(p-tolyloxymethyl)-bicyclo[2.2.1]hept-2-ene),
poly(5-(4-oxy-1,1'-biphenylmethyl)-bicyclo[2.2.1]hept-2-ene), and
poly(5-(4-hydroxyphenyloxymethyl)-bicyclo[2.2.1]hept-2-ene) in a case where at least one of $R^1$ to $R^4$ represents an aryloxyalkyl group;
poly(5-methoxycarbonyl-bicyclo[2.2.1]hept-2-ene),
poly(5-ethoxycarbonyl-bicyclo[2.2.1]hept-2-ene),
poly(5-(n-propoxycarbonyl)-bicyclo[2.2.1]hept-2-ene),
poly(5-(n-butoxycarbonyl)-bicyclo[2.2.1]hept-2-ene),
poly(5-isobutoxycarbonyl-bicyclo[2.2.1]hept-2-ene),
poly(5-(tert-butoxycarbonyl)-bicyclo[2.2.1]hept-2-ene),
poly(5-(n-pentyloxycarbonyl)-bicyclo[2.2.1]hept-2-ene),
poly(5-(2-methyl-2-pentyloxycarbonyl)-bicyclo[2.2.1]hept-2-ene),
poly(5-(3-methyl-3-pentyloxycarbonyl)-bicyclo[2.2.1]hept-2-ene),
poly(5-(2-ethyl-3-methyl-3-pentyloxycarbonyl)-bicyclo[2.2.1]hept-2-ene), poly(5-cyclopentyloxycarbonyl-bicyclo[2.2.1]hept-2-ene),
poly(5-(n-hexyloxycarbonyl)-bicyclo[2.2.1]hept-2-ene),
poly(5-cyclohexyloxycarbonyl-bicyclo[2.2.1]hept-2-ene),
poly(5-(2-methyl-2-butoxycarbonyl)-bicyclo[2.2.1]hept-2-ene),
poly(5-(2,3-dimethyl-2-butoxycarbonyl)-bicyclo[2.2.1]hept-2-ene),
poly(5-(2,3,3-trimethyl-2-butoxycarbonyl)-bicyclo[2.2.1]hept-2-ene),
poly(5-(2-methyl-2-hexyloxycarbonyl)-bicyclo[2.2.1]hept-2-ene),
poly(5-(3,4-dimethyl-3-hexyloxycarbonyl)-bicyclo[2.2.1]hept-2-ene),
poly(5-(3-methylbutoxycarbonyl)-bicyclo[2.2.1]hept-2-ene),
poly(5-(2-methylpentoxycarbonyl)-bicyclo[2.2.1]hept-2-ene),
poly(5-(3-methylpentoxycarbonyl)-bicyclo[2.2.1]hept-2-ene),
poly(5-(4-methylpentoxycarbonyl)-bicyclo[2.2.1]hept-2-ene),
poly(5-(3-methyl-3-heptyloxycarbonyl)-bicyclo[2.2.1]hept-2-ene),
poly(5-(2-cyclopentyl-2-propoxycarbonyl)-bicyclo[2.2.1]hept-2-ene),
poly(5-(2-cyclohexyl-2-propoxycarbonyl)-bicyclo[2.2.1]hept-2-ene
poly(5-(2-norbornyl-2-propoxycarbonyl)-bicyclo[2.2.1]hept-2-ene),
poly(5-(1,1-dicyclopentylethoxycarbonyl)-bicyclo[2.2.1]hept-2-ene),
poly(5-(1,1-dicyclohexylethoxycarbonyl)-bicyclo[2.2.1]hept-2-ene
poly(5-(1-methylcyclopentyloxycarbonyl)-bicyclo[2.2.1]hept-2-ene),
poly(5-(1-ethylcyclopentyloxycarbonyl)-bicyclo[2.2.1]hept-2-ene),
poly(5-(1-methylcyclohexyloxycarbonyl)-bicyclo[2.2.1]hept-2-ene),
poly(5-(1-ethylcyclohexyloxycarboxyl)-bicyclo[2.2.1]hept-2-ene),
poly(5-(1-methylcyclooctyloxycarbonyl)-bicyclo[2.2.1]hept-2-ene),
poly(5-(1-ethylcyclooctyloxycarbonyl)-bicyclo[2.2.1]hept-2-ene),
poly(5-(1-adamantyloxycarbonyl)-bicyclo[2.2.1]hept-2-ene),
poly(5-(2-methyl-2-adamantyloxycarbonyl)-bicyclo[2.2.1]hept-2-ene),
poly(5-(2-ethyl-2-adamantyloxycarbonyl)-bicyclo[2.2.1]hept-2-ene),
poly(5-(1-methyldecahydronaphthalene-1-yloxycarbonyl)-bicyclo[2.2.1]hept-2-ene),
poly(5-(1-ethyldecahydronaphthalene-1-yloxycarbonyl)-bicyclo[2.2.1]hept-2-ene),
poly(5-(2-methyldecahydronaphthalene-2-yloxycarbonyl)-bicyclo[2.2.1]hept-2-ene),
poly(5-(2-ethyldecahydronaphthalene-2-yloxycarbonyl)-bicyclo[2.2.1]hept-2-ene),
poly(5-(2-methyl-2-norbornyloxycarbonyl)-bicyclo[2.2.1]hept-2-ene),
poly(5-(2-ethyl-2-norbornyloxycarbonyl)-bicyclo[2.2.1]hept-2-ene),
poly(5-(2,7,7-trimethyl-2-norbornyloxycarbonyl)-bicyclo[2.2.1]hept-2-ene),
poly(5-(2-ethyl-7,7-dimethyl-2-norbornyloxycarbonyl)-bicyclo[2.2.1]hept-2-ene),
poly(5-(5-methyl-octahydro-4,7-methano-indene-5-yloxycarbonyl)-bicyclo[2.2.1]hept-2-ene),
poly(5-(5-ethyl-octahydro-4,7-methano-indene-5-yloxycarbonyl)-bicyclo[2.2.1]hept-2-ene),
poly(5-(4-methyl-tetracyclo[6.2.1.1$^{3,6}$.0$^{2,7}$]-dodecane-4-yloxycarbonyl)-bicyclo[2.2.1]hept-2-ene), and
poly(5-(4-ethyl-tetracyclo[6.2.1.1$^{3,6}$.0$^{2,7}$]-dodecane-4-yloxycarbonyl)-bicyclo[2.2.1]hept-2-ene) in a case where at least one of $R^1$ to $R^4$ represents an alkoxycarbonyl group;
poly(5-dimethylaminocarbonyl-bicyclo[2.2.1]hept-2-ene),
poly(5-diethylaminocarbonyl-bicyclo[2.2.1]hept-2-ene),
poly(5-ethylmethylaminocarbonyl-bicyclo[2.2.1]hept-2-ene),
poly(5-methylbutylaminocarbonyl-bicyclo[2.2.1]hept-2-ene),
poly(5-butylethylaminocarbonyl-bicyclo[2.2.1]hept-2-ene), and
poly(5-cyclohexylmethylaminocarbonyl-bicyclo[2.2.1]hept-2-ene) in a case where at least one of $R^1$ to $R^4$ represents a dialkylaminocarbonyl group; poly(5-phenoxycarbonyl-bicyclo[2.2.1]hept-2-ene),
poly(5-benzyloxycarbonyl-bicyclo[2.2.1]hept-2-ene),
poly(5-(4-methylphenoxycarbonyl)-bicyclo[2.2.1]hept-2-ene),
poly(5-(3,4-dimethylphenoxycarbonyl)-bicyclo[2.2.1]hept-2-ene),
poly(5-(1-naphthoxycarbonyl)-bicyclo[2.2.1]hept-2-ene),
poly(5-(2-naphthoxycarbonyl)-bicyclo[2.2.1]hept-2-ene), and
poly(5-(1-anthracenoxycarbonyl)-bicyclo[2.2.1]hept-2-ene) in a case where at least one of $R^1$ to $R^4$ represents an aryloxycarbonyl group;
poly(5-methylphenylaminocarbonyl-bicyclo[2.2.1]hept-2-ene),
poly(5-ethylphenylaminocarbonyl-bicyclo[2.2.1]hept-2-ene),
poly(5-butylphenylaminocarbonyl-bicyclo[2.2.1]hept-2-ene), and poly(5-cyclohexylphenylaminocarbonyl-bicyclo[2.2.1]hept-2-ene) in a case where at least one of R¹ to R⁴ represents an alkylarylaminocarbonyl group;
poly(5-methoxycarbonylmethyl-bicyclo[2.2.1]hept-2-ene),
poly(5-methoxycarbonylethyl-bicyclo[2.2.1]hept-2-ene),
poly(5-ethoxycarbonylmethyl-bicyclo[2.2.1]hept-2-ene),
poly(5-ethoxycarbonylethyl-bicyclo[2.2.1]hept-2-ene),
poly(5-(n-propoxycarbonylmethyl)-bicyclo[2.2.1]hept-2-ene),
poly(5-(i-propoxycarbonylmethyl)-bicyclo[2.2.1]hept-2-ene),
poly(5-(n-butoxycarbonylmethyl)-bicyclo[2.2.1]hept-2-ene),
poly(5-(tert-butoxycarbonylmethyl)-bicyclo[2.2.1]hept-2-ene),
poly(5-(n-pentyloxycarbonylmethyl)-bicyclo[2.2.1]hept-2-ene),
poly(5-(2-methyl-2-butoxycarbonyl)methyl)-bicyclo[2.2.1]hept-2-ene),
poly(5-(2,3-dimethyl-2-butoxycarbonyl)methyl)-bicyclo[2.2.1]hept-2-ene),
poly(5-cyclopentyloxycarbonylmethyl-bicyclo[2.2.1]hept-2-ene),
poly(5-(n-hexyloxycarbonylmethyl)-bicyclo[2.2.1]hept-2-ene),
poly(5-cyclohexyloxycarbonylmethyl-bicyclo[2.2.1]hept-2-ene),
poly(5-(n-octyloxycarbonylmethyl)-bicyclo[2.2.1]hept-2-ene),
poly(5-cyclooctyloxycarbonylmethyl-bicyclo[2.2.1]hept-2-ene),
poly(5-(2-cyclopentyl-2-propoxycarbonyl)methyl)-bicyclo[2.2.1]hept-2-ene),
poly(5-(2-cyclopentyl-2-propoxycarbonyl)methyl)-bicyclo[2.2.1]hept-2-ene),
poly(5-(1-methylcyclopentyloxycarbonyl)methyl)-bicyclo[2.2.1]hept-2-ene),
poly(5-(1-ethylcyclopentyloxycarbonyl)methyl)-bicyclo[2.2.1]hept-2-ene),
poly(5-(1-methylcyclohexyloxycarbonyl)methyl)-bicyclo[2.2.1]hept-2-ene), and
poly(5-(1-ethylcyclohexyloxycarbonyl)methyl)-bicyclo[2.2.1]hept-2-ene) in a case where at least one of R¹ to R⁴ represents an alkoxycarbonylalkyl group;
poly(5-methoxycarbonylphenyl-bicyclo[2.2.1]hept-2-ene),
poly(5-ethoxycarbonylphenyl-bicyclo[2.2.1]hept-2-ene),
poly(5-(n-propoxycarbonylphenyl)-bicyclo[2.2.1]hept-2-ene),
poly(5-(i-propoxycarbonylphenyl)-bicyclo[2.2.1]hept-2-ene),
poly(5-(n-butoxycarbonylphenyl)-bicyclo[2.2.1]hept-2-ene),
poly(5-(tert-butoxycarbonylphenyl)-bicyclo[2.2.1]hept-2-ene),
poly(5-(n-pentyloxycarbonylphenyl)-bicyclo[2.2.1]hept-2-ene),
poly(5-(3-(2-methyl-2-butoxycarbonyl)phenyl)-bicyclo[2.2.1]hept-2-ene),
poly(5-(3-2,3-dimethyl-2-butoxycarbonyl)phenyl)-bicyclo[2.2.1]hept-2-ene),
poly(5-(3-(2-cyclopentyl-2-propoxycarbonyl)phenyl)-bicyclo[2.2.1]hept-2-ene),
poly(5-(3-(2-cyclohexyl-2-propoxycarbonyl)phenyl)-bicyclo[2.2.1]hept-2-ene),
poly(5-(3-(1-methylcyclopentyloxycarbonyl)phenyl)-bicyclo[2.2.1]hept-2-ene),
poly(5-(3-(1-ethylcyclopentyloxycarbonyl)phenyl)-bicyclo[2.2.1]hept-2-ene),
poly(5-(3-(1-methylcyclohexyloxycarbonyl)phenyl)-bicyclo[2.2.1]hept-2-ene),
poly(5-(3-(1-ethylcyclohexyloxycarbonyl)phenyl)-bicyclo[2.2.1]hept-2-ene),
poly(5-(4-(2-methyl-2-butoxycarbonyl)phenyl)-bicyclo[2.2.1]hept-2-ene),
poly(5-(4-(2,3-dimethyl-2-butoxycarbonyl)phenyl)-bicyclo[2.2.1]hept-2-ene),
poly(5-(4-(2-cyclopentyl-2-propoxycarbonyl)phenyl)-bicyclo[2.2.1]hept-2-ene),
poly(5-(4-(2-cyclohexyl-2-propoxycarbonyl)phenyl)-bicyclo[2.2.1]hept-2-ene),
poly(5-(4-(1-methylcyclopentyloxycarbonyl)phenyl)-bicyclo[2.2.1]hept-2-ene),
poly(5-(4-(1-ethylcyclopentyloxycarbonyl)phenyl)-bicyclo[2.2.1]hept-2-ene),
poly(5-(4-(1-methylcyclohexyloxycarbonyl)phenyl)-bicyclo[2.2.1]hept-2-ene),
poly(5-(4-(1-ethylcyclohexyloxycarbonyl)phenyl)-bicyclo[2.2.1]hept-2-ene),
poly(5-methoxycarbonylnaphthyl-bicyclo[2.2.1]hept-2-ene),
poly(5-ethoxycarbonylnaphthyl-bicyclo[2.2.1]hept-2-ene),
poly(5-(n-propoxycarbonylnaphthyl)-bicyclo[2.2.1]hept-2-ene),
poly(5-(i-propoxycarbonylnaphthyl)-bicyclo[2.2.1]hept-2-ene),
poly(5-(n-butoxycarbonylnaphthyl)-bicyclo[2.2.1]hept-2-ene),
poly(5-(tert-butoxycarbonylphenyl)-bicyclo[2.2.1]hept-2-ene),
poly(5-(n-pentyloxycarbonylnaphthyl)-bicyclo[2.2.1]hept-2-ene),
poly(5-(5-(2-methyl-2-butoxycarbonyl)naphthyl)-bicyclo[2.2.1]hept-2-ene),
poly(5-(5-(2,3-dimethyl-2-butoxycarbonyl)naphthyl)-bicyclo[2.2.1]hept-2-ene),
poly(5-(5-(2-cyclopentyl-2-propoxycarbonyl)naphthyl)-bicyclo[2.2.1]hept-2-ene),
poly(5-(5-(2-cyclohexyl-2-propoxycarbonyl)naphthyl)-bicyclo[2.2.1]hept-2-ene),
poly(5-(5-(1-methylcyclopentyloxycarbonyl)naphthyl)-bicyclo[2.2.1]hept-2-ene),
poly(5-(5-(1-ethylcyclopentyloxycarbonyl)naphthyl)-bicyclo[2.2.1]hept-2-ene),
poly(5-(5-(1-methylcyclohexyloxycarbonyl)naphthyl)-bicyclo[2.2.1]hept-2-ene), and
poly(5-(5-(1-ethylcyclohexyloxycarbonyl)naphthyl)-bicyclo[2.2.1]hept-2-ene) in a case where at least one of R¹ to R⁴ represents an alkoxycarbonylaryl group;
poly(5-phenoxycarbonylmethyl-bicyclo[2.2.1]hept-2-ene),
poly(5-benzyloxycarbonylmethyl-bicyclo[2.2.1]hept-2-ene),
poly(5-(4-methylphenoxycarbonylmethyl)-bicyclo[2.2.1]hept-2-ene),
poly(5-(3,4-dimethylphenoxycarbonylmethyl)-bicyclo[2.2.1]hept-2-ene),
poly(5-(1-naphthoxycarbonylmethyl)-bicyclo[2.2.1]hept-2-ene),
poly(5-(2-naphthoxycarbonylmethyl)-bicyclo[2.2.1]hept-2-ene), and
poly(5-(1-anthracenoxycarbonylmethyl)-bicyclo[2.2.1]hept-2-ene) in a case where at least one of R¹ to R⁴ represents an aryloxycarbonylalkyl group;

poly(5-methoxymethyloxycarbonyl-bicyclo[2.2.1]hept-2-ene),
poly(5-ethoxymethyloxycarbonyl-bicyclo[2.2.1]hept-2-ene),
poly(5-(n-propoxymethyloxycarbonyl)-bicyclo[2.2.1]hept-2-ene),
poly(5-isopropoxymethyloxycarbonyl-bicyclo[2.2.1]hept-2-ene),
poly(5-(n-butoxymethyloxycarbonyl)-bicyclo[2.2.1]hept-2-ene),
poly(5-(tert-butoxymethyloxycarbonyl)-bicyclo[2.2.1]hept-2-ene),
poly(5-cyclopentyloxymethyloxycarbonyl)-bicyclo[2.2.1]hept-2-ene),
poly(5-cyclohexyloxymethyloxycarbonyl-bicyclo[2.2.1]hept-2-ene),
poly(5-cyclooctyloxymethyloxycarbonyl-bicyclo[2.2.1]hept-2-ene),
poly(5-norbornyloxymethyloxycarbonyl-bicyclo[2.2.1]hept-2-ene),
poly(5-(1-methylcyclopentyloxymethyloxycarbonyl)-bicyclo[2.2.1]hept-2-ene),
poly(5-(1-ethylcyclopentyloxymethyloxycarbonyl)-bicyclo[2.2.1]hept-2-ene),
poly(5-(1-methylcyclohexyloxymethyloxycarbonyl)-bicyclo[2.2.1]hept-2-ene),
poly(5-(1-ethylcyclohexyloxymethyloxycarbonyl)-bicyclo[2.2.1]hept-2-ene),
poly(5-(1-methylnorbornyloxymethyloxycarbonyl)-bicyclo[2.2.1]hept-2-ene),
poly(5-(1-ethylnorbornyloxymethyloxycarbonyl)-bicyclo[2.2.1]hept-2-ene),
poly(5-(1-ethoxypropyloxymethyloxycarbonyl)-bicyclo[2.2.1]hept-2-ene),
poly(5-(1-ethoxy-1-methylethyloxymethyloxycarbonyl)-bicyclo[2.2.1]hept-2-ene),
poly(5-tetrahydrofuran-2-yloxymethyloxycarbonyl-bicyclo[2.2.1]hept-2-ene),
poly(5-tetrahydropyran-2-yloxymethyloxycarbonyl-bicyclo[2.2.1]hept-2-ene),
poly(5-(1-adamantyloxymethyloxycarbonyl)-bicyclo[2.2.1]hept-2-ene),
poly(5-(2-adamantyloxymethyloxycarbonyl)-bicyclo[2.2.1]hept-2-ene),
poly(5-(1-(1-methoxy)ethoxycarbonyl)-bicyclo[2.2.1]hept-2-ene),
poly(5-(1-(1-ethoxy)ethoxycarbonyl)-bicyclo[2.2.1]hept-2-ene),
poly(5-(1-(1-n-propoxy)ethoxycarbonyl)-bicyclo[2.2.1]hept-2-ene),
poly(5-(1-(1-isopropoxy)ethoxycarbonyl)-bicyclo[2.2.1]hept-2-ene),
poly(5-(1-(1-n-butoxy)ethoxycarbonyl)-bicyclo[2.2.1]hept-2-ene),
poly(5-(1-(1-tert-butoxy)ethoxycarbonyl)-bicyclo[2.2.1]hept-2-ene),
poly(5-(1-(1-cyclopentyloxy)ethoxycarbonyl)-bicyclo[2.2.1]hept-2-ene),
poly(5-(1-(1-cyclohexyloxy)ethoxycarbonyl)-bicyclo[2.2.1]hept-2-ene),
poly(5-(1-(1-cyclooctyloxy)ethoxycarbonyl)-bicyclo[2.2.1]hept-2-ene),
poly(5-(1-(1-norbornyloxy)ethoxycarbonyl)-bicyclo[2.2.1]hept-2-ene),
poly(5-(1-(1-methylcyclopentyloxy)ethoxycarbonyl)-bicyclo[2.2.1]hept-2-ene),
poly(5-(1-(1-ethylcyclopentyloxy)ethoxycarbonyl)-bicyclo[2.2.1]hept-2-ene),
poly(5-(1-(1-methylcyclohexyloxy)ethoxycarbonyl)-bicyclo[2.2.1]hept-2-ene),
poly(5-(1-(1-ethylcyclohexyloxy)ethoxycarbonyl)-bicyclo[2.2.1]hept-2-ene),
poly(5-(1-(1-methylnorbornyloxy)ethoxycarbonyl)-bicyclo[2.2.1]hept-2-ene),
poly(5-(1-(1-ethylnorbornyloxy)ethoxycarbonyl)-bicyclo[2.2.1]hept-2-ene),
poly(5-(1-(1-ethoxypropyloxy)ethoxycarbonyl)-bicyclo[2.2.1]hept-2-ene),
poly(5-(1-(1-ethoxy-1-methylethyloxy)ethoxycarbonyl)-bicyclo[2.2.1]hept-2-ene),
poly(5-(1-(tetrahydrofuran-2-yloxy)ethoxycarbonyl)-bicyclo[2.2.1]hept-2-ene),
poly(5-(1-(tetrahydropyran-2-yloxy)ethoxycarbonyl)-bicyclo[2.2.1]hept-2-ene),
poly(5-(1-(1-adamantyloxy)ethoxycarbonyl)-bicyclo[2.2.1]hept-2-ene), and
poly(5-(1-(2-adamantyloxy)ethoxycarbonyl)-bicyclo[2.2.1]hept-2-ene) in a case where at least one of $R^1$ to $R^4$ represents an alkoxyalkyloxycarbonyl group; and
poly(5-methoxycarbonylmethyloxycarbonyl-bicyclo[2.2.1]hept-2-ene
poly(5-ethoxycarbonylmethyloxycarbonyl-bicyclo[2.2.1]hept-2-ene),
poly(5-(n-propoxycarbonylmethyloxycarbonyl)-bicyclo[2.2.1]hept-2-ene),
poly(5-(isopropoxycarbonylmethyloxycarbonyl-bicyclo[2.2.1]hept-2-ene),
poly(5-(n-butoxycarbonylmethyloxycarbonyl)-bicyclo[2.2.1]hept-2-ene),
poly(5-(tert-butoxycarbonylmethyloxycarbonyl)-bicyclo[2.2.1]hept-2-ene),
poly(5-(2-cyclopentyl-2-propoxycarbonylmethyloxycarbonyl)-bicyclo[2.2.1]hept-2-ene),
poly(5-(2-cyclopentyl-2-butoxycarbonylmethyloxycarbonyl)-bicyclo[2.2.1]hept-2-ene),
poly(5-(2-cyclohexyl-2-propoxycarbonylmethyloxycarbonyl)-bicyclo[2.2.1]hept-2-ene),
poly(5-(3-(2-cyclohexyl-2-propoxycarbonyl)propoxycarbonyl)-bicyclo[2.2.1]hept-2-ene),
poly(5-(2-cyclohexyl-2-butoxycarbonylmethyloxycarbonyl)-bicyclo[2.2.1]hept-2-ene),
poly(5-(3-cyclohexyl-3-pentyloxycarbonylmethyloxycarbonyl)-bicyclo[2.2.1]hept-2-ene),
poly(5-(2-ethyl-2-norbornyloxycarbonylmethyloxycarbonyl)-bicyclo[2.2.1]hept-2-ene),
poly(5-(2-norbornyl-2-propoxycarbonylmethyloxycarbonyl)-bicyclo[2.2.1]hept-2-ene),
poly(5-(4-ethyl-tetracyclo[6.2.1.1$^{3,6}$.0$^{2,7}$]-dodecane-4-yloxycarbonylmethyloxycarbonyl)-bicyclo[2.2.1]hept-2-ene),
poly(5-(2-tetracyclo[6.2.1.1$^{3,6}$.0$^{2,7}$]-dodecane-4-yl)-2-propoxycarbonylmethyloxycarbonyl)-bicyclo[2.2.1]hept-2-ene),
poly(5-(1,1-dicyclohexylethoxycarbonylmethyloxycarbonyl)-bicyclo[2.2.1]hept-2-ene),
poly(5-(1,1-dicyclohexylpropoxycarbonylmethyloxycarbonyl)-bicyclo[2.2.1]hept-2-ene),
poly(5-cyclopentyloxycarbonylmethyloxycarbonyl-bicyclo[2.2.1]hept-2-ene),
poly(5-cyclohexyloxycarbonylmethyloxycarbonyl-bicyclo[2.2.1]hept-2-ene),
poly(5-cyclooctyloxycarbonylmethyloxycarbonyl-bicyclo[2.2.1]hept-2-ene), poly(5-norbornyloxycarbonylmethyloxycarbonyl-bicyclo[2.2.1]hept-2-ene),
poly(5-(1-methylcyclopentyloxycarbonylmethyloxycarbonyl-bicyclo[2.2.1]hept-2-ene),
poly(5-(1-ethylcyclopentyloxycarbonylmethyloxycarbonyl)-bicyclo[2.2.1]hept-2-ene),
poly(5-(1-methylcyclohexyloxycarbonylmethyloxycarbonyl)-bicyclo[2.2.1]hept-2-ene),
poly(5-(1-ethylcyclohexyloxycarbonylmethyloxycarbonyl)-bicyclo[2.2.1]hept-2-ene),
poly(5-(1-methylnorbornyloxycarbonylmethyloxycarbonyl)-bicyclo[2.2.1]hept-2-ene),
poly(5-(1-ethylnorbornyloxycarbonylmethyloxycarbonyl)-bicyclo[2.2.1]hept-2-ene),
poly(5-(1-ethoxypropyloxycarbonylmethyloxycarbonyl)-bicyclo[2.2.1]hept-2-ene),
poly(5-(1-ethoxy-1-methylethyloxycarbonylmethyloxycarbonyl)-bicyclo[2.2.1]hept-2-ene),
poly(5-tetrahydrofuran-2-yloxycarbonylmethyloxycarbonyl-bicyclo[2.2.1]hept-2-ene),
poly(5-tetrahydropyran-2-yloxycarbonylmethyloxycarbonyl-bicyclo[2.2.1]hept-2-ene),
poly(5-(1-adamantyloxycarbonylmethyloxycarbonyl)-bicyclo[2.2.1]hept-2-ene),
poly(5-(2-adamantyloxycarbonylmethyloxycarbonyl)-bicyclo[2.2.1]hept-2-ene),
poly(5-(1-(2-(1-adamantyl)-2-propoxycarbonyl)ethoxycarbonyl)-bicyclo[2.2.1]hept-2-ene),
poly(5-(3-(2-(1-adamantyl)-2-propoxycarbonyl)propoxycarbonyl)-bicyclo[2.2.1]hept-2-ene),
poly(5-(2-(2-(1-adamantyl)-2-propoxycarbonyl)-2-propoxycarbonyl)-bicyclo[2.2.1]hept-2-ene),
poly(5-(2-methyl-2-adamantyloxycarbonylmethyloxycarbonyl)-bicyclo[2.2.1]hept-2-ene),
poly(5-(3-(2-methyl-2-adamantyloxycarbonyl)propoxycarbonyl)-bicyclo[2.2.1]hept-2-ene),
poly(5-(2-(2-methyl-2-adamantyloxycarbonyl)-2-propoxycarbonyl)-bicyclo[2.2.1]hept-2-ene),
poly(5-(1-(2-methyl-2-adamantyloxycarbonyl)ethoxycarbonyl)-bicyclo[2.2.1]hept-2-ene),
poly(5-(2-ethyl-2-adamantyloxycarbonylmethyloxycarbonyl)-bicyclo [2.2.1]hept-2-ene),
poly(5-(2-isopropyl-2-adamantyloxycarbonylmethyloxycarbonyl)-bicyclo[2.2.1]hept-2-ene),
poly(5-(2-(1-adamantyl)-2-propoxycarbonylmethyloxycarbonyl)-bicyclo[2.2.1]hept-2-ene),
poly(5-(2-(1-adamantyl)-2-butoxycarbonylmethyloxycarbonyl)-bicyclo[2.2.1]hept-2-ene),
poly(5-(3-(1-adamantyl)-3-pentyloxycarbonylmethyloxycarbonyl)-bicyclo[2.2.1]hept-2-ene),
poly(5-(3-tert-butoxycarbonyl-1-cyclopentyloxycarbonyl)-bicyclo[2.2.1]hept-2-ene),
poly(5-(3-(1-methylcyclohexyloxycarbonyl)-1-cyclopentyloxycarbonyl)-bicyclo[2.2.1]hept-2-ene),
poly(5-(5-tert-butoxycarbonyl-2-norbornyloxycarbonyl)-bicyclo[2.2.1]hept-2-ene),
poly(5-(5-1-methylcyclohexyloxycarbonyl)-2-norbornyloxycarbonyl)-bicyclo[2.2.1]hept-2-ene),
poly(5-(5,5-di(tert-butoxycarbonyl)-2-norbornyloxycarbonyl)-bicyclo[2.2.1]hept-2-ene),
poly(5-(5,6-di(tert-butoxycarbonyl)-2-norbornyloxycarbonyl)-bicyclo[2.2.1]hept-2-ene),
poly(5-(1-(1-methylcyclohexyloxycarbonyl)-octahydro-4,7-methano-indene-5-yloxycarbonyl)-bicyclo[2.2.1]hept-2-ene),
poly(5-(6-tert-butoxycarbonyl-tetrahydronaphthalene-2-yloxycarbonyl)-bicyclo[2.2.1]hept-2-ene),
poly(5-(9-tert-butoxycarbonyl-tetracyclo[6.2.1.1$^{3,6}$.0$^{2,7}$]-dodecane-4-yloxycarbonyl)-bicyclo[2.2.1]hept-2-ene), and
poly(5-(9-1-methylcyclohexyloxycarbonyl-tetracyclo[6.2.1.1$^{3,6}$.0$^{2,7}$]-dodecane-4-yloxycarbonyl)-bicyclo[2.2.1]hept-2-ene) in a case where at least one of R$^1$ to R$^4$ represents an alkoxycarbonylalkyloxycarbonyl group.

In a case where R$^1$ to R$^4$ are bonded to one another to form a ring structure, examples of the cyclic alkyl structure include poly(1,4,4a,5,6,7,8,8a-octahydro-1,4-methanonaphthalene). Examples of the cyclic ester structure which can form a lactone ring include poly(4-oxy-tricyclo[5.2.1.0$^{2,6}$]-8-decene-3-one) as a γ-butyrolactone structure; poly(4-oxy-tricyclo[6.2.1.0$^{2,7}$]-9-undecene-3-one) as a δ-valerolactone structure; and poly(4-oxy-tricyclo[5.2.1.0$^{2,6}$]-8-decene-3,5-dione) as a cyclic acid anhydride structure. Examples of the cyclic amide structure which can form a lactam ring include
poly(4-methyl-4-aza-tricyclo[5.2.1.0$^{2,6}$]-8-decene-3-one),
poly(4-ethyl-4-aza-tricyclo[5.2.1.0$^{2,6}$]-8-decene-3-one),
poly(4-(n-propyl)-4-aza-tricyclo[5.2.1.0$^{2,6}$]-8-decene-3-one),
poly(4-(n-butyl)-4-aza-tricyclo[5.2.1.0$^{2,6}$]-8-decene-3-one),
poly(4-(1-methylbutyl)-4-aza-tricyclo[5.2.1.0$^{2,6}$]-8-decene-3-one),
poly(4-cyclopentyl-4-aza-tricyclo[5.2.1.0$^{2,6}$]-8-decene-3-one),
poly(4-cyclohexyl-4-aza-tricyclo[5.2.1.0$^{2,6}$]-8-decene-3-one),
poly(4-phenyl-4-aza-tricyclo[5.2.1.0$^{2,6}$]-8-decene-3-one), and
poly(4-(4-hydroxyphenyl)-4-aza-tricyclo[5.2.1.0$^{2,6}$]-8-decene-3-one) as γ-lactam; and
poly(4-methyl-4-aza-tricyclo[6.2.1.0$^{2,7}$]-9-undecene-3-one),
poly(4-ethyl-4-aza-tricyclo[6.2.1.0$^{2,7}$]-9-undecene-3-one),
poly(4-(n-propyl)-4-aza-tricyclo[6.2.1.0$^{2,7}$]-9-undecene-3-one),
poly(4-(n-butyl)-4-aza-tricyclo[6.2.1.0$^{2,7}$]-9-undecene-3-one),
poly(4-(1-methylbutyl)-4-aza-tricyclo[6.2.1.0$^{2,7}$]-9-undecene-3-one),
poly(4-cyclopentyl-4-aza-tricyclo[6.2.1.0$^{2,7}$]-9-undecene-3-one),
poly(4-cyclohexyl-4-aza-tricyclo[6.2.1.0$^{2,7}$]-9-undecene-3-one),
poly(4-phenyl-4-aza-tricyclo[6.2.1.0$^{2,7}$]-9-undecene-3-one), and
poly(4-(4-hydroxyphenyl)-4-aza-tricyclo[6.2.1.0$^{2,7}$]-9-undecene-3-one) as δ-lactam. Examples of the cyclic imide structure which can form a maleimide ring include
poly(4-methyl-4-aza-tricyclo[5.2.1.0$^{2,6}$]-8-decene-3,5-dione),
poly(4-(ethyl-4-aza-tricyclo[5.2.1.0$^{2,6}$]-8-decene-3,5-dione),
poly(4-(n-propyl)-4-aza-tricyclo[5.2.1.0$^{2,6}$]-8-decene-3,5-dione),
poly(4-(n-butyl)-4-aza-tricyclo[5.2.1.0$^{2,6}$]-8-decene-3,5-dione),
poly(4-(1-methylbutyl)-4-aza-tricyclo[5.2.1.0$^{2,6}$]-8-decene-3,5-dione),
poly(4-cyclopentyl-4-aza-tricyclo[5.2.1.0$^{2,6}$]-8-decene-3,5-dione),
poly(4-cyclohexyl-4-aza-tricyclo[5.2.1.0$^{2,6}$]-8-decene-3,5-dione),
poly(4-phenyl-4-aza-tricyclo[5.2.1.0$^{2,6}$]-8-decene-decene-3,5-dione) and poly(4-(4-hydroxyphenyl)-4-aza-tricyclo[5.2.1.0$^{2,6}$]-8-decene-3,5-dione).

Among these, in the repeating structural unit [A] represented by Formula (1) according to the present embodiment, as the cyclic olefin polymer in which n represents 0,
poly(5-methoxycarbonyl-bicyclo[2.2.1]hept-2-ene),
poly(5-ethoxycarbonyl-bicyclo[2.2.1]hept-2-ene),
poly(5-(n-propoxycarbonyl)-bicyclo[2.2.1]hept-2-ene),
poly(5-(n-butoxycarbonyl)-bicyclo[2.2.1]hept-2-ene),
poly(5-isobutoxycarbonyl-bicyclo[2.2.1]hept-2-ene),
poly(5-(tert-butoxycarbonyl)-bicyclo[2.2.1]hept-2-ene),
poly(5-(n-pentyloxycarbonyl)-bicyclo[2.2.1]hept-2-ene),
poly(5-(2-methyl-2-pentyloxycarbonyl)-bicyclo[2.2.1]hept-2-ene),
poly(5-(3-methyl-3-pentyloxycarbonyl)-bicyclo[2.2.1]hept-2-ene),
poly(5-(2-ethyl-3-methyl-3-pentyloxycarbonyl)-bicyclo[2.2.1]hept-2-ene), poly(5-cyclopentyloxycarbonyl-bicyclo[2.2.1]hept-2-ene),
poly(5-(n-hexyloxycarbonyl)-bicyclo[2.2.1]hept-2-ene),
poly(5-cyclohexyloxycarbonyl-bicyclo[2.2.1]hept-2-ene),
poly(5-(2-methyl-2-butoxycarbonyl)-bicyclo[2.2.1]hept-2-ene),
poly(5-(2,3-dimethyl-2-butoxycarbonyl)-bicyclo[2.2.1]hept-2-ene),
poly(5-(2,3,3-trimethyl-2-butoxycarbonyl)-bicyclo[2.2.1]hept-2-ene),
poly(5-2-methyl-2-hexyloxycarbonyl)-bicyclo[2.2.1]hept-2-ene),
poly(5-(3,4-dimethyl-3-hexyloxycarbonyl)-bicyclo[2.2.1]hept-2-ene),
poly(5-(3-methylbutoxycarbonyl)-bicyclo[2.2.1]hept-2-ene),
poly(5-(2-methylpentoxycarbonyl)-bicyclo[2.2.1]hept-2-ene),
poly(5-(3-methylpentoxycarbonyl)-bicyclo[2.2.1]hept-2-ene),
poly(5-(4-methylpentoxycarbonyl)-bicyclo[2.2.1]hept-2-ene),
poly(5-(3-methyl-3-heptyloxycarbonyl)-bicyclo[2.2.1]hept-2-ene),
poly(5-(2-cyclopentyl-2-propoxycarbonyl)-bicyclo[2.2.1]hept-2-ene),
poly(5-(2-cyclohexyl-2-propoxycarbonyl)-bicyclo[2.2.1]hept-2-ene
poly(5-(2-norbornyl-2-propoxycarbonyl)-bicyclo[2.2.1]hept-2-ene),
poly(5-(1,1-dicyclopentylethoxycarbonyl)-bicyclo[2.2.1]hept-2-ene),
poly(5-(1,1-dicyclohexylethoxycarbonyl)-bicyclo[2.2.1]hept-2-ene),
poly(5-(1-methylcyclopentyloxycarbonyl)-bicyclo[2.2.1]hept-2-ene),
poly(5-(1-ethylcyclopentyloxycarbonyl)-bicyclo[2.2.1]hept-2-ene),
poly(5-(1-methylcyclohexyloxycarbonyl)-bicyclo[2.2.1]hept-2-ene),
poly(5-(1-ethylcyclohexyloxycarbonyl)-bicyclo[2.2.1]hept-2-ene),
poly(5-(1-methylcyclooctyloxycarbonyl)-bicyclo[2.2.1]hept-2-ene),
poly(5-(1-ethylcyclooctyloxycarbonyl)-bicyclo[2.2.1]hept-2-ene),
poly(5-(1-adamantyloxycarbonyl)-bicyclo[2.2.1]hept-2-ene),
poly(5-(2-methyl-2-adamantyloxycarbonyl)-bicyclo[2.2.1]hept-2-ene),
poly(5-(2-ethyl-2-adamantyloxycarbonyl)-bicyclo[2.2.1]hept-2-ene),
poly(5-(1-methyldecahydronaphthalene-1-yloxycarbonyl)-bicyclo[2.2.1]hept-2-ene),
poly(5-(1-ethyldecahydronaphthalene-1-yloxycarbonyl)-bicyclo[2.2.1]hept-2-ene),
poly(5-(2-methyldecahydronaphthalene-2-yloxycarbonyl)-bicyclo[2.2.1]hept-2-ene),
poly(5-(2-ethyldecahydronaphthalene-2-yloxycarbonyl)-bicyclo[2.2.1]hept-2-ene),
poly(5-(2-methyl-2-norbornyloxycarbonyl)-bicyclo[2.2.1]hept-2-ene),
poly(5-(2-ethyl-2-norbornyloxycarbonyl)-bicyclo[2.2.1]hept-2-ene),
poly(5-(2,7,7-trimethyl-2-norbornyloxycarbonyl)-bicyclo[2.2.1]hept-2-ene),
poly(5-(2-ethyl-7,7-dimethyl-2-norbornyloxycarbonyl)-bicyclo[2.2.1]hept-2-ene),
poly(5-(5-methyl-octahydro-4,7-methano-indene-5-yloxycarbonyl)-bicyclo[2.2.1]hept-2-ene),
poly(5-(5-ethyl-octahydro-4,7-methano-indene-5-yloxycarbonyl)-bicyclo[2.2.1]hept-2-ene),
poly(5-(4-methyl-tetracyclo[6.2.1.1$^{3,6}$.0$^{2,7}$]-dodecane-4-yloxycarbonyl)-bicyclo[2.2.1]hept-2-ene),
poly(5-(4-ethyl-tetracyclo[6.2.1.1$^{3,6}$.0$^{2,7}$]-dodecane-4-yloxycarbonyl)-bicyclo[2.2.1]hept-2-ene),
poly(5-methoxycarbonylphenyl-bicyclo[2.2.1]hept-2-ene),
poly(5-ethoxycarbonylphenyl-bicyclo[2.2.1]hept-2-ene),
poly(5-(n-propoxycarbonylphenyl)-bicyclo[2.2.1]hept-2-ene),
poly(5-(i-propoxycarbonylphenyl)-bicyclo[2.2.1]hept-2-ene),
poly(5-(n-butoxycarbonylphenyl)-bicyclo[2.2.1]hept-2-ene),
poly(5-(tert-butoxycarbonylphenyl)-bicyclo[2.2.1]hept-2-ene),
poly(5-n-pentyloxycarbonylphenyl-bicyclo[2.2.1]hept-2-ene),
poly(5-(3-(2-methyl-2-butoxycarbonyl)phenyl)-bicyclo[2.2.1]hept-2-ene),
poly(5-(3-2,3-dimethyl-2-butoxycarbonyl)phenyl)-bicyclo[2.2.1]hept-2-ene),
poly(5-(3-(2-cyclopentyl-2-propoxycarbonyl)phenyl)-bicyclo[2.2.1]hept-2-ene),
poly(5-(3-(2-cyclohexyl-2-propoxycarbonyl)phenyl)-bicyclo[2.2.1]hept-2-ene),
poly(5-(3-(1-methylcyclopentyloxycarbonyl)phenyl)-bicyclo[2.2.1]hept-2-ene),
poly(5-(3-(1-ethylcyclopentyloxycarbonyl)phenyl)-bicyclo[2.2.1]hept-2-ene),
poly(5-(3-(1-methylcyclohexyloxycarbonyl)phenyl)-bicyclo[2.2.1]hept-2-ene),
poly(5-(3-(1-ethylcyclohexyloxycarbonyl)phenyl)-bicyclo[2.2.1]hept-2-ene),
poly(5-(4-(2-methyl-2-butoxycarbonyl)phenyl)-bicyclo[2.2.1]hept-2-ene),
poly(5-(4-(2,3-dimethyl-2-butoxycarbonyl)phenyl)-bicyclo[2.2.1]hept-2-ene),
poly(5-(4-(2-cyclopentyl-2-propoxycarbonyl)phenyl)-bicyclo[2.2.1]hept-2-ene),
poly(5-(4-(2-cyclohexyl-2-propoxycarbonyl)phenyl)-bicyclo[2.2.1]hept-2-ene),
poly(5-(4-(1-methylcyclopentyloxycarbonyl)phenyl)-bicyclo[2.2.1]hept-2-ene),
poly(5-(4-(1-ethylcyclopentyloxycarbonyl)phenyl)-bicyclo[2.2.1]hept-2-ene), poly(5-(4-(1-methylcyclohexyloxycarbonyl)phenyl)-bicyclo[2.2.1]hept-2-ene),
poly(5-(4-(1-ethylcyclohexyloxycarbonyl)phenyl)-bicyclo[2.2.1]hept-2-ene),
poly(5-methoxycarbonylnaphthyl-bicyclo[2.2.1]hept-2-ene),
poly(5-ethoxycarbonylnaphthyl-bicyclo[2.2.1]hept-2-ene),
poly(5-(n-propoxycarbonylnaphthyl)-bicyclo[2.2.1]hept-2-ene),
poly(5-(i-propoxycarbonylnaphthyl)-bicyclo[2.2.1]hept-2-ene),
poly(5-(n-butoxycarbonylnaphthyl)-bicyclo[2.2.1]hept-2-ene),
poly(5-(tert-butoxycarbonylphenyl)-bicyclo[2.2.1]hept-2-ene),
poly(5-(n-pentyloxycarbonylnaphthyl)-bicyclo[2.2.1]hept-2-ene),
poly(5-(5-(2-methyl-2-butoxycarbonyl)naphthyl)-bicyclo[2.2.1]hept-2-ene),
poly(5-(5-(2,3-dimethyl-2-butoxycarbonyl)naphthyl)-bicyclo[2.2.1]hept-2-ene),
poly(5-(5-(2-cyclopentyl-2-propoxycarbonyl)naphthyl)-bicyclo[2.2.1]hept-2-ene),
poly(5-(5-(2-cyclohexyl-2-propoxycarbonyl)naphthyl)-bicyclo[2.2.1]hept-2-ene),
poly(5-(5-(1-methylcyclopentyloxycarbonyl)naphthyl)-bicyclo[2.2.1]hept-2-ene),
poly(5-(5-(1-ethylcyclopentyloxycarbonyl)naphthyl)-bicyclo[2.2.1]hept-2-ene),
poly(5-(5-(1-methylcyclohexyloxycarbonyl)naphthyl)-bicyclo[2.2.1]hept-2-ene),
poly(5-(5-(1-ethylcyclohexyloxycarbonyl)naphthyl)-bicyclo[2.2.1]hept-2-ene),
poly(5-phenoxycarbonylmethyl-bicyclo[2.2.1]hept-2-ene),
poly(5-benzyloxycarbonylmethyl-bicyclo[2.2.1]hept-2-ene),
poly(5-(4-methylphenoxycarbonylmethyl)-bicyclo[2.2.1]hept-2-ene),
poly(5-(3,4-dimethylphenoxycarbonylmethyl)-bicyclo[2.2.1]hept-2-ene),
poly(5-(1-naphthoxycarbonylmethyl)-bicyclo[2.2.1]hept-2-ene),
poly(5-(2-naphthoxycarbonylmethyl)-bicyclo[2.2.1]hept-2-ene),
poly(5-(1-anthracenoxycarbonyl)-bicyclo[2.2.1]hept-2-ene),
poly(5-methoxymethyloxycarbonyl-bicyclo[2.2.1]hept-2-ene),
poly(5-ethoxymethyloxycarbonyl-bicyclo[2.2.1]hept-2-ene),
poly(5-(n-propoxymethyloxycarbonyl)-bicyclo[2.2.1]hept-2-ene),
poly(5-isopropoxymethyloxycarbonyl-bicyclo[2.2.1]hept-2-ene),
poly(5-(n-butoxymethyloxycarbonyl)-bicyclo[2.2.1]hept-2-ene),
poly(5-(tert-butoxymethyloxycarbonyl)-bicyclo[2.2.1]hept-2-ene),
poly(5-cyclopentyloxymethyloxycarbonyl)-bicyclo[2.2.1]hept-2-ene),
poly(5-cyclohexyloxymethyloxycarbonyl-bicyclo[2.2.1]hept-2-ene),
poly(5-cyclooctyloxymethyloxycarbonyl-bicyclo[2.2.1]hept-2-ene),
poly(5-norbornyloxymethyloxycarbonyl-bicyclo[2.2.1]hept-2-ene),
poly(5-(1-methylcyclopentyloxymethyloxycarbonyl)-bicyclo[2.2.1]hept-2-ene),
poly(5-(1-ethylcyclopentyloxymethyloxycarbonyl)-bicyclo[2.2.1]hept-2-ene),
poly(5-(1-methylcyclohexyloxymethyloxycarbonyl)-bicyclo[2.2.1]hept-2-ene),
poly(5-(1-ethylcyclohexyloxymethyloxycarbonyl)-bicyclo[2.2.1]hept-2-ene),
poly(5-(1-methylnorbornyloxymethyloxycarbonyl)-bicyclo[2.2.1]hept-2-ene),
poly(5-(1-ethylnorbornyloxymethyloxycarbonyl)-bicyclo[2.2.1]hept-2-ene),
poly(5-(1-ethoxypropyloxymethyloxycarbonyl)-bicyclo[2.2.1]hept-2-ene),
poly(5-(1-ethoxy-1-methylethyloxymethyloxycarbonyl)-bicyclo[2.2.1]hept-2-ene),
poly(5-tetrahydrofuran-2-yloxymethyloxycarbonyl-bicyclo[2.2.1]hept-2-ene),
poly(5-tetrahydropyran-2-yloxymethyloxycarbonyl-bicyclo[2.2.1]hept-2-ene),
poly(5-(1-adamantyloxymethyloxycarbonyl)-bicyclo[2.2.1]hept-2-ene),
poly(5-(2-adamantyloxymethyloxycarbonyl)-bicyclo[2.2.1]hept-2-ene),
poly(5-(1-(1-methoxy)ethoxycarbonyl)-bicyclo[2.2.1]hept-2-ene),
poly(5-(1-(1-ethoxy)ethoxycarbonyl)-bicyclo[2.2.1]hept-2-ene),
poly(5-(1-(1-n-propoxy)ethoxycarbonyl)-bicyclo[2.2.1]hept-2-ene),
poly(5-(1-(1-isopropoxy)ethoxycarbonyl)-bicyclo[2.2.1]hept-2-ene),
poly(5-(1-(1-n-butoxy)ethoxycarbonyl)-bicyclo[2.2.1]hept-2-ene),
poly(5-(1-(1-tert-butoxy)ethoxycarbonyl)-bicyclo[2.2.1]hept-2-ene),
poly(5-(1-(1-cyclopentyloxy)ethoxycarbonyl)-bicyclo[2.2.1]hept-2-ene),
poly(5-(1-(1-cyclohexyloxy)ethoxycarbonyl)-bicyclo[2.2.1]hept-2-ene),
poly(5-(1-(1-cyclooctyloxy)ethoxycarbonyl)-bicyclo[2.2.1]hept-2-ene),
poly(5-(1-(1-norbornyloxy)ethoxycarbonyl)-bicyclo[2.2.1]hept-2-ene),
poly(5-(1-(1-methylcyclopentyloxy)ethoxycarbonyl)-bicyclo[2.2.1]hept-2-ene),
poly(5-(1-(1-ethylcyclopentyloxy)ethoxycarbonyl)-bicyclo[2.2.1]hept-2-ene),
poly(5-(1-(1-methylcyclohexyloxy)ethoxycarbonyl)-bicyclo[2.2.1]hept-2-ene),
poly(5-(1-(1-ethylcyclohexyloxy)ethoxycarbonyl)-bicyclo[2.2.1]hept-2-ene),
poly(5-(1-(1-methylnorbornyloxy)ethoxycarbonyl)-bicyclo[2.2.1]hept-2-ene),
poly(5-(1-(1-ethylnorbornyloxy)ethoxycarbonyl)-bicyclo[2.2.1]hept-2-ene),
poly(5-(1-(1-ethoxypropyloxy)ethoxycarbonyl)-bicyclo[2.2.1]hept-2-ene),
poly(5-(1-(1-ethoxy-1-methylethyloxy)ethoxycarbonyl)-bicyclo[2.2.1]hept-2-ene),
poly(5-(1-(tetrahydrofuran-2-yloxy)ethoxycarbonyl)-bicyclo[2.2.1]hept-2-ene),
poly(5-(1-tetrahydropyran-2-yloxy)ethoxycarbonyl)-bicyclo[2.2.1]hept-2-ene),
poly(5-(1-(1-adamantyloxy)ethoxycarbonyl)-bicyclo[2.2.1]hept-2-ene), poly(5-(1-(2-adamantyloxy)ethoxycarbonyl)-bicyclo[2.2.1]hept-2-ene),
poly(5-(n-butoxycarbonylmethyloxycarbonyl)-bicyclo[2.2.1]hept-2-ene),
poly(5-(tert-butoxycarbonylmethyloxycarbonyl)-bicyclo[2.2.1]hept-2-ene),
poly(5-(2-cyclopentyl-2-propoxycarbonylmethyloxycarbonyl)-bicyclo[2.2.1]hept-2-ene),
poly(5-(2-cyclopentyl-2-butoxycarbonylmethyloxycarbonyl)-bicyclo [2.2.1]hept-2-ene),
poly(5-(2-cyclohexyl-2-propoxycarbonylmethyloxycarbonyl)-bicyclo [2.2.1]hept-2-ene),
poly(5-(3-(2-cyclohexyl-2-propoxycarbonyl)propoxycarbonyl)-bicyclo[2.2.1]hept-2-ene),
poly(5-(2-cyclohexyl-2-butoxycarbonylmethyloxycarbonyl)-bicyclo[2.2.1]hept-2-ene),
poly(5-(3-cyclohexyl-3-pentyloxycarbonylmethyloxycarbonyl)-bicyclo[2.2.1]hept-2-ene),
poly(5-(2-ethyl-2-norbornyloxycarbonylmethyloxycarbonyl)-bicyclo [2.2.1]hept-2-ene),
poly(5-(2-norbornyl-2-propoxycarbonylmethyloxycarbonyl)-bicyclo[2.2.1]hept-2-ene),
poly(5-(4-ethyl-tetracyclo[6.2.1.1$^{3,6}$.0$^{2,7}$]-dodecane-4-yloxycarbonylmethyloxycarbonyl)-bicyclo[2.2.1]hept-2-ene),
poly(5-(2-tetracyclo[6.2.1.1$^{3,6}$.0$^{2,7}$]-dodecane-4-yl)-2-propoxycarbonylmethyloxycarbonyl)-bicyclo[2.2.1]hept-2-ene),
poly(5-(1,1-dicyclohexylethoxycarbonylmethyloxycarbonyl)-bicyclo [2.2.1]hept-2-ene),
poly(5-(1,1-dicyclohexylpropoxycarbonylmethyloxycarbonyl)-bicyclo[2.2.1]hept-2-ene),
poly(5-cyclopentyloxycarbonylmethyloxycarbonyl-bicyclo[2.2.1]hept-2-ene),
poly(5-cyclohexyloxycarbonylmethyloxycarbonyl-bicyclo[2.2.1]hept-2-ene),
poly(5-cyclooctyloxycarbonylmethyloxycarbonyl-bicyclo[2.2.1]hept-2-ene),
poly(5-norbornyloxycarbonylmethyloxycarbonyl-bicyclo[2.2.1]hept-2-ene),
poly(5-(1-methylcyclopentyloxycarbonylmethyloxycarbonyl-bicyclo[2.2.1]hept-2-ene),
poly(5-(1-ethylcyclopentyloxycarbonylmethyloxycarbonyl-bicyclo[2.2.1]hept-2-ene),
poly(5-(1-methylcyclohexyloxycarbonylmethyloxycarbonyl-bicyclo[2.2.1]hept-2-ene),
poly(5-(1-ethylcyclohexyloxycarbonylmethyloxycarbonyl)-bicyclo[2.2.1]hept-2-ene),
poly(5-(1-methylnorbornyloxycarbonylmethyloxycarbonyl-bicyclo[2.2.1]hept-2-ene),
poly(5-(1-ethylnorbornyloxycarbonylmethyloxycarbonyl)-bicyclo[2.2.1]hept-2-ene),
poly(5-(1-ethoxypropyloxycarbonylmethyloxycarbonyl)-bicyclo[2.2.1]hept-2-ene),
poly(5-(1-ethoxy-1-methylethyloxycarbonylmethyloxycarbonyl)-bicyclo[2.2.1]hept-2-ene),
poly(5-tetrahydrofuran-2-yloxycarbonylmethyloxycarbonyl-bicyclo[2.2.1]hept-2-ene),
poly(5-tetrahydropyran-2-yloxycarbonylmethyloxycarbonyl-bicyclo[2.2.1]hept-2-ene),
poly(5-(1-adamantyloxycarbonylmethyloxycarbonyl)-bicyclo[2.2.1]hept-2-ene),
poly(5-(2-adamantyloxycarbonylmethyloxycarbonyl)-bicyclo[2.2.1]hept-2-ene),
poly(5-(1-(2-(1-adamantyl)-2-propoxycarbonyl)ethoxycarbonyl)-bicyclo[2.2.1]hept-2-ene),
poly(5-(3-(2-(1-adamantyl)-2-propoxycarbonyl)propoxycarbonyl)-bicyclo[2.2.1]hept-2-ene),
poly(5-(2-(2-(1-adamantyl)-2-propoxycarbonyl)-2-propoxycarbonyl)-bicyclo[2.2.1]hept-2-ene),
poly(5-(2-methyl-2-adamantyloxycarbonylmethyloxycarbonyl)-bicyclo[2.2.1]hept-2-ene),
poly(5-(3-(2-methyl-2-adamantyloxycarbonyl)propoxycarbonyl)-bicyclo[2.2.1]hept-2-ene),
poly(5-(2-(2-methyl-2-adamantyloxycarbonyl)-2-propoxycarbonyl)-bicyclo[2.2.1]hept-2-ene),
poly(5-(1-(2-methyl-2-adamantyloxycarbonyl)ethoxycarbonyl)-bicyclo[2.2.1]hept-2-ene),
poly(5-(2-ethyl-2-adamantyloxycarbonylmethyloxycarbonyl)-bicyclo [2.2.1]hept-2-ene),
poly(5-(2-isopropyl-2-adamantyloxycarbonylmethyloxycarbonyl)-bicyclo[2.2.1]hept-2-ene),
poly(5-(2-(1-adamantyl)-2-propoxycarbonylmethyloxycarbonyl)-bicyclo[2.2.1]hept-2-ene),
poly(5-(2-(1-adamantyl)-2-butoxycarbonylmethyloxycarbonyl)-bicyclo[2.2.1]hept-2-ene),
poly(5-(3-(1-adamantyl)-3-pentyloxycarbonylmethyloxycarbonyl)-bicyclo[2.2.1]hept-2-ene),
poly(5-(3-tert-butoxycarbonyl-1-cyclopentyloxycarbonyl)-bicyclo[2.2.1]hept-2-ene),
poly(5-(3-(1-methylcyclohexyloxycarbonyl)-1-cyclopentyloxycarbonyl)-bicyclo[2.2.1]hept-2-ene),
poly(5-(5-tert-butoxycarbonyl-2-norbornyloxycarbonyl)-bicyclo[2.2.1]hept-2-ene),
poly(5-(5-1-methylcyclohexyloxycarbonyl)-2-norbornyloxycarbonyl)-bicyclo[2.2.1]hept-2-ene),
poly(5-(5,5-di(tert-butoxycarbonyl)-2-norbornyloxycarbonyl)-bicyclo[2.2.1]hept-2-ene),
poly(5-(5,6-di(tert-butoxycarbonyl)-2-norbornyloxycarbonyl)-bicyclo[2.2.1]hept-2-ene),
poly(5-(1-(1-methylcyclohexyloxycarbonyl)-octahydro-4,7-methano-indene-5-yloxycarbonyl)-bicyclo[2.2.1]hept-2-ene),
poly(5-(6-tert-butoxycarbonyl-tetrahydronaphthalene-2-yloxycarbonyl)-bicyclo[2.2.1]hept-2-ene),
poly(5-(9-tert-butoxycarbonyl-tetracyclo[6.2.1.1$^{3,6}$.0$^{2,7}$]-dodecane-4-yloxycarbonyl)-bicyclo[2.2.1]hept-2-ene), or
poly(5-(9-1-methylcyclohexyloxycarbonyl-tetracyclo[6.2.1.1$^{3,6}$.0$^{2,7}$]-dodecane-4-yloxycarbonyl)-bicyclo [2.2.1]hept-2-ene) is preferable.

Among these, from the viewpoints of improving the solubility in a solvent (PGMEA) during preparation of a coating solution and greatly changing the polarity of the cyclic olefin polymer after application, in the repeating structural unit [A] represented by Formula (1) according to the present embodiment, as the cyclic olefin polymer in which n represents 0,
poly(5-(tert-butoxycarbonyl)-bicyclo[2.2.1]hept-2-ene),
poly(5-(2-methyl-2-pentyloxycarbonyl)-bicyclo[2.2.1]hept-2-ene),
poly(5-(3-methyl-3-pentyloxycarbonyl)-bicyclo[2.2.1]hept-2-ene),
poly(5-(2-ethyl-3-methyl-3-pentyloxycarbonyl)-bicyclo[2.2.1]hept-2-ene),
poly(5-(2-methyl-2-butoxycarbonyl)-bicyclo[2.2.1]hept-2-ene),
poly(5-(2,3-dimethyl-2-butoxycarbonyl)-bicyclo[2.2.1]hept-2-ene),
poly(5-(2,3,3-trimethyl-2-butoxycarbonyl)-bicyclo[2.2.1]hept-2-ene),
poly(5-2-methyl-2-hexyloxycarbonyl)-bicyclo[2.2.1]hept-2-ene), poly(5-(3,4-dimethyl-3-hexyloxycarbonyl)-bicyclo[2.2.1]hept-2-ene),
poly(5-(3-methyl-3-heptyloxycarbonyl)-bicyclo[2.2.1]hept-2-ene),
poly(5-(2-cyclopentyl-2-propoxycarbonyl)-bicyclo[2.2.1]hept-2-ene),
poly(5-(2-cyclohexyl-2-propoxycarbonyl)-bicyclo[2.2.1]hept-2-ene),
poly(5-(2-norbornyl-2-propoxycarbonyl)-bicyclo[2.2.1]hept-2-ene),
poly(5-(1,1-dicyclopentylethoxycarbonyl)-bicyclo[2.2.1]hept-2-ene),
poly(5-(1,1-dicyclohexylethoxycarbonyl)-bicyclo[2.2.1]hept-2-ene),
poly(5-(1-methylcyclopentyloxycarbonyl)-bicyclo[2.2.1]hept-2-ene),
poly(5-(1-ethylcyclopentyloxycarbonyl)-bicyclo[2.2.1]hept-2-ene),
poly(5-(1-methylcyclohexyloxycarbonyl)-bicyclo[2.2.1]hept-2-ene),
poly(5-(1-ethylcyclohexyloxycarbonyl)-bicyclo[2.2.1]hept-2-ene),
poly(5-(1-methylcyclooctyloxycarbonyl)-bicyclo[2.2.1]hept-2-ene),
poly(5-(1-ethylcyclooctyloxycarbonyl)-bicyclo[2.2.1]hept-2-ene),
poly(5-(1-adamantyloxycarbonyl)-bicyclo[2.2.1]hept-2-ene),
poly(5-(2-methyl-2-adamantyloxycarbonyl)-bicyclo[2.2.1]hept-2-ene),
poly(5-(2-ethyl-2-adamantyloxycarbonyl)-bicyclo[2.2.1]hept-2-ene),
poly(5-(1-methyldecahydronaphthalene-1-yloxycarbonyl)-bicyclo[2.2.1]hept-2-ene),
poly(5-(1-ethyldecahydronaphthalene-1-yloxycarbonyl)-bicyclo[2.2.1]hept-2-ene),
poly(5-(2-methyldecahydronaphthalene-2-yloxycarbonyl)-bicyclo[2.2.1]hept-2-ene),
poly(5-(2-ethyldecahydronaphthalene-2-yloxycarbonyl)-bicyclo[2.2.1]hept-2-ene),
poly(5-(2-methyl-2-norbornyloxycarbonyl)-bicyclo[2.2.1]hept-2-ene),
poly(5-(2-ethyl-2-norbornyloxycarbonyl)-bicyclo[2.2.1]hept-2-ene),
poly(5-(2,7,7-trimethyl-2-norbornyloxycarbonyl)-bicyclo[2.2.1]hept-2-ene),
poly(5-(2-ethyl-7,7-dimethyl-2-norbornyloxycarbonyl)-bicyclo[2.2.1]hept-2-ene),
poly(5-(5-methyl-octahydro-4,7-methano-indene-5-yloxycarbonyl)-bicyclo[2.2.1]hept-2-ene),
poly(5-(5-ethyl-octahydro-4,7-methano-indene-5-yloxycarbonyl)-bicyclo[2.2.1]hept-2-ene),
poly(5-(4-methyl-tetracyclo[6.2.1.1$^{3,6}$.0$^{2,7}$]-dodecane-4-yloxycarbonyl)-bicyclo[2.2.1]hept-2-ene),
poly(5-(4-ethyl-tetracyclo[6.2.1.1$^{3,6}$.0$^{2,7}$]-dodecane-4-yloxycarbonyl)-bicyclo[2.2.1]hept-2-ene),
poly(5-(tert-butoxycarbonylphenyl)-bicyclo[2.2.1]hept-2-ene),
poly(5-(3-(2-methyl-2-butoxycarbonyl)phenyl)-bicyclo[2.2.1]hept-2-ene),
poly(5-(3-2,3-dimethyl-2-butoxycarbonyl)phenyl)-bicyclo[2.2.1]hept-2-ene),
poly(5-(3-(2-cyclopentyl-2-propoxycarbonyl)phenyl)-bicyclo[2.2.1]hept-2-ene),
poly(5-(3-(2-cyclohexyl-2-propoxycarbonyl)phenyl)-bicyclo[2.2.1]hept-2-ene),
poly(5-(3-(1-methylcyclopentyloxycarbonyl)phenyl)-bicyclo[2.2.1]hept-2-ene),
poly(5-(3-(1-ethylcyclopentyloxycarbonyl)phenyl)-bicyclo[2.2.1]hept-2-ene),
poly(5-(3-(1-methylcyclohexyloxycarbonyl)phenyl)-bicyclo[2.2.1]hept-2-ene),
poly(5-(3-(1-ethylcyclohexyloxycarbonyl)phenyl)-bicyclo[2.2.1]hept-2-ene),
poly(5-(4-(2-methyl-2-butoxycarbonyl)phenyl)-bicyclo[2.2.1]hept-2-ene),
poly(5-(4-(2,3-dimethyl-2-butoxycarbonyl)phenyl)-bicyclo[2.2.1]hept-2-ene),
poly(5-(4-(2-cyclopentyl-2-propoxycarbonyl)phenyl)-bicyclo[2.2.1]hept-2-ene),
poly(5-(4-(2-cyclohexyl-2-propoxycarbonyl)phenyl)-bicyclo[2.2.1]hept-2-ene),
poly(5-(4-(1-methylcyclopentyloxycarbonyl)phenyl)-bicyclo[2.2.1]hept-2-ene),
poly(5-(4-(1-ethylcyclopentyloxycarbonyl)phenyl)-bicyclo[2.2.1]hept-2-ene),
poly(5-(4-(1-methylcyclohexyloxycarbonyl)phenyl)-bicyclo[2.2.1]hept-2-ene),
poly(5-(4-(1-ethylcyclohexyloxycarbonyl)phenyl)-bicyclo[2.2.1]hept-2-ene),
poly(5-(tert-butoxycarbonylphenyl)-bicyclo[2.2.1]hept-2-ene),
poly(5-(n-pentyloxycarbonylnaphthyl)-bicyclo[2.2.1]hept-2-ene),
poly(5-(5-(2-methyl-2-butoxycarbonyl)naphthyl)-bicyclo[2.2.1]hept-2-ene),
poly(5-(5-(2,3-dimethyl-2-butoxycarbonyl)naphthyl)-bicyclo[2.2.1]hept-2-ene),
poly(5-(5-(2-cyclopentyl-2-propoxycarbonyl)naphthyl)-bicyclo[2.2.1]hept-2-ene),
poly(5-(5-(2-cyclohexyl-2-propoxycarbonyl)naphthyl)-bicyclo[2.2.1]hept-2-ene),
poly(5-(5-(1-methylcyclopentyloxycarbonyl)naphthyl)-bicyclo[2.2.1]hept-2-ene),
poly(5-(5-(1-ethylcyclopentyloxycarbonyl)naphthyl)-bicyclo[2.2.1]hept-2-ene),
poly(5-(5-(1-methylcyclohexyloxycarbonyl)naphthyl)-bicyclo[2.2.1]hept-2-ene),
poly(5-(5-(1-ethylcyclohexyloxycarbonyl)naphthyl)-bicyclo[2.2.1]hept-2-ene),
poly(5-(tert-butoxymethyloxycarbonyl)-bicyclo[2.2.1]hept-2-ene),
poly(5-(1-methylcyclopentyloxymethyloxycarbonyl)-bicyclo[2.2.1]hept-2-ene),
poly(5-(1-ethylcyclopentyloxymethyloxycarbonyl)-bicyclo[2.2.1]hept-2-ene),
poly(5-(1-methylcyclohexyloxymethyloxycarbonyl)-bicyclo[2.2.1]hept-2-ene),
poly(5-(1-ethylcyclohexyloxymethyloxycarbonyl)-bicyclo[2.2.1]hept-2-ene),
poly(5-(1-(1-methoxy)ethoxycarbonyl)-bicyclo[2.2.1]hept-2-ene),
poly(5-(1-(1-ethoxy)ethoxycarbonyl)-bicyclo[2.2.1]hept-2-ene),
poly(5-(1-(1-n-propoxy)ethoxycarbonyl)-bicyclo[2.2.1]hept-2-ene),
poly(5-(1-(1-isopropoxy)ethoxycarbonyl)-bicyclo[2.2.1]hept-2-ene),
poly(5-(1-(1-n-butoxy)ethoxycarbonyl)-bicyclo[2.2.1]hept-2-ene),
poly(5-(1-(1-tert-butoxy)ethoxycarbonyl)-bicyclo[2.2.1]hept-2-ene), poly(5-(1-(1-cyclopentyloxy)ethoxycarbonyl)-bicyclo [2.2.1]hept-2-ene),
poly(5-(1-(1-cyclohexyloxy)ethoxycarbonyl)-bicyclo[2.2.1]hept-2-ene),
poly(5-(1-(1-cyclooctyloxy)ethoxycarbonyl)-bicyclo[2.2.1]hept-2-ene),
poly(5-(1-(1-norbornyloxy)ethoxycarbonyl)-bicyclo[2.2.1]hept-2-ene),
poly(5-(1-(1-methylcyclopentyloxy)ethoxycarbonyl)-bicyclo[2.2.1]hept-2-ene),
poly(5-(1-(1-ethylcyclopentyloxy)ethoxycarbonyl)-bicyclo [2.2.1]hept-2-ene),
poly(5-(1-(1-methylcyclohexyloxy)ethoxycarbonyl)-bicyclo[2.2.1]hept-2-ene),
poly(5-(1-(1-ethylcyclohexyloxy)ethoxycarbonyl)-bicyclo [2.2.1]hept-2-ene),
poly(5-(1-(1-methylnorbornyloxy)ethoxycarbonyl)-bicyclo [2.2.1]hept-2-ene),
poly(5-(1-(1-ethylnorbornyloxy)ethoxycarbonyl)-bicyclo [2.2.1]hept-2-ene),
poly(5-(1-(1-ethoxypropyloxy)ethoxycarbonyl)-bicyclo [2.2.1]hept-2-ene),
poly(5-(1-(1-ethoxy-1-methylethyloxy)ethoxycarbonyl)-bicyclo[2.2.1]hept-2-ene),
poly(5-(1-(tetrahydrofuran-2-yloxy)ethoxycarbonyl)-bicyclo[2.2.1]hept-2-ene),
poly(5-(1-tetrahydropyran-2-yloxy)ethoxycarbonyl)-bicyclo[2.2.1]hept-2-ene),
poly(5-(1-(1-adamantyloxy)ethoxycarbonyl)-bicyclo[2.2.1]hept-2-ene),
poly(5-(1-(2-adamantyloxy)ethoxycarbonyl)-bicyclo[2.2.1]hept-2-ene),
poly(5-(tert-butoxycarbonylmethyloxycarbonyl)-bicyclo [2.2.1]hept-2-ene),
poly(5-(2-cyclopentyl-2-propoxycarbonylmethyloxycarbonyl)-bicyclo[2.2.1]hept-2-ene),
poly(5-(2-cyclopentyl-2-butoxycarbonylmethyloxycarbonyl)-bicyclo [2.2.1]hept-2-ene),
poly(5-(2-cyclohexyl-2-propoxycarbonylmethyloxycarbonyl)-bicyclo [2.2.1]hept-2-ene),
poly(5-(3-(2-cyclohexyl-2-propoxycarbonyl)propoxycarbonyl)-bicyclo[2.2.1]hept-2-ene),
poly(5-(2-cyclohexyl-2-butoxycarbonylmethyloxycarbonyl)-bicyclo[2.2.1]hept-2-ene),
poly(5-(3-cyclohexyl-3-pentyloxycarbonylmethyloxycarbonyl)-bicyclo[2.2.1]hept-2-ene),
poly(5-(2-ethyl-2-norbornyloxycarbonylmethyloxycarbonyl)-bicyclo [2.2.1]hept-2-ene),
poly(5-(2-norbornyl-2-propoxycarbonylmethyloxycarbonyl)-bicyclo[2.2.1]hept-2-ene),
poly(5-(4-ethyl-tetracyclo[6.2.1.1$^{3,6}$.0$^{2,7}$]-dodecane-4-yloxycarbonylmethyloxycarbonyl)-bicyclo[2.2.1]hept-2-ene),
poly(5-(2-tetracyclo[6.2.1.1$^{3,6}$.0$^{2,7}$]-dodecane-4-yl)-2-propoxycarbonylmethyloxycarbonyl)-bicyclo[2.2.1]hept-2-ene),
poly(5-(1,1-dicyclohexylethoxycarbonylmethyloxycarbonyl)-bicyclo [2.2.1]hept-2-ene),
poly(5-(1,1-dicyclohexylpropoxycarbonylmethyloxycarbonyl)-bicyclo[2.2.1]hept-2-ene),
poly(5-(1-methylcyclopentyloxycarbonylmethyloxycarbonyl-bicyclo[2.2.1]hept-2-ene),
poly(5-(1-ethylcyclopentyloxycarbonylmethyloxycarbonyl)-bicyclo[2.2.1]hept-2-ene),
poly(5-(1-methylcyclohexyloxycarbonylmethyloxycarbonyl)-bicyclo[2.2.1]hept-2-ene),
poly(5-(1-ethylcyclohexyloxycarbonylmethyloxycarbonyl)-bicyclo[2.2.1]hept-2-ene),
poly(5-(1-(2-(1-adamantyl)-2-propoxycarbonyl)ethoxycarbonyl)-bicyclo[2.2.1]hept-2-ene),
poly(5-(3-(2-(1-adamantyl)-2-propoxycarbonyl)propoxycarbonyl)-bicyclo[2.2.1]hept-2-ene),
poly(5-(2-(2-(1-adamantyl)-2-propoxycarbonyl)-2-propoxycarbonyl)-bicyclo[2.2.1]hept-2-ene),
poly(5-(2-methyl-2-adamantyloxycarbonylmethyloxycarbonyl)-bicyclo[2.2.1]hept-2-ene),
poly(5-(3-(2-methyl-2-adamantyloxycarbonyl)propoxycarbonyl)-bicyclo[2.2.1]hept-2-ene),
poly(5-(2-(2-methyl-2-adamantyloxycarbonyl)-2-propoxycarbonyl)-bicyclo[2.2.1]hept-2-ene),
poly(5-(1-(2-methyl-2-adamantyloxycarbonyl)ethoxycarbonyl)-bicyclo[2.2.1]hept-2-ene),
poly(5-(2-ethyl-2-adamantyloxycarbonylmethyloxycarbonyl)-bicyclo [2.2.1]hept-2-ene),
poly(5-(2-isopropyl-2-adamantyloxycarbonylmethyloxycarbonyl)-bicyclo[2.2.1]hept-2-ene),
poly(5-(2-(1-adamantyl)-2-propoxycarbonylmethyloxycarbonyl)-bicyclo[2.2.1]hept-2-ene),
poly(5-(2-(1-adamantyl)-2-butoxycarbonylmethyloxycarbonyl)-bicyclo[2.2.1]hept-2-ene),
poly(5-(3-(1-adamantyl)-3-pentyloxycarbonylmethyloxycarbonyl)-bicyclo[2.2.1]hept-2-ene),
poly(5-(3-tert-butoxycarbonyl-1-cyclopentyloxycarbonyl)-bicyclo[2.2.1]hept-2-ene),
poly(5-(3-(1-methylcyclohexyloxycarbonyl)-1-cyclopentyloxycarbonyl)-bicyclo[2.2.1]hept-2-ene),
poly(5-(5-tert-butoxycarbonyl-2-norbornyloxycarbonyl)-bicyclo[2.2.1]hept-2-ene),
poly(5-(5-1-methylcyclohexyloxycarbonyl)-2-norbornyloxycarbonyl)-bicyclo[2.2.1]hept-2-ene),
poly(5-(5,5-di(tert-butoxycarbonyl)-2-norbornyloxycarbonyl)-bicyclo[2.2.1]hept-2-ene),
poly(5-(5,6-di(tert-butoxycarbonyl)-2-norbornyloxycarbonyl)-bicyclo[2.2.1]hept-2-ene),
poly(5-(1-(1-methylcyclohexyloxycarbonyl)-octahydro-4,7-methano-indene-5-yloxycarbonyl)-bicyclo[2.2.1]hept-2-ene),
poly(5-(6-tert-butoxycarbonyl-tetrahydronaphthalene-2-yloxycarbonyl)-bicyclo[2.2.1]hept-2-ene),
poly(5-(9-tert-butoxycarbonyl-tetracyclo[6.2.1.1$^{3,6}$.0$^{2,7}$]-dodecane-4-yloxycarbonyl)-bicyclo[2.2.1]hept-2-ene), or
poly(5-(9-1-methylcyclohexyloxycarbonyl-tetracyclo [6.2.1.1$^{3,6}$.0$^{2,7}$]-dodecane-4-yloxycarbonyl)-bicyclo [2.2.1]hept-2-ene) is more preferable.

In the repeating structural unit [A] represented by Formula (1) according to the present embodiment, in a case where $R^1$ to $R^4$ are bonded to one another to form a ring structure, as the cyclic olefin polymer in which n represents 0,
poly(4-oxy-tricyclo[5.2.1.0$^{2,6}$]-8-decene-3-one),
poly(4-oxy-tricyclo[5.2.1.0$^{2,6}$]-8-decene-3,5-dione),
poly(4-methyl-4-aza-tricyclo[5.2.1.0$^{2,6}$]-8-decene-3,5-dione),
poly(4-(ethyl-4-aza-tricyclo[5.2.1.0$^{2,6}$]-8-decene-3,5-dione),
poly(4-(n-propyl)-4-aza-tricyclo[5.2.1.0$^{2,6}$]-8-decene-3,5-dione),
poly(4-(n-butyl)-4-aza-tricyclo[5.2.1.0$^{2,6}$]-8-decene-3,5-dione),
poly(4-(1-methylbutyl)-4-aza-tricyclo[5.2.1.0$^{2,6}$]-8-decene-3,5-dione),
poly(4-cyclopentyl-4-aza-tricyclo[5.2.1.0$^{2,6}$]-8-decene-3,5-dione), poly(4-cyclohexyl-4-aza-tricyclo[5.2.1.0$^{2,6}$]-8-decene-3,5-dione),
poly(4-phenyl-4-aza-tricyclo[5.2.1.0$^{2,6}$]-8-decene-3,5-dione), or
poly(4-(4-hydroxyphenyl-4-aza-tricyclo[5.2.1.0$^{2,6}$]-8-decene-3,5-dione) is preferable.

In the repeating structural unit [A] represented by Formula (1) according to the present embodiment, examples of the cyclic olefin polymer in which n represents 1 include poly(tetracyclo[4.4.0.1$^{2,5}$.1$^{7,10}$]-3-dodecene) in a case where all of R$^1$ to R$^4$ represent hydrogen;
poly(8-methyl-tetracyclo[4.4.0.1$^{2,5}$.1$^{7,10}$]-3-dodecene),
poly(8-ethyl-tetracyclo[4.4.0.1$^{2,5}$.1$^{7,10}$]-3-dodecene),
poly(8-(n-propyl)-tetracyclo[4.4.0.1$^{2,5}$.1$^{7,10}$]-3-dodecene),
poly(8-i-propyl)-tetracyclo[4.4.0.1$^{2,5}$.1$^{7,10}$]-3-dodecene),
poly(8-n-butyl)-tetracyclo[4.4.0.1$^{2,5}$.1$^{7,10}$]-3-dodecene),
poly(8-tert-butyl)-tetracyclo[4.4.0.1$^{2,5}$.1$^{7,10}$]-3-dodecene),
poly(8-(n-pentyl)-tetracyclo[4.4.0.1$^{2,5}$.1$^{7,10}$]-3-dodecene),
poly(8-cyclopentyl-tetracyclo[4.4.0.1$^{2,5}$.1$^{7,10}$]-3-dodecene), and
poly(8-cyclohexyl-tetracyclo[4.4.0.1$^{2,5}$.1$^{7,10}$]-3-dodecene),
poly(8-cyclooctyl-tetracyclo[4.4.0.1$^{2,5}$.1$^{7,10}$]-3-dodecene) in a case where at least one of R$^1$ to R$^4$ represents an alkyl group;
poly(8-phenyl-tetracyclo[4.4.0.1$^{2,5}$.1$^{7,10}$]-3-dodecene),
poly(8-naphthyl-tetracyclo[4.4.0.1$^{2,5}$.1$^{7,10}$]-3-dodecene),
poly(8-anthracenyl-tetracyclo[4.4.0.1$^{2,5}$.1$^{7,10}$]-3-dodecene),
poly(8-(o-tolyl)-tetracyclo[4.4.0.1$^{2,5}$.1$^{7,10}$]-3-dodecene),
poly(8-(m-tolyl)-tetracyclo[4.4.0.1$^{2,5}$.1$^{7,10}$]-3-dodecene),
poly(8-(p-tolyl)-tetracyclo[4.4.0.1$^{2,5}$.1$^{7,10}$]-3-dodecene),
poly(8-biphenyl-tetracyclo[4.4.0.1$^{2,5}$.1$^{7,10}$]-3-dodecene), and
poly(8-(4-hydroxyphenyl)-tetracyclo[4.4.0.1$^{2,5}$.1$^{7,10}$]-3-dodecene) in a case where at least one of R$^1$ to R$^4$ represents an aryl group;
poly(8-methoxy-tetracyclo[4.4.0.1$^{2,5}$.1$^{7,10}$]-3-dodecene),
poly(8-ethoxy-tetracyclo[4.4.0.1$^{2,5}$.1$^{7,10}$]-3-dodecene),
poly(8-(n-propoxy)-tetracyclo[4.4.0.1$^{2,5}$.1$^{7,10}$]-3-dodecene),
poly(8-(i-propoxy)-tetracyclo[4.4.0.1$^{2,5}$.1$^{7,10}$]-3-dodecene),
poly(8-(n-butoxy)-tetracyclo[4.4.0.1$^{2,5}$.1$^{7,10}$]-3-dodecene),
poly(8-(tert-butoxy)-tetracyclo[4.4.0.1$^{2,5}$.1$^{7,10}$]-3-dodecene),
poly(8-(n-pentoxy)-tetracyclo[4.4.0.1$^{2,5}$.1$^{7,10}$]-3-dodecene),
poly(8-cyclopentyloxy-tetracyclo[4.4.0.1$^{2,5}$.1$^{7,10}$]-3-dodecene),
poly(8-cyclohexyloxy-tetracyclo[4.4.0.1$^{2,5}$.1$^{7,10}$]-3-dodecene), and
poly(8-cyclooctyloxy-tetracyclo[4.4.0.1$^{2,5}$.1$^{7,10}$]-3-dodecene) in a case where at least one of R$^1$ to R$^4$ represents an alkoxy group;
poly(8-phenyloxy-tetracyclo[4.4.0.1$^{2,5}$.1$^{7,10}$]-3-dodecene),
poly(8-naphthyloxy-tetracyclo[4.4.0.1$^{2,5}$.1$^{7,10}$]-3-dodecene),
poly(8-anthracenyloxy-tetracyclo[4.4.0.1$^{2,5}$.1$^{7,10}$]-3-dodecene),
poly(8-(o-tolyloxy)-tetracyclo[4.4.0.1$^{2,5}$.1$^{7,10}$]-3-dodecene),
poly(8-(m-tolyloxy)-tetracyclo[4.4.0.1$^{2,5}$.1$^{7,10}$]-3-dodecene),
poly(8-(p-tolyloxy)-tetracyclo[4.4.0.1$^{2,5}$.1$^{7,10}$]-3-dodecene),
poly(8-(4-oxy-1,1'-biphenyl)-tetracyclo[4.4.0.1$^{2,5}$.1$^{7,10}$]-3-dodecene), and
(8-(4-hydroxyphenyloxy)-tetracyclo[4.4.0.1$^{2,5}$.1$^{7,10}$]-3-dodecene) in a case where at least one of R$^1$ to R$^4$ represents an aryloxy group;
poly(8-methoxymethyl-tetracyclo[4.4.0.1$^{2,5}$.1$^{7,10}$]-3-dodecene),
poly(8-methoxyethyl-tetracyclo[4.4.0.1$^{2,5}$.1$^{7,10}$]-3-dodecene),
poly(8-ethoxyethyl-tetracyclo[4.4.0.1$^{2,5}$.1$^{7,10}$]-3-dodecene),
poly(8-(n-propoxymethyl)-tetracyclo[4.4.0.1$^{2,5}$.1$^{7,10}$]-3-dodecene),
poly(8-isopropoxymethyl-tetracyclo[4.4.0.1$^{2,5}$.1$^{7,10}$]-3-dodecene),
poly(8-(n-butoxymethyl)-tetracyclo[4.4.0.1$^{2,5}$.1$^{7,10}$]-3-dodecene),
poly(8-isobutoxymethyl-tetracyclo[4.4.0.1$^{2,5}$.1$^{7,10}$]-3-dodecene),
poly(8-tert-butoxymethyl)-tetracyclo[4.4.0.1$^{2,5}$.1$^{7,10}$]-3-dodecene),
poly(8-cyclopentyloxymethyl-tetracyclo[4.4.0.1$^{2,5}$.1$^{7,10}$]-3-dodecene),
poly(8-cyclohexyloxymethyl-tetracyclo[4.4.0.1$^{2,5}$.1$^{7,10}$]-3-dodecene) and
poly(8-cyclooctyloxymethyl-tetracyclo[4.4.0.1$^{2,5}$.1$^{7,10}$]-3-dodecene) in a case where at least one of R$^1$ to R$^4$ represents an alkoxyalkyl group;
poly(8-phenyloxymethyl-tetracyclo[4.4.0.1$^{2,5}$.1$^{7,10}$]-3-dodecene),
poly(8-naphthyloxymethyl-tetracyclo[4.4.0.1$^{2,5}$.1$^{7,10}$]-3-dodecene),
poly(8-anthracenyloxymethyl-tetracyclo[4.4.0.1$^{2,5}$.1$^{7,10}$]-3-dodecene
poly(8-(o-tolyloxymethyl)-tetracyclo), [4.4.0.1$^{2,5}$.1$^{7,10}$]-3-dodecene),
poly(8-(m-tolyloxymethyl)-tetracyclo[4.4.0.1$^{2,5}$.1$^{7,10}$]-3-dodecene),
poly(8-(p-tolyloxymethyl)-tetracyclo[4.4.0.1$^{2,5}$.1$^{7,10}$]-3-dodecene),
poly(8-4-oxy-1,1'-biphenylmethyl)-tetracyclo[4.4.0.1$^{2,5}$.1$^{7,10}$]-3-dodecene), and
poly(8-(4-hydroxyphenyloxymethyl)-tetracyclo[4.4.0.1$^{2,5}$.1$^{7,10}$]-3-dodecene) in a case where at least one of R$^1$ to R$^4$ represents an aryloxyalkyl group;
poly(8-methoxycarbonyl-tetracyclo[4.4.0.1$^{2,5}$.1$^{7,10}$]-3-dodecene),
poly(8-ethoxycarbonyl-tetracyclo[4.4.0.1$^{2,5}$.1$^{7,10}$]-3-dodecene),
poly(8-(n-propoxycarbonyl)-tetracyclo[4.4.0.1$^{2,5}$.1$^{7,10}$]-3-dodecene),
poly(8-(n-butoxycarbonyl)-tetracyclo[4.4.0.1$^{2,5}$.1$^{7,10}$]-3-dodecene),
poly(8-isobutoxycarbonyl-tetracyclo[4.4.0.1$^{2,5}$.1$^{7,10}$]-3-dodecene),
poly(8-(tert-butoxycarbonyl)-tetracyclo[4.4.0.1$^{2,5}$.1$^{7,10}$]-3-dodecene),
poly(8-(n-pentyloxycarbonyl)-tetracyclo[4.4.0.1$^{2,5}$.1$^{7,10}$]-3-dodecene),
poly(8-(2-methyl-2-pentyloxycarbonyl)-tetracyclo[4.4.0.1$^{2,5}$.1$^{7,10}$]-3-dodecene),
poly(8-(3-methyl-3-pentyloxycarbonyl)-tetracyclo[4.4.0.1$^{2,5}$.1$^{7,10}$]-3-dodecene),
poly(8-(2-ethyl-3-methyl-3-pentyloxycarbonyl)-tetracyclo[4.4.0.1$^{2,5}$.1$^{7,10}$]-3-dodecene),
poly(8-cyclopentyloxycarbonyl-tetracyclo[4.4.0.1$^{2,5}$.1$^{7,10}$]-3-dodecene),
poly(8-(n-hexyloxycarbonyl)-tetracyclo[4.4.0.1$^{2,5}$.1$^{7,10}$]-3-dodecene
poly(8-cyclohexyloxycarbonyl)-tetracyclo[4.4.0.1$^{2,5}$.1$^{7,10}$]-3-dodecene),
poly(8-(2-methyl-2-butoxycarbonyl)-tetracyclo[4.4.0.1$^{2,5}$.1$^{7,10}$]-3-dodecene), poly(8-(2,3-dimethyl-2-butoxycarbonyl)-tetracyclo[4.4.0.1$^{2,5}$.1$^{7,10}$]-3-dodecene),
poly(8-(2,3,3-trimethyl-2-butoxycarbonyl)-tetracyclo[4.4.0.1$^{2,5}$.1$^{7,10}$]-3-dodecene),
poly(8-(2-methyl-2-hexyloxycarbonyl)-tetracyclo[4.4.0.1$^{2,5}$.1$^{7,10}$]-3-dodecene),
poly(8-(3,4-dimethyl-3-hexyloxycarbonyl)-tetracyclo[4.4.0.1$^{2,5}$.1$^{7,10}$]-3-dodecene),
poly(8-(3-methylbutoxycarbonyl)-tetracyclo[4.4.0.1$^{2,5}$.1$^{7,10}$]-3-dodecene),
poly(8-(2-methylpentoxycarbonyl)-tetracyclo[4.4.0.1$^{2,5}$.1$^{7,10}$]-3-dodecene),
poly(8-(3-methylpentoxycarbonyl)-tetracyclo[4.4.0.1$^{2,5}$.1$^{7,10}$]-3-dodecene),
poly(8-(4-methylpentoxycarbonyl)-tetracyclo[4.4.0.1$^{2,5}$.1$^{7,10}$]-3-dodecene),
poly(8-(3-methyl-3-heptyloxycarbonyl)-tetracyclo[4.4.0.1$^{2,5}$.1$^{7,10}$]-3-dodecene),
poly(8-(2-cyclopentyl)-2-propoxycarbonyl)-tetracyclo[4.4.0.1$^{2,5}$.1$^{7,10}$]-3-dodecene),
poly(8-(2-cyclohexyl-2-propoxycarbonyl)-tetracyclo[4.4.0.1$^{2,5}$.1$^{7,10}$]-3-dodecene),
poly(8-(2-norbornyl-2-propoxycarbonyl)-tetracyclo[4.4.0.1$^{2,5}$.1$^{7,10}$]-3-dodecene),
poly(8-(1,1-dicyclopentylethoxycarbonyl)-tetracyclo[4.4.0.1$^{2,5}$.1$^{7,10}$]-3-dodecene),
poly(8-(1,1-dicyclohexylethoxycarbonyl)-tetracyclo[4.4.0.1$^{2,5}$.1$^{7,10}$]-3-dodecene),
poly(8-(1-methylcyclopentyloxycarbonyl)-tetracyclo[4.4.0.1$^{2,5}$.1$^{7,10}$]-3-dodecene),
poly(8-(1-ethylcyclopentyloxycarbonyl)-tetracyclo[4.4.0.1$^{2,5}$.1$^{7,10}$]-3-dodecene),
poly(8-(1-methylcyclohexyloxycarbonyl)-tetracyclo[4.4.0.1$^{2,5}$.1$^{7,10}$]-3-dodecene),
poly(8-(1-ethylcyclohexyloxycarbonyl)-tetracyclo[4.4.0.1$^{2,5}$.1$^{7,10}$]3-dodecene),
poly(8-(1-methylcyclooctyloxycarbonyl)-tetracyclo[4.4.0.1$^{2,5}$.1$^{7,10}$]-3-dodecene),
poly(8-(1-ethylcyclooctyloxycarbonyl)-tetracyclo[4.4.0.1$^{2,5}$.1$^{7,10}$]3-dodecene),
poly(8-(1-adamantyloxycarbonyl)-tetracyclo[4.4.0.1$^{2,5}$.1$^{7,10}$]-3-dodecene),
poly(8-(2-methyl-2-adamantyloxycarbonyl)-tetracyclo[4.4.0.1$^{2,5}$.1$^{7,10}$]-3-dodecene),
poly(8-(2-ethyl-2-adamantyloxycarbonyl)-tetracyclo[4.4.0.1$^{2,5}$.1$^{7,10}$]-3-dodecene),
poly(8-(1-methyldecahydronaphthalene-1-yloxycarbonyl)-tetracyclo[4.4.0.1$^{2,5}$.1$^{7,10}$]-3-dodecene),
poly(8-(1-ethyldecahydronaphthalene-1-yloxycarbonyl)-tetracyclo[4.4.0.1$^{2,5}$.1$^{7,10}$]-3-dodecene),
poly(8-(2-methyldecahydronaphthalene-2-yloxycarbonyl)-tetracyclo[4.4.0.1$^{2,5}$.1$^{7,10}$]-3-dodecene),
poly(8-(2-ethyldecahydronaphthalene-2-yloxycarbonyl)-tetracyclo[4.4.0.1$^{2,5}$.1$^{7,10}$]-3-dodecene),
poly(8-(2-methyl-2-norbornyloxycarbonyl)-tetracyclo[4.4.0.1$^{2,5}$.1$^{7,10}$]-3-dodecene),
poly(8-(2-ethyl-2-norbornyloxycarbonyl)-tetracyclo[4.4.0.1$^{2,5}$.1$^{7,10}$]-3-dodecene),
poly(8-(2,7,7-trimethyl-2-norbornyloxycarbonyl)-tetracyclo[4.4.0.1$^{2,5}$.1$^{7,10}$]-3-dodecene),
poly(8-(2-ethyl-7,7-dimethyl-2-norbornyloxycarbonyl)-tetracyclo[4.4.0.1$^{2,5}$.1$^{7,10}$]-3-dodecene),
poly(8-(5-methyl-octahydro-4,7-methano-indene-5-yloxycarbonyl)-tetracyclo[4.4.0.1$^{2,5}$.1$^{7,10}$]-3-dodecene),
poly(8-(5-ethyl-octahydro-4,7-methano-indene-5-yloxycarbonyl)-tetracyclo[4.4.0.1$^{2,5}$.1$^{7,10}$]-3-dodecene),
poly(8-(4-methyl-tetracyclo[6.2.1.1$^{3,6}$.0$^{2,7}$]-dodecane-4-yloxycarbonyl)-tetracyclo[4.4.0.1$^{2,5}$.1$^{7,10}$]-3-dodecene), and
poly(8-(4-ethyl-tetracyclo[6.2.1.1$^{3,6}$.0$^{2,7}$]-dodecane-4-yloxycarbonyl)-tetracyclo[4.4.0.1$^{2,5}$.1$^{7,10}$]-3-dodecene)
in a case where at least one of $R^1$ to $R^4$ represents an alkoxycarbonyl group;
poly(8-dimethylaminocarbonyl-tetracyclo[4.4.0.1$^{2,5}$.1$^{7,10}$]-3-dodecene),
poly(8-diethylaminocarbonyl-tetracyclo[4.4.0.1$^{2,5}$.1$^{7,10}$]-3-dodecene
poly(8-ethylmethylaminocarbonyl-tetracyclo[4.4.0.1$^{2,5}$.1$^{7,10}$]-3-dodecene),
poly(8-methylbutylaminocarbonyl-tetracyclo[4.4.0.1$^{2,5}$.1$^{7,10}$]-3-dodecene),
poly(8-butylethylaminocarbonyl-tetracyclo[4.4.0.1$^{2,5}$.1$^{7,10}$]-3-dodecene),
and
poly(8-cyclohexylmethylaminocarbonyl-tetracyclo[4.4.0.1$^{2,5}$.1$^{7,10}$]-3-dodecene) in a case where at least one of $R^1$ to $R^4$ represents an alkylaminocarbonyl group;
poly(8-phenoxycarbonyl-tetracyclo[4.4.0.1$^{2,5}$.1$^{7,10}$]-3-dodecene),
poly(8-benzyloxycarbonyl-tetracyclo[4.4.0.1$^{2,5}$.1$^{7,10}$]-3-dodecene),
poly(8-(4-methylphenoxycarbonyl)-tetracyclo[4.4.0.1$^{2,5}$.1$^{7,10}$]-3-dodecene),
poly(8-(3,4-dimethylphenoxycarbonyl)-tetracyclo[4.4.0.1$^{2,5}$.1$^{7,10}$]-3-dodecene),
poly(8-(1-naphthoxycarbonyl)-tetracyclo[4.4.0.1$^{2,5}$.1$^{7,10}$]-3-dodecene),
poly(8-(2-naphthoxycarbonyl)-tetracyclo[4.4.0.1$^{2,5}$.1$^{7,10}$]-3-dodecene),
and
poly(8-(1-anthracenoxycarbonyl)-tetracyclo[4.4.0.1$^{2,5}$.1$^{7,10}$]-3-dodecene) in a case where at least one of $R^1$ to $R^4$ represents an aryloxycarbonyl group;
poly(8-methylphenylaminocarbonyl)-tetracyclo[4.4.0.1$^{2,5}$.1$^{7,10}$]-3-dodecene),
poly(8-ethylphenylaminocarbonyl-tetracyclo[4.4.0.1$^{2,5}$.1$^{7,10}$]-3-dodecene),
poly(8-butylphenylaminocarbonyl-tetracyclo[4.4.0.1$^{2,5}$.1$^{7,10}$]-3-dodecene), and
poly(8-cyclohexylphenylaminocarbonyl-tetracyclo[4.4.0.1$^{2,5}$.1$^{7,10}$]-3-dodecene) in a case where at least one of $R^1$ to $R^4$ represents an alkylarylaminocarbonyl group;
poly(8-methoxycarbonylmethyl-tetracyclo[4.4.0.1$^{2,5}$.1$^{7,10}$]-3-dodecene),
poly(8-methoxycarbonylethyl-tetracyclo[4.4.0.1$^{2,5}$.1$^{7,10}$]-3-dodecene),
poly(8-ethoxycarbonylmethyl-tetracyclo[4.4.0.1$^{2,5}$.1$^{7,10}$]-3-dodecene),
poly(8-ethoxycarbonylethyl-tetracyclo[4.4.0.1$^{2,5}$.1$^{7,10}$]-3-dodecene),
poly(8-(n-propoxycarbonylmethyl)-tetracyclo[4.4.0.1$^{2,5}$.1$^{7,10}$]-3-dodecene),
poly(8-(i-propoxycarbonylmethyl)-tetracyclo[4.4.0.1$^{2,5}$.1$^{7,10}$]-3-dodecene),
poly(8-(n-butoxycarbonylmethyl)-tetracyclo[4.4.0.1$^{2,5}$.1$^{7,10}$]-3-dodecene),
poly(8-(tert-butoxycarbonylmethyl)-tetracyclo[4.4.0.1$^{2,5}$.1$^{7,10}$]-3-dodecene),
poly(8-(n-pentyloxycarbonylmethyl)-tetracyclo[4.4.0.1$^{2,5}$.1$^{7,10}$]-3-dodecene),
poly(8-(2-methyl-2-butoxycarbonyl)methyl)-tetracyclo[4.4.0.1$^{2,5}$.1$^{7,10}$]-3-dodecene), poly(8-(2,3-dimethyl-2-butoxycarbonyl)methyl)-tetracyclo[4.4.0.1$^{2,5}$.1$^{7,10}$]-3-dodecene),
poly(8-cyclopentyloxycarbonylmethyl-tetracyclo[4.4.0.1$^{2,5}$.1$^{7,10}$]-3-dodecene),
poly(8-(n-hexyloxycarbonylmethyl)-tetracyclo[4.4.0.1$^{2,5}$.1$^{7,10}$]-3-dodecene),
poly(8-cyclohexyloxycarbonylmethyl-tetracyclo[4.4.0.1$^{2,5}$.1$^{7,10}$]-3-dodecene),
poly(8-(n-octyloxycarbonylmethyl)-tetracyclo[4.4.0.1$^{2,5}$.1$^{7,10}$]-3-dodecene),
poly(8-cyclooctyloxycarbonylmethyl-tetracyclo[4.4.0.1$^{2,5}$.1$^{7,10}$]-3-dodecene),
poly(8-(2-cyclopentyl-2-propoxycarbonyl)methyl)-tetracyclo[4.4.0.1$^{2,5}$.1$^{7,10}$]-3-dodecene),
poly(8-(2-cyclohexyl-2-propoxycarbonyl)methyl)-tetracyclo[4.4.0.1$^{2,5}$.1$^{7,10}$]-3-dodecene),
poly(8-(1-methylcyclopentyloxycarbonyl)methyl)-tetracyclo[4.4.0.1$^{2,5}$.1$^{7,10}$]-3-dodecene),
poly(8-(1-ethylcyclopentyloxycarbonyl)methyl)-tetracyclo[4.4.0.1$^{2,5}$.1$^{7,10}$]-3-dodecene),
poly(8-(1-methylcyclohexyloxycarbonyl)methyl)-tetracyclo[4.4.0.1$^{2,5}$.1$^{7,10}$]-3-dodecene), and
poly(8-(1-ethylcyclohexyloxycarbonyl)methyl)-tetracyclo[4.4.0.1$^{2,5}$.1$^{7,10}$]-3-dodecene) in a case where at least one of R$^1$ to R$^4$ represents an alkoxycarbonylalkyl group;
poly(8-methoxycarbonylphenyl)-tetracyclo[4.4.0.1$^{2,5}$.1$^{7,10}$]-3-dodecene),
poly(8-ethoxycarbonylphenyl)-tetracyclo[4.4.0.1$^{2,5}$.1$^{7,10}$]-3-dodecene),
poly(8-(n-propoxycarbonylphenyl)-tetracyclo[4.4.0.1$^{2,5}$.1$^{7,10}$]-3-dodecene),
poly(8-(i-propoxycarbonylphenyl)-tetracyclo[4.4.0.1$^{2,5}$.1$^{7,10}$]-3-dodecene),
poly(8-(n-butoxycarbonylphenyl)-tetracyclo[4.4.0.1$^{2,5}$.1$^{7,10}$]-3-dodecene),
poly(8-(tert-butoxycarbonylphenyl)-tetracyclo[4.4.0.1$^{2,5}$.1$^{7,10}$]-3-dodecene),
poly(8-(n-pentyloxycarbonylphenyl)-tetracyclo[4.4.0.1$^{2,5}$.1$^{7,10}$]-3-dodecene),
poly(8-(3-(2-methyl-2-butoxycarbonyl)phenyl)-tetracyclo[4.4.0.1$^{2,5}$.1$^{7,10}$]-3-dodecene),
poly(8-(3-(2,3-dimethyl-2-butoxycarbonyl)phenyl)-tetracyclo[4.4.0.1$^{2,5}$.1$^{7,10}$]-3-dodecene),
poly(8-(3-(2-cyclopentyl-2-propoxycarbonyl)phenyl)-tetracyclo[4.4.0.1$^{2,5}$.1$^{7,10}$]-3-dodecene),
poly(8-(3-(2-cyclohexyl-2-propoxycarbonyl)phenyl)-tetracyclo[4.4.0.1$^{2,5}$.1$^{7,10}$]-3-dodecene),
poly(8-(3-(1-methylcyclopentyloxycarbonyl)phenyl)-tetracyclo[4.4.0.1$^{2,5}$.1$^{7,10}$]-3-dodecene),
poly(8-(3-(1-ethylcyclopentyloxycarbonyl)phenyl)-tetracyclo[4.4.0.1$^{2,5}$.1$^{7,10}$]-3-dodecene),
poly(8-(3-(1-methylcyclohexyloxycarbonyl)phenyl)-tetracyclo[4.4.0.1$^{2,5}$.1$^{7,10}$]-3-dodecene),
poly(8-(3-(1-ethylcyclohexyloxycarbonyl)phenyl)-tetracyclo[4.4.0.1$^{2,5}$.1$^{7,10}$]-3-dodecene),
poly(8-(4-(2-methyl-2-butoxycarbonyl)phenyl)-tetracyclo[4.4.0.1$^{2,5}$.1$^{7,10}$]-3-dodecene),
poly(8-(4-(2,3-dimethyl-2-butoxycarbonyl)phenyl)-tetracyclo[4.4.0.1$^{2,5}$.1$^{7,10}$]-3-dodecene),
poly(8-(4-(2-cyclopentyl-2-propoxycarbonyl)phenyl)-tetracyclo[4.4.0.1$^{2,5}$.1$^{7,10}$]-3-dodecene),
poly(8-(4-(2-cyclohexyl-2-propoxycarbonyl)phenyl)-tetracyclo[4.4.0.1$^{2,5}$.1$^{7,10}$]-3-dodecene),
poly(8-(4-(1-methylcyclopentyloxycarbonyl)phenyl)-tetracyclo[4.4.0.1$^{2,5}$.1$^{7,10}$]-3-dodecene),
poly(8-(4-(1-ethylcyclopentyloxycarbonyl)phenyl)-tetracyclo[4.4.0.1$^{2,5}$.1$^{7,10}$]-3-dodecene),
poly(8-(4-(1-methylcyclohexyloxycarbonyl)phenyl)-tetracyclo[4.4.0.1$^{2,5}$.1$^{7,10}$]-3-dodecene),
poly(8-(4-(1-ethylcyclohexyloxycarbonyl)phenyl)-tetracyclo[4.4.0.1$^{2,5}$.1$^{7,10}$]-3-dodecene),
poly(8-methoxycarbonylnaphthyl-tetracyclo[4.4.0.1$^{2,5}$.1$^{7,10}$]-3-dodecene),
poly(8-ethoxycarbonylnaphthyl-tetracyclo[4.4.0.1$^{2,5}$.1$^{7,10}$]-3-dodecene),
poly(8-(n-propoxycarbonylnaphthyl)-tetracyclo[4.4.0.1$^{2,5}$.1$^{7,10}$]-3-dodecene),
poly(8-(i-propoxycarbonylnaphthyl)-tetracyclo[4.4.0.1$^{2,5}$.1$^{7,10}$]-3-dodecene),
poly(8-(n-butoxycarbonylnaphthyl)-tetracyclo[4.4.0.1$^{2,5}$.1$^{7,10}$]-3-dodecene),
poly(8-(tert-butoxycarbonylphenyl)-tetracyclo[4.4.0.1$^{2,5}$.1$^{7,10}$]-3-dodecene),
poly(8-(n-pentyloxycarbonylnaphthyl)-tetracyclo[4.4.0.1$^{2,5}$.1$^{7,10}$]-3-dodecene),
poly(8-(5-(2-methyl-2-butoxycarbonyl)naphthyl)-tetracyclo[4.4.0.1$^{2,5}$.1$^{7,10}$]-3-dodecene),
poly(8-(5-(2,3-dimethyl-2-butoxycarbonyl)naphthyl)-tetracyclo[4.4.0.1$^{2,5}$.1$^{7,10}$]-3-dodecene),
poly(8-(5-(2-cyclopentyl-2-propoxycarbonyl)naphthyl)-tetracyclo[4.4.0.1$^{2,5}$.1$^{7,10}$]-3-dodecene),
poly(8-(5-(2-cyclohexyl-2-propoxycarbonyl)naphthyl)-tetracyclo[4.4.0.1$^{2,5}$.1$^{7,10}$]-3-dodecene),
poly(8-(5-(1-methylcyclopentyloxycarbonyl)naphthyl)-tetracyclo[4.4.0.1$^{2,5}$.1$^{7,10}$]-3-dodecene),
poly(8-(5-(1-ethylcyclopentyloxycarbonyl)naphthyl)-tetracyclo[4.4.0.1$^{2,5}$.1$^{7,10}$]-3-dodecene),
poly(8-(5-(1-methylcyclohexyloxycarbonyl)naphthyl)-tetracyclo[4.4.0.1$^{2,5}$.1$^{7,10}$]-3-dodecene), and
poly(8-(5-(1-ethylcyclohexyloxycarbonyl)naphthyl)-tetracyclo[4.4.0.1$^{2,5}$.1$^{7,10}$]-3-dodecene) in a case where at least one of R$^1$ to R$^4$ represents an alkoxycarbonylaryl group;
poly(8-phenoxycarbonylmethyl-tetracyclo[4.4.0.1$^{2,5}$.1$^{7,10}$]-3-dodecene),
poly(8-benzyloxycarbonylmethyl-tetracyclo[4.4.0.1$^{2,5}$.1$^{7,10}$]-3-dodecene),
poly(8-(4-methylphenoxycarbonylmethyl)-tetracyclo[4.4.0.1$^{2,5}$.1$^{7,10}$]-3-dodecene),
poly(8-(3,4-dimethylphenoxycarbonylmethyl)-tetracyclo[4.4.0.1$^{2,5}$.1$^{7,10}$]-3-dodecene),
poly(8-(1-naphthoxycarbonylmethyl)-tetracyclo[4.4.0.1$^{2,5}$.1$^{7,10}$]-3-dodecene),
poly(8-(2-naphthoxycarbonylmethyl)-tetracyclo[4.4.0.1$^{2,5}$.1$^{7,10}$]-3-dodecene),
and poly(8-(1-anthracenoxycarbonylmethyl)-tetracyclo[4.4.0.1$^{2,5}$.1$^{7,10}$]-3-dodecene) in a case where at least one of R$^1$ to R$^4$ represents an aryloxycarbonylalkyl group;
poly(8-(methoxymethyloxycarbonyl-tetracyclo[4.4.0.1$^{2,5}$.1$^{7,10}$]-3-dodecene),
poly(8-(ethoxymethyloxycarbonyl-tetracyclo[4.4.0.1$^{2,5}$.1$^{7,10}$]-3-dodecene),
poly(8-(n-propoxymethyloxycarbonyl)-tetracyclo[4.4.0.1$^{2,5}$.1$^{7,10}$]-3-dodecene),
poly(8-isopropoxymethyloxycarbonyl-tetracyclo[4.4.0.1$^{2,5}$.1$^{7,10}$]-3-dodecene),
poly(8-(n-butoxymethyloxycarbonyl)-tetracyclo[4.4.0.1$^{2,5}$.1$^{7,10}$]-3-dodecene),
poly(8-(tert-butoxymethyloxycarbonyl)-tetracyclo[4.4.0.1$^{2,5}$.1$^{7,10}$]-3-dodecene),
poly(8-cyclopentyloxymethyloxycarbonyl-tetracyclo[4.4.0.1$^{2,5}$.1$^{7,10}$]-3-dodecene),
poly(8-cyclohexyloxymethyloxycarbonyl-tetracyclo[4.4.0.1$^{2,5}$.1$^{7,10}$]-3-dodecene), poly(8-cyclooctyloxymethyloxycarbonyl-tetracyclo [4.4.0.1$^{2,5}$.1$^{7,10}$]-3-dodecene),
poly(8-norbornyloxymethyloxycarbonyl-tetracyclo [4.4.0.1$^{2,5}$.1$^{7,10}$]-3-dodecene),
poly(8-(1-methylcyclopentyloxymethyloxycarbonyl-tetracyclo[4.4.0.1$^{2,5}$.1$^{7,10}$]-3-dodecene),
poly(8-(1-ethylcyclopentyloxymethyloxycarbonyl-tetracyclo[4.4.0.1$^{2,5}$.1$^{7,10}$]-3-dodecene),
poly(8-(1-methylcyclohexyloxymethyloxycarbonyl-tetracyclo[4.4.0.1$^{2,5}$.1$^{7,10}$]-3-dodecene),
poly(8-(1-ethylcyclohexyloxymethyloxycarbonyl-tetracyclo[4.4.0.1$^{2,5}$.1$^{7,10}$]-3-dodecene),
poly(8-(1-methylnorbornyloxymethyloxycarbonyl-tetracyclo[4.4.0.1$^{2,5}$.1$^{7,10}$]-3-dodecene),
poly(8-(1-ethylnorbornyloxymethyloxycarbonyl-tetracyclo [4.4.0.1$^{2,5}$.1$^{7,10}$]-3-dodecene),
poly(8-(1-ethoxypropyloxymethyloxycarbonyl-tetracyclo [4.4.0.1$^{2,5}$.1$^{7,10}$]-3-dodecene),
poly(8-(1-ethoxy-1-methylethyloxymethyloxycarbonyl-tetracyclo[4.4.0.1$^{2,5}$.1$^{7,10}$]-3-dodecene),
poly(8-tetrahydrofuran-2-yloxymethyloxycarbonyl-tetracyclo[4.4.0.1$^{2,5}$.1$^{7,10}$]-3-dodecene),
poly(8-tetrahydropyran-2-yloxymethyloxycarbonyl-tetracyclo[4.4.0.1$^{2,5}$.1$^{7,10}$]-3-dodecene),
poly(8-(1-adamantyloxymethyloxycarbonyl)-tetracyclo [4.4.0.1$^{2,5}$.1$^{7,10}$]-3-dodecene),
poly(8-(2-adamantyloxymethyloxycarbonyl)-tetracyclo [4.4.0.1$^{2,5}$.1$^{7,10}$]-3-dodecene),
poly(8-(1-(1-methoxy)ethoxycarbonyl)-tetracyclo [4.4.0.1$^{2,5}$.1$^{7,10}$]-3-dodecene),
poly(8-(1-(1-ethoxy)ethoxycarbonyl)-tetracyclo [4.4.0.1$^{2,5}$.1$^{7,10}$]-3-dodecene),
poly(8-(1-(1-n-propoxy)ethoxycarbonyl)-tetracyclo [4.4.0.1$^{2,5}$.1$^{7,10}$]-3-dodecene),
poly(8-(1-(1-isopropoxy)ethoxycarbonyl)-tetracyclo [4.4.0.1$^{2,5}$.1$^{7,10}$]-3-dodecene),
poly(8-(1-(1-n-butoxy)ethoxycarbonyl)-tetracyclo [4.4.0.1$^{2,5}$.1$^{7,10}$]-3-dodecene),
poly(8-(1-(1-tert-butoxy)ethoxycarbonyl)-tetracyclo [4.4.0.1$^{2,5}$.1$^{7,10}$]-3-dodecene),
poly(8-(1-(1-cyclopentyloxy)ethoxycarbonyl)-tetracyclo [4.4.0.1$^{2,5}$.1$^{7,10}$]-3-dodecene),
poly(8-(1-(1-cyclohexyloxy)ethoxycarbonyl)-tetracyclo [4.4.0.1$^{2,5}$.1$^{7,10}$]-3-dodecene),
poly(8-(1-(1-cyclooctyloxy)ethoxycarbonyl)-tetracyclo [4.4.0.1$^{2,5}$.1$^{7,10}$]-3-dodecene),
poly(8-(1-(1-norboryloxy)ethoxycarbonyl)-tetracyclo [4.4.0.1$^{2,5}$.1$^{7,10}$]-3-dodecene),
poly(8-(1-(1-methylcyclopentyloxy)ethoxycarbonyl)-tetracyclo[4.4.0.1$^{2,5}$.1$^{7,10}$]-3-dodecene),
poly(8-(1-(1-ethylcyclopentyloxy)ethoxycarbonyl)-tetracyclo[4.4.0.1$^{2,5}$.1$^{7,10}$]-3-dodecene),
poly(8-(1-(1-methylcyclohexyloxy)ethoxycarbonyl)-tetracyclo[4.4.0.1$^{2,5}$.1$^{7,10}$]-3-dodecene),
poly(8-(1-(1-ethylcyclohexyloxy)ethoxycarbonyl)-tetracyclo[4.4.0.1$^{2,5}$.1$^{7,10}$]-3-dodecene),
poly(8-(1-(1-methylnorbornyloxy)ethoxycarbonyl)-tetracyclo[4.4.0.1$^{2,5}$.1$^{7,10}$]-3-dodecene),
poly(8-(1-(1-ethylnorbornyloxy)ethoxycarbonyl)-tetracyclo [4.4.0.1$^{2,5}$.1$^{7,10}$]-3-dodecene),
poly(8-(1-(1-ethoxypropyloxy)ethoxycarbonyl)-tetracyclo [4.4.0.1$^{2,5}$.1$^{7,10}$]-3-dodecene),
poly(8-(1-(1-ethoxy-1-methylethyloxy)ethoxycarbonyl)-tetracyclo[4.4.0.1$^{2,5}$.1$^{7,10}$]-3-dodecene),
poly(8-(1-(tetrahydrofuran-2-yloxy)ethoxycarbonyl)-tetracyclo[4.4.0.1$^{2,5}$.1$^{7,10}$]-3-dodecene),
poly(8-(1-(tetrahydropyran-2-yloxy)ethoxycarbonyl)-tetracyclo[4.4.0.1$^{2,5}$.1$^{7,10}$]-3-dodecene),
poly(8-(1-(1-adamantyloxy)ethoxycarbonyl)-tetracyclo [4.4.0.1$^{2,5}$.1$^{7,10}$]-3-dodecene), and
poly(8-(1-(2-adamantyloxy)ethoxycarbonyl)-tetracyclo [4.4.0.1$^{2,5}$.1$^{7,10}$]-3-dodecene) in a case where at least one of R$^1$ to R$^4$ represents an alkoxyalkyloxycarbonyl group; and
poly(8-methoxycarbonylmethyloxycarbonyl-tetracyclo [4.4.0.1$^{2,5}$.1$^{7,10}$]-3-dodecene),
poly(8-ethoxycarbonylmethyloxycarbonyl-tetracyclo [4.4.0.1$^{2,5}$.1$^{7,10}$]-3-dodecene),
poly(8-(n-propoxycarbonylmethyloxycarbonyl-tetracyclo [4.4.0.1$^{2,5}$.1$^{7,10}$]-3-dodecene),
poly(8-isopropoxycarbonylmethyloxycarbonyl-tetracyclo [4.4.0.1$^{2,5}$.1$^{7,10}$]-3-dodecene),
poly(8-(n-butoxycarbonylmethyloxycarbonyl-tetracyclo [4.4.0.1$^{2,5}$.1$^{7,10}$]-3-dodecene),
poly(8-(tert-butoxycarbonylmethyloxycarbonyl-tetracyclo [4.4.0.1$^{2,5}$.1$^{7,10}$]-3-dodecene),
poly(8-(2-cyclopentyl-2-propoxycarbonylmethyloxycarbonyl-tetracyclo[4.4.0.1$^{2,5}$.1$^{7,10}$]-3-dodecene),
poly(8-(2-cyclopentyl-2-butoxycarbonylmethyloxycarbonyl-tetracyclo[4.4.0.1$^{2,5}$.1$^{7,10}$]-3-dodecene),
poly(8-(2-cyclohexyl-2-propoxycarbonylmethyloxycarbonyl-tetracyclo[4.4.0.1$^{2,5}$.1$^{7,10}$]-3-dodecene),
poly(8-(3-(2-cyclohexyl-2-propoxycarbonyl)propoxycarbonyl)-tetracyclo[4.4.0.1$^{2,5}$.1$^{7,10}$]-3-dodecene),
poly(8-(2-cyclohexyl-2-butoxycarbonylmethyloxycarbonyl-tetracyclo[4.4.0.1$^{2,5}$.1$^{7,10}$]-3-dodecene),
poly(8-(3-cyclohexyl-3-pentyloxycarbonylmethyloxycarbonyl-tetracyclo[4.4.0.1$^{2,5}$.1$^{7,10}$]-3-dodecene),
poly(8-(2-ethyl-2-norbornyloxycarbonylmethyloxycarbonyl-tetracyclo[4.4.0.1$^{2,5}$.1$^{7,10}$]-3-dodecene),
poly(8-(2-norbornyl-2-propoxycarbonylmethyloxycarbonyl-tetracyclo[4.4.0.1$^{2,5}$.1$^{7,10}$]-3-dodecene),
poly(8-(4-ethyl-tetracyclo[6.2.1.1$^{3,6}$.0$^{2,7}$]-dodecane-4-yloxycarbonylmethyloxycarbonyl)-tetracyclo [4.4.0.1$^{2,5}$.1$^{7,10}$]-3-dodecene),
poly(8-(2-tetracyclo[6.2.1.1$^{3,6}$.0$^{2,7}$]-dodecane-4-yl)-2-propoxycarbonylmethyloxycarbonyl)-tetracyclo [4.4.0.1$^{2,5}$.1$^{7,10}$]-3-dodecene),
poly(8-(1,1-dicyclohexyletohxycarbonylmethyloxycarbonyl)-tetracyclo[4.4.0.1$^{2,5}$.1$^{7,10}$]-3-dodecene),
poly(8-(1,1-dicyclohexylpropoxycarbonylmethyloxycarbonyl)-tetracyclo[4.4.0.1$^{2,5}$.1$^{7,10}$]-3-dodecene),
poly(8-cyclopentyloxycarbonylmethyloxycarbonyl-tetracyclo[4.4.0.1$^{2,5}$.1$^{7,10}$]-3-dodecene),
poly(8-cyclohexyloxycarbonylmethyloxycarbonyl-tetracyclo[4.4.0.1$^{2,5}$.1$^{7,10}$]-3-dodecene),
poly(8-cyclooctyloxycarbonylmethyloxycarbonyl-tetracyclo[4.4.0.1$^{2,5}$.1$^{7,10}$]-3-dodecene),
poly(8-norbornyloxycarbonylmethyloxycarbonyl-tetracyclo [4.4.0.1$^{2,5}$.1$^{7,10}$]-3-dodecene),
poly(8-(1-methylcyclopentyloxycarbonylmethyloxycarbonyl-tetracyclo[4.4.0.1$^{2,5}$.1$^{7,10}$]-3-dodecene),
poly(8-(1-ethylcyclopentyloxycarbonylmethyloxycarbonyl-tetracyclo[4.4.0.1$^{2,5}$.1$^{7,10}$]-3-dodecene),
poly(8-(1-methylcyclohexyloxycarbonylmethyloxycarbonyl-tetracyclo[4.4.0.1$^{2,5}$.1$^{7,10}$]-3-dodecene),
poly(8-(1-ethylcyclohexyloxycarbonylmethyloxycarbonyl-tetracyclo[4.4.0.1$^{2,5}$.1$^{7,10}$]-3-dodecene),
poly(8-(1-methylnorbornyloxycarbonylmethyloxycarbonyl-tetracyclo[4.4.0.1$^{2,5}$.1$^{7,10}$]-3-dodecene),
poly(8-(1-ethylnorbornyloxycarbonylmethyloxycarbonyl-tetracyclo[4.4.0.1$^{2,5}$.1$^{7,10}$]-3-dodecene), poly(8-(1-ethoxypropyloxycarbonylmethyloxycarbonyl-tetracyclo[4.4.0.1$^{2,5}$.1$^{7,10}$]-3-dodecene),
poly(8-(1-ethoxy-1-methylethyloxycarbonylmethyloxycarbonyl-tetracyclo[4.4.0.1$^{2,5}$.1$^{7,10}$]-3-dodecene),
poly(8-tetrahydrofuran-2-yloxycarbonylmethyloxycarbonyl-tetracyclo[4.4.0.1$^{2,5}$.1$^{7,10}$]-3-dodecene),
poly(8-tetrahydropyran-2-yloxycarbonylmethyloxycarbonyl-tetracyclo[4.4.0.1$^{2,5}$.1$^{7,10}$]-3-dodecene),
poly(8-1-adamantyloxycarbonylmethyloxycarbonyl)-tetracyclo[4.4.0.1$^{2,5}$.1$^{7,10}$]-3-dodecene),
poly(8-2-adamantyloxycarbonylmethyloxycarbonyl)-tetracyclo[4.4.0.1$^{2,5}$.1$^{7,10}$]-3-dodecene),
poly(8-(1-(2-(1-adamantyl)-2-propoxycarbonyl)-ethoxycarbonyl)-tetracyclo[4.4.0.1$^{2,5}$.1$^{7,10}$]-3-dodecene),
poly(8-(3-(2-(1-adamantyl)-2-propoxycarbonyl)-propoxycarbonyl)-tetracyclo[4.4.0.1$^{2,5}$.1$^{7,10}$]-3-dodecene),
poly(8-(2-(2-(1-adamantyl)-2-propoxycarbonyl)-2-propoxycarbonyl)-tetracyclo[4.4.0.1$^{2,5}$.1$^{7,10}$]-3-dodecene),
poly(8-(2-methyl-2-adamantyloxycarbonylmethyloxycarbonyl)-tetracyclo[4.4.0.1$^{2,5}$.1$^{7,10}$]-3-dodecene),
poly(8-(3-(2-methyl-2-adamantyloxycarbonyl)propoxycarbonyl)-tetracyclo[4.4.0.1$^{2,5}$.1$^{7,10}$]-3-dodecene),
poly(8-(2-(2-methyl-2-adamantyloxycarbonyl)-2-propoxycarbonyl)-tetracyclo[4.4.0.1$^{2,5}$.1$^{7,10}$]-3-dodecene),
poly(8-(1-(2-methyl-2-adamantyloxycarbonyl)ethoxycarbonyl)-tetracyclo[4.4.0.1$^{2,5}$.1$^{7,10}$]-3-dodecene),
poly(8-(2-ethyl-2-adamantyloxycarbonylmethyloxycarbonyl)-tetracyclo[4.4.0.1$^{2,5}$.1$^{7,10}$]-3-dodecene),
poly(8-(2-isopropyl-2-adamantyloxycarbonylmethyloxycarbonyl)-tetracyclo[4.4.0.1$^{2,5}$.1$^{7,10}$]-3-dodecene),
poly(8-(2-(1-adamantyl)-2-propoxycarbonylmethyloxycarbonyl)-tetracyclo[4.4.0.1$^{2,5}$.1$^{7,10}$]-3-dodecene),
poly(8-(2-(1-adamantyl)-2-butoxycarbonylmethyloxycarbonyl)-tetracyclo[4.4.0.1$^{2,5}$.1$^{7,10}$]-3-dodecene),
poly(8-(3-(1-adamantyl)-3-pentyloxycarbonylmethyloxycarbonyl)-tetracyclo[4.4.0.1$^{2,5}$.1$^{7,10}$]-3-dodecene),
poly(8-(3-tert-butoxycarbonyl-1-cyclopentyloxycarbonyl)-tetracyclo[4.4.0.1$^{2,5}$.1$^{7,10}$]-3-dodecene),
poly(8-(3-(1-methylcyclohexyloxycarbonyl)-1-cyclopentyloxycarbonyl)-tetracyclo[4.4.0.1$^{2,5}$.1$^{7,10}$]-3-dodecene),
poly(8-(5-tert-butoxycarbonyl-2-norbornyloxycarbonyl)-tetracyclo[4.4.0.1$^{2,5}$.1$^{7,10}$]-3-dodecene),
poly(8-(5-(1-methylcyclohexyloxycarbonyl)-2-norbornyloxycarbonyl)-tetracyclo[4.4.0.1$^{2,5}$.1$^{7,10}$]-3-dodecene),
poly(8-(5,5-di(tert-butoxycarbonyl)-2-norbornyloxycarbonyl)-tetracyclo[4.4.0.1$^{2,5}$.1$^{7,10}$]-3-dodecene),
poly(8-(5,6-di(tert-butoxycarbonyl)-2-norbornyloxycarbonyl)-tetracyclo[4.4.0.1$^{2,5}$.1$^{7,10}$]-3-dodecene),
poly(8-(1-(1-methylcyclohexyloxycarbonyl)-octahydro-4,7-methano-indene-5-yloxycarbonyl)-tetracyclo[4.4.0.1$^{2,5}$.1$^{7,10}$]-3-dodecene),
poly(8-(6-tert-butoxycarbonyl-decahydronaphthalene-2-yloxycarbonyl)-tetracyclo[4.4.0.1$^{2,5}$.1$^{7,10}$]-3-dodecene),
poly(8-(9-tert-butoxycarbonyl-tetracyclo[6.2.1.1$^{3,6}$.0$^{2,7}$]-dodecane-4-yloxycarbonyl)-tetracyclo[4.4.0.1$^{2,5}$.1$^{7,10}$]-3-dodecene), and
poly(8-(9-(1-methylcyclohexyloxycarbonyl)-tetracyclo[6.2.1.1$^{3,6}$.0$^{2,7}$]-dodecane-4-yloxycarbonyl)-tetracyclo[4.4.0.1$^{2,5}$.1$^{7,10}$]-3-dodecene) in a case where at least one of R$^1$ to R$^4$ represents an alkoxycarbonylalkyloxycarbonyl group.

In a case where R$^1$ to R$^4$ are bonded to each other to form a ring structure, examples of the cyclic alkyl structure include poly(1,4,4a,5,6,7,8,8a,9,9a,10,10a-dodecahydro-1,4:9,10-dimethano-anthracene). Examples of the cyclic ester structure which can form a lactone ring include poly(4-oxy-pentacyclo[9.2.1.1$^{1,7}$.0$^{2,6}$.0$^{8,13}$]-10-pentadecene-3-one) as a γ-butyrolactone structure; and
poly(4-oxy-pentacyclo[10.2.1.1$^{1,8}$.0$^{2,7}$.0$^{9,14}$]-11-hexadecene-3-one) as a δ-valerolactone structure. Examples of the cyclic acid anhydride structure include
poly(4-oxy-pentacyclo[9.2.1.1$^{1,7}$.0$^{2,6}$.0$^{8,13}$]-10-pentadecene-3-one).

Examples of the cyclic amide structure which can form a lactam ring include
poly(4-methyl-4-aza-pentacyclo[9.2.1.1$^{1,7}$.0$^{2,6}$.0$^{8,13}$]-10-pentadecene-3-one),
poly(4-ethyl-4-aza-pentacyclo[9.2.1.1$^{1,7}$.0$^{2,6}$.0$^{8,13}$]-10-pentadecene-3-one),
poly(4-(n-propyl)-4-aza-pentacyclo[9.2.1.1$^{1,7}$.0$^{2,6}$.0$^{8,13}$]-10-pentadecene-3-one),
poly(4-(n-butyl)-4-aza-pentacyclo[9.2.1.1$^{1,7}$.0$^{2,6}$.0$^{8,13}$]-10-pentadecene-3-one),
poly(4-(1-methylbutyl)-4-aza-pentacyclo[9.2.1.1$^{1,7}$.0$^{2,6}$.0$^{8,13}$]-10-pentadecene-3-one),
poly(4-cyclopentyl-4-aza-pentacyclo[9.2.1.1$^{1,7}$.0$^{2,6}$.0$^{8,13}$]-10-pentadecene-3-one),
poly(4-cyclohexyl-4-aza-pentacyclo[9.2.1.1$^{1,7}$.0$^{2,6}$.0$^{8,13}$]-10-pentadecene-3-one),
poly(4-phenyl-4-aza-pentacyclo[9.2.1.1$^{1,7}$.0$^{2,6}$.0$^{8,13}$]-10-pentadecene-3-one), and
poly(4-(4-hydrophenyl)-4-aza-pentacyclo[9.2.1.1$^{1,7}$.0$^{2,6}$.0$^{8,13}$]-10-pentadecene-3-one) as γ-lactam; and
poly(4-methyl-4-aza-pentacyclo[10.2.1.1$^{1,8}$.0$^{2,7}$.0$^{9,14}$]-11-hexadecene-3-one),
poly(4-methyl-4-aza-pentacyclo[10.2.1.1$^{1,8}$.0$^{2,7}$.0$^{9,14}$]-11-hexadecene-3-one),
poly(4-(n-propyl)-4-aza-pentacyclo[10.2.1.1$^{1,8}$.0$^{2,7}$.0$^{9-14}$]-11-hexadecene-3-one),
poly(4-(n-butyl)-4-aza-pentacyclo[10.2.1.1$^{1,8}$.0$^{2,7}$.0$^{9,14}$]-11-hexadecene-3-one),
poly(4-(1-methylbutyl)-4-aza-pentacyclo[10.2.1.1$^{1,8}$.0$^{2,7}$.0$^{9,14}$]-11-hexadecene-3-one),
poly(4-cyclopentyl-4-aza-pentacyclo[10.2.1.1$^{1,8}$.0$^{2,7}$.0$^{9,14}$]-11-hexadecene-3-one),
poly(4-cyclohexyl-4-aza-pentacyclo[10.2.1.1$^{1,8}$.0$^{2,7}$.0$^{9,14}$]-11-hexadecene-3-one),
poly(4-phenyl-4-aza-pentacyclo[10.2.1.1$^{1,8}$.0$^{2,7}$.0$^{9,14}$]-11-hexadecene-3-one), and
poly(4-(4-hydroxyphenyl)-4-aza-pentacyclo[10.2.1.1$^{1,8}$.0$^{2,7}$.0$^{9,14}$]-11-hexadecene-3-one) as δ-lactam. Examples of the cyclic imide structure which can form a maleimide ring include
poly(4-methyl-4-aza-pentacyclo[9.2.1.1$^{1,7}$.0$^{2,6}$.0$^{8,13}$]-10-pentadecene-3,5-dione),
poly(4-ethyl-4-aza-pentacyclo[9.2.1.1$^{1,7}$.0$^{2,6}$.0$^{8,13}$]-10-pentadecene-3,5-dione),
poly(4-(n-propyl)-4-aza-pentacyclo[9.2.1.1$^{1,7}$.0$^{2,6}$.0$^{8,13}$]-10-pentadecene-3,5-dione),
poly(4-(n-butyl)-4-aza-pentacyclo[9.2.1.1$^{1,7}$.0$^{2,6}$.0$^{8,13}$]-10-pentadecene-3,5-dione),
poly(4-(1-methylbutyl)-4-aza-pentacyclo[9.2.1.1$^{1,7}$.0$^{2,6}$.0$^{8,13}$]-10-pentadecene-3,5-dione),
poly(4-cyclopentyl)-4-aza-pentacyclo[9.2.1.1$^{1,7}$.0$^{2,6}$.0$^{8,13}$]-10-penta decene-3,5-dione),
poly(4-cyclohexyl-4-aza-pentacyclo[9.2.1.1$^{1,7}$.0$^{2,6}$.0$^{8,13}$]-10-pentadecene-3,5-dione),
poly(4-phenyl-4-aza-pentacyclo[9.2.1.1$^{1,7}$.0$^{2,6}$.0$^{8,13}$]-10-pentadecene-3,5-dione), and
poly(4-(4-hydroxyphenyl)-4-aza-pentacyclo[9.2.1.1$^{1,7}$.0$^{2,6}$.0$^{8,13}$]-10-pentadecene-3,5-dione). Among these, in the repeating structural unit [A] represented by Formula (1)

according to the present embodiment, as the cyclic olefin polymer in which n represents 1, poly(8-methoxycarbonyl-tetracyclo[4.4.0.1$^{2,5}$.1$^{7,10}$]-3-dodecene),
poly(8-ethoxycarbonyl-tetracyclo[4.4.0.1$^{2,5}$.1$^{7,10}$]-3-dodecene),
poly(8-(n-propoxycarbonyl)-tetracyclo[4.4.0.1$^{2,5}$.1$^{7,10}$]-3-dodecene),
poly(8-(n-butoxycarbonyl)-tetracyclo[4.4.0.1$^{2,5}$.1$^{7,10}$]-3-dodecene),
poly(8-isobutoxycarbonyl-tetracyclo[4.4.0.1$^{2,5}$.1$^{7,10}$]-3-dodecene),
poly(8-(tert-butoxycarbonyl)-tetracyclo[4.4.0.1$^{2,5}$.1$^{7,10}$]-3-dodecene),
poly(8-(n-pentyloxycarbonyl)-tetracyclo[4.4.0.1$^{2,5}$.1$^{7,10}$]-3-dodecene),
poly(8-(2-methyl-2-pentyloxycarbonyl)-tetracyclo[4.4.0.1$^{2,5}$.1$^{7,10}$]-3-dodecene),
poly(8-(3-methyl-3-pentyloxycarbonyl)-tetracyclo[4.4.0.1$^{2,5}$.1$^{7,10}$]-3-dodecene),
poly(8-(2-ethyl-3-methyl-3-pentyloxycarbonyl)-tetracyclo[4.4.0.1$^{2,5}$.1$^{7,10}$]-3-dodecene),
poly(8-cyclopentyloxycarbonyl-tetracyclo[4.4.0.1$^{2,5}$.1$^{7,10}$]-3-dodecene),
poly(8-(n-hexyloxycarbonyl)-tetracyclo[4.4.0.1$^{2,5}$.1$^{7,10}$]-3-dodecene poly(8-cyclohexyloxycarbonyl-tetracyclo[4.4.0.1$^{2,5}$.1$^{7,10}$]-3-dodecene),
poly(8-(2-methyl-2-butoxycarbonyl)-tetracyclo[4.4.0.1$^{2,5}$.1$^{7,10}$]-3-dodecene),
poly(8-(2,3-dimethyl-2-butoxycarbonyl)-tetracyclo[4.4.0.1$^{2,5}$.1$^{7,10}$]-3-dodecene),
poly(8-(2,3,3-trimethyl-2-butoxycarbonyl)-tetracyclo[4.4.0.1$^{2,5}$.1$^{7,10}$]-3-dodecene),
poly(8-(2-methyl-2-hexyloxycarbonyl)-tetracyclo[4.4.0.1$^{2,5}$.1$^{7,10}$]-3-dodecene),
poly(8-(3,4-dimethyl-3-hexyloxycarbonyl)-tetracyclo[4.4.0.1$^{2,5}$.1$^{7,10}$]-3-dodecene),
poly(8-(3-methylbutoxycarbonyl)-tetracyclo[4.4.0.1$^{2,5}$.1$^{7,10}$]-3-dodecene),
poly(8-(2-methylpentoxycarbonyl)-tetracyclo[4.4.0.1$^{2,5}$.1$^{7,10}$]-3-dodecene),
poly(8-(3-methylpentoxycarbonyl)-tetracyclo[4.4.0.1$^{2,5}$.1$^{7,10}$]-3-dodecene),
poly(8-(4-methylpentoxycarbonyl)-tetracyclo[4.4.0.1$^{2,5}$.1$^{7,10}$]-3-dodecene),
poly(8-(3-methyl-3-heptyloxycarbonyl)-tetracyclo[4.4.0.1$^{2,5}$.1$^{7,10}$]-3-dodecene),
poly(8-(2-cyclopentyl)-2-propoxycarbonyl)-tetracyclo[4.4.0.1$^{2,5}$.1$^{7,10}$]-3-dodecene,
poly(8-(2-cyclohexyl-2-propoxycarbonyl)-tetracyclo[4.4.0.1$^{2,5}$.1$^{7,10}$]-3-dodecene),
poly(8-(2-norbornyl-2-propoxycarbonyl)-tetracyclo[4.4.0.1$^{2,5}$.1$^{7,10}$]-3-dodecene),
poly(8-(1,1-dicyclopentylethoxycarbonyl)-tetracyclo[4.4.0.1$^{2,5}$.1$^{7,10}$]-3-dodecene),
poly(8-(1,1-dicyclohexylethoxycarbonyl)-tetracyclo[4.4.0.1$^{2,5}$.1$^{7,10}$]-3-dodecene),
poly(8-(1-methylcyclopentyloxycarbonyl)-tetracyclo[4.4.0.1$^{2,5}$.1$^{7,10}$]-3-dodecene),
poly(8-(1-ethylcyclopentyloxycarbonyl)-tetracyclo[4.4.0.1$^{2,5}$.1$^{7,10}$]-3-dodecene),
poly(8-(1-methylcyclohexyloxycarbonyl)-tetracyclo[4.4.0.1$^{2,5}$.1$^{7,10}$]-3-dodecene),
poly(8-(1-ethylcyclohexyloxycarbonyl)-tetracyclo[4.4.0.1$^{2,5}$.1$^{7,10}$]-3-dodecene),
poly(8-(1-methylcyclooctyloxycarbonyl)-tetracyclo[4.4.0.1$^{2,5}$.1$^{7,10}$]-3-dodecene),
poly(8-(1-ethylcyclooctyloxycarbonyl)-tetracyclo[4.4.0.1$^{2,5}$.1$^{7,10}$]3-dodecene),
poly(8-(1-adamantyloxycarbonyl)-tetracyclo[4.4.0.1$^{2,5}$.1$^{7,10}$]-3-dodecene),
poly(8-(2-methyl-2-adamantyloxycarbonyl)-tetracyclo[4.4.0.1$^{2,5}$.1$^{7,10}$]-3-dodecene),
poly(8-(2-ethyl-2-adamantyloxycarbonyl)-tetracyclo[4.4.0.1$^{2,5}$.1$^{7,10}$]-3-dodecene),
poly(8-(1-methyldecahydronaphthalene-1-yloxycarbonyl)-tetracyclo[4.4.0.1$^{2,5}$.1$^{7,10}$]-3-dodecene),
poly(8-(1-ethyldecahydronaphthalene-1-yloxycarbonyl)-tetracyclo[4.4.0.1$^{2,5}$.1$^{7,10}$]-3-dodecene),
poly(8-(2-methyldecahydronaphthalene-2-yloxycarbonyl)-tetracyclo[4.4.0.1$^{2,5}$.1$^{7,10}$]-3-dodecene),
poly(8-(2-ethyldecahydronaphthalene-2-yloxycarbonyl)-tetracyclo[4.4.0.1$^{2,5}$.1$^{7,10}$]-3-dodecene),
poly(8-(2-methyl-2-norbornyloxycarbonyl)-tetracyclo[4.4.0.1$^{2,5}$.1$^{7,10}$]-3-dodecene),
poly(8-(2-ethyl-2-norbornyloxycarbonyl)-tetracyclo[4.4.0.1$^{2,5}$.1$^{7,10}$]-3-dodecene),
poly(8-(2,7,7-trimethyl-2-norbornyloxycarbonyl)-tetracyclo[4.4.0.1$^{2,5}$.1$^{7,10}$]-3-dodecene),
poly(8-(2-ethyl-7,7-dimethyl-2-norbornyloxycarbonyl)-tetracyclo[4.4.0.1$^{2,5}$.1$^{7,10}$]-3-dodecene),
poly(8-(5-methyl-octahydro-4,7-methano-indene-5-yloxycarbonyl)-tetracyclo[4.4.0.1$^{2,5}$.1$^{7,10}$]-3-dodecene),
poly(8-(5-ethyl-octahydro-4,7-methano-indene-5-yloxycarbonyl)-tetracyclo[4.4.0.1$^{2,5}$.1$^{7,10}$]-3-dodecene),
poly(8-(4-methyl-tetracyclo[6.2.1.1$^{3,6}$.0$^{2,7}$]-dodecane-4-yloxycarbonyl)-tetracyclo[4.4.0.1$^{2,5}$.1$^{7,10}$]-3-dodecene),
poly(8-(4-ethyl-tetracyclo[6.2.1.1$^{3,6}$.0$^{2,7}$]-dodecane-4-yloxycarbonyl)-tetracyclo[4.4.0.1$^{2,5}$.1$^{7,10}$]-3-dodecene),
poly(8-methoxycarbonylphenyl)-tetracyclo[4.4.0.1$^{2,5}$.1$^{7,10}$]-3-dodecene),
poly(8-ethoxycarbonylphenyl)-tetracyclo[4.4.0.1$^{2,5}$.1$^{7,10}$]-3-dodecene),
poly(8-(n-propoxycarbonylphenyl)-tetracyclo[4.4.0.1$^{2,5}$.1$^{7,10}$]-3-dodecene),
poly(8-(i-propoxycarbonylphenyl)-tetracyclo[4.4.0.1$^{2,5}$.1$^{7,10}$]-3-dodecene),
poly(8-(n-butoxycarbonylphenyl)-tetracyclo[4.4.0.1$^{2,5}$.1$^{7,10}$]-3-dodecene),
poly(8-(tert-butoxycarbonylphenyl)-tetracyclo[4.4.0.1$^{2,5}$.1$^{7,10}$]-3-dodecene),
poly(8-(n-pentyloxycarbonylphenyl)-tetracyclo[4.4.0.1$^{2,5}$.1$^{7,10}$]-3-dodecene),
poly(8-(3-(2-methyl-2-butoxycarbonyl)phenyl)-tetracyclo[4.4.0.1$^{2,5}$.1$^{7,10}$]-3-dodecene),
poly(8-(3-(2,3-dimethyl-2-butoxycarbonyl)phenyl)-tetracyclo[4.4.0.1$^{2,5}$.1$^{7,10}$]-3-dodecene),
poly(8-(3-(2-cyclopentyl-2-propoxycarbonyl)phenyl)-tetracyclo[4.4.0.1$^{2,5}$.1$^{7,10}$]-3-dodecene),
poly(8-(3-(2-cyclohexyl-2-propoxycarbonyl)phenyl)-tetracyclo[4.4.0.1$^{2,5}$.1$^{7,10}$]-3-dodecene),
poly(8-(3-(1-methylcyclopentyloxycarbonyl)phenyl)-tetracyclo[4.4.0.1$^{2,5}$.1$^{7,10}$]-3-dodecene),
poly(8-(3-(1-ethylcyclopentyloxycarbonyl)phenyl)-tetracyclo[4.4.0.1$^{2,5}$.1$^{7,10}$]-3-dodecene),
poly(8-(3-(1-methylcyclohexyloxycarbonyl)phenyl)-tetracyclo[4.4.0.1$^{2,5}$.1$^{7,10}$]-3-dodecene),
poly(8-(3-(1-ethylcyclohexyloxycarbonyl)phenyl)-tetracyclo[4.4.0.1$^{2,5}$.1$^{7,10}$]-3-dodecene),
poly(8-(4-(2-methyl-2-butoxycarbonyl)phenyl)-tetracyclo[4.4.0.1$^{2,5}$.1$^{7,10}$]-3-dodecene),
poly(8-(4-(2,3-dimethyl-2-butoxycarbonyl)phenyl)-tetracyclo[4.4.0.1$^{2,5}$.1$^{7,10}$]-3-dodecene), poly(8-(4-(2-cyclopentyl-2-propoxycarbonyl)phenyl)-tetracyclo[4.4.0.1$^{2,5}$.1$^{7,10}$]-3-dodecene),
poly(8-(4-(2-cyclohexyl-2-propoxycarbonyl)phenyl)-tetracyclo[4.4.0.1$^{2,5}$.1$^{7,10}$]-3-dodecene),
poly(8-(4-(1-methylcyclopentyloxycarbonyl)phenyl)-tetracyclo[4.4.0.1$^{2,5}$.1$^{7,10}$]-3-dodecene),
poly(8-(4-(1-ethylcyclopentyloxycarbonyl)phenyl)-tetracyclo[4.4.0.1$^{2,5}$.1$^{7,10}$]-3-dodecene),
poly(8-(4-(1-methylcyclohexyloxycarbonyl)phenyl)-tetracyclo[4.4.0.1$^{2,5}$.1$^{7,10}$]-3-dodecene),
poly(8-(4-(1-ethylcyclohexyloxycarbonyl)phenyl)-tetracyclo[4.4.0.1$^{2,5}$.1$^{7,10}$]-3-dodecene),
poly(8-methoxycarbonylnaphthyl-tetracyclo[4.4.0.1$^{2,5}$.1$^{7,10}$]-3-dodecene),
poly(8-ethoxycarbonylnaphthyl-tetracyclo[4.4.0.1$^{2,5}$.1$^{7,10}$]-3-dodecene),
poly(8-(n-propoxycarbonylnaphthyl)-tetracyclo[4.4.0.1$^{2,5}$.1$^{7,10}$]-3-dodecene),
poly(8-(i-propoxycarbonylnaphthyl)-tetracyclo[4.4.0.1$^{2,5}$.1$^{7,10}$]-3-dodecene),
poly(8-(n-butoxycarbonylnaphthyl)-tetracyclo[4.4.0.1$^{2,5}$.1$^{7,10}$]-3-dodecene),
poly(8-(tert-butoxycarbonylphenyl)-tetracyclo[4.4.0.1$^{2,5}$.1$^{7,10}$]-3-dodecene),
poly(8-(n-pentyloxycarbonylnaphthyl)-tetracyclo[4.4.0.1$^{2,5}$.1$^{7,10}$]-3-dodecene),
poly(8-(5-(2-methyl-2-butoxycarbonyl)naphthyl)-tetracyclo[4.4.0.1$^{2,5}$.1$^{7,10}$]-3-dodecene),
poly(8-(5-(2,3-dimethyl-2-butoxycarbonyl)naphthyl)-tetracyclo[4.4.0.1$^{2,5}$.1$^{7,10}$]-3-dodecene),
poly(8-(5-(2-cyclopentyl-2-propoxycarbonyl)naphthyl)-tetracyclo[4.4.0.1$^{2,5}$.1$^{7,10}$]-3-dodecene),
poly(8-(5-(2-cyclohexyl-2-propoxycarbonyl)naphthyl)-tetracyclo[4.4.0.1$^{2,5}$.1$^{7,10}$]-3-dodecene),
poly(8-(5-(1-methylcyclopentyloxycarbonyl)naphthyl)-tetracyclo[4.4.0.1$^{2,5}$.1$^{7,10}$]-3-dodecene),
poly(8-(5-(1-ethylcyclopentyloxycarbonyl)naphthyl)-tetracyclo[4.4.0.1$^{2,5}$.1$^{7,10}$]-3-dodecene),
poly(8-(5-(1-methylcyclohexyloxycarbonyl)naphthyl)-tetracyclo[4.4.0.1$^{2,5}$.1$^{7,10}$]-3-dodecene),
poly(8-(5-(1-ethylcyclohexyloxycarbonyl)naphthyl)-tetracyclo[4.4.0.1$^{2,5}$.1$^{7,10}$]-3-dodecene),
poly(8-phenoxycarbonyl-tetracyclo[4.4.0.1$^{2,5}$.1$^{7,10}$]-3-dodecene),
poly(8-benzyloxycarbonyl-tetracyclo[4.4.0.1$^{2,5}$.1$^{7,10}$]-3-dodecene),
poly(8-(4-methylphenoxycarbonyl)-tetracyclo[4.4.0.1$^{2,5}$.1$^{7,10}$]-3-dodecene),
poly(8-(3,4-dimethylphenoxycarbonyl)-tetracyclo[4.4.0.1$^{2,5}$.1$^{7,10}$]-3-dodecene),
poly(8-(1-naphthoxycarbonyl)-tetracyclo[4.4.0.1$^{2,5}$.1$^{7,10}$]-3-dodecene),
poly(8-(2-naphthoxycarbonyl)-tetracyclo[4.4.0.1$^{2,5}$.1$^{7,10}$]-3-dodecene),
poly(8-(1-anthracenoxycarbonyl)-tetracyclo[4.4.0.1$^{2,5}$.1$^{7,10}$]-3-dodecene),
poly(8-(methoxymethyloxycarbonyl-tetracyclo[4.4.0.1$^{2,5}$.1$^{7,10}$]-3-dodecene),
poly(8-(ethoxymethyloxycarbonyl-tetracyclo[4.4.0.1$^{2,5}$.1$^{7,10}$]-3-dodecene),
poly(8-(n-propoxymethyloxycarbonyl)-tetracyclo[4.4.0.1$^{2,5}$.1$^{7,10}$]-3-dodecene),
poly(8-isopropoxymethyloxycarbonyl)-tetracyclo[4.4.0.1$^{2,5}$.1$^{7,10}$]-3-dodecene),
poly(8-(n-butoxymethyloxycarbonyl)-tetracyclo[4.4.0.1$^{2,5}$.1$^{7,10}$]-3-dodecene),
poly(8-(tert-butoxymethyloxycarbonyl)-tetracyclo[4.4.0.1$^{2,5}$.1$^{7,10}$]-3-dodecene),
poly(8-cyclopentyloxymethyloxycarbonyl-tetracyclo[4.4.0.1$^{2,5}$.1$^{7,10}$]-3-dodecene),
poly(8-cyclohexyloxymethyloxycarbonyl-tetracyclo[4.4.0.1$^{2,5}$.1$^{7,10}$]-3-dodecene),
poly(8-cyclooctyloxymethyloxycarbonyl-tetracyclo[4.4.0.1$^{2,5}$.1$^{7,10}$]-3-dodecene),
poly(8-norbornyloxymethyloxycarbonyl-tetracyclo[4.4.0.1$^{2,5}$.1$^{7,10}$]-3-dodecene),
poly(8-(1-methylcyclopentyloxymethyloxycarbonyl-tetracyclo[4.4.0.1$^{2,5}$.1$^{7,10}$]-3-dodecene),
poly(8-(1-ethylcyclopentyloxymethyloxycarbonyl-tetracyclo[4.4.0.1$^{2,5}$.1$^{7,10}$]-3-dodecene),
poly(8-(1-methylcyclohexyloxymethyloxycarbonyl-tetracyclo[4.4.0.1$^{2,5}$.1$^{7,10}$]-3-dodecene),
poly(8-(1-ethylcyclohexyloxymethyloxycarbonyl-tetracyclo[4.4.0.1$^{2,5}$.1$^{7,10}$]-3-dodecene),
poly(8-(1-methylnorbornyloxymethyloxycarbonyl-tetracyclo[4.4.0.1$^{2,5}$.1$^{7,10}$]-3-dodecene),
poly(8-(1-ethylnorbornyloxymethyloxycarbonyl-tetracyclo[4.4.0.1$^{2,5}$.1$^{7,10}$]-3-dodecene),
poly(8-(1-ethoxypropyloxymethyloxycarbonyl-tetracyclo[4.4.0.1$^{2,5}$.1$^{7,10}$]-3-dodecene),
poly(8-(1-ethoxy-1-methylethyloxymethyloxycarbonyl-tetracyclo[4.4.0.1$^{2,5}$.1$^{7,10}$]-3-dodecene),
poly(8-tetrahydrofuran-2-yloxymethyloxycarbonyl-tetracyclo[4.4.0.1$^{2,5}$.1$^{7,10}$]-3-dodecene),
poly(8-tetrahydropyran-2-yloxymethyloxycarbonyl-tetracyclo[4.4.0.1$^{2,5}$.1$^{7,10}$]-3-dodecene),
poly(8-(1-adamantyloxymethyloxycarbonyl)-tetracyclo[4.4.0.1$^{2,5}$.1$^{7,10}$]-3-dodecene),
poly(8-(2-adamantyloxymethyloxycarbonyl)-tetracyclo[4.4.0.1$^{2,5}$.1$^{7,10}$]-3-dodecene),
poly(8-(1-(1-methoxy)ethoxycarbonyl)-tetracyclo[4.4.0.1$^{2,5}$.1$^{7,10}$]-3-dodecene),
poly(8-(1-(1-ethoxy)ethoxycarbonyl)-tetracyclo[4.4.0.1$^{2,5}$.1$^{7,10}$]-3-dodecene),
poly(8-(1-(1-n-propoxy) ethoxycarbonyl)-tetracyclo[4.4.0.1$^{2,5}$.1$^{7,10}$]-3-dodecene),
poly(8-(1-(1-isopropoxy)ethoxycarbonyl)-tetracyclo[4.4.0.1$^{2,5}$.1$^{7,10}$]-3-dodecene),
poly(8-(1-(1-n-butoxy)ethoxycarbonyl)-tetracyclo[4.4.0.1$^{2,5}$.1$^{7,10}$]-3-dodecene),
poly(8-(1-(1-tert-butoxy)ethoxycarbonyl)-tetracyclo[4.4.0.1$^{2,5}$.1$^{7,10}$]-3-dodecene),
poly(8-(1-(1-cyclopentyloxy) ethoxycarbonyl)-tetracyclo[4.4.0.1$^{2,5}$.1$^{7,10}$]-3-dodecene),
poly(8-(1-(1-cyclohexyloxy)ethoxycarbonyl)-tetracyclo[4.4.0.1$^{2,5}$.1$^{7,10}$]-3-dodecene),
poly(8-(1-(1-cyclooctyloxy)ethoxycarbonyl)-tetracyclo[4.4.0.1$^{2,5}$.1$^{7,10}$]-3-dodecene),
poly(8-(1-(1-norboryloxy)ethoxycarbonyl)-tetracyclo[4.4.0.1$^{2,5}$.1$^{7,10}$]-3-dodecene),
poly(8-(1-(1-methylcyclopentyloxy)ethoxycarbonyl)-tetracyclo[4.4.0.1$^{2,5}$.1$^{7,10}$]-3-dodecene),
poly(8-(1-(1-ethylcyclopentyloxy)ethoxycarbonyl)-tetracyclo[4.4.0.1$^{2,5}$.1$^{7,10}$]-3-dodecene),
poly(8-(1-(1-methylcyclohexyloxy)ethoxycarbonyl)-tetracyclo[4.4.0.1$^{2,5}$.1$^{7,10}$]-3-dodecene),
poly(8-(1-(1-ethylcyclohexyloxy)ethoxycarbonyl)-tetracyclo[4.4.0.1$^{2,5}$.1$^{7,10}$]-3-dodecene),
poly(8-(1-(1-methylnorbornyloxy)ethoxycarbonyl)-tetracyclo[4.4.0.1$^{2,5}$.1$^{7,10}$]-3-dodecene),
poly(8-(1-(1-ethylnorbornyloxy)ethoxycarbonyl)-tetracyclo[4.4.0.1$^{2,5}$.1$^{7,10}$]-3-dodecene), poly(8-(1-(1-ethoxypropyloxy)ethoxycarbonyl)-tetracyclo[4.4.0.1$^{2,5}$.1$^{7,10}$]-3-dodecene),
poly(8-(1-(1-ethoxy-1-methylethyloxy)ethoxycarbonyl)-tetracyclo[4.4.0.1$^{2,5}$.1$^{7,10}$]-3-dodecene),
poly(8-(1-(tetrahydrofuran-2-yloxy)ethoxycarbonyl)-tetracyclo[4.4.0.1$^{2,5}$.1$^{7,10}$]-3-dodecene),
poly(8-(1-(tetrahydropyran-2-yloxy)ethoxycarbonyl)-tetracyclo[4.4.0.1$^{2,5}$.1$^{7,10}$]-3-dodecene),
poly(8-(1-(1-adamantyloxy)ethoxycarbonyl)-tetracyclo[4.4.0.1$^{2,5}$.1$^{7,10}$]-3-dodecene),
poly(8-(1-(2-adamantyloxy)ethoxycarbonyl)-tetracyclo[4.4.0.1$^{2,5}$.1$^{7,10}$]-3-dodecene),
poly(8-(n-butoxycarbonylmethyloxycarbonyl-tetracyclo[4.4.0.1$^{2,5}$.1$^{7,10}$]-3-dodecene),
poly(8-(tert-butoxycarbonylmethyloxycarbonyl-tetracyclo[4.4.0.1$^{2,5}$.1$^{7,10}$]-3-dodecene),
poly(8-(2-cyclopentyl-2-propoxycarbonylmethyloxycarbonyl-tetracyclo[4.4.0.1$^{2,5}$.1$^{7,10}$]-3-dodecene),
poly(8-(2-cyclopentyl-2-butoxycarbonylmethyloxycarbonyl-tetracyclo[4.4.0.1$^{2,5}$.1$^{7,10}$]-3-dodecene),
poly(8-(2-cyclohexyl-2-propoxycarbonylmethyloxycarbonyl-tetracyclo[4.4.0.1$^{2,5}$.1$^{7,10}$]-3-dodecene),
poly(8-(3-(2-cyclohexyl-2-propoxycarbonyl)propoxycarbonyl-tetracyclo[4.4.0.1$^{2,5}$.1$^{7,10}$]-3-dodecene),
poly(8-(2-cyclohexyl-2-butoxycarbonylmethyloxycarbonyl-tetracyclo[4.4.0.1$^{2,5}$.1$^{7,10}$]-3-dodecene),
poly(8-(3-cyclohexyl-3-pentyloxycarbonylmethyloxycarbonyl-tetracyclo[4.4.0.1$^{2,5}$.1$^{7,10}$]-3-dodecene),
poly(8-(2-ethyl-2-norbornyloxycarbonylmethyloxycarbonyl-tetracyclo[4.4.0.1$^{2,5}$.1$^{7,10}$]-3-dodecene),
poly(8-(2-norbornyl-2-propoxycarbonylmethyloxycarbonyl-tetracyclo[4.4.0.1$^{2,5}$.1$^{7,10}$]-3-dodecene),
poly(8-(4-ethyl-tetracyclo[6.2.1.1$^{3,6}$.0$^{2,7}$]-dodecane-4-yloxycarbonylmethyloxycarbonyl)-tetracyclo[4.4.0.1$^{2,5}$.1$^{7,10}$]-3-dodecene),
poly(8-(2-tetracyclo[6.2.1.1$^{3,6}$.0$^{2,7}$]-dodecane-4-yl)-2-propoxycarbonylmethyloxycarbonyl)-tetracyclo[4.4.0.1$^{2,5}$.1$^{7,10}$]-3-dodecene),
poly(8-(1,1-dicyclohexylethoxycarbonylmethyloxycarbonyl)-tetracyclo[4.4.0.1$^{2,5}$.1$^{7,10}$]-3-dodecene),
poly(8-(1,1-dicyclohexylpropoxycarbonylmethyloxycarbonyl)-tetracyclo[4.4.0.1$^{2,5}$.1$^{7,10}$]-3-dodecene),
poly(8-cyclopentyloxycarbonylmethyloxycarbonyl-tetracyclo[4.4.0.1$^{2,5}$.1$^{7,10}$]-3-dodecene),
poly(8-cyclohexyloxycarbonylmethyloxycarbonyl-tetracyclo[4.4.0.1$^{2,5}$.1$^{7,10}$]-3-dodecene),
poly(8-cyclooctyloxycarbonylmethyloxycarbonyl-tetracyclo[4.4.0.1$^{2,5}$.1$^{7,10}$]-3-dodecene),
poly(8-norbornyloxycarbonylmethyloxycarbonyl-tetracyclo[4.4.0.1$^{2,5}$.1$^{7,10}$]-3-dodecene),
poly(8-(1-methylcyclopentyloxycarbonylmethyloxycarbonyl-tetracyclo[4.4.0.1$^{2,5}$.1$^{7,10}$]-3-dodecene),
poly(8-(1-ethylcyclopentyloxycarbonylmethyloxycarbonyl-tetracyclo[4.4.0.1$^{2,5}$.1$^{7,10}$]-3-dodecene),
poly(8-(1-methylcyclohexyloxycarbonylmethyloxycarbonyl-tetracyclo[4.4.0.1$^{2,5}$.1$^{7,10}$]-3-dodecene,
poly(8-(1-ethylcyclohexyloxycarbonylmethyloxycarbonyl-tetracyclo[4.4.0.1$^{2,5}$.1$^{7,10}$]-3-dodecene),
poly(8-(1-methylnorbornyloxycarbonylmethyloxycarbonyl-tetracyclo[4.4.0.1$^{2,5}$.1$^{7,10}$]-3-dodecene),
poly(8-(1-ethylnorbornyloxycarbonylmethyloxycarbonyl-tetracyclo[4.4.0.1$^{2,5}$.1$^{7,10}$]-3-dodecene),
poly(8-(1-ethoxypropyloxycarbonylmethyloxycarbonyl-tetracyclo[4.4.0.1$^{2,5}$.1$^{7,10}$]-3-dodecene),
poly(8-(1-ethoxy-1-methylethyloxycarbonylmethyloxycarbonyl-tetracyclo[4.4.0.1$^{2,5}$.1$^{7,10}$]-3-dodecene),
poly(8-tetrahydrofuran-2-yloxycarbonylmethyloxycarbonyl-tetracyclo[4.4.0.1$^{2,5}$.1$^{7,10}$]-3-dodecene),
poly(8-tetrahydropyran-2-yloxycarbonylmethyloxycarbonyl-tetracyclo[4.4.0.1$^{2,5}$.1$^{7,10}$]-3-dodecene),
poly(8-1-adamantyloxycarbonylmethyloxycarbonyl)-tetracyclo[4.4.0.1$^{2,5}$.1$^{7,10}$]-3-dodecene),
poly(8-2-adamantyloxycarbonylmethyloxycarbonyl)-tetracyclo[4.4.0.1$^{2,5}$.1$^{7,10}$]-3-dodecene),
poly(8-(1-(2-(1-adamantyl)-2-propoxycarbonyl)-ethoxycarbonyl)-tetracyclo[4.4.0.1$^{2,5}$.1$^{7,10}$]-3-dodecene),
poly(8-(3-(2-(1-adamantyl)-2-propoxycarbonyl)-propoxycarbonyl)-tetracyclo[4.4.0.1$^{2,5}$.1$^{7,10}$]-3-dodecene),
poly(8-(2-(2-(1-adamantyl)-2-propoxycarbonyl)-2-propoxycarbonyl)-tetracyclo[4.4.0.1$^{2,5}$.1$^{7,10}$]-3-dodecene),
poly(8-(2-methyl-2-adamantyloxycarbonylmethyloxycarbonyl)-tetracyclo[4.4.0.1$^{2,5}$.1$^{7,10}$]-3-dodecene),
poly(8-(3-(2-methyl-2-adamantyloxycarbonyl)propoxycarbonyl)-tetracyclo[4.4.0.1$^{2,5}$.1$^{7,10}$]-3-dodecene),
poly(8-(2-(2-methyl-2-adamantyloxycarbonyl)-2-propoxycarbonyl)-tetracyclo[4.4.0.1$^{2,5}$.1$^{7,10}$]-3-dodecene),
poly(8-(1-(2-methyl-2-adamantyloxycarbonyl)ethoxycarbonyl)-tetracyclo[4.4.0.1$^{2,5}$.1$^{7,10}$]-3-dodecene),
poly(8-(2-ethyl-2-adamantyloxycarbonylmethyloxycarbonyl)-tetracyclo[4.4.0.1$^{2,5}$.1$^{7,10}$]-3-dodecene),
poly(8-(2-isopropyl-2-adamantyloxycarbonylmethyloxycarbonyl)-tetracyclo[4.4.0.1$^{2,5}$.1$^{7,10}$]-3-dodecene),
poly(8-(2-(1-adamantyl)-2-propoxycarbonylmethyloxycarbonyl)-tetracyclo[4.4.0.1$^{2,5}$.1$^{7,10}$]-3-dodecene),
poly(8-(2-(1-adamantyl)-2-butoxycarbonylmethyloxycarbonyl)-tetracyclo[4.4.0.1$^{2,5}$.1$^{7,10}$]-3-dodecene),
poly(8-(3-(1-adamantyl)-3-pentyloxycarbonylmethyloxycarbonyl)-tetracyclo[4.4.0.1$^{2,5}$.1$^{7,10}$]-3-dodecene),
poly(8-(3-tert-butoxycarbonyl-1-cyclopentyloxycarbonyl)-tetracyclo[4.4.0.1$^{2,5}$.1$^{7,10}$]-3-dodecene),
poly(8-(3-(1-methylcyclohexyloxycarbonyl)-1-cyclopentyloxycarbonyl)-tetracyclo[4.4.0.1$^{2,5}$.1$^{7,10}$]-3-dodecene),
poly(8-(5-tert-butoxycarbonyl-2-norbornyloxycarbonyl)-tetracyclo[4.4.0.1$^{2,5}$.1$^{7,10}$]-3-dodecene),
poly(8-(5-(1-methylcyclohexyloxycarbonyl)-2-norbornyloxycarbonyl)-tetracyclo[4.4.0.1$^{2,5}$.1$^{7,10}$]-3-dodecene),
poly(8-(5,5-di(tert-butoxycarbonyl)-2-norbornyloxycarbonyl)-tetracyclo[4.4.0.1$^{2,5}$.1$^{7,10}$]-3-dodecene),
poly(8-(5,6-di(tert-butoxycarbonyl)-2-norbornyloxycarbonyl)-tetracyclo[4.4.0.1$^{2,5}$.1$^{7,10}$]-3-dodecene),
poly(8-(1-(1-methylcyclohexyloxycarbonyl)-octahydro-4,7-methano-indene-5-yloxycarbonyl)-tetracyclo[4.4.0.1$^{2,5}$.1$^{7,10}$]-3-dodecene),
poly(8-(6-tert-butoxycarbonyl-decahydronaphthalene-2-yloxycarbonyl)-tetracyclo[4.4.0.1$^{2,5}$.1$^{7,10}$]-3-dodecene),
poly(8-(9-tert-butoxycarbonyl-tetracyclo[6.2.1.1$^{3,6}$.0$^{2,7}$]-dodecane-4-yloxycarbonyl)-tetracyclo[4.4.0.1$^{2,5}$.1$^{7,10}$]-3-dodecene), or
poly(8-(9-(1-methylcyclohexyloxycarbonyl)-tetracyclo[6.2.1.1$^{3,6}$.0$^{2,7}$]-dodecane-4-yloxycarbonyl)-tetracyclo[4.4.0.1$^{2,5}$.1$^{7,10}$]-3-dodecene is preferable.

Among these, from the viewpoints of improving the solubility in a solvent (PGMEA) during preparation of a coating solution and greatly changing the polarity of the cyclic olefin polymer after application, in the repeating structural unit [A] represented by Formula (1) according to the present embodiment, as the cyclic olefin polymer in which n represents 0,
poly(8-(tert-butoxycarbonyl)-tetracyclo[4.4.0.1$^{2,5}$.1$^{7,10}$]-3-dodecene),
poly(8-(2-methyl-2-pentyloxycarbonyl)-tetracyclo[4.4.0.1$^{2,5}$.1$^{7,10}$]-3-dodecene), poly(8-(3-methyl-3-pentyloxycarbonyl)-tetracyclo[4.4.0.1$^{2,5}$.1$^{7,10}$]-3-dodecene),
poly(8-(2-ethyl-3-methyl-3-pentyloxycarbonyl)-tetracyclo[4.4.0.1$^{2,5}$.1$^{7,10}$]-3-dodecene),
poly(8-(2-methyl-2-butoxycarbonyl)-tetracyclo[4.4.0.1$^{2,5}$.1$^{7,10}$]-3-dodecene),
poly(8-(2,3-dimethyl-2-butoxycarbonyl)-tetracyclo[4.4.0.1$^{2,5}$.1$^{7,10}$]-3-dodecene),
poly(8-(2,3,3-trimethyl-2-butoxycarbonyl)-tetracyclo[4.4.0.1$^{2,5}$.1$^{7,10}$]-3-dodecene),
poly(8-(2-methyl-2-hexyloxycarbonyl)-tetracyclo[4.4.0.1$^{2,5}$.1$^{7,10}$]-3-dodecene),
poly(8-(3,4-dimethyl-3-hexyloxycarbonyl)-tetracyclo[4.4.0.1$^{2,5}$.1$^{7,10}$]-3-dodecene),
poly(8-(3-methyl-3-heptyloxycarbonyl)-tetracyclo[4.4.0.1$^{2,5}$.1$^{7,10}$]-3-dodecene),
poly(8-(2-cyclopentyl)-2-propoxycarbonyl)-tetracyclo[4.4.0.1$^{2,5}$.1$^{7,10}$]-3-dodecene),
poly(8-(2-cyclohexyl-2-propoxycarbonyl)-tetracyclo[4.4.0.1$^{2,5}$.1$^{7,10}$]-3-dodecene),
poly(8-(2-norbornyl-2-propoxycarbonyl)-tetracyclo[4.4.0.1$^{2,5}$.1$^{7,10}$]-3-dodecene),
poly(8-(1,1-dicyclopentylethoxycarbonyl)-tetracyclo[4.4.0.1$^{2,5}$.1$^{7,10}$]-3-dodecene),
poly(8-(1,1-dicyclohexylethoxycarbonyl)-tetracyclo[4.4.0.1$^{2,5}$.1$^{7,10}$]-3-dodecene),
poly(8-(1-methylcyclopentyloxycarbonyl)-tetracyclo[4.4.0.1$^{2,5}$.1$^{7,10}$]-3-dodecene),
poly(8-(1-ethylcyclopentyloxycarbonyl)-tetracyclo[4.4.0.1$^{2,5}$.1$^{7,10}$]-3-dodecene),
poly(8-(1-methylcyclohexyloxycarbonyl)-tetracyclo[4.4.0.1$^{2,5}$.1$^{7,10}$]-3-dodecene),
poly(8-(1-ethylcyclohexyloxycarbonyl)-tetracyclo[4.4.0.1$^{2,5}$.1$^{7,10}$]-3-dodecene),
poly(8-(1-methylcyclooctyloxycarbonyl)-tetracyclo[4.4.0.1$^{2,5}$.1$^{7,10}$]-3-dodecene),
poly(8-(1-ethylcyclooctyloxycarbonyl)-tetracyclo[4.4.0.1$^{2,5}$.1$^{7,10}$]-3-dodecene),
poly(8-(1-adamantyloxycarbonyl)-tetracyclo[4.4.0.1$^{2,5}$.1$^{7,10}$]-3-dodecene),
poly(8-(2-methyl-2-adamantyloxycarbonyl)-tetracyclo[4.4.0.1$^{2,5}$.1$^{7,10}$]-3-dodecene),
poly(8-(2-ethyl-2-adamantyloxycarbonyl)-tetracyclo[4.4.0.1$^{2,5}$.1$^{7,10}$]-3-dodecene),
poly(8-(1-methyldecahydronaphthalene-1-yloxycarbonyl)-tetracyclo[4.4.0.1$^{2,5}$.1$^{7,10}$]-3-dodecene),
poly(8-(1-ethyldecahydronaphthalene-1-yloxycarbonyl)-tetracyclo[4.4.0.1$^{2,5}$.1$^{7,10}$]-3-dodecene),
poly(8-(2-methyldecahydronaphthalene-2-yloxycarbonyl)-tetracyclo[4.4.0.1$^{2,5}$.1$^{7,10}$]-3-dodecene),
poly(8-(2-ethyldecahydronaphthalene-2-yloxycarbonyl)-tetracyclo[4.4.0.1$^{2,5}$.1$^{7,10}$]-3-dodecene),
poly(8-(2-methyl-2-norbornyloxycarbonyl)-tetracyclo[4.4.0.1$^{2,5}$.1$^{7,10}$]-3-dodecene),
poly(8-(2-ethyl-2-norbornyloxycarbonyl)-tetracyclo[4.4.0.1$^{2,5}$.1$^{7,10}$]-3-dodecene),
poly(8-(2,7,7-trimethyl-2-norbornyloxycarbonyl)-tetracyclo[4.4.0.1$^{2,5}$.1$^{7,10}$]-3-dodecene),
poly(8-(2-ethyl-7,7-dimethyl-2-norbornyloxycarbonyl)-tetracyclo[4.4.0.1$^{2,5}$.1$^{7,10}$]-3-dodecene),
poly(8-(5-methyl-octahydro-4,7-methano-indene-5-yloxycarbonyl)-tetracyclo[4.4.0.1$^{2,5}$.1$^{7,10}$]-3-dodecene),
poly(8-(5-ethyl-octahydro-4,7-methano-indene-5-yloxycarbonyl)-tetracyclo[4.4.0.1$^{2,5}$.1$^{7,10}$]-3-dodecene),
poly(8-(4-methyl-tetracyclo[6.2.1.1$^{3,6}$.0$^{2,7}$]-dodecane-4-yloxycarbonyl)-tetracyclo[4.4.0.1$^{2,5}$.1$^{7,10}$]-3-dodecene),
poly(8-(4-ethyl-tetracyclo[6.2.1.1$^{3,6}$.0$^{2,7}$]-dodecane-4-yloxycarbonyl)-tetracyclo[4.4.0.1$^{2,5}$.1$^{7,10}$]-3-dodecene),
poly(8-(tert-butoxycarbonylphenyl)-tetracyclo[4.4.0.1$^{2,5}$.1$^{7,10}$]-3-dodecene),
poly(8-(3-(2-methyl-2-butoxycarbonyl)phenyl)-tetracyclo[4.4.0.1$^{2,5}$.1$^{7,10}$]-3-dodecene),
poly(8-(3-(2,3-dimethyl-2-butoxycarbonyl)phenyl)-tetracyclo[4.4.0.1$^{2,5}$.1$^{7,10}$]-3-dodecene),
poly(8-(3-(2-cyclopentyl-2-propoxycarbonyl)phenyl)-tetracyclo[4.4.0.1$^{2,5}$.1$^{7,10}$]-3-dodecene),
poly(8-(3-(2-cyclohexyl-2-propoxycarbonyl)phenyl)-tetracyclo[4.4.0.1$^{2,5}$.1$^{7,10}$]-3-dodecene),
poly(8-(3-(1-methylcyclopentyloxycarbonyl)phenyl)-tetracyclo[4.4.0.1$^{2,5}$.1$^{7,10}$]-3-dodecene),
poly(8-(3-(1-ethylcyclopentyloxycarbonyl)phenyl)-tetracyclo[4.4.0.1$^{2,5}$.1$^{7,10}$]-3-dodecene),
poly(8-(3-(1-methylcyclohexyloxycarbonyl)phenyl)-tetracyclo[4.4.0.1$^{2,5}$.1$^{7,10}$]-3-dodecene),
poly(8-(3-(1-ethylcyclohexyloxycarbonyl)phenyl)-tetracyclo[4.4.0.1$^{2,5}$.1$^{7,10}$]-3-dodecene),
poly(8-(4-(2-methyl-2-butoxycarbonyl)phenyl)-tetracyclo[4.4.0.1$^{2,5}$.1$^{7,10}$]-3-dodecene),
poly(8-(4-(2,3-dimethyl-2-butoxycarbonyl)phenyl)-tetracyclo[4.4.0.1$^{2,5}$.1$^{7,10}$]-3-dodecene),
poly(8-(4-(2-cyclopentyl-2-propoxycarbonyl)phenyl)-tetracyclo[4.4.0.1$^{2,5}$.1$^{7,10}$]-3-dodecene),
poly(8-(4-(2-cyclohexyl-2-propoxycarbonyl)phenyl)-tetracyclo[4.4.0.1$^{2,5}$.1$^{7,10}$]-3-dodecene),
poly(8-(4-(1-methylcyclopentyloxycarbonyl)phenyl)-tetracyclo[4.4.0.1$^{2,5}$.1$^{7,10}$]-3-dodecene),
poly(8-(4-(1-ethylcyclopentyloxycarbonyl)phenyl)-tetracyclo[4.4.0.1$^{2,5}$.1$^{7,10}$]-3-dodecene),
poly(8-(4-(1-methylcyclohexyloxycarbonyl)phenyl)-tetracyclo[4.4.0.1$^{2,5}$.1$^{7,10}$]-3-dodecene),
poly(8-(4-(1-ethylcyclohexyloxycarbonyl)phenyl)-tetracyclo[4.4.0.1$^{2,5}$.1$^{7,10}$]-3-dodecene),
poly(8-(tert-butoxycarbonylphenyl)-tetracyclo[4.4.0.1$^{2,5}$.1$^{7,10}$]-3-dodecene),
poly(8-(n-pentyloxycarbonylnaphthyl)-tetracyclo[4.4.0.1$^{2,5}$.1$^{7,10}$]-3-dodecene),
poly(8-(5-(2-methyl-2-butoxycarbonyl)naphthyl)-tetracyclo[4.4.0.1$^{2,5}$.1$^{7,10}$]-3-dodecene),
poly(8-(5-(2,3-dimethyl-2-butoxycarbonyl)naphthyl)-tetracyclo[4.4.0.1$^{2,5}$.1$^{7,10}$]-3-dodecene),
poly(8-(5-(2-cyclopentyl-2-propoxycarbonyl)naphthyl)-tetracyclo[4.4.0.1$^{2,5}$.1$^{7,10}$]-3-dodecene),
poly(8-(5-(2-cyclohexyl-2-propoxycarbonyl)naphthyl)-tetracyclo[4.4.0.1$^{2,5}$.1$^{7,10}$]-3-dodecene),
poly(8-(5-(1-methylcyclopentyloxycarbonyl)naphthyl)-tetracyclo[4.4.0.1$^{2,5}$.1$^{7,10}$]-3-dodecene),
poly(8-(5-(1-ethylcyclopentyloxycarbonyl)naphthyl)-tetracyclo[4.4.0.1$^{2,5}$.1$^{7,10}$]-3-dodecene),
poly(8-(5-(1-methylcyclohexyloxycarbonyl)naphthyl)-tetracyclo[4.4.0.1$^{2,5}$.1$^{7,10}$]-3-dodecene),
poly(8-(5-(1-ethylcyclohexyloxycarbonyl)naphthyl)-tetracyclo[4.4.0.1$^{2,5}$.1$^{7,10}$]-3-dodecene),
poly(8-(tert-butoxymethyloxycarbonyl)-tetracyclo[4.4.0.1$^{2,5}$.1$^{7,10}$]-3-dodecene),
poly(8-(1-methylcyclopentyloxymethyloxycarbonyl-tetracyclo[4.4.0.1$^{2,5}$.1$^{7,10}$]-3-dodecene),
poly(8-(1-ethylcyclopentyloxymethyloxycarbonyl-tetracyclo[4.4.0.1$^{2,5}$.1$^{7,10}$]-3-dodecene),
poly(8-(1-methylcyclohexyloxymethyloxycarbonyl-tetracyclo[4.4.0.1$^{2,5}$.1$^{7,10}$]-3-dodecene),
poly(8-(1-ethylcyclohexyloxymethyloxycarbonyl-tetracyclo[4.4.0.1$^{2,5}$.1$^{7,10}$]-3-dodecene), poly(8-(1-(1-methoxy)ethoxycarbonyl)-tetracyclo [4.4.0.1$^{2,5}$.1$^{7,10}$]-3-dodecene),
poly(8-(1-(1-ethoxy)ethoxycarbonyl)-tetracyclo [4.4.0.1$^{2,5}$.1$^{7,10}$]-3-dodecene),
poly(8-(1-(1-n-propoxy) ethoxycarbonyl)-tetracyclo [4.4.0.1$^{2,5}$.1$^{7,10}$]-3-dodecene),
poly(8-(1-(1-isopropoxy)ethoxycarbonyl)-tetracyclo [4.4.0.1$^{2,5}$.1$^{7,10}$]-3-dodecene),
poly(8-(1-(1-n-butoxy)ethoxycarbonyl)-tetracyclo [4.4.0.1$^{2,5}$.1$^{7,10}$]-3-dodecene),
poly(8-(1-(1-tert-butoxy)ethoxycarbonyl)-tetracyclo [4.4.0.1$^{2,5}$.1$^{7,10}$]-3-dodecene),
poly(8-(1-(1-cyclopentyloxy)ethoxycarbonyl)-tetracyclo [4.4.0.1$^{2,5}$.1$^{7,10}$]-3-dodecene),
poly(8-(1-(1-cyclohexyloxy)ethoxycarbonyl)-tetracyclo [4.4.0.1$^{2,5}$.1$^{7,10}$]-3-dodecene),
poly(8-(1-(1-cyclooctyloxy)ethoxycarbonyl)-tetracyclo [4.4.0.1$^{2,5}$.1$^{7,10}$]-3-dodecene),
poly(8-(1-(1-norboryloxy)ethoxycarbonyl)-tetracyclo [4.4.0.1$^{2,5}$.1$^{7,10}$]-3-dodecene),
poly(8-(1-(1-methylcyclopentyloxy)ethoxycarbonyl)-tetracyclo[4.4.0.1$^{2,5}$.1$^{7,10}$]-3-dodecene),
poly(8-(1-(1-ethylcyclopentyloxy)ethoxycarbonyl)-tetracyclo[4.4.0.1$^{2,5}$.1$^{7,10}$]-3-dodecene),
poly(8-(1-(1-methylcyclohexyloxy)ethoxycarbonyl)-tetracyclo[4.4.0.1$^{2,5}$.1$^{7,10}$]-3-dodecene),
poly(8-(1-(1-ethylcyclohexyloxy)ethoxycarbonyl)-tetracyclo[4.4.0.1$^{2,5}$.1$^{7,10}$]-3-dodecene),
poly(8-(1-(1-methylnorbornyloxy)ethoxycarbonyl)-tetracyclo[4.4.0.1$^{2,5}$.1$^{7,10}$]-3-dodecene),
poly(8-(1-(1-ethylnorbornyloxy)ethoxycarbonyl)-tetracyclo [4.4.0.1$^{2,5}$.1$^{7,10}$]-3-dodecene),
poly(8-(1-(1-ethoxypropyloxy)ethoxycarbonyl)-tetracyclo [4.4.0.1$^{2,5}$.1$^{7,10}$]-3-dodecene),
poly(8-(1-(1-ethoxy-1-methylethyloxy)ethoxycarbonyl)-tetracyclo[4.4.0.1$^{2,5}$.1$^{7,10}$]-3-dodecene),
poly(8-(1-(tetrahydrofuran-2-yloxy)ethoxycarbonyl)-tetracyclo[4.4.0.1$^{2,5}$.1$^{7,10}$]-3-dodecene),
poly(8-(1-(tetrahydropyran-2-yloxy)ethoxycarbonyl)-tetracyclo[4.4.0.1$^{2,5}$.1$^{7,10}$]-3-dodecene),
poly(8-(1-(1-adamantyloxy)ethoxycarbonyl)-tetracyclo [4.4.0.1$^{2,5}$.1$^{7,10}$]-3-dodecene),
poly(8-(1-(2-adamantyloxy)ethoxycarbonyl)-tetracyclo [4.4.0.1$^{2,5}$.1$^{7,10}$]-3-dodecene),
poly(8-(tert-butoxycarbonylmethyloxycarbonyl-tetracyclo [4.4.0.1$^{2,5}$.1$^{7,10}$]-3-dodecene),
poly(8-(2-cyclopentyl-2-propoxycarbonylmethyloxycarbonyl-tetracyclo[4.4.0.1$^{2,5}$.1$^{7,10}$]-3-dodecene),
poly(8-(2-cyclopentyl-2-butoxycarbonylmethyloxycarbonyl-tetracyclo[4.4.0.1$^{2,5}$.1$^{7,10}$]-3-dodecene),
poly(8-(2-cyclohexyl-2-propoxycarbonylmethyloxycarbonyl-tetracyclo[4.4.0.1$^{2,5}$.1$^{7,10}$]-3-dodecene),
poly(8-(3-(2-cyclohexyl-2-propoxycarbonyl)propoxycarbonyl)-tetracyclo[4.4.0.1$^{2,5}$.1$^{7,10}$]-3-dodecene),
poly(8-(2-cyclohexyl-2-butoxycarbonylmethyloxycarbonyl-tetracyclo[4.4.0.1$^{2,5}$.1$^{7,10}$]-3-dodecene),
poly(8-(3-cyclohexyl-3-pentyloxycarbonylmethyloxycarbonyl-tetracyclo[4.4.0.1$^{2,5}$.1$^{7,10}$]-3-dodecene),
poly(8-(2-ethyl-2-norbornyloxycarbonylmethyloxycarbonyl-tetracyclo[4.4.0.1$^{2,5}$.1$^{7,10}$]-3-dodecene),
poly(8-(2-norbornyl-2-propoxycarbonylmethyloxycarbonyl-tetracyclo[4.4.0.1$^{2,5}$.1$^{7,10}$]-3-dodecene),
poly(8-(4-ethyl-tetracyclo[6.2.1.1$^{3,6}$.0$^{2,7}$]-dodecane-4-yloxycarbonylmethyloxycarbonyl)-tetracyclo[4.4.0.1$^{2,5}$.1$^{7,10}$]-3-dodecene),
poly(8-(2-tetracyclo[6.2.1.1$^{3,6}$.0$^{2,7}$]-dodecane-4-yl)-2-propoxycarbonylmethyloxycarbonyl)-tetracyclo [4.4.0.1$^{2,5}$.1$^{7,10}$]-3-dodecene),
poly(8-(1,1-dicyclohexylethoxycarbonylmethyloxycarbonyl)-tetracyclo[4.4.0.1$^{2,5}$.1$^{7,10}$]-3-dodecene),
poly(8-(1,1-dicyclohexylpropoxycarbonylmethyloxycarbonyl)-tetracyclo[4.4.0.1$^{2,5}$.1$^{7,10}$]-3-dodecene),
poly(8-(1-methylcyclopentyloxycarbonylmethyloxycarbonyl-tetracyclo[4.4.0.1$^{2,5}$.1$^{7,10}$]-3-dodecene),
poly(8-(1-ethylcyclopentyloxycarbonylmethyloxycarbonyl-tetracyclo[4.4.0.1$^{2,5}$.1$^{7,10}$]-3-dodecene),
poly(8-(1-methylcyclohexyloxycarbonylmethyloxycarbonyl-tetracyclo[4.4.0.1$^{2,5}$.1$^{7,10}$]-3-dodecene),
poly(8-(1-ethylcyclohexyloxycarbonylmethyloxycarbonyl-tetracyclo[4.4.0.1$^{2,5}$.1$^{7,10}$]-3-dodecene),
poly(8-(1-(2-(1-adamantyl)-2-propoxycarbonyl)-ethoxycarbonyl)-tetracyclo[4.4.0.1$^{2,5}$.1$^{7,10}$]-3-dodecene),
poly(8-(3-(2-(1-adamantyl)-2-propoxycarbonyl)-propoxycarbonyl)-tetracyclo[4.4.0.1$^{2,5}$.1$^{7,10}$]-3-dodecene),
poly(8-(2-(2-(1-adamantyl)-2-propoxycarbonyl)-2-propoxycarbonyl)-tetracyclo[4.4.0.1$^{2,5}$.1$^{7,10}$]-3-dodecene),
poly(8-(2-methyl-2-adamantyloxycarbonylmethyloxycarbonyl)-tetracyclo[4.4.0.1$^{2,5}$.1$^{7,10}$]-3-dodecene),
poly(8-(3-(2-methyl-2-adamantyloxycarbonyl)propoxycarbonyl)-tetracyclo[4.4.0.1$^{2,5}$.1$^{7,10}$]-3-dodecene),
poly(8-(2-(2-methyl-2-adamantyloxycarbonyl)-2-propoxycarbonyl)-tetracyclo[4.4.0.1$^{2,5}$.1$^{7,10}$]-3-dodecene),
poly(8-(1-(2-methyl-2-adamantyloxycarbonyl)ethoxycarbonyl)-tetracyclo[4.4.0.1$^{2,5}$.1$^{7,10}$]-3-dodecene),
poly(8-(2-ethyl-2-adamantyloxycarbonylmethyloxycarbonyl)-tetracyclo[4.4.0.1$^{2,5}$.1$^{7,10}$]-3-dodecene),
poly(8-(2-isopropyl-2-adamantyloxycarbonylmethyloxycarbonyl)-tetracyclo[4.4.0.1$^{2,5}$.1$^{7,10}$]-3-dodecene),
poly(8-(2-(1-adamantyl)-2-propoxycarbonylmethyloxycarbonyl)-tetracyclo[4.4.0.1$^{2,5}$.1$^{7,10}$]-3-dodecene),
poly(8-(2-(1-adamantyl)-2-butoxycarbonylmethyloxycarbonyl)-tetracyclo[4.4.0.1$^{2,5}$.1$^{7,10}$]-3-dodecene),
poly(8-(3-(1-adamantyl)-3-pentyloxycarbonylmethyloxycarbonyl)-tetracyclo[4.4.0.1$^{2,5}$.1$^{7,10}$]-3-dodecene),
poly(8-(3-tert-butoxycarbonyl-1-cyclopentyloxycarbonyl)-tetracyclo[4.4.0.1$^{2,5}$.1$^{7,10}$]-3-dodecene),
poly(8-(3-(1-methylcyclohexyloxycarbonyl)-1-cyclopentyloxycarbonyl)-tetracyclo[4.4.0.1$^{2,5}$.1$^{7,10}$]-3-dodecene),
poly(8-(5-tert-butoxycarbonyl-2-norbornyloxycarbonyl)-tetracyclo [4.4.0.1$^{2,5}$.1$^{7,10}$]-3-dodecene),
poly(8-(5-(1-methylcyclohexyloxycarbonyl)-2-norbornyloxycarbonyl)-tetracyclo[4.4.0.1$^{2,5}$.1$^{7,10}$]-3-dodecene),
poly(8-(5,5-di(tert-butoxycarbonyl)-2-norbornyloxycarbonyl)-tetracyclo[4.4.0.1$^{2,5}$.1$^{7,10}$]-3-dodecene),
poly(8-(5,6-di(tert-butoxycarbonyl)-2-norbornyloxycarbonyl)-tetracyclo[4.4.0.1$^{2,5}$.1$^{7,10}$]-3-dodecene),
poly(8-(1-(1-methylcyclohexyloxycarbonyl)-octahydro-4,7-methano-indene-5-yloxycarbonyl)-tetracyclo [4.4.0.1$^{2,5}$.1$^{7,10}$]-3-dodecene),
poly(8-(6-tert-butoxycarbonyl-decahydronaphthalene-2-yloxycarbonyl)-tetracyclo[4.4.0.1$^{2,5}$.1$^{7,10}$]-3-dodecene),
poly(8-(9-tert-butoxycarbonyl-tetracyclo[6.2.1.1$^{3,6}$.0$^{2,7}$]-dodecane-4-yloxycarbonyl)-tetracyclo[4.4.0.1$^{2,5}$.1$^{7,10}$]-3-dodecene), or
poly(8-(9-(1-methylcyclohexyloxycarbonyl)-tetracyclo [6.2.1.1$^{3,6}$.0$^{2,7}$]-dodecane-4-yloxycarbonyl)-tetracyclo [4.4.0.1$^{2,5}$.1$^{7,10}$]-3-dodecene is more preferable.

In the repeating structural unit [A] represented by Formula (1) according to the present embodiment, in a case where $R^1$ to $R^4$ are bonded to one another to form a ring structure, as the cyclic olefin polymer in which n represents 1,
poly(4-oxy-pentacyclo[9.2.1.1$^{1,7}$.0$^{2,6}$.0$^{8,13}$]-10-pentadecene-3-one),
poly(4-oxy-pentacyclo[9.2.1.1$^{1,7}$.0$^{2,6}$.0$^{8,13}$]-10-pentadecene-3,5-dione),
poly(4-methyl-4-aza-pentacyclo[9.2.1.1$^{1,7}$.0$^{2,6}$.0$^{8,13}$]-10-pentadecene-3,5-dione),
poly(4-ethyl-4-aza-pentacyclo[9.2.1.1$^{1,7}$.0$^{2,6}$.0$^{8,13}$]-10-pentadecene-3,5-dione),
poly(4-(n-propyl)-4-aza-pentacyclo[9.2.1.1$^{1,7}$.0$^{2,6}$.0$^{8,13}$]-10-pentadecene-3,5-dione),
poly(4-(n-butyl)-4-aza-pentacyclo[9.2.1.1$^{1,7}$.0$^{2,6}$.0$^{8,13}$]-10-pentadecene-3,5-dione),
poly(4-(1-methylbutyl)-4-aza-pentacyclo[9.2.1.1$^{1,7}$.0$^{2,6}$.0$^{8,13}$]-10-pentadecene-3,5-dione),
poly(4-cyclopentyl)-4-aza-pentacyclo[9.2.1.1$^{1,7}$.0$^{2,6}$.0$^{8,13}$]-10-penta decene-3,5-dione),
poly(4-cyclohexyl)-4-aza-pentacyclo[9.2.1.1$^{1,7}$.0$^{2,6}$.0$^{8,13}$]-10-pentadecene-3,5-dione),
poly(4-phenyl-4-aza-pentacyclo[9.2.1.1$^{1,7}$.0$^{2,6}$.0$^{8,13}$]-10-pentadecene-3,5-dione), or
poly(4-(4-hydroxyphenyl)-4-aza-pentacyclo[9.2.1.1$^{1,7}$.0$^{2,6}$.0$^{8,13}$]-10-pentadecene-3,5-dione) is preferable.

$R^5$ to $R^8$ in Formula (2) each have the same definition as that for $R^1$ to $R^4$ in Formula (1). Further, $R^5$ to $R^8$ may form a ring structure. Specifically, $R^5$ to $R^8$ are each independently bonded to one another or at least two of these are bonded to each other to form a ring structure optionally through a —C— bond, a —O— bond, or a —NR$^9$— bond. Examples thereof include a cyclic alkyl structure, a cyclic ester structure, a cyclic acid anhydride structure, a cyclic amide structure, and a cyclic imide structure.

The cyclic olefin polymer according to the present embodiment may have two or more structural units in which at least one of $R^5$ to $R^8$ in the repeating structural unit [B] represented by Formula (2) is different from the rest.

In the repeating structural unit [B] represented by Formula (2) according to the present embodiment, examples of the cyclic olefin polymer in which n represents 0 include
poly(5-methyl-7-oxy-bicyclo[2.2.1]hept-2-ene),
poly(5-ethyl-7-oxy-bicyclo[2.2.1]hept-2-ene),
poly(5-(n-propyl)-7-oxy-bicyclo[2.2.1]hept-2-ene),
poly(5-(i-propyl)-7-oxy-bicyclo[2.2.1]hept-2-ene),
poly(5-(n-butyl)-7-oxy-bicyclo[2.2.1]hept-2-ene),
poly(5-(tert-butyl)-7-oxy-bicyclo[2.2.1]hept-2-ene),
poly(5-(n-pentyl)-7-oxy-bicyclo[2.2.1]hept-2-ene),
poly(5-cyclopentyl-7-oxy-bicyclo[2.2.1]hept-2-ene),
poly(5-cyclohexyl-7-oxy-bicyclo[2.2.1]hept-2-ene), and
poly(5-cyclooctyl-7-oxy-bicyclo[2.2.1]hept-2-ene) in a case where at least one of $R^5$ to $R^8$ represents an alkyl group;
poly(5-phenyl-7-oxy-bicyclo[2.2.1]hept-2-ene),
poly(5-naphthyl-7-oxy-bicyclo[2.2.1]hept-2-ene),
poly(5-anthracenyl-7-oxy-bicyclo[2.2.1]hept-2-ene),
poly(5-(o-tolyl)-7-oxy-bicyclo[2.2.1]hept-2-ene),
poly(5-(m-tolyl)-7-oxy-bicyclo[2.2.1]hept-2-ene),
poly(5-(p-tolyl)-7-oxy-bicyclo[2.2.1]hept-2-ene),
poly(5-biphenyl-7-oxy-bicyclo[2.2.1]hept-2-ene), and
poly(5-(4-hydroxyphenyl)-7-oxy-bicyclo[2.2.1]hept-2-ene) in a case where at least one of $R^5$ to $R^8$ represents an aryl group;
poly(5-methoxy-7-oxy-bicyclo[2.2.1]hept-2-ene),
poly(5-ethoxy-7-oxy-bicyclo[2.2.1]hept-2-ene),
poly(5-(n-propoxy)-7-oxy-bicyclo[2.2.1]hept-2-ene),
poly(5-(i-propoxy)-7-oxy-bicyclo[2.2.1]hept-2-ene),
poly(5-(n-butoxy)-7-oxy-bicyclo[2.2.1]hept-2-ene),
poly(5-(tert-butoxy)-7-oxy-bicyclo[2.2.1]hept-2-ene),
poly(5-(n-pentoxy)-7-oxy-bicyclo[2.2.1]hept-2-ene),
poly(5-cyclopentyloxy-7-oxy-bicyclo[2.2.1]hept-2-ene),
poly(5-cyclohexyloxy-7-oxy-bicyclo[2.2.1]hept-2-ene), and
poly(5-cyclopentyloxy-7-oxy-bicyclo[2.2.1]hept-2-ene) in a case where at least one of $R^5$ to $R^8$ represents an alkoxy group;
poly(5-phenyloxy-7-oxy-bicyclo[2.2.1]hept-2-ene),
poly(5-naphthyloxy-7-oxy-bicyclo[2.2.1]hept-2-ene),
poly(5-anthracenyloxy-7-oxy-bicyclo[2.2.1]hept-2-ene),
poly(5-(o-tolyloxy)-7-oxy-bicyclo[2.2.1]hept-2-ene),
poly(5-(m-tolyloxy)-7-oxy-bicyclo[2.2.1]hept-2-ene),
poly(5-(p-tolyloxy)-7-oxy-bicyclo[2.2.1]hept-2-ene),
poly(5-(4-oxy-1,1'-biphenyl)-7-oxy-bicyclo[2.2.1]hept-2-ene), and
poly(5-(4-hydroxyphenyloxy)-7-oxy-bicyclo[2.2.1]hept-2-ene) in a case where at least one of $R^5$ to $R^8$ represents an aryloxy group;
poly(5-methoxymethyl-7-oxy-bicyclo[2.2.1]hept-2-ene),
poly(5-methoxyethyl-7-oxy-bicyclo[2.2.1]hept-2-ene),
poly(5-ethoxymethyl-7-oxy-bicyclo[2.2.1]hept-2-ene),
poly(5-ethoxyethyl-7-oxy-bicyclo[2.2.1]hept-2-ene),
poly(5-(n-propoxymethyl)-7-oxy-bicyclo[2.2.1]hept-2-ene),
poly(5-isopropoxymethyl-7-oxy-bicyclo[2.2.1]hept-2-ene),
poly(5-(n-butoxymethyl)-7-oxy-bicyclo[2.2.1]hept-2-ene),
poly(5-isobutoxymethyl-7-oxy-bicyclo[2.2.1]hept-2-ene),
poly(5-(tert-butoxymethyl)-7-oxy-bicyclo[2.2.1]hept-2-ene),
poly(5-cyclopentyloxymethyl-7-oxy-bicyclo[2.2.1]hept-2-ene),
poly(5-cyclohexyloxymethyl-7-oxy-bicyclo[2.2.1]hept-2-ene), and
poly(5-cyclooctyloxymethyl-7-oxy-bicyclo[2.2.1]hept-2-ene) in a case where at least one of $R^5$ to $R^8$ represents an alkoxyalkyl group;
poly(5-phenyloxymethyl-7-oxy-bicyclo[2.2.1]hept-2-ene),
poly(5-naphthyloxymethyl-7-oxy-bicyclo[2.2.1]hept-2-ene),
poly(5-anthracenyloxymethyl-7-oxy-bicyclo[2.2.1]hept-2-ene),
poly(5-(o-tolyloxymethyl)-7-oxy-bicyclo[2.2.1]hept-2-ene),
poly(5-(m-tolyloxymethyl)-7-oxy-bicyclo[2.2.1]hept-2-ene),
poly(5-(p-tolyloxymethyl)-7-oxy-bicyclo[2.2.1]hept-2-ene),
poly(5-(4-oxy-1,1'-biphenylmethyl)-7-oxy-bicyclo[2.2.1]hept-2-ene),
poly(5-(4-hydroxyphenyloxymethyl)-7-oxy-bicyclo[2.2.1]hept-2-ene) in a case where at least one of $R^5$ to $R^8$ represents an aryloxyalkyl group; poly(5-methoxycarbonyl-7-oxy-bicyclo[2.2.1]hept-2-ene),
poly(5-ethoxycarbonyl-7-oxy-bicyclo[2.2.1]hept-2-ene),
poly(5-(n-propoxycarbonyl)-7-oxy-bicyclo[2.2.1]hept-2-ene),
poly(5-(n-butoxycarbonyl)-7-oxy-bicyclo[2.2.1]hept-2-ene),
poly(5-isobutoxycarbonyl-7-oxy-bicyclo[2.2.1]hept-2-ene),
poly(5-(tert-butoxycarbonyl)-7-oxy-bicyclo[2.2.1]hept-2-ene),
poly(5-(n-pentyloxycarbonyl)-7-oxy-bicyclo[2.2.1]hept-2-ene),
poly(5-(2-methyl-2-pentyloxycarbonyl)-7-oxy-bicyclo[2.2.1]hept-2-ene),
poly(5-(3-methyl-3-pentyloxycarbonyl)-7-oxy-bicyclo[2.2.1]hept-2-ene), poly(5-(2-ethyl-3-methyl-3-pentyloxycarbonyl)-7-oxy-bicyclo[2.2.1]hept-2-ene),
poly(5-cyclopentyloxycarbonyl-7-oxy-bicyclo[2.2.1]hept-2-ene),
poly(5-(n-hexyloxycarbonyl)-7-oxy-bicyclo[2.2.1]hept-2-ene),
poly(5-cyclohexyloxycarbonyl-7-oxy-bicyclo[2.2.1]hept-2-ene),
poly(5-(2-methyl-2-butoxycarbonyl)-7-oxy-bicyclo[2.2.1]hept-2-ene),
poly(5-(2,3-dimethyl-2-butoxycarbonyl)-7-oxy-bicyclo[2.2.1]hept-2-ene),
poly(5-(2,3,3-trimethyl-2-butoxycarbonyl)-7-oxy-bicyclo[2.2.1]hept-2-ene),
poly(5-(2-methyl-2-hexyloxycarbonyl)-7-oxy-bicyclo[2.2.1]hept-2-ene),
poly(5-(3,4-dimethyl-3-hexyloxycarbonyl)-7-oxy-bicyclo[2.2.1]hept-2-ene),
poly(5-(3-methylbutoxycarbonyl)-7-oxy-bicyclo[2.2.1]hept-2-ene),
poly(5-(2-methylpentoxycarbonyl)-7-oxy-bicyclo[2.2.1]hept-2-ene),
poly(5-(3-methylpentoxycarbonyl)-7-oxy-bicyclo[2.2.1]hept-2-ene),
poly(5-(4-methylpentoxycarbonyl)-7-oxy-bicyclo[2.2.1]hept-2-ene),
poly(5-(3-methyl-3-heptyloxycarbonyl)-7-oxy-bicyclo[2.2.1]hept-2-ene),
poly(5-(2-cyclopentyl-2-propoxycarbonyl)-7-oxy-bicyclo[2.2.1]hept-2-ene),
poly(5-(2-cyclohexyl-2-propoxycarbonyl)-7-oxy-bicyclo[2.2.1]hept-2-ene),
poly(5-(2-norbornyl-2-propoxycarbonyl)-7-oxy-bicyclo[2.2.1]hept-2-ene),
poly(5-(1,1-dicyclopentylethoxycarbonyl)-7-oxy-bicyclo[2.2.1]hept-2-ene),
poly(5-(1,1-dicyclohexylethoxycarbonyl)-7-oxy-bicyclo[2.2.1]hept-2-ene),
poly(5-(1-methylcyclopentyloxycarbonyl)-7-oxy-bicyclo[2.2.1]hept-2-ene),
poly(5-(1-ethylcyclopentyloxycarbonyl)-7-oxy-bicyclo[2.2.1]hept-2-ene),
poly(5-(1-methylcyclohexyloxycarbonyl)-7-oxy-bicyclo[2.2.1]hept-2-ene),
poly(5-(1-ethylcyclohexyloxycarbonyl)-7-oxy-bicyclo[2.2.1]hept-2-ene),
poly(5-(1-methylcyclooctyloxycarbonyl)-7-oxy-bicyclo[2.2.1]hept-2-ene),
poly(5-(1-ethylcyclooctyloxycarbonyl)-7-oxy-bicyclo[2.2.1]hept-2-ene),
poly(5-(1-adamantyloxycarbonyl)-7-oxy-bicyclo[2.2.1]hept-2-ene),
poly(5-(2-methyl-2-adamantyloxycarbonyl)-7-oxy-bicyclo[2.2.1]hept-2-ene),
poly(5-(2-ethyl-2-adamantyloxycarbonyl)-7-oxy-bicyclo[2.2.1]hept-2-ene),
poly(5-(1-methyldecahydronaphthalene-1-yloxycarbonyl)-7-oxy-bicyclo[2.2.1]hept-2-ene),
poly(5-(1-ethyldecahydronaphthalene-1-yloxycarbonyl)-7-oxy-bicyclo[2.2.1]hept-2-ene),
poly(5-(2-methyldecahydronaphthalene-2-yloxycarbonyl)-7-oxy-bicyclo[2.2.1]hept-2-ene),
poly(5-(2-ethyldecahydronaphthalene-2-yloxycarbonyl)-7-oxy-bicyclo[2.2.1]hept-2-ene),
poly(5-(2-methyl-2-norbornyloxycarbonyl)-7-oxy-bicyclo[2.2.1]hept-2-ene),
poly(5-(2-ethyl-2-norbornyloxycarbonyl)-7-oxy-bicyclo[2.2.1]hept-2-ene),
poly(5-(2,7,7-trimethyl-2-norbornyloxycarbonyl)-7-oxy-bicyclo[2.2.1]hept-2-ene),
poly(5-(2-ethyl-7,7-dimethyl-2-norbornyloxycarbonyl)-7-oxy-bicyclo[2.2.1]hept-2-ene),
poly(5-(5-methyl-octahydro-4,7-methano-indene-5-yloxycarbonyl)-7-oxy-bicyclo[2.2.1]hept-2-ene),
poly(5-(5-ethyl-octahydro-4,7-methano-indene-5-yloxycarbonyl)-7-oxy-bicyclo[2.2.1]hept-2-ene),
poly(5-(4-methyl-tetracyclo[6.2.1.1$^{3,6}$.0$^{2,7}$]-dodecane-4-yloxycarbonyl)-7-oxy-bicyclo[2.2.1]hept-2-ene), and
poly(5-(4-ethyl-tetracyclo[6.2.1.1$^{3,6}$.0$^{2,7}$]-dodecane-4-yloxycarbonyl)-7-oxy-bicyclo[2.2.1]hept-2-ene) in a case where at least one of $R^5$ to $R^8$ represents an alkoxycarbonyl group;
poly(5-dimethylaminocarbonyl-7-oxy-bicyclo[2.2.1]hept-2-ene),
poly(5-diethylaminocarbonyl-7-oxy-bicyclo[2.2.1]hept-2-ene),
poly(5-ethylmethylaminocarbonyl-7-oxy-bicyclo[2.2.1]hept-2-ene),
poly(5-methylbutylaminocarbonyl-7-oxy-bicyclo[2.2.1]hept-2-ene),
poly(5-butylethylaminocarbonyl-7-oxy-bicyclo[2.2.1]hept-2-ene), and
poly(5-cyclohexylmethylaminocarbonyl-7-oxy-bicyclo[2.2.1]hept-2-ene) in a case where at least one of $R^5$ to $R^8$ represents a dialkylaminocarbonyl group;
poly(5-phenoxycarbonyl-7-oxy-bicyclo[2.2.1]hept-2-ene),
poly(5-benzyloxycarbonyl-7-oxy-bicyclo[2.2.1]hept-2-ene),
poly(5-(4-methylphenoxycarbonyl)-7-oxy-bicyclo[2.2.1]hept-2-ene),
poly(5-(3,4-dimethylphenoxycarbonyl)-7-oxy-bicyclo[2.2.1]hept-2-ene),
poly(5-(1-naphthoxycarbonyl)-7-oxy-bicyclo[2.2.1]hept-2-ene),
poly(5-(2-naphthoxycarbonyl)-7-oxy-bicyclo[2.2.1]hept-2-ene), and
poly(5-(1-anthracenoxycarbonyl)-7-oxy-bicyclo[2.2.1]hept-2-ene) in a case where at least one of $R^5$ to $R^8$ represents an aryloxycarbonyl group;
poly(5-methylphenylaminocarbonyl-7-oxy-bicyclo[2.2.1]hept-2-ene),
poly(5-ethylphenylaminocarbonyl-7-oxy-bicyclo[2.2.1]hept-2-ene),
poly(5-butylphenylaminocarbonyl-7-oxy-bicyclo[2.2.1]hept-2-ene), and
poly(5-cyclohexylphenylaminocarbonyl-7-oxy-bicyclo[2.2.1]hept-2-ene) in a case where at least one of $R^5$ to $R^8$ represents an alkylarylaminocarbonyl group;
poly(5-methoxycarbonylmethyl-7-oxy-bicyclo[2.2.1]hept-2-ene),
poly(5-methoxycarbonylethyl-7-oxy-bicyclo[2.2.1]hept-2-ene),
poly(5-ethoxycarbonylmethyl-7-oxy-bicyclo[2.2.1]hept-2-ene),
poly(5-ethoxycarbonylethyl-7-oxy-bicyclo[2.2.1]hept-2-ene),
poly(5-(n-propoxycarbonylmethyl)-7-oxy-bicyclo[2.2.1]hept-2-ene),
poly(5-(i-propoxycarbonylmethyl)-7-oxy-bicyclo[2.2.1]hept-2-ene),
poly(5-(n-butoxycarbonylmethyl)-7-oxy-bicyclo[2.2.1]hept-2-ene), poly(5-(tert-butoxycarbonylmethyl)-7-oxy-bicyclo[2.2.1]hept-2-ene),
poly(5-(n-pentyloxycarbonylmethyl)-7-oxy-bicyclo[2.2.1]hept-2-ene),
poly(5-(2-methyl-2-butoxycarbonyl)methyl)-7-oxy-bicyclo[2.2.1]hept-2-ene),
poly(5-(2,3-dimethyl-2-butoxycarbonyl)methyl)-7-oxy-bicyclo[2.2.1]hept-2-ene),
poly(5-cyclopentyloxycarbonylmethyl-7-oxy-bicyclo[2.2.1]hept-2-ene),
poly(5-(n-hexyloxycarbonylmethyl)-7-oxy-bicyclo[2.2.1]hept-2-ene poly(5-cyclohexyloxycarbonylmethyl-7-oxy-bicyclo[2.2.1]hept-2-ene),
poly(5-(n-octyloxycarbonylmethyl)-7-oxy-bicyclo[2.2.1]hept-2-ene poly(5-cyclooctyloxycarbonylmethyl-7-oxy-bicyclo[2.2.1]hept-2-ene),
poly(5-(2-cyclopentyl-2-propoxycarbonyl)methyl)-7-oxy-bicyclo[2.2.1]hept-2-ene),
poly(5-(2-cyclohexyl-2-propoxycarbonyl)methyl)-7-oxy-bicyclo[2.2.1]hept-2-ene),
poly(5-(1-methylcyclopentyloxycarbonyl)methyl)-7-oxy-bicyclo[2.2.1]hept-2-ene),
poly(5-(1-ethylcyclopentyloxycarbonyl)methyl)-7-oxy-bicyclo[2.2.1]hept-2-ene),
poly(5-(1-methylcyclohexyloxycarbonyl)methyl)-7-oxy-bicyclo[2.2.1]hept-2-ene), and
poly(5-(1-ethylcyclohexyloxycarbonyl)methyl)-7-oxy-bicyclo[2.2.1]hept-2-ene) in a case where at least one of $R^5$ to $R^8$ represents an alkoxycarbonylalkyl group;
poly(5-methoxycarbonylphenyl-7-oxy-bicyclo[2.2.1]hept-2-ene),
poly(5-ethoxycarbonylphenyl-7-oxy-bicyclo[2.2.1]hept-2-ene),
poly(5-(n-propoxycarbonylphenyl)-7-oxy-bicyclo[2.2.1]hept-2-ene),
poly(5-(i-propoxycarbonylphenyl)-7-oxy-bicyclo[2.2.1]hept-2-ene),
poly(5-(n-butoxycarbonylphenyl)-7-oxy-bicyclo[2.2.1]hept-2-ene),
poly(5-(tert-butoxycarbonylphenyl)-7-oxy-bicyclo[2.2.1]hept-2-ene),
poly(5-(n-pentyloxycarbonylphenyl)-7-oxy-bicyclo[2.2.1]hept-2-ene),
poly(5-(3-(2-methyl-2-butoxycarbonyl)phenyl)-7-oxy-bicyclo[2.2.1]hept-2-ene),
poly(5-(3-(2,3-dimethyl-2-butoxycarbonyl)phenyl)-7-oxy-bicyclo[2.2.1]hept-2-ene),
poly(5-(3-(2-cyclopentyl-2-propoxycarbonyl)phenyl)-bicyclo[2.2.1]hept-2-ene),
poly(5-(3-(2-cyclohexyl-2-propoxycarbonyl)phenyl)-7-oxy-bicyclo[2.2.1]hept-2-ene),
poly(5-(3-(1-methylcyclopentyloxycarbonyl)phenyl)-7-oxy-bicyclo[2.2.1]hept-2-ene),
poly(5-(3-(1-ethylcyclopentyloxycarbonyl)phenyl)-7-oxy-bicyclo[2.2.1]hept-2-ene),
poly(5-(3-(1-methylcyclohexyloxycarbonyl)phenyl)-7-oxy-bicyclo[2.2.1]hept-2-ene),
poly(5-(3-(1-ethylcyclohexyloxycarbonyl)phenyl)-7-oxy-bicyclo[2.2.1]hept-2-ene),
poly(5-(4-(2-methyl-2-butoxycarbonyl)phenyl)-7-oxy-bicyclo[2.2.1]hept-2-ene),
poly(5-(4-(2,3-dimethyl-2-butoxycarbonyl)phenyl)-7-oxy-bicyclo[2.2.1]hept-2-ene),
poly(5-(4-(2-cyclopentyl-2-propoxycarbonyl)phenyl)-7-oxy-bicyclo [2.2.1]hept-2-ene),
poly(5-(4-(2-cyclohexyl-2-propoxycarbonyl)phenyl)-7-oxy-bicyclo[2.2.1]hept-2-ene),
poly(5-(4-(1-methylcyclopentyloxycarbonyl)phenyl)-7-oxy-bicyclo[2.2.1]hept-2-ene),
poly(5-(4-(1-ethylcyclopentyloxycarbonyl)phenyl)-7-oxy-bicyclo[2.2.1]hept-2-ene),
poly(5-(4-(1-methylcyclohexyloxycarbonyl)phenyl)-7-oxy-bicyclo[2.2.1]hept-2-ene),
poly(5-(4-(1-ethylcyclohexyloxycarbonyl)phenyl)-7-oxy-bicyclo[2.2.1]hept-2-ene),
poly(5-methoxycarbonylnaphthyl-7-oxy-bicyclo[2.2.1]hept-2-ene),
poly(5-ethoxycarbonylnaphthyl-7-oxy-bicyclo[2.2.1]hept-2-ene),
poly(5-(n-propoxycarbonylnaphthyl)-7-oxy-bicyclo[2.2.1]hept-2-ene),
poly(5-(i-propoxycarbonylnaphthyl)-7-oxy-bicyclo[2.2.1]hept-2-ene),
poly(5-(n-butoxycarbonylnaphthyl)-7-oxy-bicyclo[2.2.1]hept-2-ene),
poly(5-(tert-butoxycarbonylphenyl)-7-oxy-bicyclo[2.2.1]hept-2-ene),
poly(5-(n-pentyloxycarbonylnaphthyl)-7-oxy-bicyclo[2.2.1]hept-2-ene),
poly(5-(5-(2-methyl-2-butoxycarbonyl)naphthyl)-7-oxy-bicyclo[2.2.1]hept-2-ene),
poly(5-(5-(2,3-dimethyl-2-butoxycarbonyl)naphthyl)-7-oxy-bicyclo [2.2.1]hept-2-ene),
poly(5-(5-(2-cyclopentyl-2-propoxycarbonyl)naphthyl)-7-oxy-bicyclo[2.2.1]hept-2-ene),
poly(5-(5-(2-cyclohexyl-2-propoxycarbonyl)naphthyl)-7-oxy-bicyclo[2.2.1]hept-2-ene),
poly(5-(5-(1-methylcyclopentyloxycarbonyl)naphthyl)-7-oxy-bicyclo[2.2.1]hept-2-ene),
poly(5-(5-(1-ethylcyclopentyloxycarbonyl)naphthyl)-7-oxy-bicyclo [2.2.1]hept-2-ene),
poly(5-(5-(1-methylcyclohexyloxycarbonyl)naphthyl)-7-oxy-bicyclo [2.2.1]hept-2-ene), and
poly(5-(5-(1-ethylcyclohexyloxycarbonyl)naphthyl)-7-oxy-bicyclo[2.2.1]hept-2-ene) in a case where at least one of $R^5$ to $R^8$ represents an alkoxycarbonylaryl group;
poly(5-phenoxycarbonylmethyl-7-oxy-bicyclo[2.2.1]hept-2-ene),
poly(5-benzyloxycarbonylmethyl-7-oxy-bicyclo[2.2.1]hept-2-ene),
poly(5-(4-methylphenoxycarbonylmethyl)-7-oxy-bicyclo[2.2.1]hept-2-ene),
poly(5-(3,4-dimethylphenoxycarbonylmethyl)-7-oxy-bicyclo[2.2.1]hept-2-ene),
poly(5-(1-naphthoxycarbonylmethyl)-7-oxy-bicyclo[2.2.1]hept-2-ene),
poly(5-(2-naphthoxycarbonylmethyl)-7-oxy-bicyclo[2.2.1]hept-2-ene), and
poly(5-(1-anthracenoxycarbonylmethyl)-7-oxy-bicyclo[2.2.1]hept-2-ene) in a case where at least one of $R^5$ to $R^8$ represents an aryloxycarbonylalkyl group;
poly(5-methoxymethyloxycarbonyl-7-oxy-bicyclo[2.2.1]hept-2-ene),
poly(5-ethoxymethyloxycarbonyl-7-oxy-bicyclo[2.2.1]hept-2-ene),
poly(5-(n-propoxymethyloxycarbonyl)-7-oxy-bicyclo[2.2.1]hept-2-ene),
poly(5-isopropoxymethyloxycarbonyl-7-oxy-bicyclo[2.2.1]hept-2-ene),
poly(5-(n-butoxymethyloxycarbonyl)-7-oxy-bicyclo[2.2.1]hept-2-ene),
poly(5-(tert-butoxymethyloxycarbonyl)-7-oxy-bicyclo[2.2.1]hept-2-ene), poly(5-cyclopentyloxymethyloxycarbonyl)-7-oxy-bicyclo[2.2.1]hept-2-ene),
poly(5-cyclohexyloxymethyloxycarbonyl-7-oxy-bicyclo[2.2.1]hept-2-ene),
poly(5-cyclooctyloxymethyloxycarbonyl-7-oxy-bicyclo[2.2.1]hept-2-ene),
poly(5-norbornyloxymethyloxycarbonyl-7-oxy-bicyclo[2.2.1]hept-2-ene),
poly(5-(1-methylcyclopentyloxymethyloxycarbonyl)-7-oxy-bicyclo[2.2.1]hept-2-ene),
poly(5-(1-ethylcyclopentyloxymethyloxycarbonyl)-7-oxy-bicyclo[2.2.1]hept-2-ene),
poly(5-(1-methylcyclohexyloxymethyloxycarbonyl)-7-oxy-bicyclo[2.2.1]hept-2-ene),
poly(5-(1-ethylcyclohexyloxymethyloxycarbonyl)-7-oxy-bicyclo[2.2.1]hept-2-ene),
poly(5-(1-methylnorbornyloxymethyloxycarbonyl)-7-oxy-bicyclo[2.2.1]hept-2-ene),
poly(5-(1-ethylnorbornyloxymethyloxycarbonyl)-7-oxy-bicyclo[2.2.1]hept-2-ene),
poly(5-(1-ethoxypropyloxymethyloxycarbonyl)-7-oxy-bicyclo[2.2.1]hept-2-ene),
poly(5-(1-ethoxy-1-methylethyloxymethyloxycarbonyl)-7-oxy-bicyclo[2.2.1]hept-2-ene),
poly(5-tetrahydrofuran-2-yloxymethyloxycarbonyl-7-oxy-bicyclo[2.2.1]hept-2-ene),
poly(5-tetrahydropyran-2-yloxymethyloxycarbonyl-7-oxy-bicyclo[2.2.1]hept-2-ene),
poly(5-(1-adamantyloxymethyloxycarbonyl)-7-oxy-bicyclo[2.2.1]hept-2-ene),
poly(5-(2-adamantyloxymethyloxycarbonyl)-7-oxy-bicyclo[2.2.1]hept-2-ene),
poly(5-(1-(1-methoxy)ethoxycarbonyl)-7-oxy-bicyclo[2.2.1]hept-2-ene),
poly(5-(1-(1-ethoxy)ethoxycarbonyl)-7-oxy-bicyclo[2.2.1]hept-2-ene),
poly(5-(1-(1-n-propoxy)ethoxycarbonyl)-7-oxy-bicyclo[2.2.1]hept-2-ene),
poly(5-(1-(1-isopropoxy)ethoxycarbonyl)-7-oxy-bicyclo[2.2.1]hept-2-ene),
poly(5-(1-(1-n-butoxy)ethoxycarbonyl)-7-oxy-bicyclo[2.2.1]hept-2-ene),
poly(5-(1-(1-tert-butoxy)ethoxycarbonyl)-7-oxy-bicyclo[2.2.1]hept-2-ene),
poly(5-(1-(1-cyclopentyloxy)ethoxycarbonyl)-7-oxy-bicyclo[2.2.1]hept-2-ene),
poly(5-(1-(1-cyclohexyloxy)ethoxycarbonyl)-7-oxy-bicyclo[2.2.1]hept-2-ene),
poly(5-(1-(1-cyclooctyloxy)ethoxycarbonyl)-7-oxy-bicyclo[2.2.1]hept-2-ene),
poly(5-(1-(1-norbornyloxy)ethoxycarbonyl)-7-oxy-bicyclo[2.2.1]hept-2-ene),
poly(5-(1-(1-methylcyclopentyloxy)ethoxycarbonyl)-7-oxy-bicyclo[2.2.1]hept-2-ene),
poly(5-(1-(1-ethylcyclopentyloxy)ethoxycarbonyl)-7-oxy-bicyclo[2.2.1]hept-2-ene),
poly(5-(1-(1-methylcyclohexyloxy)ethoxycarbonyl)-7-oxy-bicyclo[2.2.1]hept-2-ene),
poly(5-(1-(1-ethylcyclohexyloxy)ethoxycarbonyl)-7-oxy-bicyclo[2.2.1]hept-2-ene),
poly(5-(1-(1-methylnorbornyloxy)ethoxycarbonyl)-7-oxy-bicyclo[2.2.1]hept-2-ene),
poly(5-(1-(1-ethylnorbornyloxy)ethoxycarbonyl)-7-oxy-bicyclo[2.2.1]hept-2-ene),
poly(5-(1-(1-ethoxypropyloxy)ethoxycarbonyl)-7-oxy-bicyclo[2.2.1]hept-2-ene),
poly(5-(1-(1-ethoxy-1-methylethyloxy)ethoxycarbonyl)-7-oxy-bicyclo[2.2.1]hept-2-ene),
poly(5-(1-(tetrahydrofuran-2-yloxy)ethoxycarbonyl)-7-oxy-bicyclo [2.2.1]hept-2-ene),
poly(5-(1-(tetrahydropyran-2-yloxy)ethoxycarbonyl)-7-oxy-bicyclo[2.2.1]hept-2-ene),
poly(5-(1-(1-adamantyloxy)ethoxycarbonyl)-7-oxy-bicyclo[2.2.1]hept-2-ene), and
poly(5-(1-(2-adamantyloxy)ethoxycarbonyl)-7-oxy-bicyclo[2.2.1]hept-2-ene) in a case where at least one of $R^5$ to $R^8$ represents an alkoxyalkyloxycarbonyl group; and poly(5-methoxycarbonylmethyloxycarbonyl-7-oxy-bicyclo[2.2.1]hept-2-ene),
poly(5-ethoxycarbonylmethyloxycarbonyl-7-oxy-bicyclo[2.2.1]hept-2-ene),
poly(5-(n-propoxycarbonylmethyloxycarbonyl)-7-oxy-bicyclo[2.2.1]hept-2-ene),
poly(5-(isopropoxycarbonylmethyloxycarbonyl-7-oxy-bicyclo[2.2.1]hept-2-ene),
poly(5-(n-butoxycarbonylmethyloxycarbonyl)-7-oxy-bicyclo[2.2.1]hept-2-ene),
poly(5-(tert-butoxycarbonylmethyloxycarbonyl)-7-oxy-bicyclo[2.2.1]hept-2-ene),
poly(5-(2-cyclopentyl-2-propoxycarbonylmethyloxycarbonyl)-7-oxy-bicyclo[2.2.1]hept-2-ene),
poly(5-(2-cyclopentyl-2-butoxycarbonylmethyloxycarbonyl)-7-oxy-bicyclo[2.2.1]hept-2-ene),
poly(5-(2-cyclohexyl-2-propoxycarbonylmethyloxycarbonyl)-7-oxy-bicyclo[2.2.1]hept-2-ene),
poly(5-(3-(2-cyclohexyl-2-propoxycarbonyl)propoxycarbonyl)-7-oxy-bicyclo[2.2.1]hept-2-ene),
poly(5-(2-cyclohexyl-2-butoxycarbonylmethyloxycarbonyl)-7-oxy-bicyclo[2.2.1]hept-2-ene),
poly(5-(3-cyclohexyl-3-pentyloxycarbonylmethyloxycarbonyl)-7-oxy-bicyclo[2.2.1]hept-2-ene),
poly(5-(2-ethyl-2-norbornyloxycarbonylmethyloxycarbonyl)-7-oxy-bicyclo[2.2.1]hept-2-ene),
poly(5-(2-norbornyl-2-propoxycarbonylmethyloxycarbonyl)-7-oxy-bicyclo[2.2.1]hept-2-ene),
poly(5-(4-ethyl-tetracyclo[6.2.1.1$^{3,6}$.0$^{2,7}$]-dodecane-4-yloxycarbonylmethyloxycarbonyl)-7-oxy-bicyclo[2.2.1]hept-2-ene),
poly(5-(2-tetracyclo[6.2.1.1$^{3,6}$.0$^{2,7}$]-dodecane-4-yl)-2-propoxycarbonylmethyloxycarbonyl)-7-oxy-bicyclo[2.2.1]hept-2-ene),
poly(5-(1,1-dicyclohexylethoxycarbonylmethyloxycarbonyl)-7-oxy-bicyclo[2.2.1]hept-2-ene),
poly(5-(1,1-dicyclohexylpropoxycarbonylmethyloxycarbonyl)-7-oxy-bicyclo[2.2.1]hept-2-ene),
poly(5-cyclopentyloxycarbonylmethyloxycarbonyl-7-oxy-bicyclo[2.2.1]hept-2-ene),
poly(5-cyclohexyloxycarbonylmethyloxycarbonyl-7-oxy-bicyclo[2.2.1]hept-2-ene),
poly(5-cyclooctyloxycarbonylmethyloxycarbonyl-7-oxy-bicyclo[2.2.1]hept-2-ene),
poly(5-norbornyloxycarbonylmethyloxycarbonyl-7-oxy-bicyclo[2.2.1]hept-2-ene),
poly(5-(1-methylcyclopentyloxycarbonylmethyloxycarbonyl-7-oxy-bicyclo[2.2.1]hept-2-ene),
poly(5-(1-ethylcyclopentyloxycarbonylmethyloxycarbonyl)-7-oxy-bicyclo[2.2.1]hept-2-ene),
poly(5-(1-methylcyclohexyloxycarbonylmethyloxycarbonyl)-7-oxy-bicyclo[2.2.1]hept-2-ene),
poly(5-(1-ethylcyclohexyloxycarbonylmethyloxycarbonyl)-7-oxy-bicyclo[2.2.1]hept-2-ene),
poly(5-(1-methylnorbornyloxycarbonylmethyloxycarbonyl)-7-oxy-bicyclo[2.2.1]hept-2-ene), poly(5-(1-ethylnorbornyloxycarbonylmethyloxycarbonyl)-7-oxy-bicyclo[2.2.1]hept-2-ene),
poly(5-(1-ethoxypropyloxycarbonylmethyloxycarbonyl)-7-oxy-bicyclo[2.2.1]hept-2-ene),
poly(5-(1-ethoxy-1-methylethyloxycarbonylmethyloxycarbonyl)-7-oxy-bicyclo[2.2.1]hept-2-ene),
poly(5-tetrahydrofuran-2-yloxycarbonylmethyloxycarbonyl-7-oxy-bicyclo[2.2.1]hept-2-ene),
poly(5-tetrahydropyran-2-yloxycarbonylmethyloxycarbonyl-7-oxy-bicyclo[2.2.1]hept-2-ene),
poly(5-(1-adamantyloxycarbonylmethyloxycarbonyl)-7-oxy-bicyclo[2.2.1]hept-2-ene),
poly(5-(2-adamantyloxycarbonylmethyloxycarbonyl)-7-oxy-bicyclo[2.2.1]hept-2-ene),
poly(5-(1-(2-(1-adamantyl)-2-propoxycarbonyl)ethoxycarbonyl)-7-oxy-bicyclo[2.2.1]hept-2-ene),
poly(5-(3-(2-(1-adamantyl)-2-propoxycarbonyl)propoxycarbonyl)-7-oxy-bicyclo[2.2.1]hept-2-ene),
poly(5-(2-(2-(1-adamantyl)-2-propoxycarbonyl)-2-propoxycarbonyl)-7-oxy-bicyclo[2.2.1]hept-2-ene),
poly(5-(2-methyl-2-adamantyloxycarbonylmethyloxycarbonyl)-bicyclo[2.2.1]hept-2-ene),
poly(5-(3-(2-methyl-2-adamantyloxycarbonyl)propoxycarbonyl)-7-oxy-bicyclo[2.2.1]hept-2-ene),
poly(5-(2-(2-methyl-2-adamantyloxycarbonyl)-2-propoxycarbonyl)-7-oxy-bicyclo[2.2.1]hept-2-ene),
poly(5-(1-(2-methyl-2-adamantyloxycarbonyl)ethoxycarbonyl)-7-oxy-bicyclo[2.2.1]hept-2-ene),
poly(5-(2-ethyl-2-adamantyloxycarbonylmethyloxycarbonyl)-7-oxy-bicyclo[2.2.1]hept-2-ene),
poly(5-(2-isopropyl-2-adamantyloxycarbonylmethyloxycarbonyl)-7-oxy-bicyclo[2.2.1]hept-2-ene),
poly(5-(2-(1-adamantyl)-2-propoxycarbonylmethyloxycarbonyl)-7-oxy-bicyclo[2.2.1]hept-2-ene),
poly(5-(2-(1-adamantyl)-2-butoxycarbonylmethyloxycarbonyl)-7-oxy-bicyclo[2.2.1]hept-2-ene),
poly(5-(3-(1-adamantyl)-3-pentyloxycarbonylmethyloxycarbonyl)-7-oxy-bicyclo[2.2.1]hept-2-ene),
poly(5-(3-tert-butoxycarbonyl-1-cyclopentyloxycarbonyl)-7-oxy-bicyclo[2.2.1]hept-2-ene),
poly(5-(3-(1-methylcyclohexyloxycarbonyl)-1-cyclopentyloxycarbonyl)-7-oxy-bicyclo[2.2.1]hept-2-ene),
poly(5-(5-tert-butoxycarbonyl-2-norbornyloxycarbonyl)-7-oxy-bicyclo[2.2.1]hept-2-ene),
poly(5-(5-(1-methylcyclohexyloxycarbonyl)-2-norbornyloxycarbonyl)-7-oxy-bicyclo[2.2.1]hept-2-ene),
poly(5-(5,5-di(tert-butoxycarbonyl)-2-norbornyloxycarbonyl)-7-oxy-bicyclo[2.2.1]hept-2-ene),
poly(5-(5,6-di(tert-butoxycarbonyl)-2-norbornyloxycarbonyl)-7-oxy-bicyclo[2.2.1]hept-2-ene),
poly(5-(1-(1-methylcyclohexyloxycarbonyl)-octahydro-4,7-methano-indene-5-yloxycarbonyl)-7-oxy-bicyclo[2.2.1]hept-2-ene),
poly(5-(6-tert-butoxycarbonyl-tetrahydronaphthalene-2-yloxycarbonyl)-7-oxy-bicyclo[2.2.1]hept-2-ene),
poly(5-(9-tert-butoxycarbonyl-tetracyclo[6.2.1.1$^{3,6}$.0$^{2,7}$]-dodecane-4-yloxycarbonyl)-7-oxy-bicyclo[2.2.1]hept-2-ene), and
poly(5-(9-(1-methylcyclohexyloxycarbonyl)-tetracyclo[6.2.1.1$^{3,6}$.0$^{2,7}$]-dodecane-4-yloxycarbonyl)-7-oxy-bicyclo[2.2.1]hept-2-ene) in a case where at least one of $R^5$ to $R^8$ represents an alkoxycarbonylalkyloxycarbonyl group.

In a case where $R^5$ to $R^8$ are bonded to one another to form a ring structure, examples of the cyclic alkyl structure include poly(1,4,4a,5,6,7,8,8a-octahydro-1,4-ethano-naphthalene). Examples of the cyclic ester structure which can form a lactone ring include poly(4,10-dioxy-tricyclo[5.2.1.0$^{2,6}$]-8-decene-3-one) as a γ-butyrolactone structure; poly(4,10-dioxy-tricyclo[6.2.1.0$^{2,7}$]-9-undecene-3-one) as a δ-valerolactone structure; and poly(4,10-dioxy-tricyclo[5.2.1.0$^{2,6}$]-8-decene-3,5-dione) as a cyclic acid anhydride structure. Examples of the cyclic amide structure which can form a lactam ring include
poly(4-methyl-4-aza-10-oxy-tricyclo[5.2.1.0$^{2,6}$]-8-decene-3-one),
poly(4-ethyl-4-aza-10-oxy-tricyclo[5.2.1.0$^{2,6}$]-8-decene-3-one),
poly(4-(n-propyl)-4-aza-10-oxy-tricyclo[5.2.1.0$^{2,6}$]-8-decene-3-one),
poly(4-(n-butyl)-4-aza-10-oxy-tricyclo[5.2.1.0$^{2,6}$]-8-decene-3-one),
poly(4-(1-methylbutyl)-4-aza-10-oxy-tricyclo[5.2.1.0$^{2,6}$]-8-decene-3-one),
poly(4-cyclopentyl-4-aza-10-oxy-tricyclo[5.2.1.0$^{2,6}$]-8-decene-3-one),
poly(4-cyclohexyl-4-aza-10-oxy-tricyclo[5.2.1.0$^{2,6}$]-8-decene-3-one),
poly(4-phenyl-4-aza-10-oxy-tricyclo[5.2.1.0$^{2,6}$]-8-decene-3-one), and
poly(4-(4-hydroxyphenyl)-4-aza-10-oxy-tricyclo[5.2.1.0$^{2,6}$]-8-decene-3-one) as γ-lactam;
poly(4-methyl-4-aza-10-oxy-tricyclo[6.2.1.0$^{2,7}$]-9-undecene-3-one),
poly(4-ethyl-4-aza-10-oxy-tricyclo[6.2.1.0$^{2,7}$]-9-undecene-3-one),
poly(4-(n-propyl)-4-aza-10-oxy-tricyclo[6.2.1.0$^{2,7}$]-9-undecene-3-one),
poly(4-(n-butyl)-4-aza-10-oxy-tricyclo[6.2.1.0$^{2,7}$]-9-undecene-3-one),
poly(4-cyclobutyl-4-aza-10-oxy-tricyclo[6.2.1.0$^{2,7}$]-9-undecene-3-one),
poly(4-cyclopentyl-4-aza-10-oxy-tricyclo[6.2.1.0$^{2,7}$]-9-undecene-3-one),
poly(4-cyclohexyl-4-aza-10-oxy-tricyclo[6.2.1.0$^{2,7}$]-9-undecene-3-one),
poly(4-phenyl-4-aza-10-oxy-tricyclo[6.2.1.0$^{2,7}$]-9-undecene-3-one), and
poly(4-(4-hydroxyphenyl)-4-aza-10-oxy-tricyclo[6.2.1.0$^{2,7}$]-9-undecene-3-one) as δ-lactam. Examples of the cyclic imide structure which can form a maleimide ring include
poly(4-methyl-4-aza-10-oxy-tricyclo[5.2.1.0$^{2,6}$]-8-decene-3,5-dione),
poly(4-(ethyl-4-aza-10-oxy-tricyclo[5.2.1.0$^{2,6}$]-8-decene-3,5-dione),
poly(4-(n-propyl)-4-aza-10-oxy-tricyclo[5.2.1.0$^{2,6}$]-8-decene-3,5-dione),
poly(4-(n-butyl)-4-aza-10-oxy-tricyclo[5.2.1.0$^{2,6}$]-8-decene-3,5-dione),
poly(4-cyclobutyl-4-aza-10-oxy-tricyclo[5.2.1.0$^{2,6}$]-8-decene-3,5-dione),
poly(4-cyclopentyl-4-aza-10-oxy-tricyclo[5.2.1.0$^{2,6}$]-8-decene-3,5-dione),
poly(4-cyclohexyl-4-aza-10-oxy-tricyclo[5.2.1.0$^{2,6}$]-8-decene-3,5-dione),
poly(4-phenyl-4-aza-10-oxy-tricyclo[5.2.1.0$^{2,6}$]-8-decene-3,5-dione), and
poly(4-(4-hydroxyphenyl)-4-aza-10-oxy-tricyclo[5.2.1.0$^{2,6}$]-8-decene-3,5-dione).

Among these, in the repeating structural unit [B] represented by Formula (2) according to the present embodiment, as the cyclic olefin polymer in which n represents 0,
poly(5-methoxycarbonyl-7-oxy-bicyclo[2.2.1]hept-2-ene),
poly(5-ethoxycarbonyl-7-oxy-bicyclo[2.2.1]hept-2-ene),
poly(5-(n-propoxycarbonyl)-7-oxy-bicyclo[2.2.1]hept-2-ene),
poly(5-(n-butoxycarbonyl)-7-oxy-bicyclo[2.2.1]hept-2-ene),
poly(5-isobutoxycarbonyl-7-oxy-bicyclo[2.2.1]hept-2-ene),
poly(5-(tert-butoxycarbonyl)-7-oxy-bicyclo[2.2.1]hept-2-ene),
poly(5-(n-pentyloxycarbonyl)-7-oxy-bicyclo[2.2.1]hept-2-ene),
poly(5-(2-methyl-2-pentyloxycarbonyl)-7-oxy-bicyclo[2.2.1]hept-2-ene),
poly(5-(3-methyl-3-pentyloxycarbonyl)-7-oxy-bicyclo[2.2.1]hept-2-ene),
poly(5-(2-ethyl-3-methyl-3-pentyloxycarbonyl)-7-oxy-bicyclo[2.2.1]hept-2-ene),
poly(5-cyclopentyloxycarbonyl-7-oxy-bicyclo[2.2.1]hept-2-ene),
poly(5-(n-hexyloxycarbonyl)-7-oxy-bicyclo[2.2.1]hept-2-ene),
poly(5-cyclohexyloxycarbonyl-7-oxy-bicyclo[2.2.1]hept-2-ene),
poly(5-(2-methyl-2-butoxycarbonyl)-7-oxy-bicyclo[2.2.1]hept-2-ene),
poly(5-(2,3-dimethyl-2-butoxycarbonyl)-7-oxy-bicyclo[2.2.1]hept-2-ene),
poly(5-(2,3,3-trimethyl-2-butoxycarbonyl)-7-oxy-bicyclo[2.2.1]hept-2-ene),
poly(5-(2-methyl-2-hexyloxycarbonyl)-7-oxy-bicyclo[2.2.1]hept-2-ene),
poly(5-(3,4-dimethyl-3-hexyloxycarbonyl)-7-oxy-bicyclo[2.2.1]hept-2-ene),
poly(5-(3-methylbutoxycarbonyl)-7-oxy-bicyclo[2.2.1]hept-2-ene),
poly(5-(2-methylpentoxycarbonyl)-7-oxy-bicyclo[2.2.1]hept-2-ene),
poly(5-(3-methylpentoxycarbonyl)-7-oxy-bicyclo[2.2.1]hept-2-ene),
poly(5-(4-methylpentoxycarbonyl)-7-oxy-bicyclo[2.2.1]hept-2-ene),
poly(5-(3-methyl-3-heptyloxycarbonyl)-7-oxy-bicyclo[2.2.1]hept-2-ene),
poly(5-(2-cyclopentyl-2-propoxycarbonyl)-7-oxy-bicyclo[2.2.1]hept-2-ene),
poly(5-(2-cyclohexyl-2-propoxycarbonyl)-7-oxy-bicyclo[2.2.1]hept-2-ene),
poly(5-(2-norbornyl-2-propoxycarbonyl)-7-oxy-bicyclo[2.2.1]hept-2-ene),
poly(5-(1,1-dicyclopentylethoxycarbonyl)-7-oxy-bicyclo[2.2.1]hept-2-ene),
poly(5-(1,1-dicyclohexylethoxycarbonyl)-7-oxy-bicyclo[2.2.1]hept-2-ene),
poly(5-(1-methylcyclopentyloxycarbonyl)-7-oxy-bicyclo[2.2.1]hept-2-ene),
poly(5-(1-ethylcyclopentyloxycarbonyl)-7-oxy-bicyclo[2.2.1]hept-2-ene),
poly(5-(1-methylcyclohexyloxycarbonyl)-7-oxy-bicyclo[2.2.1]hept-2-ene),
poly(5-(1-ethylcyclohexyloxycarbonyl)-7-oxy-bicyclo[2.2.1]hept-2-ene),
poly(5-(1-methylcyclooctyloxycarbonyl)-7-oxy-bicyclo[2.2.1]hept-2-ene),
poly(5-(1-ethylcyclooctyloxycarbonyl)-7-oxy-bicyclo[2.2.1]hept-2-ene),
poly(5-(1-adamantyloxycarbonyl)-7-oxy-bicyclo[2.2.1]hept-2-ene),
poly(5-(2-methyl-2-adamantyloxycarbonyl)-7-oxy-bicyclo[2.2.1]hept-2-ene),
poly(5-(2-ethyl-2-adamantyloxycarbonyl)-7-oxy-bicyclo[2.2.1]hept-2-ene),
poly(5-(1-methyldecahydronaphthalene-1-yloxycarbonyl)-7-oxy-bicyclo[2.2.1]hept-2-ene),
poly(5-(1-ethyldecahydronaphthalene-1-yloxycarbonyl)-7-oxy-bicyclo[2.2.1]hept-2-ene),
poly(5-(2-methyldecahydronaphthalene-2-yloxycarbonyl)-7-oxy-bicyclo[2.2.1]hept-2-ene),
poly(5-(2-ethyldecahydronaphthalene-2-yloxycarbonyl)-7-oxy-bicyclo[2.2.1]hept-2-ene),
poly(5-(2-methyl-2-norbornyloxycarbonyl)-7-oxy-bicyclo[2.2.1]hept-2-ene),
poly(5-(2-ethyl-2-norbornyloxycarbonyl)-7-oxy-bicyclo[2.2.1]hept-2-ene),
poly(5-(2,7,7-trimethyl-2-norbornyloxycarbonyl)-7-oxy-bicyclo[2.2.1]hept-2-ene),
poly(5-(2-ethyl-7,7-dimethyl-2-norbornyloxycarbonyl)-7-oxy-bicyclo[2.2.1]hept-2-ene),
poly(5-(5-methyl-octahydro-4,7-methano-indene-5-yloxycarbonyl)-7-oxy-bicyclo[2.2.1]hept-2-ene),
poly(5-(5-ethyl-octahydro-4,7-methano-indene-5-yloxycarbonyl)-7-oxy-bicyclo[2.2.1]hept-2-ene),
poly(5-(4-methyl-tetracyclo[6.2.1.1$^{3,6}$.0$^{2,7}$]-dodecane-4-yloxycarbonyl)-7-oxy-bicyclo[2.2.1]hept-2-ene), and
poly(5-(4-ethyl-tetracyclo[6.2.1.1$^{3,6}$.0$^{2,7}$]-dodecane-4-yloxycarbonyl)-7-oxy-bicyclo[2.2.1]hept-2-ene),
poly(5-methoxycarbonylphenyl-7-oxy-bicyclo[2.2.1]hept-2-ene),
poly(5-ethoxycarbonylphenyl-7-oxy-bicyclo[2.2.1]hept-2-ene),
poly(5-(n-propoxycarbonylphenyl)-7-oxy-bicyclo[2.2.1]hept-2-ene),
poly(5-(i-propoxycarbonylphenyl)-7-oxy-bicyclo[2.2.1]hept-2-ene),
poly(5-(n-butoxycarbonylphenyl)-7-oxy-bicyclo[2.2.1]hept-2-ene),
poly(5-(tert-butoxycarbonylphenyl)-7-oxy-bicyclo[2.2.1]hept-2-ene),
poly(5-(n-pentyloxycarbonylphenyl)-7-oxy-bicyclo[2.2.1]hept-2-ene),
poly(5-(3-(2-methyl-2-butoxycarbonyl)phenyl)-7-oxy-bicyclo[2.2.1]hept-2-ene),
poly(5-(3-2,3-dimethyl-2-butoxycarbonyl)phenyl)-7-oxy-bicyclo[2.2.1]hept-2-ene),
poly(5-(3-(2-cyclopentyl-2-propoxycarbonyl)phenyl)-bicyclo[2.2.1]hept-2-ene),
poly(5-(3-(2-cyclohexyl-2-propoxycarbonyl)phenyl)-7-oxy-bicyclo[2.2.1]hept-2-ene),
poly(5-(3-(1-methylcyclopentyloxycarbonyl)phenyl)-7-oxy-bicyclo[2.2.1]hept-2-ene),
poly(5-(3-(1-ethylcyclopentyloxycarbonyl)phenyl)-7-oxy-bicyclo[2.2.1]hept-2-ene),
poly(5-(3-(1-methylcyclohexyloxycarbonyl)phenyl)-7-oxy-bicyclo[2.2.1]hept-2-ene),
poly(5-(3-(1-ethylcyclohexyloxycarbonyl)phenyl)-7-oxy-bicyclo[2.2.1]hept-2-ene),
poly(5-(4-(2-methyl-2-butoxycarbonyl)phenyl)-7-oxy-bicyclo[2.2.1]hept-2-ene),
poly(5-(4-(2,3-dimethyl-2-butoxycarbonyl)phenyl)-7-oxy-bicyclo[2.2.1]hept-2-ene), poly(5-(4-(2-cyclopentyl-2-propoxycarbonyl)phenyl)-7-oxy-bicyclo [2.2.1]hept-2-ene),
poly(5-(4-(2-cyclohexyl-2-propoxycarbonyl)phenyl)-7-oxy-bicyclo[2.2.1]hept-2-ene),
poly(5-(4-(1-methylcyclopentyloxycarbonyl)phenyl)-7-oxy-bicyclo[2.2.1]hept-2-ene),
poly(5-(4-(1-ethylcyclopentyloxycarbonyl)phenyl)-7-oxy-bicyclo[2.2.1]hept-2-ene),
poly(5-(4-(1-methylcyclohexyloxycarbonyl)phenyl)-7-oxy-bicyclo[2.2.1]hept-2-ene),
poly(5-(4-(1-ethylcyclohexyloxycarbonyl)phenyl)-7-oxy-bicyclo[2.2.1]hept-2-ene),
poly(5-methoxycarbonylnaphthyl-7-oxy-bicyclo[2.2.1]hept-2-ene),
poly(5-ethoxycarbonylnaphthyl-7-oxy-bicyclo[2.2.1]hept-2-ene),
poly(5-(n-propoxycarbonylnaphthyl)-7-oxy-bicyclo[2.2.1]hept-2-ene),
poly(5-(i-propoxycarbonylnaphthyl)-7-oxy-bicyclo[2.2.1]hept-2-ene),
poly(5-(n-butoxycarbonylnaphthyl)-7-oxy-bicyclo[2.2.1]hept-2-ene),
poly(5-(tert-butoxycarbonylphenyl)-7-oxy-bicyclo[2.2.1]hept-2-ene),
poly(5-(n-pentyloxycarbonylnaphthyl)-7-oxy-bicyclo [2.2.1]hept-2-ene),
poly(5-(5-(2-methyl-2-butoxycarbonyl)naphthyl)-7-oxy-bicyclo[2.2.1]hept-2-ene),
poly(5-(5-(2,3-dimethyl-2-butoxycarbonyl)naphthyl)-7-oxy-bicyclo [2.2.1]hept-2-ene),
poly(5-(5-(2-cyclopentyl-2-propoxycarbonyl)naphthyl)-7-oxy-bicyclo[2.2.1]hept-2-ene),
poly(5-(5-(2-cyclohexyl-2-propoxycarbonyl)naphthyl)-7-oxy-bicyclo[2.2.1]hept-2-ene),
poly(5-(5-(1-methylcyclopentyloxycarbonyl)naphthyl)-7-oxy-bicyclo[2.2.1]hept-2-ene),
poly(5-(5-(1-ethylcyclopentyloxycarbonyl)naphthyl)-7-oxy-bicyclo [2.2.1]hept-2-ene),
poly(5-(5-(1-methylcyclohexyloxycarbonyl)naphthyl)-7-oxy-bicyclo [2.2.1]hept-2-ene),
poly(5-(5-(1-ethylcyclohexyloxycarbonyl)naphthyl)-7-oxy-bicyclo[2.2.1]hept-2-ene),
poly(5-phenoxycarbonyl-7-oxy-bicyclo[2.2.1]hept-2-ene),
poly(5-benzyloxycarbonyl-7-oxy-bicyclo[2.2.1]hept-2-ene),
poly(5-(4-methylphenoxycarbonyl)-7-oxy-bicyclo[2.2.1]hept-2-ene),
poly(5-(3,4-dimethylphenoxycarbonyl)-7-oxy-bicyclo [2.2.1]hept-2-ene),
poly(5-(1-naphthoxycarbonyl)-7-oxy-bicyclo[2.2.1]hept-2-ene),
poly(5-(2-naphthoxycarbonyl)-7-oxy-bicyclo[2.2.1]hept-2-ene),
poly(5-(1-anthracenoxycarbonyl)-7-oxy-bicyclo[2.2.1]hept-2-ene),
poly(5-methoxymethyloxycarbonyl-7-oxy-bicyclo[2.2.1]hept-2-ene),
poly(5-ethoxymethyloxycarbonyl-7-oxy-bicyclo[2.2.1]hept-2-ene),
poly(5-(n-propoxymethyloxycarbonyl)-7-oxy-bicyclo [2.2.1]hept-2-ene),
poly(5-isopropoxymethyloxycarbonyl-7-oxy-bicyclo[2.2.1]hept-2-ene),
poly(5-(n-butoxymethyloxycarbonyl)-7-oxy-bicyclo[2.2.1]hept-2-ene),
poly(5-(tert-butoxymethyloxycarbonyl)-7-oxy-bicyclo [2.2.1]hept-2-ene),
poly(5-cyclopentyloxymethyloxycarbonyl)-7-oxy-bicyclo [2.2.1]hept-2-ene),
poly(5-cyclohexyloxymethyloxycarbonyl-7-oxy-bicyclo [2.2.1]hept-2-ene),
poly(5-cyclooctyloxymethyloxycarbonyl-7-oxy-bicyclo [2.2.1]hept-2-ene),
poly(5-norbornyloxymethyloxycarbonyl-7-oxy-bicyclo [2.2.1]hept-2-ene),
poly(5-(1-methylcyclopentyloxymethyloxycarbonyl)-7-oxy-bicyclo[2.2.1]hept-2-ene),
poly(5-(1-ethylcyclopentyloxymethyloxycarbonyl)-7-oxy-bicyclo[2.2.1]hept-2-ene),
poly(5-(1-methylcyclohexyloxymethyloxycarbonyl)-7-oxy-bicyclo[2.2.1]hept-2-ene),
poly(5-(1-ethylcyclohexyloxymethyloxycarbonyl)-7-oxy-bicyclo[2.2.1]hept-2-ene),
poly(5-(1-methylnorbornyloxymethyloxycarbonyl)-7-oxy-bicyclo[2.2.1]hept-2-ene),
poly(5-(1-ethylnorbornyloxymethyloxycarbonyl)-7-oxy-bicyclo[2.2.1]hept-2-ene),
poly(5-(1-ethoxypropyloxymethyloxycarbonyl)-7-oxy-bicyclo[2.2.1]hept-2-ene),
poly(5-(1-ethoxy-1-methylethyloxymethyloxycarbonyl)-7-oxy-bicyclo[2.2.1]hept-2-ene),
poly(5-tetrahydrofuran-2-yloxymethyloxycarbonyl-7-oxy-bicyclo[2.2.1]hept-2-ene),
poly(5-tetrahydropyran-2-yloxymethyloxycarbonyl-7-oxy-bicyclo[2.2.1]hept-2-ene),
poly(5-(1-adamantyloxymethyloxycarbonyl)-7-oxy-bicyclo [2.2.1]hept-2-ene),
poly(5-(2-adamantyloxymethyloxycarbonyl)-7-oxy-bicyclo [2.2.1]hept-2-ene),
poly(5-(1-(1-methoxy)ethoxycarbonyl)-7-oxy-bicyclo [2.2.1]hept-2-ene),
poly(5-(1-(1-ethoxy)ethoxycarbonyl)-7-oxy-bicyclo[2.2.1]hept-2-ene),
poly(5-(1-(1-n-propoxy)ethoxycarbonyl)-7-oxy-bicyclo [2.2.1]hept-2-ene),
poly(5-(1-(1-isopropoxy)ethoxycarbonyl)-7-oxy-bicyclo [2.2.1]hept-2-ene),
poly(5-(1-(1-n-butoxy)ethoxycarbonyl)-7-oxy-bicyclo [2.2.1]hept-2-ene),
poly(5-(1-(1-tert-butoxy)ethoxycarbonyl)-7-oxy-bicyclo [2.2.1]hept-2-ene),
poly(5-(1-(1-cyclopentyloxy)ethoxycarbonyl)-7-oxy-bicyclo[2.2.1]hept-2-ene),
poly(5-(1-(1-cyclohexyloxy)ethoxycarbonyl)-7-oxy-bicyclo [2.2.1]hept-2-ene),
poly(5-(1-(1-cyclooctyloxy)ethoxycarbonyl)-7-oxy-bicyclo [2.2.1]hept-2-ene),
poly(5-(1-(1-norbornyloxy)ethoxycarbonyl)-7-oxy-bicyclo [2.2.1]hept-2-ene),
poly(5-(1-(1-methylcyclopentyloxy)ethoxycarbonyl)-7-oxy-bicyclo[2.2.1]hept-2-ene),
poly(5-(1-(1-ethylcyclopentyloxy)ethoxycarbonyl)-7-oxy-bicyclo[2.2.1]hept-2-ene),
poly(5-(1-(1-methylcyclohexyloxy)ethoxycarbonyl)-7-oxy-bicyclo[2.2.1]hept-2-ene),
poly(5-(1-(1-ethylcyclohexyloxy)ethoxycarbonyl)-7-oxy-bicyclo[2.2.1]hept-2-ene),
poly(5-(1-(1-methylnorbornyloxy)ethoxycarbonyl)-7-oxy-bicyclo[2.2.1]hept-2-ene),
poly(5-(1-(1-ethylnorbornyloxy)ethoxycarbonyl)-7-oxy-bicyclo[2.2.1]hept-2-ene),
poly(5-(1-(1-ethoxypropyloxy)ethoxycarbonyl)-7-oxy-bicyclo[2.2.1]hept-2-ene), poly(5-(1-(1-ethoxy-1-methylethyloxy)ethoxycarbonyl)-7-oxy-bicyclo[2.2.1]hept-2-ene),
poly(5-(1-(tetrahydrofuran-2-yloxy)ethoxycarbonyl)-7-oxy-bicyclo [2.2.1]hept-2-ene),
poly(5-(1-tetrahydropyran-2-yloxy)ethoxycarbonyl)-7-oxy-bicyclo[2.2.1]hept-2-ene),
poly(5-(1-(1-adamantyloxy)ethoxycarbonyl)-7-oxy-bicyclo [2.2.1]hept-2-ene),
poly(5-(1-(2-adamantyloxy)ethoxycarbonyl)-7-oxy-bicyclo [2.2.1]hept-2-ene),
poly(5-(n-butoxycarbonylmethyloxycarbonyl)-7-oxy-bicyclo[2.2.1]hept-2-ene),
poly(5-(tert-butoxycarbonylmethyloxycarbonyl)-7-oxy-bicyclo[2.2.1]hept-2-ene),
poly(5-(2-cyclopentyl-2-propoxycarbonylmethyloxycarbonyl)-7-oxy-bicyclo[2.2.1]hept-2-ene),
poly(5-(2-cyclopentyl-2-butoxycarbonylmethyloxycarbonyl)-7-oxy-bicyclo[2.2.1]hept-2-ene),
poly(5-(2-cyclohexyl-2-propoxycarbonylmethyloxycarbonyl)-7-oxy-bicyclo[2.2.1]hept-2-ene),
poly(5-(3-(2-cyclohexyl-2-propoxycarbonyl)propoxycarbonyl)-7-oxy-bicyclo[2.2.1]hept-2-ene),
poly(5-(2-cyclohexyl-2-butoxycarbonylmethyloxycarbonyl)-7-oxy-bicyclo[2.2.1]hept-2-ene),
poly(5-(3-cyclohexyl-3-pentyloxycarbonylmethyloxycarbonyl)-7-oxy-bicyclo[2.2.1]hept-2-ene),
poly(5-(2-ethyl-2-norbornyloxycarbonylmethyloxycarbonyl)-7-oxy-bicyclo[2.2.1]hept-2-ene),
poly(5-(2-norbornyl-2-propoxycarbonylmethyloxycarbonyl)-7-oxy-bicyclo[2.2.1]hept-2-ene),
poly(5-(4-ethyl-tetracyclo[6.2.1.1$^{3,6}$.0$^{2,7}$]-dodecane-4-yloxycarbonylmethyloxycarbonyl)-7-oxy-bicyclo[2.2.1]hept-2-ene),
poly(5-(2-tetracyclo[6.2.1.1$^{3,6}$.0$^{2,7}$]-dodecane-4-yl)-2-propoxycarbonylmethyloxycarbonyl)-7-oxy-bicyclo[2.2.1]hept-2-ene),
poly(5-(1,1-dicyclohexylethoxycarbonylmethyloxycarbonyl)-7-oxy-bicyclo[2.2.1]hept-2-ene),
poly(5-(1,1-dicyclohexylpropoxycarbonylmethyloxycarbonyl)-7-oxy-bicyclo[2.2.1]hept-2-ene),
poly(5-cyclopentyloxycarbonylmethyloxycarbonyl-7-oxy-bicyclo[2.2.1]hept-2-ene),
poly(5-cyclohexyloxycarbonylmethyloxycarbonyl-7-oxy-bicyclo[2.2.1]hept-2-ene),
poly(5-cyclooctyloxycarbonylmethyloxycarbonyl-7-oxy-bicyclo[2.2.1]hept-2-ene),
poly(5-norbornyloxycarbonylmethyloxycarbonyl-7-oxy-bicyclo[2.2.1]hept-2-ene),
poly(5-(1-methylcyclopentyloxycarbonylmethyloxycarbonyl-7-oxy-bicyclo[2.2.1]hept-2-ene),
poly(5-(1-ethylcyclopentyloxycarbonylmethyloxycarbonyl-7-oxy-bicyclo[2.2.1]hept-2-ene),
poly(5-(1-methylcyclohexyloxycarbonylmethyloxycarbonyl-7-oxy-bicyclo[2.2.1]hept-2-ene),
poly(5-(1-ethylcyclohexyloxycarbonylmethyloxycarbonyl)-7-oxy-bicyclo[2.2.1]hept-2-ene),
poly(5-(1-methylnorbornyloxycarbonylmethyloxycarbonyl-7-oxy-bicyclo[2.2.1]hept-2-ene),
poly(5-(1-ethylnorbornyloxycarbonylmethyloxycarbonyl)-7-oxy-bicyclo[2.2.1]hept-2-ene),
poly(5-(1-ethoxypropyloxycarbonylmethyloxycarbonyl)-7-oxy-bicyclo[2.2.1]hept-2-ene),
poly(5-(1-ethoxy-1-methylethyloxycarbonylmethyloxycarbonyl)-7-oxy-bicyclo[2.2.1]hept-2-ene),
poly(5-tetrahydrofuran-2-yloxycarbonylmethyloxycarbonyl-7-oxy-bicyclo[2.2.1]hept-2-ene),
poly(5-tetrahydropyran-2-yloxycarbonylmethyloxycarbonyl-7-oxy-bicyclo[2.2.1]hept-2-ene),
poly(5-(1-adamantyloxycarbonylmethyloxycarbonyl)-7-oxy-bicyclo[2.2.1]hept-2-ene),
poly(5-(2-adamantyloxycarbonylmethyloxycarbonyl)-7-oxy-bicyclo[2.2.1]hept-2-ene),
poly(5-(1-(2-(1-adamantyl)-2-propoxycarbonyl)ethoxycarbonyl)-7-oxy-bicyclo[2.2.1]hept-2-ene),
poly(5-(3-(2-(1-adamantyl)-2-propoxycarbonyl)propoxycarbonyl)-7-oxy-bicyclo[2.2.1]hept-2-ene),
poly(5-(2-(2-(1-adamantyl)-2-propoxycarbonyl)-2-propoxycarbonyl)-7-oxy-bicyclo[2.2.1]hept-2-ene),
poly(5-(2-methyl-2-adamantyloxycarbonylmethyloxycarbonyl)-7-oxy-bicyclo[2.2.1]hept-2-ene),
poly(5-(3-(2-methyl-2-adamantyloxycarbonyl)propoxycarbonyl)-7-oxy-bicyclo[2.2.1]hept-2-ene),
poly(5-(2-(2-methyl-2-adamantyloxycarbonyl)-2-propoxycarbonyl)-7-oxy-bicyclo[2.2.1]hept-2-ene),
poly(5-(1-(2-methyl-2-adamantyloxycarbonyl)ethoxycarbonyl)-7-oxy-bicyclo[2.2.1]hept-2-ene),
poly(5-(2-ethyl-2-adamantyloxycarbonylmethyloxycarbonyl)-7-oxy-bicyclo[2.2.1]hept-2-ene),
poly(5-(2-isopropyl-2-adamantyloxycarbonylmethyloxycarbonyl)-7-oxy-bicyclo[2.2.1]hept-2-ene),
poly(5-(2-(1-adamantyl)-2-propoxycarbonylmethyloxycarbonyl)-7-oxy-bicyclo[2.2.1]hept-2-ene),
poly(5-(2-(1-adamantyl)-2-butoxycarbonylmethyloxycarbonyl)-7-oxy-bicyclo[2.2.1]hept-2-ene),
poly(5-(3-(1-adamantyl)-3-pentyloxycarbonylmethyloxycarbonyl)-7-oxy-bicyclo[2.2.1]hept-2-ene),
poly(5-(3-tert-butoxycarbonyl-1-cyclopentyloxycarbonyl)-7-oxy-bicyclo[2.2.1]hept-2-ene),
poly(5-(3-(1-methylcyclohexyloxycarbonyl)-1-cyclopentyloxycarbonyl)-7-oxy-bicyclo[2.2.1]hept-2-ene),
poly(5-(5-tert-butoxycarbonyl-2-norbornyloxycarbonyl)-7-oxy-bicyclo[2.2.1]hept-2-ene),
poly(5-(5-(1-methylcyclohexyloxycarbonyl)-2-norbornyloxycarbonyl)-7-oxy-bicyclo[2.2.1]hept-2-ene),
poly(5-(5,5-di(tert-butoxycarbonyl)-2-norbornyloxycarbonyl)-7-oxy-bicyclo[2.2.1]hept-2-ene),
poly(5-(5,6-di(tert-butoxycarbonyl)-2-norbornyloxycarbonyl)-7-oxy-bicyclo[2.2.1]hept-2-ene),
poly(5-(1-(1-methylcyclohexyloxycarbonyl)-octahydro-4,7-methano-indene-5-yloxycarbonyl)-7-oxy-bicyclo[2.2.1]hept-2-ene),
poly(5-(6-tert-butoxycarbonyl-tetrahydronaphthalene-2-yloxycarbonyl)-7-oxy-bicyclo[2.2.1]hept-2-ene),
poly(5-(9-tert-butoxycarbonyl-tetracyclo[6.2.1.1$^{3,6}$.0$^{2,7}$]-dodecane-4-yloxycarbonyl)-7-oxy-bicyclo[2.2.1]hept-2-ene), or
poly(5-(9-(1-methylcyclohexyloxycarbonyl)-tetracyclo[6.2.1.1$^{3,6}$.0$^{2,7}$]-dodecane-4-yloxycarbonyl)-7-oxy-bicyclo[2.2.1]hept-2-ene) is preferable.

Among these, from the viewpoints of improving the solubility in a solvent (PGMEA) during preparation of a coating solution and greatly changing the polarity of the cyclic olefin polymer after application, in the repeating structural unit [B] represented by Formula (2) according to the present embodiment, as the cyclic olefin polymer in which n represents 0,
poly(5-(tert-butoxycarbonyl)-7-oxy-bicyclo[2.2.1]hept-2-ene),
poly(5-(2-methyl-2-pentyloxycarbonyl)-7-oxy-bicyclo[2.2.1]hept-2-ene),
poly(5-(3-methyl-3-pentyloxycarbonyl)-7-oxy-bicyclo[2.2.1]hept-2-ene), poly(5-(2-ethyl-3-methyl-3-pentyloxycarbonyl)-7-oxy-bicyclo[2.2.1]hept-2-ene),
poly(5-(2-methyl-2-butoxycarbonyl)-7-oxy-bicyclo[2.2.1]hept-2-ene),
poly(5-(2,3-dimethyl-2-butoxycarbonyl)-7-oxy-bicyclo[2.2.1]hept-2-ene),
poly(5-(2,3,3-trimethyl-2-butoxycarbonyl)-7-oxy-bicyclo[2.2.1]hept-2-ene),
poly(5-(2-methyl-2-hexyloxycarbonyl)-7-oxy-bicyclo[2.2.1]hept-2-ene),
poly(5-(3,4-dimethyl-3-hexyloxycarbonyl)-7-oxy-bicyclo[2.2.1]hept-2-ene),
poly(5-(3-methyl-3-heptyloxycarbonyl)-7-oxy-bicyclo[2.2.1]hept-2-ene),
poly(5-(2-cyclopentyl-2-propoxycarbonyl)-7-oxy-bicyclo[2.2.1]hept-2-ene),
poly(5-(2-cyclohexyl-2-propoxycarbonyl)-7-oxy-bicyclo[2.2.1]hept-2-ene),
poly(5-(2-norbornyl-2-propoxycarbonyl)-7-oxy-bicyclo[2.2.1]hept-2-ene),
poly(5-(1,1-dicyclopentylethoxycarbonyl)-7-oxy-bicyclo[2.2.1]hept-2-ene),
poly(5-(1,1-dicyclohexylethoxycarbonyl)-7-oxy-bicyclo[2.2.1]hept-2-ene),
poly(5-(1-methylcyclopentyloxycarbonyl)-7-oxy-bicyclo[2.2.1]hept-2-ene),
poly(5-(1-ethylcyclopentyloxycarbonyl)-7-oxy-bicyclo[2.2.1]hept-2-ene),
poly(5-(1-methylcyclohexyloxycarbonyl)-7-oxy-bicyclo[2.2.1]hept-2-ene),
poly(5-(1-ethylcyclohexyloxycarbonyl)-7-oxy-bicyclo[2.2.1]hept-2-ene),
poly(5-(1-methylcyclooctyloxycarbonyl)-7-oxy-bicyclo[2.2.1]hept-2-ene),
poly(5-(1-ethylcyclooctyloxycarbonyl)-7-oxy-bicyclo[2.2.1]hept-2-ene),
poly(5-(1-adamantyloxycarbonyl)-7-oxy-bicyclo[2.2.1]hept-2-ene),
poly(5-(2-methyl-2-adamantyloxycarbonyl)-7-oxy-bicyclo[2.2.1]hept-2-ene),
poly(5-(2-ethyl-2-adamantyloxycarbonyl)-7-oxy-bicyclo[2.2.1]hept-2-ene),
poly(5-(1-methyldecahydronaphthalene-1-yloxycarbonyl)-7-oxy-bicyclo[2.2.1]hept-2-ene),
poly(5-(1-ethyldecahydronaphthalene-1-yloxycarbonyl)-7-oxy-bicyclo[2.2.1]hept-2-ene),
poly(5-(2-methyldecahydronaphthalene-2-yloxycarbonyl)-7-oxy-bicyclo[2.2.1]hept-2-ene),
poly(5-(2-ethyldecahydronaphthalene-2-yloxycarbonyl)-7-oxy-bicyclo[2.2.1]hept-2-ene),
poly(5-(2-methyl-2-norbornyloxycarbonyl)-7-oxy-bicyclo[2.2.1]hept-2-ene),
poly(5-(2-ethyl-2-norbornyloxycarbonyl)-7-oxy-bicyclo[2.2.1]hept-2-ene),
poly(5-(2,7,7-trimethyl-2-norbornyloxycarbonyl)-7-oxy-bicyclo[2.2.1]hept-2-ene),
poly(5-(2-ethyl-7,7-dimethyl-2-norbornyloxycarbonyl)-7-oxy-bicyclo[2.2.1]hept-2-ene),
poly(5-(5-methyl-octahydro-4,7-methano-indene-5-yloxycarbonyl)-7-oxy-bicyclo[2.2.1]hept-2-ene),
poly(5-(5-ethyl-octahydro-4,7-methano-indene-5-yloxycarbonyl)-7-oxy-bicyclo[2.2.1]hept-2-ene),
poly(5-(4-methyl-tetracyclo[6.2.1.1$^{3,6}$.0$^{2,7}$]-dodecane-4-yloxycarbonyl)-7-oxy-bicyclo[2.2.1]hept-2-ene),
poly(5-(4-ethyl-tetracyclo[6.2.1.1$^{3,6}$.0$^{2,7}$]-dodecane-4-yloxycarbonyl)-7-oxy-bicyclo[2.2.1]hept-2-ene),
poly(5-(tert-butoxycarbonylphenyl)-7-oxy-bicyclo[2.2.1]hept-2-ene),
poly(5-(3-(2-methyl-2-butoxycarbonyl)phenyl)-7-oxy-bicyclo[2.2.1]hept-2-ene),
poly(5-(3-(2,3-dimethyl-2-butoxycarbonyl)phenyl)-7-oxy-bicyclo[2.2.1]hept-2-ene),
poly(5-(3-(2-cyclopentyl-2-propoxycarbonyl)phenyl)-bicyclo[2.2.1]hept-2-ene),
poly(5-(3-(2-cyclohexyl-2-propoxycarbonyl)phenyl)-7-oxy-bicyclo[2.2.1]hept-2-ene),
poly(5-(3-(1-methylcyclopentyloxycarbonyl)phenyl)-7-oxy-bicyclo[2.2.1]hept-2-ene),
poly(5-(3-(1-ethylcyclopentyloxycarbonyl)phenyl)-7-oxy-bicyclo[2.2.1]hept-2-ene),
poly(5-(3-(1-methylcyclohexyloxycarbonyl)phenyl)-7-oxy-bicyclo[2.2.1]hept-2-ene),
poly(5-(3-(1-ethylcyclohexyloxycarbonyl)phenyl)-7-oxy-bicyclo[2.2.1]hept-2-ene),
poly(5-(4-(2-methyl-2-butoxycarbonyl)phenyl)-7-oxy-bicyclo[2.2.1]hept-2-ene),
poly(5-(4-(2,3-dimethyl-2-butoxycarbonyl)phenyl)-7-oxy-bicyclo[2.2.1]hept-2-ene),
poly(5-(4-(2-cyclopentyl-2-propoxycarbonyl)phenyl)-7-oxy-bicyclo [2.2.1]hept-2-ene),
poly(5-(4-(2-cyclohexyl-2-propoxycarbonyl)phenyl)-7-oxy-bicyclo[2.2.1]hept-2-ene),
poly(5-(4-(1-methylcyclopentyloxycarbonyl)phenyl)-7-oxy-bicyclo[2.2.1]hept-2-ene),
poly(5-(4-(1-ethylcyclopentyloxycarbonyl)phenyl)-7-oxy-bicyclo[2.2.1]hept-2-ene),
poly(5-(4-(1-methylcyclohexyloxycarbonyl)phenyl)-7-oxy-bicyclo[2.2.1]hept-2-ene),
poly(5-(4-(1-ethylcyclohexyloxycarbonyl)phenyl)-7-oxy-bicyclo[2.2.1]hept-2-ene),
poly(5-(tert-butoxycarbonylphenyl)-7-oxy-bicyclo[2.2.1]hept-2-ene),
poly(5-(n-pentyloxycarbonylnaphthyl)-7-oxy-bicyclo[2.2.1]hept-2-ene),
poly(5-(5-(2-methyl-2-butoxycarbonyl)naphthyl)-7-oxy-bicyclo[2.2.1]hept-2-ene),
poly(5-(5-(2,3-dimethyl-2-butoxycarbonyl)naphthyl)-7-oxy-bicyclo [2.2.1]hept-2-ene),
poly(5-(5-(2-cyclopentyl-2-propoxycarbonyl)naphthyl)-7-oxy-bicyclo[2.2.1]hept-2-ene),
poly(5-(5-(2-cyclohexyl-2-propoxycarbonyl)naphthyl)-7-oxy-bicyclo[2.2.1]hept-2-ene),
poly(5-(5-(1-methylcyclopentyloxycarbonyl)naphthyl)-7-oxy-bicyclo[2.2.1]hept-2-ene),
poly(5-(5-(1-ethylcyclopentyloxycarbonyl)naphthyl)-7-oxy-bicyclo [2.2.1]hept-2-ene),
poly(5-(5-(1-methylcyclohexyloxycarbonyl)naphthyl)-7-oxy-bicyclo [2.2.1]hept-2-ene),
poly(5-(5-(1-ethylcyclohexyloxycarbonyl)naphthyl)-7-oxy-bicyclo[2.2.1]hept-2-ene),
poly(5-(tert-butoxymethyloxycarbonyl)-7-oxy-bicyclo[2.2.1]hept-2-ene),
poly(5-(1-methylcyclopentyloxymethyloxycarbonyl)-7-oxy-bicyclo[2.2.1]hept-2-ene),
poly(5-(1-ethylcyclopentyloxymethyloxycarbonyl)-7-oxy-bicyclo[2.2.1]hept-2-ene),
poly(5-(1-methylcyclohexyloxymethyloxycarbonyl)-7-oxy-bicyclo[2.2.1]hept-2-ene),
poly(5-(1-ethylcyclohexyloxymethyloxycarbonyl)-7-oxy-bicyclo[2.2.1]hept-2-ene),
poly(5-(1-(1-methoxy)ethoxycarbonyl)-7-oxy-bicyclo[2.2.1]hept-2-ene), poly(5-(1-(1-ethoxy)ethoxycarbonyl)-7-oxy-bicyclo[2.2.1]hept-2-ene),
poly(5-(1-(1-n-propoxy)ethoxycarbonyl)-7-oxy-bicyclo[2.2.1]hept-2-ene),
poly(5-(1-(1-isopropoxy)ethoxycarbonyl)-7-oxy-bicyclo[2.2.1]hept-2-ene),
poly(5-(1-(1-n-butoxy)ethoxycarbonyl)-7-oxy-bicyclo[2.2.1]hept-2-ene),
poly(5-(1-(1-tert-butoxy)ethoxycarbonyl)-7-oxy-bicyclo[2.2.1]hept-2-ene),
poly(5-(1-(1-cyclopentyloxy)ethoxycarbonyl)-7-oxy-bicyclo[2.2.1]hept-2-ene),
poly(5-(1-(1-cyclohexyloxy)ethoxycarbonyl)-7-oxy-bicyclo[2.2.1]hept-2-ene),
poly(5-(1-(1-cyclooctyloxy)ethoxycarbonyl)-7-oxy-bicyclo[2.2.1]hept-2-ene),
poly(5-(1-(1-norbornyloxy)ethoxycarbonyl)-7-oxy-bicyclo[2.2.1]hept-2-ene),
poly(5-(1-(1-methylcyclopentyloxy)ethoxycarbonyl)-7-oxy-bicyclo[2.2.1]hept-2-ene),
poly(5-(1-(1-ethylcyclopentyloxy)ethoxycarbonyl)-7-oxy-bicyclo[2.2.1]hept-2-ene),
poly(5-(1-(1-methylcyclohexyloxy)ethoxycarbonyl)-7-oxy-bicyclo[2.2.1]hept-2-ene),
poly(5-(1-(1-ethylcyclohexyloxy)ethoxycarbonyl)-7-oxy-bicyclo[2.2.1]hept-2-ene),
poly(5-(1-(1-methylnorbornyloxy)ethoxycarbonyl)-7-oxy-bicyclo[2.2.1]hept-2-ene),
poly(5-(1-(1-ethylnorbornyloxy)ethoxycarbonyl)-7-oxy-bicyclo[2.2.1]hept-2-ene),
poly(5-(1-(1-ethoxypropyloxy)ethoxycarbonyl)-7-oxy-bicyclo[2.2.1]hept-2-ene),
poly(5-(1-(1-ethoxy-1-methylethyloxy)ethoxycarbonyl)-7-oxy-bicyclo[2.2.1]hept-2-ene),
poly(5-(1-(tetrahydrofuran-2-yloxy)ethoxycarbonyl)-7-oxy-bicyclo [2.2.1]hept-2-ene),
poly(5-(1-(tetrahydropyran-2-yloxy)ethoxycarbonyl)-7-oxy-bicyclo[2.2.1]hept-2-ene),
poly(5-(1-(1-adamantyloxy)ethoxycarbonyl)-7-oxy-bicyclo[2.2.1]hept-2-ene),
poly(5-(1-(2-adamantyloxy)ethoxycarbonyl)-7-oxy-bicyclo[2.2.1]hept-2-ene),
poly(5-(tert-butoxycarbonylmethyloxycarbonyl)-7-oxy-bicyclo[2.2.1]hept-2-ene),
poly(5-(2-cyclopentyl-2-propoxycarbonylmethyloxycarbonyl)-7-oxy-bicyclo[2.2.1]hept-2-ene),
poly(5-(2-cyclopentyl-2-butoxycarbonylmethyloxycarbonyl)-7-oxy-bicyclo[2.2.1]hept-2-ene),
poly(5-(2-cyclohexyl-2-propoxycarbonylmethyloxycarbonyl)-7-oxy-bicyclo[2.2.1]hept-2-ene),
poly(5-(3-(2-cyclohexyl-2-propoxycarbonyl)propoxycarbonyl)-7-oxy-bicyclo[2.2.1]hept-2-ene),
poly(5-(2-cyclohexyl-2-butoxycarbonylmethyloxycarbonyl)-7-oxy-bicyclo[2.2.1]hept-2-ene),
poly(5-(3-cyclohexyl-3-pentyloxycarbonylmethyloxycarbonyl)-7-oxy-bicyclo[2.2.1]hept-2-ene),
poly(5-(2-ethyl-2-norbornyloxycarbonylmethyloxycarbonyl)-7-oxy-bicyclo[2.2.1]hept-2-ene),
poly(5-(2-norbornyl-2-propoxycarbonylmethyloxycarbonyl)-7-oxy-bicyclo[2.2.1]hept-2-ene),
poly(5-(4-ethyl-tetracyclo[6.2.1.1$^{3,6}$.0$^{2,7}$]-dodecane-4-yloxycarbonylmethyloxycarbonyl)-7-oxy-bicyclo[2.2.1]hept-2-ene),
poly(5-(2-tetracyclo[6.2.1.1$^{3,6}$.0$^{2,7}$]-dodecane-4-yl)-2-propoxycarbonylmethyloxycarbonyl)-7-oxy-bicyclo[2.2.1]hept-2-ene),
poly(5-(1,1-dicyclohexylethoxycarbonylmethyloxycarbonyl)-7-oxy-bicyclo[2.2.1]hept-2-ene),
poly(5-(1,1-dicyclohexylpropoxycarbonylmethyloxycarbonyl)-7-oxy-bicyclo[2.2.1]hept-2-ene),
poly(5-(1-methylcyclopentyloxycarbonylmethyloxycarbonyl-7-oxy-bicyclo[2.2.1]hept-2-ene),
poly(5-(1-ethylcyclopentyloxycarbonylmethyloxycarbonyl)-7-oxy-bicyclo[2.2.1]hept-2-ene),
poly(5-(1-methylcyclohexyloxycarbonylmethyloxycarbonyl)-7-oxy-bicyclo[2.2.1]hept-2-ene),
poly(5-(1-ethylcyclohexyloxycarbonylmethyloxycarbonyl)-7-oxy-bicyclo[2.2.1]hept-2-ene),
poly(5-(1-(2-(1-adamantyl)-2-propoxycarbonyl)ethoxycarbonyl)-7-oxy-bicyclo[2.2.1]hept-2-ene),
poly(5-(3-(2-(1-adamantyl)-2-propoxycarbonyl)propoxycarbonyl)-7-oxy-bicyclo[2.2.1]hept-2-ene),
poly(5-(2-(2-(1-adamantyl)-2-propoxycarbonyl)-2-propoxycarbonyl)-7-oxy-bicyclo[2.2.1]hept-2-ene),
poly(5-(2-methyl-2-adamantyloxycarbonylmethyloxycarbonyl)-bicyclo[2.2.1]hept-2-ene),
poly(5-(3-(2-methyl-2-adamantyloxycarbonyl)propoxycarbonyl)-7-oxy-bicyclo[2.2.1]hept-2-ene),
poly(5-(2-(2-methyl-2-adamantyloxycarbonyl)-2-propoxycarbonyl)-7-oxy-bicyclo[2.2.1]hept-2-ene),
poly(5-(1-(2-methyl-2-adamantyloxycarbonyl)ethoxycarbonyl)-7-oxy-bicyclo[2.2.1]hept-2-ene),
poly(5-(2-ethyl-2-adamantyloxycarbonylmethyloxycarbonyl)-7-oxy-bicyclo[2.2.1]hept-2-ene),
poly(5-(2-isopropyl-2-adamantyloxycarbonylmethyloxycarbonyl)-7-oxy-bicyclo[2.2.1]hept-2-ene),
poly(5-(2-(1-adamantyl)-2-propoxycarbonylmethyloxycarbonyl)-7-oxy-bicyclo[2.2.1]hept-2-ene),
poly(5-(2-(1-adamantyl)-2-butoxycarbonylmethyloxycarbonyl)-7-oxy-bicyclo[2.2.1]hept-2-ene),
poly(5-(3-(1-adamantyl)-3-pentyloxycarbonylmethyloxycarbonyl)-7-oxy-bicyclo[2.2.1]hept-2-ene),
poly(5-(3-tert-butoxycarbonyl-1-cyclopentyloxycarbonyl)-7-oxy-bicyclo[2.2.1]hept-2-ene),
poly(5-(3-(1-methylcyclohexyloxycarbonyl)-1-cyclopentyloxycarbonyl)-7-oxy-bicyclo[2.2.1]hept-2-ene),
poly(5-(5-tert-butoxycarbonyl-2-norbornyloxycarbonyl)-7-oxy-bicyclo[2.2.1]hept-2-ene),
poly(5-(5-1-methylcyclohexyloxycarbonyl)-2-norbornyloxycarbonyl)-7-oxy-bicyclo[2.2.1]hept-2-ene),
poly(5-(5,5-di(tert-butoxycarbonyl)-2-norbornyloxycarbonyl)-7-oxy-bicyclo[2.2.1]hept-2-ene),
poly(5-(5,6-di(tert-butoxycarbonyl)-2-norbornyloxycarbonyl)-7-oxy-bicyclo[2.2.1]hept-2-ene),
poly(5-(1-(1-methylcyclohexyloxycarbonyl)-octahydro-4,7-methano-indene-5-yloxycarbonyl)-7-oxy-bicyclo[2.2.1]hept-2-ene),
poly(5-(6-tert-butoxycarbonyl-tetrahydronaphthalene-2-yloxycarbonyl)-7-oxy-bicyclo[2.2.1]hept-2-ene),
poly(5-(9-tert-butoxycarbonyl-tetracyclo[6.2.1.1$^{3,6}$.0$^{2,7}$]-dodecane-4-yloxycarbonyl)-7-oxy-bicyclo[2.2.1]hept-2-ene), or
poly(5-(9-(1-methylcyclohexyloxycarbonyl)-tetracyclo[6.2.1.1$^{3,6}$.0$^{2,7}$]-dodecane-4-yloxycarbonyl)-7-oxy-bicyclo[2.2.1]hept-2-ene) is more preferable.

Further, in the repeating structural unit [B] represented by Formula (2) according to the present embodiment, in a case where $R^5$ to $R^8$ are bonded to one another to form a ring structure, as the cyclic olefin polymer in which n represents 0,
poly(4,10-dioxy-tricyclo[5.2.1.0$^{2,6}$]-8-decene-3-one),
poly(4,10-dioxy-tricyclo[5.2.1.0$^{2,6}$]-8-decene-3,5-dione), poly(4-methyl-4-aza-10-oxy-tricyclo[5.2.1.0$^{2,6}$]-8-decene-3,5-dione),
poly(4-ethyl-4-aza-10-oxy-tricyclo[5.2.1.0$^{2,6}$]-8-decene-3,5-dione
poly(4-(n-propyl)-4-aza-10-oxy-tricyclo[5.2.1.0$^{2,6}$]-8-decene-3,5-dione),
poly(4-(n-butyl)-4-aza-10-oxy-tricyclo[5.2.1.0$^{2,6}$]-8-decene-3,5-dione),
poly(4-cyclobutyl-4-aza-10-oxy-tricyclo[5.2.1.0$^{2,6}$]-8-decene-3,5-dione),
poly(4-cyclopentyl-4-aza-10-oxy-tricyclo[5.2.1.0$^{2,6}$]-8-decene-3,5-dione),
poly(4-cyclohexyl-4-aza-10-oxy-tricyclo[5.2.1.0$^{2,6}$]-8-decene-3,5-dione),
poly(4-phenyl-4-aza-10-oxy-tricyclo[5.2.1.0$^{2,6}$]-8-decene-3,5-dione), or
poly(4-(4-hydroxyphenyl)-4-aza-10-oxy-tricyclo [5.2.1.0$^{2,6}$]-8-decene-3,5-dione) is preferable.

In the repeating structural unit [B] represented by Formula (2) according to the present embodiment, examples of the cyclic olefin polymer in which n represents 1 include
poly(8-methyl-11,12-dioxy-tetracyclo[4.4.0.1$^{2,5}$.1$^{7,10}$]-3-dodecene),
poly(8-ethyl-11,12-dioxy-tetracyclo[4.4.0.1$^{2,5}$.1$^{7,10}$]-3-dodecene),
poly(8-(n-propyl)-11,12-dioxy-tetracyclo[4.4.0.1$^{2,5}$.1$^{7,10}$]-3-dodecene),
poly(8-(i-propyl)-11,12-dioxy-tetracyclo[4.4.0.1$^{2,5}$.1$^{7,10}$]-3-dodecene),
poly(8-(n-butyl)-11,12-dioxy-tetracyclo[4.4.0.1$^{2,5}$.1$^{7,10}$]-3-dodecene),
poly(8-(tert-butyl)-11,12-dioxy-tetracyclo[4.4.0.1$^{2,5}$.1$^{7,10}$]-3-dodecene),
poly(8-(n-pentyl)-11,12-dioxy-tetracyclo[4.4.0.1$^{2,5}$.1$^{7,10}$]-3-dodecene),
poly(8-cyclopentyl-11,12-dioxy-tetracyclo[4.4.0.1$^{2,5}$.1$^{7,10}$]-3-dodecene),
poly(8-cyclohexyl-11,12-dioxy-tetracyclo[4.4.0.1$^{2,5}$.1$^{7,10}$]-3-dodecene), and
poly(8-cyclooctyl-11,12-dioxy-tetracyclo[4.4.0.1$^{2,5}$.1$^{7,10}$]-3-dodecene) in a case where at least one of R$^5$ to R$^8$ represents an alkyl group;
poly(8-phenyl-11,12-dioxy-tetracyclo[4.4.0.1$^{2,5}$.1$^{7,10}$]-3-dodecene),
poly(8-naphthyl-11,12-dioxy-tetracyclo[4.4.0.1$^{2,5}$.1$^{7,10}$]-3-dodecene),
poly(8-anthracenyl-11,12-dioxy-tetracyclo[4.4.0.1$^{2,5}$.1$^{7,10}$]-3-dodecene),
poly(8-(o-tolyl)-11,12-dioxy-tetracyclo[4.4.0.1$^{2,5}$.1$^{7,10}$]-3-dodecene),
poly(8-(m-tolyl)-11,12-dioxy-tetracyclo[4.4.0.1$^{2,5}$.1$^{7,10}$]-3-dodecene),
poly(8-(p-tolyl)-11,12-dioxy-tetracyclo[4.4.0.1$^{2,5}$.1$^{7,10}$]-3-dodecene),
poly(8-biphenyl-11,12-dioxy-tetracyclo[4.4.0.1$^{2,5}$.1$^{7,10}$]-3-dodecene), and
poly(8-(4-hydroxyphenyl)-11,12-dioxy-tetracyclo [4.4.0.1$^{2,5}$.1$^{7,10}$]-3-dodecene) in a case where at least one of R$^5$ to R$^8$ represents an aryl group;
poly(8-methoxy-11,12-dioxy-tetracyclo[4.4.0.1$^{2,5}$.1$^{7,10}$]-3-dodecene),
poly(8-ethoxy-11,12-dioxy-tetracyclo[4.4.0.1$^{2,5}$.1$^{7,10}$]-3-dodecene),
poly(8-(n-propoxy)-11,12-dioxy-tetracyclo[4.4.0.1$^{2,5}$.1$^{7,10}$]-3-dodecene),
poly(8-(i-propoxy)-11,12-dioxy-tetracyclo[4.4.0.1$^{2,5}$.1$^{7,10}$]-3-dodecene),
poly(8-(n-butoxy)-11,12-dioxy-tetracyclo[4.4.0.1$^{2,5}$.1$^{7,10}$]-3-dodecene),
poly(8-(tert-butoxy)-11,12-dioxy-tetracyclo[4.4.0.1$^{2,5}$.1$^{7,10}$]-3-dodecene),
poly(8-(n-pentoxy)-11,12-dioxy-tetracyclo[4.4.0.1$^{2,5}$.1$^{7,10}$]-3-dodecene),
poly(8-cyclopentyloxy-11,12-dioxy-tetracyclo[4.4.0.1$^{2,5}$.1$^{7,10}$]-3-dodecene),
poly(8-cyclohexyloxy-11,12-dioxy-tetracyclo[4.4.0.1$^{2,5}$.1$^{7,10}$]-3-dodecene), and
poly(8-cyclooctyloxy-11,12-dioxy-tetracyclo[4.4.0.1$^{2,5}$.1$^{7,10}$]-3-dodecene) in a case where at least one of R$^5$ to R$^8$ represents an alkoxy group;
poly(8-phenyloxy-11,12-dioxy-tetracyclo[4.4.0.1$^{2,5}$.1$^{7,10}$]-3-dodecene),
poly(8-naphthyloxy-11,12-dioxy-tetracyclo[4.4.0.1$^{2,5}$.1$^{7,10}$]-3-dodecene),
poly(8-anthracenyloxy-11,12-dioxy-tetracyclo[4.4.0.1$^{2,5}$.1$^{7,10}$]-3-dodecene),
poly(8-(o-tolyloxy)-11,12-dioxy-tetracyclo[4.4.0.1$^{2,5}$.1$^{7,10}$]-3-dodecene),
poly(8-(m-tolyloxy)-11,12-dioxy-tetracyclo[4.4.0.1$^{2,5}$.1$^{7,10}$]-3-dodecene),
poly(8-(p-tolyloxy)-11,12-dioxy-tetracyclo[4.4.0.1$^{2,5}$.1$^{7,10}$]-3-dodecene),
poly(8-(4-oxy-1,1'-biphenyl)-11,12-dioxy-tetracyclo [4.4.0.1$^{2,5}$.1$^{7,10}$]-3-dodecene), and
poly(8-(4-hydroxyphenyloxy)-11,12-dioxy-tetracyclo [4.4.0.1$^{2,5}$.1$^{7,10}$]-3-dodecene) in a case where at least one of R$^5$ to R$^8$ represents an aryloxy group;
poly(8-methoxymethyl-11,12-dioxy-tetracyclo [4.4.0.1$^{2,5}$.1$^{7,10}$]-3-dodecene),
poly(8-methoxyethyl-11,12-dioxy-tetracyclo[4.4.0.1$^{2,5}$.1$^{7,10}$]-3-dodecene),
poly(8-ethoxymethyl-11,12-dioxy-tetracyclo[4.4.0.1$^{2,5}$.1$^{7,10}$]-3-dodecene),
poly(8-ethoxyethyl-11,12-dioxy-tetracyclo[4.4.0.1$^{2,5}$.1$^{7,10}$]-3-dodecene),
poly(8-(n-propoxymethyl)-11,12-dioxy-tetracyclo [4.4.0.1$^{2,5}$.1$^{7,10}$]-3-dodecene),
poly(8-isopropoxymethyl-11,12-dioxy-tetracyclo [4.4.0.1$^{2,5}$.1$^{7,10}$]-3-dodecene),
poly(8-(n-butoxymethyl)-11,12-dioxy-tetracyclo [4.4.0.1$^{2,5}$.1$^{7,10}$]-3-dodecene),
poly(8-isobutoxymethyl-11,12-dioxy-tetracyclo [4.4.0.1$^{2,5}$.1$^{7,10}$]-3-dodecene),
poly(8-(tert-butoxymethyl)-11,12-dioxy-tetracyclo [4.4.0.1$^{2,5}$.1$^{7,10}$]-3-dodecene),
poly(8-cyclopentyloxymethyl-11,12-dioxy-tetracyclo [4.4.0.1$^{2,5}$.1$^{7,10}$]-3-dodecene),
poly(8-cyclohexyloxymethyl-11,12-dioxy-tetracyclo [4.4.0.1$^{2,5}$.1$^{7,10}$]-3-dodecene), and
poly(8-cyclooctyloxymethyl-11,12-dioxy-tetracyclo [4.4.0.1$^{2,5}$.1$^{7,10}$]-3-dodecene) in a case where at least one of R$^5$ to R$^8$ represents an alkoxyalkyl group;
poly(8-phenyloxymethyl-11,12-dioxy-tetracyclo [4.4.0.1$^{2,5}$.1$^{7,10}$]-3-dodecene),
poly(8-naphthyloxymethyl-11,12-dioxy-tetracyclo [4.4.0.1$^{2,5}$.1$^{7,10}$]-3-dodecene),
poly(8-anthracenyloxymethyl-11,12-dioxy-tetracyclo [4.4.0.1$^{2,5}$.1$^{7,10}$]-3-dodecene),
poly(8-(o-tolyloxymethyl)-11,12-dioxy-tetracyclo [4.4.0.1$^{2,5}$.1$^{7,10}$]-3-dodecene),
poly(8-(m-tolyloxymethyl)-11,12-dioxy-tetracyclo [4.4.0.1$^{2,5}$.1$^{7,10}$]-3-dodecene),
poly(8-(p-tolyloxymethyl)-11,12-dioxy-tetracyclo [4.4.0.1$^{2,5}$.1$^{7,10}$]-3-dodecene), poly(8-(4-oxy-1,1'-biphenylmethyl)-11,12-dioxy-tetracyclo[4.4.0.1$^{2,5}$.1$^{7,10}$]-3-dodecene), and
poly(8-(4-hydroxyphenyloxymethyl)-11,12-dioxy-tetracyclo[4.4.0.1$^{2,5}$.1$^{7,10}$]-3-dodecene) in a case where at least one of R$^5$ to R$^8$ represents an aryloxyalkyl group;
poly(8-methoxycarbonyl-11,12-dioxy-tetracyclo[4.4.0.1$^{2,5}$.1$^{7,10}$]-3-dodecene),
poly(8-ethoxycarbonyl-11,12-dioxy-tetracyclo[4.4.0.1$^{2,5}$.1$^{7,10}$]-3-dodecene),
poly(8-(n-propoxycarbonyl)-11,12-dioxy-tetracyclo[4.4.0.1$^{2,5}$.1$^{7,10}$]-3-dodecene),
poly(8-(n-butoxycarbonyl)-11,12-dioxy-tetracyclo[4.4.0.1$^{2,5}$.1$^{7,10}$]-3-dodecene),
poly(8-isobutoxycarbonyl-11,12-dioxy-tetracyclo[4.4.0.1$^{2,5}$.1$^{7,10}$]-3-dodecene),
poly(8-(tert-butoxycarbonyl)-11,12-dioxy-tetracyclo[4.4.0.1$^{2,5}$.1$^{7,10}$]-3-dodecene),
poly(8-(n-pentyloxycarbonyl)-11,12-dioxy-tetracyclo[4.4.0.1$^{2,5}$.1$^{7,10}$]-3-dodecene),
poly(8-(2-methyl-2-pentyloxycarbonyl)-11,12-dioxy-tetracyclo[4.4.0.1$^{2,5}$.1$^{7,10}$]-3-dodecene),
poly(8-(3-methyl-3-pentyloxycarbonyl)-11,12-dioxy-tetracyclo[4.4.0.1$^{2,5}$.1$^{7,10}$]-3-dodecene),
poly(8-(2-ethyl-3-methyl-3-pentyloxycarbonyl)-11,12-dioxy-tetracyclo[4.4.0.1$^{2,5}$.1$^{7,10}$]-3-dodecene),
poly(8-cyclopentyloxycarbonyl-11,12-dioxy-tetracyclo[4.4.0.1$^{2,5}$.1$^{7,10}$]-3-dodecene),
poly(8-(n-hexyloxycarbonyl)-11,12-dioxy-tetracyclo[4.4.0.1$^{2,5}$.1$^{7,10}$]-3-dodecene),
poly(8-cyclohexyloxycarbonyl-11,12-dioxy-tetracyclo[4.4.0.1$^{2,5}$.1$^{7,10}$]-3-dodecene),
poly(8-(2-methyl-2-butoxycarbonyl)-11,12-dioxy-tetracyclo[4.4.0.1$^{2,5}$.1$^{7,10}$]-3-dodecene),
poly(8-(2,3-dimethyl-2-butoxycarbonyl)-11,12-dioxy-tetracyclo[4.4.0.1$^{2,5}$.1$^{7,10}$]-3-dodecene),
poly(8-(2,3,3-trimethyl-2-butoxycarbonyl)-11,12-dioxy-tetracyclo[4.4.0.1$^{2,5}$.1$^{7,10}$]-3-dodecene),
poly(8-(2-methyl-2-hexyloxycarbonyl)-11,12-dioxy-tetracyclo[4.4.0.1$^{2,5}$.1$^{7,10}$]-3-dodecene),
poly(8-(3,4-dimethyl-3-hexyloxycarbonyl)-11,12-dioxy-tetracyclo[4.4.0.1$^{2,5}$.1$^{7,10}$]-3-dodecene),
poly(8-(3-methylbutoxycarbonyl)-11,12-dioxy-tetracyclo[4.4.0.1$^{2,5}$.1$^{7,10}$]-3-dodecene),
poly(8-(2-methylpentoxycarbonyl)-11,12-dioxy-tetracyclo[4.4.0.1$^{2,5}$.1$^{7,10}$]-3-dodecene),
poly(8-(3-methylpentoxycarbonyl)-11,12-dioxy-tetracyclo[4.4.0.1$^{2,5}$.1$^{7,10}$]-3-dodecene),
poly(8-(4-methylpentoxycarbonyl)-11,12-dioxy-tetracyclo[4.4.0.1$^{2,5}$.1$^{7,10}$]-3-dodecene),
poly(8-(3-methyl-3-heptyloxycarbonyl)-11,12-dioxy-tetracyclo[4.4.0.1$^{2,5}$.1$^{7,10}$]-3-dodecene),
poly(8-(2-cyclopentyl)-2-propoxycarbonyl)-11,12-dioxy-tetracyclo[4.4.0.1$^{2,5}$.1$^{7,10}$]-3-dodecene),
poly(8-(2-cyclohexyl-2-propoxycarbonyl)-11,12-dioxy-tetracyclo[4.4.0.1$^{2,5}$.1$^{7,10}$]-3-dodecene),
poly(8-(2-norbornyl-2-propoxycarbonyl)-11,12-dioxy-tetracyclo[4.4.0.1$^{2,5}$.1$^{7,10}$]-3-dodecene),
poly(8-(1,1-dicyclopentylethoxycarbonyl)-11,12-dioxy-tetracyclo[4.4.0.1$^{2,5}$.1$^{7,10}$]-3-dodecene),
poly(8-(1,1-dicyclohexylethoxycarbonyl)-11,12-dioxy-tetracyclo[4.4.0.1$^{2,5}$.1$^{7,10}$]-3-dodecene),
poly(8-(1-methylcyclopentyloxycarbonyl)-11,12-dioxy-tetracyclo[4.4.0.1$^{2,5}$.1$^{7,10}$]-3-dodecene),
poly(8-(1-ethylcyclopentyloxycarbonyl)-11,12-dioxy-tetracyclo[4.4.0.1$^{2,5}$.1$^{7,10}$]-3-dodecene),
poly(8-(1-methylcyclohexyloxycarbonyl)-11,12-dioxy-tetracyclo[4.4.0.1$^{2,5}$.1$^{7,10}$]-3-dodecene),
poly(8-(1-ethylcyclohexyloxycarbonyl)-11,12-dioxy-tetracyclo[4.4.0.1$^{2,5}$.1$^{7,10}$]-3-dodecene),
poly(8-(1-methylcyclooctyloxycarbonyl)-11,12-dioxy-tetracyclo[4.4.0.1$^{2,5}$.1$^{7,10}$]-3-dodecene),
poly(8-(1-ethylcyclooctyloxycarbonyl)-11,12-dioxy-tetracyclo[4.4.0.1$^{2,5}$.1$^{7,10}$]-3-dodecene),
poly(8-(1-adamantyloxycarbonyl)-11,12-dioxy-tetracyclo[4.4.0.1$^{2,5}$.1$^{7,10}$]-3-dodecene),
poly(8-(2-methyl-2-adamantyloxycarbonyl)-11,12-dioxy-tetracyclo[4.4.0.1$^{2,5}$.1$^{7,10}$]-3-dodecene),
poly(8-(2-ethyl-2-adamantyloxycarbonyl)-11,12-dioxy-tetracyclo[4.4.0.1$^{2,5}$.1$^{7,10}$]-3-dodecene),
poly(8-(1-methyldecahydronaphthalene-1-yloxycarbonyl)-11,12-dioxy-tetracyclo[4.4.0.1$^{2,5}$.1$^{7,10}$]-3-dodecene),
poly(8-(1-ethyldecahydronaphthalene-1-yloxycarbonyl)-11,12-dioxy-tetracyclo[4.4.0.1$^{2,5}$.1$^{7,10}$]-3-dodecene),
poly(8-(2-methyldecahydronaphthalene-2-yloxycarbonyl)-11,12-dioxy-tetracyclo[4.4.0.1$^{2,5}$.1$^{7,10}$]-3-dodecene),
poly(8-(2-ethyldecahydronaphthalene-2-yloxycarbonyl)-11,12-dioxy-tetracyclo[4.4.0.1$^{2,5}$.1$^{7,10}$]-3-dodecene),
poly(8-(2-methyl-2-norbornyloxycarbonyl)-11,12-dioxy-tetracyclo[4.4.0.1$^{2,5}$.1$^{7,10}$]-3-dodecene),
poly(8-(2-ethyl-2-norbornyloxycarbonyl)-11,12-dioxy-tetracyclo[4.4.0.1$^{2,5}$.1$^{7,10}$]-3-dodecene),
poly(8-(2,7,7-trimethyl-2-norbornyloxycarbonyl)-11,12-dioxy-tetracyclo[4.4.0.1$^{2,5}$.1$^{7,10}$]-3-dodecene),
poly(8-(2-ethyl-7,7-dimethyl-2-norbornyloxycarbonyl)-11,12-dioxy-tetracyclo[4.4.0.1$^{2,5}$.1$^{7,10}$]-3-dodecene),
poly(8-(5-methyl-octahydro-4,7-methano-indene-5-yloxycarbonyl)-11,12-dioxy-tetracyclo[4.4.0.1$^{2,5}$.1$^{7,10}$]-3-dodecene),
poly(8-(5-ethyl-octahydro-4,7-methano-indene-5-yloxycarbonyl)-11,12-dioxy-tetracyclo[4.4.0.1$^{2,5}$.1$^{7,10}$]-3-dodecene), poly(8-(4-methyl-tetracyclo[6.2.1.1$^{3,6}$.0$^{2,7}$]-dodecane-4-yloxycarbonyl)-11,12-dioxy-tetracyclo[4.4.0.1$^{2,5}$.1$^{7,10}$]-3-dodecene), and
poly(8-(4-ethyl-tetracyclo[6.2.1.1$^{3,6}$.0$^{2,7}$]-dodecane-4-yloxycarbonyl)-11,12-dioxy-tetracyclo[4.4.0.1$^{2,5}$.1$^{7,10}$]-3-dodecene) in a case where at least one of R$^5$ to R$^8$ represents an alkoxycarbonyl group;
(5-dimethylaminocarbonyl-11,12-dioxy-tetracyclo[4.4.0.1$^{2,5}$.1$^{7,10}$]-3-dodecene),
poly(5-diethylaminocarbonyl-11,12-dioxy-tetracyclo[4.4.0.1$^{2,5}$.1$^{7,10}$]-3-dodecene),
poly(5-ethylmethylaminocarbonyl-11,12-dioxy-tetracyclo[4.4.0.1$^{2,5}$.1$^{7,10}$]-3-dodecene),
poly(5-methylbutylaminocarbonyl-11,12-dioxy-tetracyclo[4.4.0.1$^{2,5}$.1$^{7,10}$]-3-dodecene),
poly(5-butylethylaminocarbonyl-11,12-dioxy-tetracyclo[4.4.0.1$^{2,5}$.1$^{7,10}$]-3-dodecene), and
poly(5-cyclohexylmethylaminocarbonyl-11,12-dioxy-tetracyclo[4.4.0.1$^{2,5}$.1$^{7,10}$]-3-dodecene) in a case where at least one of R$^5$ to R$^8$ represents an alkylaminocarbonyl group;
poly(8-phenoxycarbonyl-11,12-dioxy-tetracyclo[4.4.0.1$^{2,5}$.1$^{7,10}$]-3-dodecene),
poly(8-benzyloxycarbonyl-11,12-dioxy-tetracyclo[4.4.0.1$^{2,5}$.1$^{7,10}$]-3-dodecene),
poly(8-(4-methylphenoxycarbonyl)-11,12-dioxy-tetracyclo[4.4.0.1$^{2,5}$.1$^{7,10}$]-3-dodecene),
poly(8-(3,4-dimethylphenoxycarbonyl)-11,12-dioxy-tetracyclo[4.4.0.1$^{2,5}$.1$^{7,10}$]-3-dodecene),
poly(8-(1-naphthoxycarbonyl)-11,12-dioxy-tetracyclo[4.4.0.1$^{2,5}$.1$^{7,10}$]-3-dodecene),
poly(8-(2-naphthoxycarbonyl)-11,12-dioxy-tetracyclo[4.4.0.1$^{2,5}$.1$^{7,10}$]-3-dodecene), and poly(8-(1-anthracenoxycarbonyl)-11,12-dioxy-tetracyclo[4.4.0.1$^{2,5}$.1$^{7,10}$]-3-dodecene) in a case where at least one of R$^5$ to R$^8$ represents an aryloxycarbonyl group;
poly(8-methylphenylaminocarbonyl)-11,12-dioxy-tetracyclo[4.4.0.1$^{2,5}$.1$^{7,10}$]-3-dodecene),
poly(8-ethylphenylaminocarbonyl)-11,12-dioxy-tetracyclo[4.4.0.1$^{2,5}$.1$^{7,10}$]-3-dodecene),
poly(8-butylphenylaminocarbonyl)-11,12-dioxy-tetracyclo[4.4.0.1$^{2,5}$.1$^{7,10}$]-3-dodecene), and
poly(8-cyclohexylphenylaminocarbonyl-11,12-dioxy-tetracyclo[4.4.0.1$^{2,5}$.1$^{7,10}$]-3-dodecene) in a case where at least one of R$^1$ to R$^4$ represents an alkylarylaminocarbonyl group;
poly(8-methoxycarbonylmethyl-11,12-dioxy-tetracyclo[4.4.0.1$^{2,5}$.1$^{7,10}$]-3-dodecene),
poly(8-methoxycarbonylethyl-11,12-dioxy-tetracyclo[4.4.0.1$^{2,5}$.1$^{7,10}$]-3-dodecene),
poly(8-ethoxycarbonylmethyl-11,12-dioxy-tetracyclo[4.4.0.1$^{2,5}$.1$^{7,10}$]-3-dodecene),
poly(8-ethoxycarbonylethyl-11,12-dioxy-tetracyclo[4.4.0.1$^{2,5}$.1$^{7,10}$]-3-dodecene),
poly(8-(n-propoxycarbonylmethyl)-11,12-dioxy-tetracyclo[4.4.0.1$^{2,5}$.1$^{7,10}$]-3-dodecene),
poly(8-(i-propoxycarbonylmethyl)-11,12-dioxy-tetracyclo[4.4.0.1$^{2,5}$.1$^{7,10}$]-3-dodecene),
poly(8-(n-butoxycarbonylmethyl)-11,12-dioxy-tetracyclo[4.4.0.1$^{2,5}$.1$^{7,10}$]-3-dodecene),
poly(8-(tert-butoxycarbonylmethyl)-11,12-dioxy-tetracyclo[4.4.0.1$^{2,5}$.1$^{7,10}$]-3-dodecene),
poly(8-(n-pentyloxycarbonylmethyl)-11,12-dioxy-tetracyclo[4.4.0.1$^{2,5}$.1$^{7,10}$]-3-dodecene),
poly(8-(2-methyl-2-butoxycarbonyl)methyl)-11,12-dioxy-tetracyclo[4.4.0.1$^{2,5}$.1$^{7,10}$]-3-dodecene),
poly(8-(2,3-dimethyl-2-butoxycarbonyl)methyl)-11,12-dioxy-tetracyclo[4.4.0.1$^{2,5}$.1$^{7,10}$]-3-dodecene),
poly(8-cyclopentyloxycarbonylmethyl-11,12-dioxy-tetracyclo[4.4.0.1$^{2,5}$.1$^{7,10}$]-3-dodecene),
poly(8-(n-hexyloxycarbonylmethyl)-11,12-dioxy-tetracyclo[4.4.0.1$^{2,5}$.1$^{7,10}$]-3-dodecene),
poly(8-cyclohexyloxycarbonylmethyl-11,12-dioxy-tetracyclo[4.4.0.1$^{2,5}$.1$^{7,10}$]-3-dodecene),
poly(8-(n-octyloxycarbonylmethyl)-11,12-dioxy-tetracyclo[4.4.0.1$^{2,5}$.1$^{7,10}$]-3-dodecene),
poly(8-cyclooctyloxycarbonylmethyl-11,12-dioxy-tetracyclo[4.4.0.1$^{2,5}$.1$^{7,10}$]-3-dodecene),
poly(8-(2-cyclopentyl-2-propoxycarbonyl)methyl)-11,12-dioxy-tetracyclo[4.4.0.1$^{2,5}$.1$^{7,10}$]-3-dodecene),
poly(8-(2-cyclohexyl-2-propoxycarbonyl)methyl)-11,12-dioxy-tetracyclo[4.4.0.1$^{2,5}$.1$^{7,10}$]-3-dodecene),
poly(8-(1-methylcyclopentyloxycarbonyl)methyl)-11,12-dioxy-tetracyclo[4.4.0.1$^{2,5}$.1$^{7,10}$]-3-dodecene),
poly(8-(1-ethylcyclopentyloxycarbonyl)methyl)-11,12-dioxy-tetracyclo[4.4.0.1$^{2,5}$.1$^{7,10}$]-3-dodecene),
poly(8-(1-methylcyclohexyloxycarbonyl)methyl)-11,12-dioxy-tetracyclo[4.4.0.1$^{2,5}$.1$^{7,10}$]-3-dodecene), and
poly(8-(1-ethylcyclohexyloxycarbonyl)methyl)-11,12-dioxy-tetracyclo[4.4.0.1$^{2,5}$.1$^{7,10}$]-3-dodecene) in a case where at least one of R$^5$ to R$^8$ represents an alkoxycarbonylalkyl group;
poly(8-methoxycarbonylphenyl-11,12-dioxy-tetracyclo[4.4.0.1$^{2,5}$.1$^{7,10}$]-3-dodecene),
poly(8-ethoxycarbonylphenyl)-11,12-dioxy-tetracyclo[4.4.0.1$^{2,5}$.1$^{7,10}$]-3-dodecene),
poly(8-(n-propoxycarbonylphenyl)-11,12-dioxy-tetracyclo[4.4.0.1$^{2,5}$.1$^{7,10}$]-3-dodecene),
poly(8-(i-propoxycarbonylphenyl)-11,12-dioxy-tetracyclo[4.4.0.1$^{2,5}$.1$^{7,10}$]-3-dodecene),
poly(8-(n-butoxycarbonylphenyl)-11,12-dioxy-tetracyclo[4.4.0.1$^{2,5}$.1$^{7,10}$]-3-dodecene),
poly(8-(tert-butoxycarbonylphenyl)-11,12-dioxy-tetracyclo[4.4.0.1$^{2,5}$.1$^{7,10}$]-3-dodecene),
poly(8-(n-pentyloxycarbonylphenyl)-11,12-dioxy-tetracyclo[4.4.0.1$^{2,5}$.1$^{7,10}$]-3-dodecene),
poly(8-(3-(2-methyl-2-butoxycarbonyl)phenyl)-11,12-dioxy-tetracyclo[4.4.0.1$^{2,5}$.1$^{7,10}$]-3-dodecene),
poly(8-(3-(2,3-dimethyl-2-butoxycarbonyl)phenyl)-11,12-dioxy-tetracyclo[4.4.0.1$^{2,5}$.1$^{7,10}$]-3-dodecene),
poly(8-(3-(2-cyclopentyl-2-propoxycarbonyl)phenyl)-11,12-dioxy-tetracyclo[4.4.0.1$^{2,5}$.1$^{7,10}$]-3-dodecene),
poly(8-(3-(2-cyclohexyl-2-propoxycarbonyl)phenyl)-11,12-dioxy-tetracyclo[4.4.0.1$^{2,5}$.1$^{7,10}$]-3-dodecene),
poly(8-(3-(1-methylcyclopentyloxycarbonyl)phenyl)-11,12-dioxy-tetracyclo[4.4.0.1$^{2,5}$.1$^{7,10}$]-3-dodecene),
poly(8-(3-(1-ethylcyclopentyloxycarbonyl)phenyl)-11,12-dioxy-tetracyclo[4.4.0.1$^{2,5}$.1$^{7,10}$]-3-dodecene),
poly(8-(3-(1-methylcyclohexyloxycarbonyl)phenyl)-11,12-dioxy-tetracyclo[4.4.0.1$^{2,5}$.1$^{7,10}$]-3-dodecene),
poly(8-(3-(1-ethylcyclohexyloxycarbonyl)phenyl)-11,12-dioxy-tetracyclo[4.4.0.1$^{2,5}$.1$^{7,10}$]-3-dodecene),
poly(8-(4-(2-methyl-2-butoxycarbonyl)phenyl)-11,12-dioxy-tetracyclo[4.4.0.1$^{2,5}$.1$^{7,10}$]-3-dodecene),
poly(8-(4-(2,3-dimethyl-2-butoxycarbonyl)phenyl)-11,12-dioxy-tetracyclo[4.4.0.1$^{2,5}$.1$^{7,10}$]-3-dodecene),
poly(8-(4-(2-cyclopentyl-2-propoxycarbonyl)phenyl)-11,12-dioxy-tetracyclo[4.4.0.1$^{2,5}$.1$^{7,10}$]-3-dodecene),
poly(8-(4-(2-cyclohexyl-2-propoxycarbonyl)phenyl)-11,12-dioxy-tetracyclo[4.4.0.1$^{2,5}$.1$^{7,10}$]-3-dodecene),
poly(8-(4-(1-methylcyclopentyloxycarbonyl)phenyl)-11,12-dioxy-tetracyclo[4.4.0.1$^{2,5}$.1$^{7,10}$]-3-dodecene),
poly(8-(4-(1-ethylcyclopentyloxycarbonyl)phenyl)-11,12-dioxy-tetracyclo[4.4.0.1$^{2,5}$.1$^{7,10}$]-3-dodecene),
poly(8-(4-(1-methylcyclohexyloxycarbonyl)phenyl)-11,12-dioxy-tetracyclo[4.4.0.1$^{2,5}$.1$^{7,10}$]-3-dodecene),
poly(8-(4-(1-ethylcyclohexyloxycarbonyl)phenyl)-11,12-dioxy-tetracyclo[4.4.0.1$^{2,5}$.1$^{7,10}$]-3-dodecene),
poly(8-methoxycarbonylnaphthyl-11,12-dioxy-tetracyclo[4.4.0.1$^{2,5}$.1$^{7,10}$]-3-dodecene),
poly(8-ethoxycarbonylnaphthyl-11,12-dioxy-tetracyclo[4.4.0.1$^{2,5}$.1$^{7,10}$]-3-dodecene),
poly(8-(n-propoxycarbonylnaphthyl)-11,12-dioxy-tetracyclo[4.4.0.1$^{2,5}$.1$^{7,10}$]-3-dodecene),
poly(8-(i-propoxycarbonylnaphthyl)-11,12-dioxy-tetracyclo[4.4.0.1$^{2,5}$.1$^{7,10}$]-3-dodecene),
poly(8-(n-butoxycarbonylnaphthyl)-11,12-dioxy-tetracyclo[4.4.0.1$^{2,5}$.1$^{7,10}$]-3-dodecene),
poly(8-(tert-butoxycarbonylphenyl)-11,12-dioxy-tetracyclo[4.4.0.1$^{2,5}$.1$^{7,10}$]-3-dodecene),
poly(8-(n-pentyloxycarbonylnaphthyl)-11,12-dioxy-tetracyclo[4.4.0.1$^{2,5}$.1$^{7,10}$]-3-dodecene),
poly(8-(5-(2-methyl-2-butoxycarbonyl)naphthyl)-11,12-dioxy-tetracyclo[4.4.0.1$^{2,5}$.1$^{7,10}$]-3-dodecene),
poly(8-(5-(2,3-dimethyl-2-butoxycarbonyl)naphthyl)-11,12-dioxy-tetracyclo[4.4.0.1$^{2,5}$.1$^{7,10}$]-3-dodecene),
poly(8-(5-(2-cyclopentyl-2-propoxycarbonyl)naphthyl)-11,12-dioxy-tetracyclo[4.4.0.1$^{2,5}$.1$^{7,10}$]-3-dodecene),
poly(8-(5-(2-cyclohexyl-2-propoxycarbonyl)naphthyl)-11,12-dioxy-tetracyclo[4.4.0.1$^{2,5}$.1$^{7,10}$]-3-dodecene),
poly(8-(5-(1-methylcyclopentyloxycarbonyl)naphthyl)-11,12-dioxy-tetracyclo[4.4.0.1$^{2,5}$.1$^{7,10}$]-3-dodecene),
poly(8-(5-(1-ethylcyclopentyloxycarbonyl)naphthyl)-11,12-dioxy-tetracyclo[4.4.0.1$^{2,5}$.1$^{7,10}$]-3-dodecene),
poly(8-(5-(1-methylcyclohexyloxycarbonyl)naphthyl)-11,12-dioxy-tetracyclo[4.4.0.1$^{2,5}$.1$^{7,10}$]-3-dodecene), and poly(8-(5-(1-ethylcyclohexyloxycarbonyl)naphthyl)-11,12-dioxy-tetracyclo[4.4.0.1$^{2,5}$.1$^{7,10}$]-3-dodecene) in a case where at least one of R$^5$ to R$^8$ represents an alkoxycarbonylaryl group;
poly(8-phenoxycarbonylmethyl-11,12-dioxy-tetracyclo[4.4.0.1$^{2,5}$.1$^{7,10}$]-3-dodecene),
poly(8-benzyloxycarbonylmethyl-11,12-dioxy-tetracyclo[4.4.0.1$^{2,5}$.1$^{7,10}$]-3-dodecene),
poly(8-(4-methylphenoxycarbonylmethyl)-11,12-dioxy-tetracyclo[4.4.0.1$^{2,5}$.1$^{7,10}$]-3-dodecene),
poly(8-(3,4-dimethylphenoxycarbonylmethyl)-11,12-dioxy-tetracyclo[4.4.0.1$^{2,5}$.1$^{7,10}$]-3-dodecene),
poly(8-(1-naphthoxycarbonylmethyl)-11,12-dioxy-tetracyclo[4.4.0.1$^{2,5}$.1$^{7,10}$]-3-dodecene),
poly(8-(2-naphthoxycarbonylmethyl)-11,12-dioxy-tetracyclo[4.4.0.1$^{2,5}$.1$^{7,10}$]-3-dodecene), and
poly(8-(1-anthracenoxycarbonylmethyl)-11,12-dioxy-tetracyclo[4.4.0.1$^{2,5}$.1$^{7,10}$]-3-dodecene) in a case where at least one of R$^5$ to R$^8$ represents an aryloxycarbonylalkyl group;
poly(8-(methoxymethyloxycarbonyl-11,12-dioxy-tetracyclo[4.4.0.1$^{2,5}$.1$^{7,10}$]-3-dodecene),
poly(8-ethoxymethyloxycarbonyl-11,12-dioxy-tetracyclo[4.4.0.1$^{2,5}$.1$^{7,10}$]-3-dodecene),
poly(8-(n-propoxymethyloxycarbonyl)-11,12-dioxy-tetracyclo[4.4.0.1$^{2,5}$.1$^{7,10}$]-3-dodecene),
poly(8-isopropoxymethyloxycarbonyl-11,12-dioxy-tetracyclo[4.4.0.1$^{2,5}$.1$^{7,10}$]-3-dodecene),
poly(8-(n-butoxymethyloxycarbonyl)-11,12-dioxy-tetracyclo[4.4.0.1$^{2,5}$.1$^{7,10}$]-3-dodecene),
poly(8-(tert-butoxymethyloxycarbonyl)-11,12-dioxy-tetracyclo[4.4.0.1$^{2,5}$.1$^{7,10}$]-3-dodecene),
poly(8-cyclopentyloxymethyloxycarbonyl-11,12-dioxy-tetracyclo[4.4.0.1$^{2,5}$.1$^{7,10}$]-3-dodecene),
poly(8-cyclohexyloxymethyloxycarbonyl-11,12-dioxy-tetracyclo[4.4.0.1$^{2,5}$.1$^{7,10}$]-3-dodecene),
poly(8-cyclooctyloxymethyloxycarbonyl-11,12-dioxy-tetracyclo[4.4.0.1$^{2,5}$.1$^{7,10}$]-3-dodecene),
poly(8-norbornyloxymethyloxycarbonyl-11,12-dioxy-tetracyclo[4.4.0.1$^{2,5}$.1$^{7,10}$]-3-dodecene),
poly(8-(1-methylcyclopentyloxymethyloxycarbonyl-11,12-dioxy-tetracyclo[4.4.0.1$^{2,5}$.1$^{7,10}$]-3-dodecene),
poly(8-(1-ethylcyclopentyloxymethyloxycarbonyl-11,12-dioxy-tetracyclo[4.4.0.1$^{2,5}$.1$^{7,10}$]-3-dodecene),
poly(8-(1-methylcyclohexyloxymethyloxycarbonyl-11,12-dioxy-tetracyclo[4.4.0.1$^{2,5}$.1$^{7,10}$]-3-dodecene),
poly(8-(1-ethylcyclohexyloxymethyloxycarbonyl-11,12-dioxy-tetracyclo[4.4.0.1$^{2,5}$.1$^{7,10}$]-3-dodecene),
poly(8-(1-methylnorbornyloxymethyloxycarbonyl-11,12-dioxy-tetracyclo[4.4.0.1$^{2,5}$.1$^{7,10}$]-3-dodecene),
poly(8-(1-ethylnorbornyloxymethyloxycarbonyl-11,12-dioxy-tetracyclo[4.4.0.1$^{2,5}$.1$^{7,10}$]-3-dodecene),
poly(8-(1-ethoxypropyloxymethyloxycarbonyl-11,12-dioxy-tetracyclo[4.4.0.1$^{2,5}$.1$^{7,10}$]-3-dodecene),
poly(8-(1-ethoxy-1-methylethyloxymethyloxycarbonyl-11,12-dioxy-tetracyclo[4.4.0.1$^{2,5}$.1$^{7,10}$]-3-dodecene),
poly(8-tetrahydrofuran-2-yloxymethyloxycarbonyl-11,12-dioxy-tetracyclo[4.4.0.1$^{2,5}$.1$^{7,10}$]-3-dodecene),
poly(8-tetrahydropyran-2-yloxymethyloxycarbonyl-11,12-dioxy-tetracyclo[4.4.0.1$^{2,5}$.1$^{7,10}$]-3-dodecene),
poly(8-(1-adamantyloxymethyloxycarbonyl)-11,12-dioxy-tetracyclo[4.4.0.1$^{2,5}$.1$^{7,10}$]-3-dodecene),
poly(8-(2-adamantyloxymethyloxycarbonyl)-11,12-dioxy-tetracyclo[4.4.0.1$^{2,5}$.1$^{7,10}$]-3-dodecene),
poly(8-(1-(1-methoxy)ethoxycarbonyl)-11,12-dioxy-tetracyclo[4.4.0.1$^{2,5}$.1$^{7,10}$]-3-dodecene),
poly(8-(1-(1-ethoxy)ethoxycarbonyl)-11,12-dioxy-tetracyclo[4.4.0.1$^{2,5}$.1$^{7,10}$]-3-dodecene),
poly(8-(1-(1-n-propoxy)ethoxycarbonyl)-11,12-dioxy-tetracyclo[4.4.0.1$^{2,5}$.1$^{7,10}$]-3-dodecene),
poly(8-(1-(1-isopropoxy)ethoxycarbonyl)-11,12-dioxy-tetracyclo[4.4.0.1$^{2,5}$.1$^{7,10}$]-3-dodecene),
poly(8-(1-(1-n-butoxy)ethoxycarbonyl)-11,12-dioxy-tetracyclo[4.4.0.1$^{2,5}$.1$^{7,10}$]-3-dodecene),
poly(8-(1-(1-tert-butoxy)ethoxycarbonyl)-11,12-dioxy-tetracyclo[4.4.0.1$^{2,5}$.1$^{7,10}$]-3-dodecene),
poly(8-(1-(1-cyclopentyloxy)ethoxycarbonyl)-11,12-dioxy-tetracyclo[4.4.0.1$^{2,5}$.1$^{7,10}$]-3-dodecene),
poly(8-(1-(1-cyclohexyloxy)ethoxycarbonyl)-11,12-dioxy-tetracyclo[4.4.0.1$^{2,5}$.1$^{7,10}$]-3-dodecene),
poly(8-(1-(1-cyclooctyloxy)ethoxycarbonyl)-11,12-dioxy-tetracyclo[4.4.0.1$^{2,5}$.1$^{7,10}$]-3-dodecene),
poly(8-(1-(1-norboryloxy)ethoxycarbonyl)-11,12-dioxy-tetracyclo[4.4.0.1$^{2,5}$.1$^{7,10}$]-3-dodecene),
poly(8-(1-(1-methylcyclopentyloxy)ethoxycarbonyl)-11,12-dioxy-tetracyclo[4.4.0.1$^{2,5}$.1$^{7,10}$]-3-dodecene),
poly(8-(1-(1-ethylcyclopentyloxy)ethoxycarbonyl)-11,12-dioxy-tetracyclo[4.4.0.1$^{2,5}$.1$^{7,10}$]-3-dodecene),
poly(8-(1-(1-methylcyclohexyloxy)ethoxycarbonyl)-11,12-dioxy-tetracyclo[4.4.0.1$^{2,5}$.1$^{7,10}$]-3-dodecene),
poly(8-(1-(1-ethylcyclohexyloxy)ethoxycarbonyl)-11,12-dioxy-tetracyclo[4.4.0.1$^{2,5}$.1$^{7,10}$]-3-dodecene),
poly(8-(1-(1-methylnorbornyloxy)ethoxycarbonyl)-11,12-dioxy-tetracyclo[4.4.0.1$^{2,5}$.1$^{7,10}$]-3-dodecene),
poly(8-(1-(1-ethylnorbornyloxy)ethoxycarbonyl)-11,12-dioxy-tetracyclo[4.4.0.1$^{2,5}$.1$^{7,10}$]-3-dodecene),
poly(8-(1-(1-ethoxypropyloxy)ethoxycarbonyl)-11,12-dioxy-tetracyclo[4.4.0.1$^{2,5}$.1$^{7,10}$]-3-dodecene),
poly(8-(1-(1-ethoxy-1-methylethyloxy)ethoxycarbonyl)-11,12-dioxy-tetracyclo[4.4.0.1$^{2,5}$.1$^{7,10}$]-3-dodecene),
poly(8-(1-(tetrahydrofuran-2-yloxy)ethoxycarbonyl)-11,12-dioxy-tetracyclo[4.4.0.1$^{2,5}$.1$^{7,10}$]-3-dodecene),
poly(8-(1-(tetrahydropyran-2-yloxy)ethoxycarbonyl)-11,12-dioxy-tetracyclo[4.4.0.1$^{2,5}$.1$^{7,10}$]-3-dodecene),
poly(8-(1-(1-adamantyloxy)ethoxycarbonyl)-11,12-dioxy-tetracyclo[4.4.0.1$^{2,5}$.1$^{7,10}$]-3-dodecene), and
poly(8-(1-(2-adamantyloxy)ethoxycarbonyl)-11,12-dioxy-tetracyclo[4.4.0.1$^{2,5}$.1$^{7,10}$]-3-dodecene) in a case where at least one of R$^5$ to R$^8$ represents an alkoxyalkyloxycarbonyl group; and
poly(8-methoxycarbonylmethyloxycarbonyl-11,12-dioxy-tetracyclo[4.4.0.1$^{2,5}$.1$^{7,10}$]-3-dodecene),
poly(8-ethoxycarbonylmethyloxycarbonyl-11,12-dioxy-tetracyclo[4.4.0.1$^{2,5}$.1$^{7,10}$]-3-dodecene),
poly(8-(n-propoxycarbonylmethyloxycarbonyl-11,12-dioxy-tetracyclo[4.4.0.1$^{2,5}$.1$^{7,10}$]-3-dodecene),
poly(8-isopropoxycarbonylmethyloxycarbonyl-11,12-dioxy-tetracyclo[4.4.0.1$^{2,5}$.1$^{7,10}$]-3-dodecene),
poly(8-(n-butoxycarbonylmethyloxycarbonyl-11,12-dioxy-tetracyclo[4.4.0.1$^{2,5}$.1$^{7,10}$]-3-dodecene),
poly(8-(tert-butoxycarbonylmethyloxycarbonyl-11,12-dioxy-tetracyclo[4.4.0.1$^{2,5}$.1$^{7,10}$]-3-dodecene),
poly(8-(2-cyclopentyl-2-propoxycarbonylmethyloxycarbonyl-11,12-dioxy-tetracyclo[4.4.0.1$^{2,5}$.1$^{7,10}$]-3-dodecene),
poly(8-(2-cyclopentyl-2-butoxycarbonylmethyloxycarbonyl-11,12-dioxy-tetracyclo[4.4.0.1$^{2,5}$.1$^{7,10}$]-3-dodecene),
poly(8-(2-cyclohexyl-2-propoxycarbonylmethyloxycarbonyl-11,12-dioxy-tetracyclo[4.4.0.1$^{2,5}$.1$^{7,10}$]-3-dodecene),
poly(8-(3-(2-cyclohexyl-2-propoxycarbonyl)propoxycarbonyl)-11,12-dioxy-tetracyclo[4.4.0.1$^{2,5}$.1$^{7,10}$]-3-dodecene),
poly(8-(2-cyclohexyl-2-butoxycarbonylmethyloxycarbonyl-11,12-dioxy-tetracyclo[4.4.0.1$^{2,5}$.1$^{7,10}$]-3-dodecene), poly(8-(3-cyclohexyl-3-pentyloxycarbonylmethyloxycarbonyl-11,12-dioxy-tetracyclo[4.4.0.1$^{2,5}$.1$^{7,10}$]-3-dodecene),
poly(8-(2-ethyl-2-norbornyloxycarbonylmethyloxycarbonyl-11,12-dioxy-tetracyclo[4.4.0.1$^{2,5}$.1$^{7,10}$]-3-dodecene),
poly(8-(2-norbornyl-2-propoxycarbonylmethyloxycarbonyl-11,12-dioxy-tetracyclo[4.4.0.1$^{2,5}$.1$^{7,10}$]-3-dodecene),
poly(8-(4-ethyl-tetracyclo[6.2.1.1$^{3,6}$.0$^{2,7}$]-dodecane-4-yloxycarbonylmethyloxycarbonyl)-11,12-dioxy-tetracyclo[4.4.0.1$^{2,5}$.1$^{7,10}$]-3-dodecene),
poly(8-(2-tetracyclo[6.2.1.1$^{3,6}$.0$^{2,7}$]-dodecane-4-yl)-2-propoxycarbonylmethyloxycarbonyl)-11,12-dioxy-tetracyclo[4.4.0.1$^{2,5}$.1$^{7,10}$]-3-dodecene),
poly(8-(1,1-dicyclohexylethoxycarbonylmethyloxycarbonyl)-11,12-dioxy-tetracyclo[4.4.0.1$^{2,5}$.1$^{7,10}$]-3-dodecene),
poly(8-(1,1-dicyclohexylpropoxycarbonylmethyloxycarbonyl)-tetracyclo[4.4.0.1$^{2,5}$.1$^{7,10}$]-3-dodecene),
poly(8-cyclopentyloxycarbonylmethyloxycarbonyl-11,12-dioxy-tetracyclo[4.4.0.1$^{2,5}$.1$^{7,10}$]-3-dodecene),
poly(8-cyclohexyloxycarbonylmethyloxycarbonyl-11,12-dioxy-tetracyclo[4.4.0.1$^{2,5}$.1$^{7,10}$]-3-dodecene),
poly(8-cyclooctyloxycarbonylmethyloxycarbonyl-11,12-dioxy-tetracyclo[4.4.0.1$^{2,5}$.1$^{7,10}$]-3-dodecene),
poly(8-norbornyloxycarbonylmethyloxycarbonyl-11,12-dioxy-tetracyclo[4.4.0.1$^{2,5}$.1$^{7,10}$]-3-dodecene),
poly(8-(1-methylcyclopentyloxycarbonylmethyloxycarbonyl-11,12-dioxy-tetracyclo[4.4.0.1$^{2,5}$.1$^{7,10}$]-3-dodecene),
poly(8-(1-ethylcyclopentyloxycarbonylmethyloxycarbonyl-11,12-dioxy-tetracyclo[4.4.0.1$^{2,5}$.1$^{7,10}$]-3-dodecene),
poly(8-(1-methylcyclohexyloxycarbonylmethyloxycarbonyl-11,12-dioxy-tetracyclo[4.4.0.1$^{2,5}$.1$^{7,10}$]-3-dodecene),
poly(8-(1-ethylcyclohexyloxycarbonylmethyloxycarbonyl)-11,12-dioxy-tetracyclo[4.4.0.1$^{2,5}$.1$^{7,10}$]-3-dodecene),
poly(8-(1-methylnorbornyloxycarbonylmethyloxycarbonyl-11,12-dioxy-tetracyclo[4.4.0.1$^{2,5}$.1$^{7,10}$]-3-dodecene),
poly(8-(1-ethylnorbornyloxycarbonylmethyloxycarbonyl)-11,12-dioxy-tetracyclo[4.4.0.1$^{2,5}$.1$^{7,10}$]-3-dodecene),
poly(8-(1-ethoxypropyloxycarbonylmethyloxycarbonyl)-11,12-dioxy-tetracyclo[4.4.0.1$^{2,5}$.1$^{7,10}$]-3-dodecene),
poly(8-(1-ethoxy-1-methylethyloxycarbonylmethyloxycarbonyl)-11,12-dioxy-tetracyclo[4.4.0.1$^{2,5}$.1$^{7,10}$]-3-dodecene),
poly(8-tetrahydrofuran-2-yloxycarbonylmethyloxycarbonyl-11,12-dioxy-tetracyclo[4.4.0.1$^{2,5}$.1$^{7,10}$]-3-dodecene),
poly(8-tetrahydropyran-2-yloxycarbonylmethyloxycarbonyl-11,12-dioxy-tetracyclo[4.4.0.1$^{2,5}$.1$^{7,10}$]-3-dodecene),
poly(8-(1-adamantyloxycarbonylmethyloxycarbonyl)-11,12-dioxy-tetracyclo[4.4.0.1$^{2,5}$.1$^{7,10}$]-3-dodecene),
poly(8-2-adamantyloxycarbonylmethyloxycarbonyl)-11,12-dioxy-tetracyclo[4.4.0.1$^{2,5}$.1$^{7,10}$]-3-dodecene),
poly(8-(1-(2-(1-adamantyl)-2-propoxycarbonyl)-ethoxycarbonyl)-11,12-dioxy-tetracyclo[4.4.0.1$^{2,5}$.1$^{7,10}$]-3-dodecene),
poly(8-(3-(2-(1-adamantyl)-2-propoxycarbonyl)-propoxycarbonyl)-11,12-dioxy-tetracyclo[4.4.0.1$^{2,5}$.1$^{7,10}$]-3-dodecene),
poly(8-(2-(2-(1-adamantyl)-2-propoxycarbonyl)-2-propoxycarbonyl)-11,12-dioxy-tetracyclo[4.4.0.1$^{2,5}$.1$^{7,10}$]-3-dodecene),
poly(8-(2-methyl-2-adamantyloxycarbonylmethyloxycarbonyl)-11,12-dioxy-tetracyclo[4.4.0.1$^{2,5}$.1$^{7,10}$]-3-dodecene),
poly(8-(3-(2-methyl-2-adamantyloxycarbonyl)propoxycarbonyl)-11,12-dioxy-tetracyclo[4.4.0.1$^{2,5}$.1$^{7,10}$]-3-dodecene),
poly(8-(2-(2-methyl-2-adamantyloxycarbonyl)-2-propoxycarbonyl)-11,12-dioxy-tetracyclo[4.4.0.1$^{2,5}$.1$^{7,10}$]-3-dodecene),
poly(8-(1-(2-methyl-2-adamantyloxycarbonyl)ethoxycarbonyl)-11,12-dioxy-tetracyclo[4.4.0.1$^{2,5}$.1$^{7,10}$]-3-dodecene),
poly(8-(2-ethyl-2-adamantyloxycarbonylmethyloxycarbonyl)-11,12-dioxy-tetracyclo[4.4.0.1$^{2,5}$.1$^{7,10}$]-3-dodecene),
poly(8-(2-isopropyl-2-adamantyloxycarbonylmethyloxycarbonyl)-11,12-dioxy-tetracyclo[4.4.0.1$^{2,5}$.1$^{7,10}$]-3-dodecene),
poly(8-(2-(1-adamantyl)-2-propoxycarbonylmethyloxycarbonyl)-11,12-dioxy-tetracyclo[4.4.0.1$^{2,5}$.1$^{7,10}$]-3-dodecene),
poly(8-(2-(1-adamantyl)-2-butoxycarbonylmethyloxycarbonyl)-11,12-dioxy-tetracyclo[4.4.0.1$^{2,5}$.1$^{7,10}$]-3-dodecene),
poly(8-(3-(1-adamantyl)-3-pentyloxycarbonylmethyloxycarbonyl)-11,12-dioxy-tetracyclo[4.4.0.1$^{2,5}$.1$^{7,10}$]-3-dodecene),
poly(8-(3-tert-butoxycarbonyl-1-cyclopentyloxycarbonyl)-11,12-dioxy-tetracyclo[4.4.0.1$^{2,5}$.1$^{7,10}$]-3-dodecene),
poly(8-(3-(1-methylcyclohexyloxycarbonyl)-1-cyclopentyloxycarbonyl)-11,12-dioxy-tetracyclo[4.4.0.1$^{2,5}$.1$^{7,10}$]-3-dodecene),
poly(8-(5-tert-butoxycarbonyl-2-norbornyloxycarbonyl)-11,12-dioxy-tetracyclo[4.4.0.1$^{2,5}$.1$^{7,10}$]-3-dodecene),
poly(8-(5-(1-methylcyclohexyloxycarbonyl)-2-norbornyloxycarbonyl)-11,12-dioxy-tetracyclo[4.4.0.1$^{2,5}$.1$^{7,10}$]-3-dodecene),
poly(8-(5,5-di(tert-butoxycarbonyl)-2-norbornyloxycarbonyl)-11,12-dioxy-tetracyclo[4.4.0.1$^{2,5}$.1$^{7,10}$]-3-dodecene),
poly(8-(5,6-di(tert-butoxycarbonyl)-2-norbornyloxycarbonyl)-11,12-dioxy-tetracyclo[4.4.0.1$^{2,5}$.1$^{7,10}$]-3-dodecene),
poly(8-(1-(1-methylcyclohexyloxycarbonyl)-octahydro-4,7-methano-indene-5-yloxycarbonyl)-11,12-dioxy-tetracyclo[4.4.0.1$^{2,5}$.1$^{7,10}$]-3-dodecene),
poly(8-(6-tert-butoxycarbonyl-decahydronaphthalene-2-yloxycarbonyl)-11,12-dioxy-tetracyclo[4.4.0.1$^{2,5}$.1$^{7,10}$]-3-dodecene),
poly(8-(9-tert-butoxycarbonyl-11,12-dioxy-tetracyclo[6.2.1.1$^{3,6}$.0$^{2,7}$]-dodecane-4-yloxycarbonyl)-11,12-dioxy-tetracyclo[4.4.0.1$^{2,5}$.1$^{7,10}$]-3-dodecene), and
poly(8-(9-(1-methylcyclohexyloxycarbonyl)-11,12-dioxy-tetracyclo[6.2.1.1$^{3,6}$.0$^{2,7}$]-dodecane-4-yloxycarbonyl)-11,12-dioxy-tetracyclo[4.4.0.1$^{2,5}$.1$^{7,10}$]-3-dodecene) in a case where at least one of $R^5$ to $R^8$ represents an alkoxycarbonylalkyloxycarbonyl group.

In a case where $R^5$ to $R^8$ are bonded to each other to form a ring structure, examples of the cyclic alkyl structure include poly(1,4,4a,5,6,7,8,8a,9,9a,10,10a-dodecahydro-1,4:9,10-diepoxy-naphthalene). Examples of the cyclic ester structure which can form a lactone ring include poly(4,14,15-trioxy-pentacyclo[9.2.1.1$^{1,7}$.0$^{2,6}$.0$^{8,13}$]-10-pentadecene-3-one) as a γ-butyrolactone structure; and poly(4,15,16-trioxy-pentacyclo[10.2.1.0$^{1,8}$.0$^{2,7}$.0$^{9,14}$]-11-hexadecene-3-one) as a δ-valerolactone structure. Examples of the cyclic acid anhydride structure include poly(4,14,15-trioxy-pentacyclo[9.2.1.1$^{1,7}$.0$^{2,6}$.0$^{8,13}$]-10-pentadecene-3-one). Examples of the cyclic amide structure which can form a lactam ring include
poly(4-methyl-4-aza-14,15-dioxy-pentacyclo[9.2.1.1$^{1,7}$.0$^{2,6}$.0$^{8,13}$]-10-pentadecene-3-one),
poly(4-ethyl-4-aza-14,15-dioxy-pentacyclo[9.2.1.1$^{1,7}$.0$^{2,6}$.0$^{8,13}$]-10-pentadecene-3-one),
poly(4-(n-propyl)-4-aza-14,15-dioxy-pentacyclo [9.2.1.1$^{1,7}$.0$^{2,6}$.0$^{8,13}$]-10-pentadecene-3-one),
poly(4-(n-butyl)-4-aza-14,15-dioxy-pentacyclo [9.2.1.1$^{1,7}$.0$^{2,6}$.0$^{8,13}$]-10-pentadecene-3-one),
poly(4-(1-methylbutyl)-4-aza-14,15-dioxy-pentacyclo [9.2.1.1$^{1,7}$.0$^{2,6}$.0$^{8,13}$]-10-pentadecene-3-one),
poly(4-cyclopentyl-4-aza-14,15-dioxy-pentacyclo [9.2.1.1$^{1,7}$.0$^{2,6}$.0$^{8,13}$]-10-pentadecene-3-one),
poly(4-cyclohexyl-4-aza-14,15-dioxy-pentacyclo [9.2.1.1$^{1,7}$.0$^{2,6}$.0$^{8,13}$]-10-pentadecene-3-one),
poly(4-phenyl-4-aza-14,15-dioxy-pentacyclo[9.2.1.1$^{1,7}$.0$^{2,6}$.0$^{8,13}$]-10-pentadecene-3-one), and
poly(4-(4-hydroxyphenyl)-4-aza-14,15-dioxy-pentacyclo [9.2.1.1$^{1,7}$.0$^{2,6}$.0$^{8,13}$]-10-pentadecene-3-one) as γ-lactam; and
poly(4-methyl-4-aza-15,16-dioxy-pentacyclo[10.2.1.1$^{1,8}$.0$^{2,7}$.0$^{9,14}$]-11-hexadecene-3-one),
poly(4-methyl-4-aza-15,16-dioxy-pentacyclo[10.2.1.1$^{1,8}$.0$^{2,7}$.0$^{9,14}$]-1 1-hexadecene-3-one),
poly(4-(n-propyl)-4-aza-15,16-dioxy-pentacyclo [10.2.1.1$^{1,8}$.0$^{2,7}$.0$^{9,14}$]-11-hexadecene-3-one),
poly(4-(n-butyl)-4-aza-15,16-dioxy-pentacyclo [10.2.1.1$^{1,8}$.0$^{2,7}$.0$^{9,14}$]-11-hexadecene-3-one),
poly(4-(1-methylbutyl)-4-aza-15,16-dioxy-pentacyclo [10.2.1.1$^{1,8}$.0$^{2,7}$.0$^{9,14}$]-11-hexadecene-3-one),
poly(4-cyclopentyl-4-aza-15,16-dioxy-pentacyclo [10.2.1.1$^{1,8}$.0$^{2,7}$.0$^{9,14}$]-11-hexadecene-3-one),
poly(4-cyclohexyl-4-aza-15,16-dioxy-pentacyclo [10.2.1.1$^{1,8}$.0$^{2,7}$.0$^{9,14}$]-11-hexadecene-3-one),
poly(4-phenyl-4-aza-15,16-dioxy-pentacyclo[10.2.1.1$^{1,8}$.0$^{2,7}$.0$^{9,14}$]-11-hexadecene-3-one), and
poly(4-(4-hydroxyphenyl)-4-aza-15,16-dioxy-pentacyclo [10.2.1.1$^{1,8}$.0$^{2,7}$.0$^{9,14}$]-11-hexadecene-3-one) as δ-lactam. Examples of the cyclic imide structure which can form a maleimide ring include
poly(4-methyl-4-aza-14,15-dioxy-pentacyclo[9.2.1.1$^{1,7}$.0$^{2,6}$.0$^{8,13}$]-10-pentadecene-3,5-dione),
poly(4-ethyl-4-aza-14,15-dioxy-pentacyclo[9.2.1.1$^{1,7}$.0$^{2,6}$.0$^{8,13}$]-10-pentadecene-3,5-dione),
poly(4-(n-propyl)-4-aza-14,15-dioxy-pentacyclo [9.2.1.1$^{1,7}$.0$^{2,6}$.0$^{8,13}$]-10-pentadecene-3,5-dione),
poly(4-(n-butyl)-4-aza-14,15-dioxy-pentacyclo [9.2.1.1$^{1,7}$.0$^{2,6}$.0$^{8,13}$]-10-pentadecene-3,5-dione),
poly(4-(1-methylbutyl)-4-aza-14,15-dioxy-pentacyclo [9.2.1.1$^{1,7}$.0$^{2,6}$.0$^{8,13}$]-10-pentadecene-3,5-dione),
poly(4-cyclopentyl)-4-aza-14,15-dioxy-pentacyclo [9.2.1.1$^{1,7}$.0$^{2,6}$.0$^{8,13}$]-10-pentadecene-3,5-dione),
poly(4-cyclohexyl-4-aza-14,15-dioxy-pentacyclo [9.2.1.1$^{1,7}$.0$^{2,6}$.0$^{8,13}$]-10-pentadecene-3,5-dione),
poly(4-phenyl-4-aza-14,15-dioxy-pentacyclo[9.2.1.1$^{1,7}$.0$^{2,6}$.0$^{8,13}$]-10-pentadecene-3,5-dione), and
poly(4-(4-hydroxyphenyl)-4-aza-14,15-dioxy-pentacyclo [9.2.1.1$^{1,7}$.0$^{2,6}$.0$^{8,13}$]-10-pentadecene-3,5-dione).

Among these, in the repeating structural unit [B] represented by Formula (2) according to the present embodiment, as the cyclic olefin polymer in which n represents 1,
poly(8-methoxycarbonyl)-11,12-dioxy-tetracyclo [4.4.0.1$^{2,5}$.1$^{7,10}$]-3-dodecene),
poly(8-ethoxycarbonyl-11,12-dioxy-tetracyclo[4.4.0.1$^{2,5}$.1$^{7,10}$]-3-dodecene),
poly(8-(n-propoxycarbonyl)-11,12-dioxy-tetracyclo [4.4.0.1$^{2,5}$.1$^{7,10}$]-3-dodecene),
poly(8-(n-butoxycarbonyl)-11,12-dioxy-tetracyclo [4.4.0.1$^{2,5}$.1$^{7,10}$]-3-dodecene),
poly(8-isobutoxycarbonyl-11,12-dioxy-tetracyclo [4.4.0.1$^{2,5}$.1$^{7,10}$]-3-dodecene),
poly(8-(tert-butoxycarbonyl)-11,12-dioxy-tetracyclo [4.4.0.1$^{2,5}$.1$^{7,10}$]-3-dodecene),
poly(8-(n-pentyloxycarbonyl)-11,12-dioxy-tetracyclo [4.4.0.1$^{2,5}$.1$^{7,10}$]-3-dodecene),
poly(8-(2-methyl-2-pentyloxycarbonyl)-11,12-dioxy-tetracyclo[4.4.0.1$^{2,5}$.1$^{7,10}$]-3-dodecene),
poly(8-(3-methyl-3-pentyloxycarbonyl)-11,12-dioxy-tetracyclo[4.4.0.1$^{2,5}$.1$^{7,10}$]-3-dodecene),
poly(8-(2-ethyl-3-methyl-3-pentyloxycarbonyl)-11,12-dioxy-tetracyclo[4.4.0.1$^{2,5}$.1$^{7,10}$]-3-dodecene),
poly(8-cyclopentyloxycarbonyl-11,12-dioxy-tetracyclo [4.4.0.1$^{2,5}$.1$^{7,10}$]-3-dodecene),
poly(8-(n-hexyloxycarbonyl)-11,12-dioxy-tetracyclo [4.4.0.1$^{2,5}$.1$^{7,10}$]-3-dodecene),
poly(8-cyclohexyloxycarbonyl-11,12-dioxy-tetracyclo [4.4.0.1$^{2,5}$.1$^{7,10}$]-3-dodecene),
poly(8-(2-methyl-2-butoxycarbonyl)-11,12-dioxy-tetracyclo[4.4.0.1$^{2,5}$.1$^{7,10}$]-3-dodecene),
poly(8-(2,3-dimethyl-2-butoxycarbonyl)-11,12-dioxy-tetracyclo[4.4.0.1$^{2,5}$.1$^{7,10}$]-3-dodecene),
poly(8-(2,3,3-trimethyl-2-butoxycarbonyl)-11,12-dioxy-tetracyclo[4.4.0.1$^{2,5}$.1$^{7,10}$]-3-dodecene),
poly(8-(2-methyl-2-hexyloxycarbonyl)-11,12-dioxy-tetracyclo[4.4.0.1$^{2,5}$.1$^{7,10}$]-3-dodecene),
poly(8-(3,4-dimethyl-3-hexyloxycarbonyl)-11,12-dioxy-tetracyclo[4.4.0.1$^{2,5}$.1$^{7,10}$]-3-dodecene),
poly(8-(3-methylbutoxycarbonyl)-11,12-dioxy-tetracyclo [4.4.0.1$^{2,5}$.1$^{7,10}$]-3-dodecene),
poly(8-(2-methylpentoxycarbonyl)-11,12-dioxy-tetracyclo [4.4.0.1$^{2,5}$.1$^{7,10}$]-3-dodecene),
poly(8-(3-methylpentoxycarbonyl)-11,12-dioxy-tetracyclo [4.4.0.1$^{2,5}$.1$^{7,10}$]-3-dodecene),
poly(8-(4-methylpentoxycarbonyl)-11,12-dioxy-tetracyclo [4.4.0.1$^{2,5}$.1$^{7,10}$]-3-dodecene),
poly(8-(3-methyl-3-heptyloxycarbonyl)-11,12-dioxy-tetracyclo[4.4.0.1$^{2,5}$.1$^{7,10}$]-3-dodecene),
poly(8-(2-cyclopentyl)-2-propoxycarbonyl)-11,12-dioxy-tetracyclo[4.4.0.1$^{2,5}$.1$^{7,10}$]-3-dodecene),
poly(8-(2-cyclohexyl-2-propoxycarbonyl)-11,12-dioxy-tetracyclo[4.4.0.1$^{2,5}$.1$^{7,10}$]-3-dodecene),
poly(8-(2-norbornyl-2-propoxycarbonyl)-11,12-dioxy-tetracyclo[4.4.0.1$^{2,5}$.1$^{7,10}$]-3-dodecene),
poly(8-(1,1-dicyclopentylethoxycarbonyl)-11,12-dioxy-tetracyclo[4.4.0.1$^{2,5}$.1$^{7,10}$]-3-dodecene),
poly(8-(1,1-dicyclohexylethoxycarbonyl)-11,12-dioxy-tetracyclo[4.4.0.1$^{2,5}$.1$^{7,10}$]-3-dodecene),
poly(8-(1-methylcyclopentyloxycarbonyl)-11,12-dioxy-tetracyclo[4.4.0.1$^{2,5}$.1$^{7,10}$]-3-dodecene),
poly(8-(1-ethylcyclopentyloxycarbonyl)-11,12-dioxy-tetracyclo[4.4.0.1$^{2,5}$.1$^{7,10}$]-3-dodecene),
poly(8-(1-methylcyclohexyloxycarbonyl)-11,12-dioxy-tetracyclo[4.4.0.1$^{2,5}$.1$^{7,10}$]-3-dodecene),
poly(8-(1-ethylcyclohexyloxycarbonyl)-11,12-dioxy-tetracyclo[4.4.0.1$^{2,5}$.1$^{7,10}$]-3-dodecene),
poly(8-(1-methylcyclooctyloxycarbonyl)-11,12-dioxy-tetracyclo[4.4.0.1$^{2,5}$.1$^{7,10}$]-3-dodecene),
poly(8-(1-ethylcyclooctyloxycarbonyl)-11,12-dioxy-tetracyclo[4.4.0.1$^{2,5}$.1$^{7,10}$]-3-dodecene),
poly(8-(1-adamantyloxycarbonyl)-11,12-dioxy-tetracyclo [4.4.0.1$^{2,5}$.1$^{7,10}$]-3-dodecene), poly(8-(2-methyl-2-adamantyloxycarbonyl)-11,12-dioxy-tetracyclo[4.4.0.1$^{2,5}$.1$^{7,10}$]-3-dodecene),
poly(8-(2-ethyl-2-adamantyloxycarbonyl)-11,12-dioxy-tetracyclo[4.4.0.1$^{2,5}$.1$^{7,10}$]-3-dodecene),
poly(8-(1-methyldecahydronaphthalene-1-yloxycarbonyl)-11,12-dioxy-tetracyclo[4.4.0.1$^{2,5}$.1$^{7,10}$]-3-dodecene),
poly(8-(1-ethyldecahydronaphthalene-1-yloxycarbonyl)-11,12-dioxy-tetracyclo[4.4.0.1$^{2,5}$.1$^{7,10}$]-3-dodecene),
poly(8-(2-methyldecahydronaphthalene-2-yloxycarbonyl)-11,12-dioxy-tetracyclo[4.4.0.1$^{2,5}$.1$^{7,10}$]-3-dodecene),
poly(8-(2-ethyldecahydronaphthalene-2-yloxycarbonyl)-11,12-dioxy-tetracyclo[4.4.0.1$^{2,5}$.1$^{7,10}$]-3-dodecene),
poly(8-(2-methyl-2-norbornyloxycarbonyl)-11,12-dioxy-tetracyclo[4.4.0.1$^{2,5}$.1$^{7,10}$]-3-dodecene),
poly(8-(2-ethyl-2-norbornyloxycarbonyl)-11,12-dioxy-tetracyclo[4.4.0.1$^{2,5}$.1$^{7,10}$]-3-dodecene),
poly(8-(2,7,7-trimethyl-2-norbornyloxycarbonyl)-11,12-dioxy-tetracyclo[4.4.0.1$^{2,5}$.1$^{7,10}$]-3-dodecene),
poly(8-(2-ethyl-7,7-dimethyl-2-norbornyloxycarbonyl)-11,12-dioxy-tetracyclo[4.4.0.1$^{2,5}$.1$^{7,10}$]-3-dodecene),
poly(8-(5-methyl-octahydro-4,7-methano-indene-5-yloxycarbonyl)-11,12-dioxy-tetracyclo[4.4.0.1$^{2,5}$.1$^{7,10}$]-3-dodecene),
poly(8-(5-ethyl-octahydro-4,7-methano-indene-5-yloxycarbonyl)-11,12-dioxy-tetracyclo[4.4.0.1$^{2,5}$.1$^{7,10}$]-3-dodecene),
poly(8-(4-methyl-tetracyclo[6.2.1.1$^{3,6}$.0$^{2,7}$]-dodecane-4-yloxycarbonyl)-11,12-dioxy-tetracyclo[4.4.0.1$^{2,5}$.1$^{7,10}$]-3-dodecene),
poly(8-(4-ethyl-tetracyclo[6.2.1.1$^{3,6}$.0$^{2,7}$]-dodecane-4-yloxycarbonyl)-11,12-dioxy-tetracyclo[4.4.0.1$^{2,5}$.1$^{7,10}$]-3-dodecene),
poly(8-methoxycarbonylphenyl)-11,12-dioxy-tetracyclo[4.4.0.1$^{2,5}$.1$^{7,10}$]-3-dodecene),
poly(8-ethoxycarbonylphenyl)-11,12-dioxy-tetracyclo[4.4.0.1$^{2,5}$.1$^{7,10}$]-3-dodecene),
poly(8-(n-propoxycarbonylphenyl)-11,12-dioxy-tetracyclo[4.4.0.1$^{2,5}$.1$^{7,10}$]-3-dodecene),
poly(8-(i-propoxycarbonylphenyl)-11,12-dioxy-tetracyclo[4.4.0.1$^{2,5}$.1$^{7,10}$]-3-dodecene),
poly(8-(n-butoxycarbonylphenyl)-11,12-dioxy-tetracyclo[4.4.0.1$^{2,5}$.1$^{7,10}$]-3-dodecene),
poly(8-(tert-butoxycarbonylphenyl)-11,12-dioxy-tetracyclo[4.4.0.1$^{2,5}$.1$^{7,10}$]-3-dodecene),
poly(8-(n-pentyloxycarbonylphenyl)-11,12-dioxy-tetracyclo[4.4.0.1$^{2,5}$.1$^{7,10}$]-3-dodecene),
poly(8-(3-(2-methyl-2-butoxycarbonyl)phenyl)-11,12-dioxy-tetracyclo[4.4.0.1$^{2,5}$.1$^{7,10}$]-3-dodecene),
poly(8-(3-(2,3-dimethyl-2-butoxycarbonyl)phenyl)-11,12-dioxy-tetracyclo[4.4.0.1$^{2,5}$.1$^{7,10}$]-3-dodecene),
poly(8-(3-(2-cyclopentyl-2-propoxycarbonyl)phenyl)-11,12-dioxy-tetracyclo[4.4.0.1$^{2,5}$.1$^{7,10}$]-3-dodecene),
poly(8-(3-(2-cyclohexyl-2-propoxycarbonyl)phenyl)-11,12-dioxy-tetracyclo[4.4.0.1$^{2,5}$.1$^{7,10}$]-3-dodecene),
poly(8-(3-(1-methylcyclopentyloxycarbonyl)phenyl)-11,12-dioxy-tetracyclo[4.4.0.1$^{2,5}$.1$^{7,10}$]-3-dodecene),
poly(8-(3-(1-ethylcyclopentyloxycarbonyl)phenyl)-11,12-dioxy-tetracyclo[4.4.0.1$^{2,5}$.1$^{7,10}$]-3-dodecene),
poly(8-(3-(1-methylcyclohexyloxycarbonyl)phenyl)-11,12-dioxy-tetracyclo[4.4.0.1$^{2,5}$.1$^{7,10}$]-3-dodecene),
poly(8-(3-(1-ethylcyclohexyloxycarbonyl)phenyl)-11,12-dioxy-tetracyclo[4.4.0.1$^{2,5}$.1$^{7,10}$]-3-dodecene),
poly(8-(4-(2-methyl-2-butoxycarbonyl)phenyl)-11,12-dioxy-tetracyclo[4.4.0.1$^{2,5}$.1$^{7,10}$]-3-dodecene),
poly(8-(4-(2,3-dimethyl-2-butoxycarbonyl)phenyl)-11,12-dioxy-tetracyclo[4.4.0.1$^{2,5}$.1$^{7,10}$]-3-dodecene),
poly(8-(4-(2-cyclopentyl-2-propoxycarbonyl)phenyl)-11,12-dioxy-tetracyclo[4.4.0.1$^{2,5}$.1$^{7,10}$]-3-dodecene),
poly(8-(4-(2-cyclohexyl-2-propoxycarbonyl)phenyl)-11,12-dioxy-tetracyclo[4.4.0.1$^{2,5}$.1$^{7,10}$]-3-dodecene),
poly(8-(4-(1-methylcyclopentyloxycarbonyl)phenyl)-11,12-dioxy-tetracyclo[4.4.0.1$^{2,5}$.1$^{7,10}$]-3-dodecene),
poly(8-(4-(1-ethylcyclopentyloxycarbonyl)phenyl)-11,12-dioxy-tetracyclo[4.4.0.1$^{2,5}$.1$^{7,10}$]-3-dodecene),
poly(8-(4-(1-methylcyclohexyloxycarbonyl)phenyl)-11,12-dioxy-tetracyclo[4.4.0.1$^{2,5}$.1$^{7,10}$]-3-dodecene),
poly(8-(4-(1-ethylcyclohexyloxycarbonyl)phenyl)-11,12-dioxy-tetracyclo[4.4.0.1$^{2,5}$.1$^{7,10}$]-3-dodecene),
poly(8-methoxycarbonylnaphthyl-11,12-dioxy-tetracyclo[4.4.0.1$^{2,5}$.1$^{7,10}$]-3-dodecene),
poly(8-ethoxycarbonylnaphthyl-11,12-dioxy-tetracyclo[4.4.0.1$^{2,5}$.1$^{7,10}$]-3-dodecene),
poly(8-(n-propoxycarbonylnaphthyl)-11,12-dioxy-tetracyclo[4.4.0.1$^{2,5}$.1$^{7,10}$]-3-dodecene),
poly(8-(i-propoxycarbonylnaphthyl)-11,12-dioxy-tetracyclo[4.4.0.1$^{2,5}$.1$^{7,10}$]-3-dodecene),
poly(8-(n-butoxycarbonylnaphthyl)-11,12-dioxy-tetracyclo[4.4.0.1$^{2,5}$.1$^{7,10}$]-3-dodecene),
poly(8-(tert-butoxycarbonylphenyl)-11,12-dioxy-tetracyclo[4.4.0.1$^{2,5}$.1$^{7,10}$]-3-dodecene),
poly(8-(n-pentyloxycarbonylnaphthyl)-11,12-dioxy-tetracyclo[4.4.0.1$^{2,5}$.1$^{7,10}$]-3-dodecene),
poly(8-(5-(2-methyl-2-butoxycarbonyl)naphthyl)-11,12-dioxy-tetracyclo[4.4.0.1$^{2,5}$.1$^{7,10}$]-3-dodecene),
poly(8-(5-(2,3-dimethyl-2-butoxycarbonyl)naphthyl)-11,12-dioxy-tetracyclo[4.4.0.1$^{2,5}$.1$^{7,10}$]-3-dodecene),
poly(8-(5-(2-cyclopentyl-2-propoxycarbonyl)naphthyl)-11,12-dioxy-tetracyclo[4.4.0.1$^{2,5}$.1$^{7,10}$]-3-dodecene),
poly(8-(5-(2-cyclohexyl-2-propoxycarbonyl)naphthyl)-11,12-dioxy-tetracyclo[4.4.0.1$^{2,5}$.1$^{7,10}$]-3-dodecene),
poly(8-(5-(1-methylcyclopentyloxycarbonyl)naphthyl)-11,12-dioxy-tetracyclo[4.4.0.1$^{2,5}$.1$^{7,10}$]-3-dodecene),
poly(8-(5-(1-ethylcyclopentyloxycarbonyl)naphthyl)-11,12-dioxy-tetracyclo[4.4.0.1$^{2,5}$.1$^{7,10}$]-3-dodecene),
poly(8-(5-(1-methylcyclohexyloxycarbonyl)naphthyl)-11,12-dioxy-tetracyclo[4.4.0.1$^{2,5}$.1$^{7,10}$]-3-dodecene),
poly(8-(5-(1-ethylcyclohexyloxycarbonyl)naphthyl)-11,12-dioxy-tetracyclo[4.4.0.1$^{2,5}$.1$^{7,10}$]-3-dodecene),
poly(8-phenoxycarbonyl-11,12-dioxy-tetracyclo[4.4.0.1$^{2,5}$.1$^{7,10}$]-3-dodecene),
poly(8-benzyloxycarbonyl-11,12-dioxy-tetracyclo[4.4.0.1$^{2,5}$.1$^{7,10}$]-3-dodecene),
poly(8-(4-methylphenoxycarbonyl)-11,12-dioxy-tetracyclo[4.4.0.1$^{2,5}$.1$^{7,10}$]-3-dodecene),
poly(8-(3,4-dimethylphenoxycarbonyl)-11,12-dioxy-tetracyclo[4.4.0.1$^{2,5}$.1$^{7,10}$]-3-dodecene),
poly(8-(1-naphthoxycarbonyl)-11,12-dioxy-tetracyclo[4.4.0.1$^{2,5}$.1$^{7,10}$]-3-dodecene),
poly(8-(2-naphthoxycarbonyl)-11,12-dioxy-tetracyclo[4.4.0.1$^{2,5}$.1$^{7,10}$]-3-dodecene),
poly(8-(1-anthracenoxycarbonyl)-11,12-dioxy-tetracyclo[4.4.0.1$^{2,5}$.1$^{7,10}$]-3-dodecene),
poly(8-(methoxymethyloxycarbonyl-11,12-dioxy-tetracyclo[4.4.0.1$^{2,5}$.1$^{7,10}$]-3-dodecene),
poly(8-(ethoxymethyloxycarbonyl-11,12-dioxy-tetracyclo[4.4.0.1$^{2,5}$.1$^{7,10}$]-3-dodecene),
poly(8-(n-propoxymethyloxycarbonyl)-11,12-dioxy-tetracyclo[4.4.0.1$^{2,5}$.1$^{7,10}$]-3-dodecene),
poly(8-isopropoxymethyloxycarbonyl-11,12-dioxy-tetracyclo[4.4.0.1$^{2,5}$.1$^{7,10}$]-3-dodecene),
poly(8-(n-butoxymethyloxycarbonyl)-11,12-dioxy-tetracyclo[4.4.0.1$^{2,5}$.1$^{7,10}$]-3-dodecene), poly(8-(tert-butoxymethyloxycarbonyl)-11,12-dioxy-tetracyclo[4.4.0.1$^{2,5}$.1$^{7,10}$]-3-dodecene),
poly(8-cyclopentyloxymethyloxycarbonyl-11,12-dioxy-tetracyclo[4.4.0.1$^{2,5}$.1$^{7,10}$]-3-dodecene),
poly(8-cyclohexyloxymethyloxycarbonyl-11,12-dioxy-tetracyclo[4.4.0.1$^{2,5}$.1$^{7,10}$]-3-dodecene),
poly(8-cyclooctyloxymethyloxycarbonyl-11,12-dioxy-tetracyclo[4.4.0.1$^{2,5}$.1$^{7,10}$]-3-dodecene),
poly(8-norbornyloxymethyloxycarbonyl-11,12-dioxy-tetracyclo[4.4.0.1$^{2,5}$.1$^{7,10}$]-3-dodecene),
poly(8-(1-methylcyclopentyloxymethyloxycarbonyl-11,12-dioxy-tetracyclo[4.4.0.1$^{2,5}$.1$^{7,10}$]-3-dodecene),
poly(8-(1-ethylcyclopentyloxymethyloxycarbonyl-11,12-dioxy-tetracyclo[4.4.0.1$^{2,5}$.1$^{7,10}$]-3-dodecene),
poly(8-(1-methylcyclohexyloxymethyloxycarbonyl-11,12-dioxy-tetracyclo[4.4.0.1$^{2,5}$.1$^{7,10}$]-3-dodecene),
poly(8-(1-ethylcyclohexyloxymethyloxycarbonyl-11,12-dioxy-tetracyclo[4.4.0.1$^{2,5}$.1$^{7,10}$]-3-dodecene),
poly(8-(1-methylnorbornyloxymethyloxycarbonyl-11,12-dioxy-tetracyclo[4.4.0.1$^{2,5}$.1$^{7,10}$]-3-dodecene),
poly(8-(1-ethylnorbornyloxymethyloxycarbonyl-11,12-dioxy-tetracyclo[4.4.0.1$^{2,5}$.1$^{7,10}$]-3-dodecene),
poly(8-(1-ethoxypropyloxymethyloxycarbonyl-11,12-dioxy-tetracyclo[4.4.0.1$^{2,5}$.1$^{7,10}$]-3-dodecene),
poly(8-(1-ethoxy-1-methylethyloxymethyloxycarbonyl-11,12-dioxy-tetracyclo[4.4.0.1$^{2,5}$.1$^{7,10}$]-3-dodecene),
poly(8-tetrahydrofuran-2-yloxymethyloxycarbonyl-11,12-dioxy-tetracyclo[4.4.0.1$^{2,5}$.1$^{7,10}$]-3-dodecene),
poly(8-tetrahydropyran-2-yloxymethyloxycarbonyl-11,12-dioxy-tetracyclo[4.4.0.1$^{2,5}$.1$^{7,10}$]-3-dodecene),
poly(8-(1-adamantyloxymethyloxycarbonyl)-11,12-dioxy-tetracyclo[4.4.0.1$^{2,5}$.1$^{7,10}$]-3-dodecene),
poly(8-(2-adamantyloxymethyloxycarbonyl)-11,12-dioxy-tetracyclo[4.4.0.1$^{2,5}$.1$^{7,10}$]-3-dodecene),
poly(8-(1-(1-methoxy)ethoxycarbonyl)-11,12-dioxy-tetracyclo[4.4.0.1$^{2,5}$.1$^{7,10}$]-3-dodecene),
poly(8-(1-(1-ethoxy)ethoxycarbonyl)-11,12-dioxy-tetracyclo[4.4.0.1$^{2.5}$.1$^{7,10}$]-3-dodecene),
poly(8-(1-(1-n-propoxy)ethoxycarbonyl)-11,12-dioxy-tetracyclo[4.4.0.1$^{2,5}$.1$^{7,10}$]-3-dodecene),
poly(8-(1-(1-isopropoxy)ethoxycarbonyl)-11,12-dioxy-tetracyclo[4.4.0.1$^{2,5}$.1$^{7,10}$]-3-dodecene),
poly(8-(1-(1-n-butoxy)ethoxycarbonyl)-11,12-dioxy-tetracyclo[4.4.0.1$^{2,5}$.1$^{7,10}$]-3-dodecene),
poly(8-(1-(1-tert-butoxy)ethoxycarbonyl)-11,12-dioxy-tetracyclo[4.4.0.1$^{2,5}$.1$^{7,10}$]-3-dodecene),
poly(8-(1-(1-cyclopentyloxy)ethoxycarbonyl)-11,12-dioxy-tetracyclo[4.4.0.1$^{2,5}$.1$^{7,10}$]-3-dodecene),
poly(8-(1-(1-cyclohexyloxy)ethoxycarbonyl)-11,12-dioxy-tetracyclo[4.4.0.1$^{2,5}$.1$^{7,10}$]-3-dodecene),
poly(8-(1-(1-cyclooctyloxy)ethoxycarbonyl)-11,12-dioxy-tetracyclo[4.4.0.1$^{2,5}$.1$^{7,10}$]-3-dodecene),
poly(8-(1-(1-norboryloxy)ethoxycarbonyl)-11,12-dioxy-tetracyclo[4.4.0.1$^{2,5}$.1$^{7,10}$]-3-dodecene),
poly(8-(1-(1-methylcyclopentyloxy)ethoxycarbonyl)-11,12-dioxy-tetracyclo[4.4.0.1$^{2,5}$.1$^{7,10}$]-3-dodecene),
poly(8-(1-(1-ethylcyclopentyloxy)ethoxycarbonyl)-11,12-dioxy-tetracyclo[4.4.0.1$^{2,5}$.1$^{7,10}$]-3-dodecene),
poly(8-(1-(1-methylcyclohexyloxy)ethoxycarbonyl)-11,12-dioxy-tetracyclo[4.4.0.1$^{2,5}$.1$^{7,10}$]-3-dodecene),
poly(8-(1-(1-ethylcyclohexyloxy)ethoxycarbonyl)-11,12-dioxy-tetracyclo[4.4.0.1$^{2,5}$.1$^{7,10}$]-3-dodecene),
poly(8-(1-(1-methylnorbornyloxy)ethoxycarbonyl)-11,12-dioxy-tetracyclo[4.4.0.1$^{2,5}$.1$^{7,10}$]-3-dodecene),
poly(8-(1-(1-ethylnorbornyloxy)ethoxycarbonyl)-11,12-dioxy-tetracyclo[4.4.0.1$^{2,5}$.1$^{7,10}$]-3-dodecene),
poly(8-(1-(1-ethoxypropyloxy)ethoxycarbonyl)-11,12-dioxy-tetracyclo[4.4.0.1$^{2,5}$.1$^{7,10}$]-3-dodecene),
poly(8-(1-(1-ethoxy-1-methylethyloxy)ethoxycarbonyl)-11,12-dioxy-tetracyclo[4.4.0.1$^{2,5}$.1$^{7,10}$]-3-dodecene),
poly(8-(1-(tetrahydrofuran-2-yloxy)ethoxycarbonyl)-11,12-dioxy-tetracyclo[4.4.0.1$^{2,5}$.1$^{7,10}$]-3-dodecene),
poly(8-(1-(tetrahydropyran-2-yloxy)ethoxycarbonyl)-11,12-dioxy-tetracyclo[4.4.0.1$^{2,5}$.1$^{7,10}$]-3-dodecene),
poly(8-(1-(1-adamantyloxy)ethoxycarbonyl)-11,12-dioxy-tetracyclo[4.4.0.1$^{2,5}$.1$^{7,10}$]-3-dodecene),
poly(8-(1-(2-adamantyloxy)ethoxycarbonyl)-11,12-dioxy-tetracyclo[4.4.0.1$^{2,5}$.1$^{7,10}$]-3-dodecene),
poly(8-(n-butoxycarbonylmethyloxycarbonyl-11,12-dioxy-tetracyclo[4.4.0.1$^{2,5}$.1$^{7,10}$]-3-dodecene),
poly(8-(tert-butoxycarbonylmethyloxycarbonyl-11,12-dioxy-tetracyclo[4.4.0.1$^{2,5}$.1$^{7,10}$]-3-dodecene),
poly(8-(2-cyclopentyl-2-propoxycarbonylmethyloxycarbonyl-11,12-dioxy-tetracyclo[4.4.0.1$^{2,5}$.1$^{7,10}$]-3-dodecene),
poly(8-(2-cyclopentyl-2-butoxycarbonylmethyloxycarbonyl-11,12-dioxy-tetracyclo[4.4.0.1$^{2,5}$.1$^{7,10}$]-3-dodecene),
poly(8-(2-cyclohexyl-2-propoxycarbonylmethyloxycarbonyl-11,12-dioxy-tetracyclo[4.4.0.1$^{2,5}$.1$^{7,10}$]-3-dodecene),
poly(8-(3-(2-cyclohexyl-2-propoxycarbonyl)propoxycarbonyl)-11,12-dioxy-tetracyclo[4.4.0.1$^{2,5}$.1$^{7,10}$]-3-dodecene),
poly(8-(2-cyclohexyl-2-butoxycarbonylmethyloxycarbonyl-11,12-dioxy-tetracyclo[4.4.0.1$^{2,5}$.1$^{7,10}$]-3-dodecene),
poly(8-(3-cyclohexyl-3-pentyloxycarbonylmethyloxycarbonyl-11,12-dioxy-tetracyclo[4.4.0.1$^{2,5}$.1$^{7,10}$]-3-dodecene),
poly(8-(2-ethyl-2-norbornyloxycarbonylmethyloxycarbonyl-11,12-dioxy-tetracyclo[4.4.0.1$^{2,5}$.1$^{7,10}$]-3-dodecene),
poly(8-(2-norbornyl-2-propoxycarbonylmethyloxycarbonyl-11,12-dioxy-tetracyclo[4.4.0.1$^{2,5}$.1$^{7,10}$]-3-dodecene),
poly(8-(4-ethyl-tetracyclo[6.2.1.1$^{3,6}$.0$^{2,7}$]-dodecane-4-yloxycarbonylmethyloxycarbonyl)-11,12-dioxy-tetracyclo[4.4.0.1$^{2,5}$.1$^{7,10}$]-3-dodecene),
poly(8-(2-tetracyclo[6.2.1.1$^{3,6}$.0$^{2,7}$]-dodecane-4-yl)-2-propoxycarbonylmethyloxycarbonyl)-11,12-dioxy-tetracyclo[4.4.0.1$^{2,5}$.1$^{7,10}$]-3-dodecene),
poly(8-(1,1-dicyclohexylethoxycarbonylmethyloxycarbonyl)-11,12-dioxy-tetracyclo[4.4.0.1$^{2,5}$.1$^{7,10}$]-3-dodecene),
poly(8-(1,1-dicyclohexylpropoxycarbonylmethyloxycarbonyl)-tetracyclo[4.4.0.1$^{2,5}$.1$^{7,10}$]-3-dodecene),
poly(8-cyclopentyloxycarbonylmethyloxycarbonyl-11,12-dioxy-tetracyclo[4.4.0.1$^{2,5}$.1$^{7,10}$]-3-dodecene),
poly(8-cyclohexyloxycarbonylmethyloxycarbonyl-11,12-dioxy-tetracyclo[4.4.0.1$^{2,5}$.1$^{7,10}$]-3-dodecene),
poly(8-cyclooctyloxycarbonylmethyloxycarbonyl-11,12-dioxy-tetracyclo[4.4.0.1$^{2,5}$.1$^{7,10}$]-3-dodecene),
poly(8-norbornyloxycarbonylmethyloxycarbonyl-11,12-dioxy-tetracyclo[4.4.0.1$^{2,5}$.1$^{7,10}$]-3-dodecene),
poly(8-(1-methylcyclopentyloxycarbonylmethyloxycarbonyl-11,12-dioxy-tetracyclo[4.4.0.1$^{2,5}$.1$^{7,10}$]-3-dodecene),
poly(8-(1-ethylcyclopentyloxycarbonylmethyloxycarbonyl)-11,12-dioxy-tetracyclo[4.4.0.1$^{2,5}$.1$^{7,10}$]-3-dodecene),
poly(8-(1-methylcyclohexyloxycarbonylmethyloxycarbonyl)-11,12-dioxy-tetracyclo[4.4.0.1$^{2,5}$.1$^{7,10}$]-3-dodecene),
poly(8-(1-ethylcyclohexyloxycarbonylmethyloxycarbonyl)-11,12-dioxy-tetracyclo[4.4.0.1$^{2,5}$.1$^{7,10}$]-3-dodecene),
poly(8-(1-methylnorbornyloxycarbonylmethyloxycarbonyl)-11,12-dioxy-tetracyclo[4.4.0.1$^{2,5}$.1$^{7,10}$]-3-dodecene),
poly(8-(1-ethylnorbornyloxycarbonylmethyloxycarbonyl)-11,12-dioxy-tetracyclo[4.4.0.1$^{2,5}$.1$^{7,10}$]-3-dodecene), poly(8-(1-ethoxypropyloxycarbonylmethyloxycarbonyl)-11,12-dioxy-tetracyclo[4.4.0.1$^{2,5}$.1$^{7,10}$]-3-dodecene),
poly(8-(1-ethoxy-1-methylethyloxycarbonylmethyloxycarbonyl)-11,12-dioxy-tetracyclo[4.4.0.1$^{2,5}$.1$^{7,10}$]-3-dodecene),
poly(8-tetrahydrofuran-2-yloxycarbonylmethyloxycarbonyl-11,12-dioxy-tetracyclo[4.4.0.1$^{2,5}$.1$^{7,10}$]-3-dodecene),
poly(8-tetrahydropyran-2-yloxycarbonylmethyloxycarbonyl-11,12-dioxy-tetracyclo[4.4.0.1$^{2,5}$.1$^{7,10}$]-3-dodecene),
poly(8-1-adamantyloxycarbonylmethyloxycarbonyl)-11,12-dioxy-tetracyclo[4.4.0.1$^{2,5}$.1$^{7,10}$]-3-dodecene),
poly(8-2-adamantyloxycarbonylmethyloxycarbonyl)-11,12-dioxy-tetracyclo[4.4.0.1$^{2,5}$.1$^{7,10}$]-3-dodecene),
poly(8-(1-(2-(1-adamantyl)-2-propoxycarbonyl)-ethoxycarbonyl)-11,12-dioxy-tetracyclo[4.4.0.1$^{2,5}$.1$^{7,10}$]-3-dodecene),
poly(8-(3-(2-(1-adamantyl)-2-propoxycarbonyl)-propoxycarbonyl)-1 1,12-dioxy-tetracyclo[4.4.0.1$^{2,5}$.1$^{7,10}$]-3-dodecene),
poly(8-(2-(2-(1-adamantyl)-2-propoxycarbonyl)-2-propoxycarbonyl)-11,12-dioxy-tetracyclo[4.4.0.1$^{2,5}$.1$^{7,10}$]-3-dodecene),
poly(8-(2-methyl-2-adamantyloxycarbonylmethyloxycarbonyl)-11,12-dioxy-tetracyclo[4.4.0.1$^{2,5}$.1$^{7,10}$]-3-dodecene),
poly(8-(3-(2-methyl-2-adamantyloxycarbonyl)propoxycarbonyl)-11,12-dioxy-tetracyclo[4.4.0.1$^{2,5}$.1$^{7,10}$]-3-dodecene),
poly(8-(2-(2-methyl-2-adamantyloxycarbonyl)-2-propoxycarbonyl)-11,12-dioxy-tetracyclo[4.4.0.1$^{2,5}$.1$^{7,10}$]-3-dodecene),
poly(8-(1-(2-methyl-2-adamantyloxycarbonyl)ethoxycarbonyl)-11,12-dioxy-tetracyclo[4.4.0.1$^{2,5}$.1$^{7,10}$]-3-dodecene),
poly(8-(2-ethyl-2-adamantyloxycarbonylmethyloxycarbonyl)-11,12-dioxy-tetracyclo[4.4.0.1$^{2,5}$.1$^{7,10}$]-3-dodecene),
poly(8-(2-isopropyl-2-adamantyloxycarbonylmethyloxycarbonyl)-11, 12-dioxy-tetracyclo[4.4.0.1$^{2,5}$.1$^{7,10}$]-3-dodecene),
poly(8-(2-(1-adamantyl)-2-propoxycarbonylmethyloxycarbonyl)-11,12-dioxy-tetracyclo[4.4.0.1$^{2,5}$.1$^{7,10}$]-3-dodecene),
poly(8-(2-(1-adamantyl)-2-butoxycarbonylmethyloxycarbonyl)-11,12-dioxy-tetracyclo[4.4.0.1$^{2,5}$.1$^{7,10}$]-3-dodecene),
poly(8-(3-(1-adamantyl)-3-pentyloxycarbonylmethyloxycarbonyl)-11,12-dioxy-tetracyclo[4.4.0.1$^{2,5}$.1$^{7,10}$]-3-dodecene),
poly(8-(3-tert-butoxycarbonyl-1-cyclopentyloxycarbonyl)-11,12-dioxy-tetracyclo[4.4.0.1$^{2,5}$.1$^{7,10}$]-3-dodecene),
poly(8-(3-(1-methylcyclohexyloxycarbonyl)-1-cyclopentyloxycarbonyl)-11,12-dioxy-tetracyclo[4.4.0.1$^{2,5}$.1$^{7,10}$]-3-dodecene),
poly(8-(5-tert-butoxycarbonyl-2-norbornyloxycarbonyl)-11,12-dioxy-tetracyclo[4.4.0.1$^{2,5}$.1$^{7,10}$]-3-dodecene),
poly(8-(5-(1-methylcyclohexyloxycarbonyl)-2-norbornyloxycarbonyl)-11,12-dioxy-tetracyclo[4.4.0.1$^{2,5}$.1$^{7,10}$]-3-dodecene),
poly(8-(5,5-di(tert-butoxycarbonyl)-2-norbornyloxycarbonyl)-11,12-dioxy-tetracyclo[4.4.0.1$^{2,5}$.1$^{7,10}$]-3-dodecene),
poly(8-(5,6-di(tert-butoxycarbonyl)-2-norbornyloxycarbonyl)-11,12-dioxy-tetracyclo[4.4.0.1$^{2,5}$.1$^{7,10}$]-3-dodecene),
poly(8-(1-(1-methylcyclohexyloxycarbonyl)-octahydro-4,7-methano-indene-5-yloxycarbonyl)-11,12-dioxy-tetracyclo[4.4.0.1$^{2,5}$.1$^{7,10}$]-3-dodecene),
poly(8-(6-tert-butoxycarbonyl-decahydronaphthalene-2-yloxycarbonyl)-11,12-dioxy-tetracyclo[4.4.0.1$^{2,5}$.1$^{7,10}$]-3-dodecene),
poly(8-(9-tert-butoxycarbonyl-11,12-dioxy-tetracyclo[6.2.1.1$^{3,6}$.0$^{2,7}$]-dodecane-4-yloxycarbonyl)-11,12-dioxy-tetracyclo[4.4.0.1$^{2,5}$.1$^{7,10}$]-3-dodecene), or
poly(8-(9-(1-methylcyclohexyloxycarbonyl)-11,12-dioxy-tetracyclo[6.2.1.1$^{3,6}$.0$^{2,7}$]-dodecane-4-yloxycarbonyl)-11,12-dioxy-tetracyclo[4.4.0.1$^{2,5}$.1$^{7,10}$]-3-dodecene) is preferable.

Among these, from the viewpoints of improving the solubility in a solvent (PGMEA) during preparation of a coating solution and greatly changing the polarity of the cyclic olefin polymer after application, in the repeating structural unit [B] represented by Formula (2) according to the present embodiment, as the cyclic olefin polymer in which n represents 1,
poly(8-(tert-butoxycarbonyl)-11,12-dioxy-tetracyclo[4.4.0.1$^{2,5}$.1$^{7,10}$]-3-dodecene),
poly(8-(2-methyl-2-pentyloxycarbonyl)-11,12-dioxy-tetracyclo[4.4.0.1$^{2,5}$.1$^{7,10}$]-3-dodecene),
poly(8-(3-methyl-3-pentyloxycarbonyl)-11,12-dioxy-tetracyclo[4.4.0.1$^{2,5}$.1$^{7,10}$]-3-dodecene),
poly(8-(2-ethyl-3-methyl-3-pentyloxycarbonyl)-11,12-dioxy-tetracyclo[4.4.0.1$^{2,5}$.1$^{7,10}$]-3-dodecene),
poly(8-(2-methyl-2-butoxycarbonyl)-11,12-dioxy-tetracyclo[4.4.0.1$^{2,5}$.1$^{7,10}$]-3-dodecene),
poly(8-(2,3-dimethyl-2-butoxycarbonyl)-11,12-dioxy-tetracyclo[4.4.0.1$^{2,5}$.1$^{7,10}$]-3-dodecene),
poly(8-(2,3,3-trimethyl-2-butoxycarbonyl)-11,12-dioxy-tetracyclo[4.4.0.1$^{2,5}$.1$^{7,10}$]-3-dodecene),
poly(8-(2-methyl-2-hexyloxycarbonyl)-11,12-dioxy-tetracyclo[4.4.0.1$^{2,5}$.1$^{7,10}$]-3-dodecene),
poly(8-(3,4-dimethyl-3-hexyloxycarbonyl)-11,12-dioxy-tetracyclo[4.4.0.1$^{2,5}$.1$^{7,10}$]-3-dodecene),
poly(8-(3-methyl-3-heptyloxycarbonyl)-11,12-dioxy-tetracyclo[4.4.0.1$^{2,5}$.1$^{7,10}$]-3-dodecene),
poly(8-(2-cyclopentyl-2-propoxycarbonyl)-11,12-dioxy-tetracyclo[4.4.0.1$^{2,5}$.1$^{7,10}$]-3-dodecene),
poly(8-(2-cyclohexyl-2-propoxycarbonyl)-11,12-dioxy-tetracyclo[4.4.0.1$^{2,5}$.1$^{7,10}$]-3-dodecene),
poly(8-(2-norbornyl-2-propoxycarbonyl)-11,12-dioxy-tetracyclo[4.4.0.1$^{2,5}$.1$^{7,10}$]-3-dodecene),
poly(8-(1,1-dicyclopentylethoxycarbonyl)-11,12-dioxy-tetracyclo[4.4.0.1$^{2,5}$.1$^{7,10}$]-3-dodecene),
poly(8-(1,1-dicyclohexylethoxycarbonyl)-11,12-dioxy-tetracyclo[4.4.0.1$^{2,5}$.1$^{7,10}$]-3-dodecene),
poly(8-(1-methylcyclopentyloxycarbonyl)-11,12-dioxy-tetracyclo[4.4.0.1$^{2,5}$.1$^{7,10}$]-3-dodecene),
poly(8-(1-ethylcyclopentyloxycarbonyl)-11,12-dioxy-tetracyclo[4.4.0.1$^{2,5}$.1$^{7,10}$]-3-dodecene),
poly(8-(1-methylcyclohexyloxycarbonyl)-11,12-dioxy-tetracyclo[4.4.0.1$^{2,5}$.1$^{7,10}$]-3-dodecene),
poly(8-(1-ethylcyclohexyloxycarbonyl)-11,12-dioxy-tetracyclo[4.4.0.1$^{2,5}$.1$^{7,10}$]-3-dodecene),
poly(8-(1-methylcyclooctyloxycarbonyl)-11,12-dioxy-tetracyclo[4.4.0.1$^{2,5}$.1$^{7,10}$]-3-dodecene),
poly(8-(1-ethylcyclooctyloxycarbonyl)-11,12-dioxy-tetracyclo[4.4.0.1$^{2,5}$.1$^{7,10}$]-3-dodecene),
poly(8-(1-adamantyloxycarbonyl))-11,12-dioxy-tetracyclo[4.4.0.1$^{2,5}$.1$^{7,10}$]-3-dodecene),
poly(8-(2-methyl-2-adamantyloxycarbonyl))-11,12-dioxy-tetracyclo[4.4.0.1$^{2,5}$.1$^{7,10}$]-3-dodecene), poly(8-(2-ethyl-2-adamantyloxycarbonyl)-11,12-dioxy-tetracyclo[4.4.0.1$^{2,5}$.1$^{7,10}$]-3-dodecene),
poly(8-(1-methyldecahydronaphthalene-1-yloxycarbonyl)-11,12-dioxy-tetracyclo[4.4.0.1$^{2,5}$.1$^{7,10}$]-3-dodecene),
poly(8-(1-ethyldecahydronaphthalene-1-yloxycarbonyl)-11,12-dioxy-tetracyclo[4.4.0.1$^{2,5}$.1$^{7,10}$]-3-dodecene),
poly(8-(2-methyldecahydronaphthalene-2-yloxycarbonyl)-11,12-dioxy-tetracyclo[4.4.0.1$^{2,5}$.1$^{7,10}$]-3-dodecene),
poly(8-(2-ethyldecahydronaphthalene-2-yloxycarbonyl)-11,12-dioxy-tetracyclo[4.4.0.1$^{2,5}$.1$^{7,10}$]-3-dodecene),
poly(8-(2-methyl-2-norbornyloxycarbonyl)-11,12-dioxy-tetracyclo[4.4.0.1$^{2,5}$.1$^{7,10}$]-3-dodecene),
poly(8-(2-ethyl-2-norbornyloxycarbonyl)-11,12-dioxy-tetracyclo[4.4.0.1$^{2,5}$.1$^{7,10}$]-3-dodecene),
poly(8-(2,7,7-trimethyl-2-norbornyloxycarbonyl)-11,12-dioxy-tetracyclo[4.4.0.1$^{2,5}$.1$^{7,10}$]-3-dodecene),
poly(8-(2-ethyl-7,7-dimethyl-2-norbornyloxycarbonyl)-11,12-dioxy-tetracyclo[4.4.0.1$^{2,5}$.1$^{7,10}$]-3-dodecene),
poly(8-(5-methyl-octahydro-4,7-methano-indene-5-yloxycarbonyl)-11,12-dioxy-tetracyclo[4.4.0.1$^{2,5}$.1$^{7,10}$]-3-dodecene),
poly(8-(5-ethyl-octahydro-4,7-methano-indene-5-yloxycarbonyl)-11,12-dioxy-tetracyclo[4.4.0.1$^{2,5}$.1$^{7,10}$]-3-dodecene),
poly(8-(4-methyl-tetracyclo[6.2.1.1$^{3,6}$.0$^{2,7}$]-dodecane-4-yloxycarbonyl)-11,12-dioxy-tetracyclo[4.4.0.1$^{2,5}$.1$^{7,10}$]-3-dodecene),
poly(8-(4-ethyl-tetracyclo[6.2.1.1$^{3,6}$.0$^{2,7}$]-dodecane-4-yloxycarbonyl)-11,12-dioxy-tetracyclo[4.4.0.1$^{2,5}$.1$^{7,10}$]-3-dodecene),
poly(8-(tert-butoxycarbonylphenyl)-11,12-dioxy-tetracyclo[4.4.0.1$^{2,5}$.1$^{7,10}$]-3-dodecene),
poly(8-(3-(2-methyl-2-butoxycarbonyl)phenyl)-11,12-dioxy-tetracyclo[4.4.0.1$^{2,5}$.1$^{7,10}$]-3-dodecene),
poly(8-(3-(2,3-dimethyl-2-butoxycarbonyl)phenyl)-11,12-dioxy-tetracyclo[4.4.0.1$^{2,5}$.1$^{7,10}$]-3-dodecene),
poly(8-(3-(2-cyclopentyl-2-propoxycarbonyl)phenyl)-11,12-dioxy-tetracyclo[4.4.0.1$^{2,5}$.1$^{7,10}$]-3-dodecene),
poly(8-(3-(2-cyclohexyl-2-propoxycarbonyl)phenyl)-11,12-dioxy-tetracyclo[4.4.0.1$^{2,5}$.1$^{7,10}$]-3-dodecene),
poly(8-(3-(1-methylcyclopentyloxycarbonyl)phenyl)-11,12-dioxy-tetracyclo[4.4.0.1$^{2,5}$.1$^{7,10}$]-3-dodecene),
poly(8-(3-(1-ethylcyclopentyloxycarbonyl)phenyl)-11,12-dioxy-tetracyclo[4.4.0.1$^{2,5}$.1$^{7,10}$]-3-dodecene),
poly(8-(3-(1-methylcyclohexyloxycarbonyl)phenyl)-11,12-dioxy-tetracyclo[4.4.0.1$^{2,5}$.1$^{7,10}$]-3-dodecene),
poly(8-(3-(1-ethylcyclohexyloxycarbonyl)phenyl)-11,12-dioxy-tetracyclo[4.4.0.1$^{2,5}$.1$^{7,10}$]-3-dodecene),
poly(8-(4-(2-methyl-2-butoxycarbonyl)phenyl)-11,12-dioxy-tetracyclo[4.4.0.1$^{2,5}$.1$^{7,10}$]-3-dodecene),
poly(8-(4-(2,3-dimethyl-2-butoxycarbonyl)phenyl)-11,12-dioxy-tetracyclo[4.4.0.1$^{2,5}$.1$^{7,10}$]-3-dodecene),
poly(8-(4-(2-cyclopentyl-2-propoxycarbonyl)phenyl)-11,12-dioxy-tetracyclo[4.4.0.1$^{2,5}$.1$^{7,10}$]-3-dodecene),
poly(8-(4-(2-cyclohexyl-2-propoxycarbonyl)phenyl)-11,12-dioxy-tetracyclo[4.4.0.1$^{2,5}$.1$^{7,10}$]-3-dodecene),
poly(8-(4-(1-methylcyclopentyloxycarbonyl)phenyl)-11,12-dioxy-tetracyclo[4.4.0.1$^{2,5}$.1$^{7,10}$]-3-dodecene),
poly(8-(4-(1-ethylcyclopentyloxycarbonyl)phenyl)-11,12-dioxy-tetracyclo[4.4.0.1$^{2,5}$.1$^{7,10}$]-3-dodecene),
poly(8-(4-(1-methylcyclohexyloxycarbonyl)phenyl)-11,12-dioxy-tetracyclo[4.4.0.1$^{2,5}$.1$^{7,10}$]-3-dodecene),
poly(8-(4-(1-ethylcyclohexyloxycarbonyl)phenyl)-11,12-dioxy-tetracyclo[4.4.0.1$^{2,5}$.1$^{7,10}$]-3-dodecene),
poly(8-(tert-butoxycarbonylphenyl)-11,12-dioxy-tetracyclo[4.4.0.1$^{2,5}$.1$^{7,10}$]-3-dodecene),
poly(8-(n-pentyloxycarbonylnaphthyl)-11,12-dioxy-tetracyclo[4.4.0.1$^{2,5}$.1$^{7,10}$]-3-dodecene),
poly(8-(5-(2-methyl-2-butoxycarbonyl)naphthyl)-11,12-dioxy-tetracyclo[4.4.0.1$^{2,5}$.1$^{7,10}$]-3-dodecene),
poly(8-(5-(2,3-dimethyl-2-butoxycarbonyl)naphthyl)-11,12-dioxy-tetracyclo[4.4.0.1$^{2,5}$.1$^{7,10}$]-3-dodecene),
poly(8-(5-(2-cyclopentyl-2-propoxycarbonyl)naphthyl)-11,12-dioxy-tetracyclo[4.4.0.1$^{2,5}$.1$^{7,10}$]-3-dodecene),
poly(8-(5-(2-cyclohexyl-2-propoxycarbonyl)naphthyl)-11,12-dioxy-tetracyclo[4.4.0.1$^{2,5}$.1$^{7,10}$]-3-dodecene),
poly(8-(5-(1-methylcyclopentyloxycarbonyl)naphthyl)-11,12-dioxy-tetracyclo[4.4.0.1$^{2,5}$.1$^{7,10}$]-3-dodecene),
poly(8-(5-(1-ethylcyclopentyloxycarbonyl)naphthyl)-11,12-dioxy-tetracyclo[4.4.0.1$^{2,5}$.1$^{7,10}$]-3-dodecene),
poly(8-(5-(1-methylcyclohexyloxycarbonyl)naphthyl)-11,12-dioxy-tetracyclo[4.4.0.1$^{2,5}$.1$^{7,10}$]-3-dodecene),
poly(8-(5-(1-ethylcyclohexyloxycarbonyl)naphthyl)-11,12-dioxy-tetracyclo[4.4.0.1$^{2,5}$.1$^{7,10}$]-3-dodecene),
poly(8-(tert-butoxymethyloxycarbonyl)-11,12-dioxy-tetracyclo[4.4.0.1$^{2,5}$.1$^{7,10}$]-3-dodecene),
poly(8-(1-methylcyclopentyloxymethyloxycarbonyl-11,12-dioxy-tetracyclo[4.4.0.1$^{2,5}$.1$^{7,10}$]-3-dodecene),
poly(8-(1-ethylcyclopentyloxymethyloxycarbonyl-11,12-dioxy-tetracyclo[4.4.0.1$^{2,5}$.1$^{7,10}$]-3-dodecene),
poly(8-(1-methylcyclohexyloxymethyloxycarbonyl-11,12-dioxy-tetracyclo[4.4.0.1$^{2,5}$.1$^{7,10}$]-3-dodecene),
poly(8-(1-ethylcyclohexyloxymethyloxycarbonyl-11,12-dioxy-tetracyclo[4.4.0.1$^{2,5}$.1$^{7,10}$]-3-dodecene),
poly(8-(1-(1-methoxy)ethoxycarbonyl)-11,12-dioxy-tetracyclo[4.4.0.1$^{2,5}$.1$^{7,10}$]-3-dodecene),
poly(8-(1-(1-ethoxy)ethoxycarbonyl)-11,12-dioxy-tetracyclo[4.4.0.1$^{2,5}$.1$^{7,10}$]-3-dodecene),
poly(8-(1-(1-n-propoxy)ethoxycarbonyl)-11,12-dioxy-tetracyclo[4.4.0.1$^{2,5}$.1$^{7,10}$]-3-dodecene),
poly(8-(1-(1-isopropoxy)ethoxycarbonyl)-11,12-dioxy-tetracyclo[4.4.0.1$^{2,5}$.1$^{7,10}$]-3-dodecene),
poly(8-(1-(1-n-butoxy)ethoxycarbonyl)-11,12-dioxy-tetracyclo[4.4.0.1$^{2,5}$.1$^{7,10}$]-3-dodecene),
poly(8-(1-(1-tert-butoxy)ethoxycarbonyl)-11,12-dioxy-tetracyclo[4.4.0.1$^{2,5}$.1$^{7,10}$]-3-dodecene),
poly(8-(1-(1-cyclopentyloxy)ethoxycarbonyl)-11,12-dioxy-tetracyclo[4.4.0.1$^{2,5}$.1$^{7,10}$]-3-dodecene),
poly(8-(1-(1-cyclohexyloxy)ethoxycarbonyl)-11,12-dioxy-tetracyclo[4.4.0.1$^{2,5}$.1$^{7,10}$]-3-dodecene),
poly(8-(1-(1-cyclooctyloxy)ethoxycarbonyl)-11,12-dioxy-tetracyclo[4.4.0.1$^{2,5}$.1$^{7,10}$]-3-dodecene),
poly(8-(1-(1-norboryloxy)ethoxycarbonyl)-11,12-dioxy-tetracyclo[4.4.0.1$^{2,5}$.1$^{7,10}$]-3-dodecene),
poly(8-(1-(1-methylcyclopentyloxy)ethoxycarbonyl)-11,12-dioxy-tetracyclo[4.4.0.1$^{2,5}$.1$^{7,10}$]-3-dodecene),
poly(8-(1-(1-ethylcyclopentyloxy)ethoxycarbonyl)-11,12-dioxy-tetracyclo[4.4.0.1$^{2,5}$.1$^{7,10}$]-3-dodecene),
poly(8-(1-(1-methylcyclohexyloxy)ethoxycarbonyl)-11,12-dioxy-tetracyclo[4.4.0.1$^{2,5}$.1$^{7,10}$]-3-dodecene),
poly(8-(1-(1-ethylcyclohexyloxy)ethoxycarbonyl)-11,12-dioxy-tetracyclo[4.4.0.1$^{2,5}$.1$^{7,10}$]-3-dodecene),
poly(8-(1-(1-methylnorbornyloxy)ethoxycarbonyl)-11,12-dioxy-tetracyclo[4.4.0.1$^{2,5}$.1$^{7,10}$]-3-dodecene),
poly(8-(1-(1-ethylnorbornyloxy)ethoxycarbonyl)-11,12-dioxy-tetracyclo[4.4.0.1$^{2,5}$.1$^{7,10}$]-3-dodecene),
poly(8-(1-(1-ethoxypropyloxy)ethoxycarbonyl)-11,12-dioxy-tetracyclo[4.4.0.1$^{2,5}$.1$^{7,10}$]-3-dodecene),
poly(8-(1-(1-ethoxy-1-methylethyloxy)ethoxycarbonyl)-11,12-dioxy-tetracyclo[4.4.0.1$^{2,5}$.1$^{7,10}$]-3-dodecene),
poly(8-(1-(tetrahydrofuran-2-yloxy)ethoxycarbonyl)-11,12-dioxy-tetracyclo[4.4.0.1$^{2,5}$.1$^{7,10}$]-3-dodecene), poly(8-(1-(tetrahydropyran-2-yloxy)ethoxycarbonyl)-11,12-dioxy-tetracyclo[4.4.0.1$^{2,5}$.1$^{7,10}$]-3-dodecene),
poly(8-(1-(1-adamantyloxy)ethoxycarbonyl)-11,12-dioxy-tetracyclo[4.4.0.1$^{2,5}$.1$^{7,10}$]-3-dodecene),
poly(8-(1-(2-adamantyloxy)ethoxycarbonyl)-11,12-dioxy-tetracyclo[4.4.0.1$^{2,5}$.1$^{7,10}$]-3-dodecene),
poly(8-(tert-butoxycarbonylmethyloxycarbonyl-11,12-dioxy-tetracyclo[4.4.0.1$^{2,5}$.1$^{7,10}$]-3-dodecene),
poly(8-(2-cyclopentyl-2-propoxycarbonylmethyloxycarbonyl-11,12-dioxy-tetracyclo[4.4.0.1$^{2,5}$.1$^{7,10}$]-3-dodecene),
poly(8-(2-cyclopentyl-2-butoxycarbonylmethyloxycarbonyl-11,12-dioxy-tetracyclo[4.4.0.1$^{2,5}$.1$^{7,10}$]-3-dodecene),
poly(8-(2-cyclohexyl-2-propoxycarbonylmethyloxycarbonyl-11,12-dioxy-tetracyclo[4.4.0.1$^{2,5}$.1$^{7,10}$]-3-dodecene),
poly(8-(3-(2-cyclohexyl-2-propoxycarbonyl)propoxycarbonyl)-11,12-dioxy-tetracyclo[4.4.0.1$^{2,5}$.1$^{7,10}$]-3-dodecene),
poly(8-(2-cyclohexyl-2-butoxycarbonylmethyloxycarbonyl-11,12-dioxy-tetracyclo[4.4.0.1$^{2,5}$.1$^{7,10}$]-3-dodecene),
poly(8-(3-cyclohexyl-3-pentyloxycarbonylmethyloxycarbonyl-11,12-dioxy-tetracyclo[4.4.0.1$^{2,5}$.1$^{7,10}$]-3-dodecene),
poly(8-(2-ethyl-2-norbornyloxycarbonylmethyloxycarbonyl-11,12-dioxy-tetracyclo[4.4.0.1$^{2,5}$.1$^{7,10}$]-3-dodecene),
poly(8-(2-norbornyl-2-propoxycarbonylmethyloxycarbonyl-11,12-dioxy-tetracyclo[4.4.0.1$^{2,5}$.1$^{7,10}$]-3-dodecene),
poly(8-(4-ethyl-tetracyclo[6.2.1.1$^{3,6}$.0$^{2,7}$]-dodecane-4-yloxycarbonylmethyloxycarbonyl)-11,12-dioxy-tetracyclo[4.4.0.1$^{2,5}$.1$^{7,10}$]-3-dodecene),
poly(8-(2-tetracyclo[6.2.1.1$^{3,6}$.0$^{2,7}$]-dodecane-4-yl)-2-propoxycarbonylmethyloxycarbonyl)-11,12-dioxy-tetracyclo[4.4.0.1$^{2,5}$.1$^{7,10}$]-3-dodecene),
poly(8-(1,1-dicyclohexylethoxycarbonylmethyloxycarbonyl)-11,12-dioxy-tetracyclo[4.4.0.1$^{2,5}$.1$^{7,10}$]-3-dodecene),
poly(8-(1,1-dicyclohexylpropoxycarbonylmethyloxycarbonyl)-tetracyclo[4.4.0.1$^{2,5}$.1$^{7,10}$]-3-dodecene),
poly(8-(1-methylcyclopentyloxycarbonylmethyloxycarbonyl)-11,12-dioxy-tetracyclo[4.4.0.1$^{2,5}$.1$^{7,10}$]-3-dodecene),
poly(8-(1-ethylcyclopentyloxycarbonylmethyloxycarbonyl)-11,12-dioxy-tetracyclo[4.4.0.1$^{2,5}$.1$^{7,10}$]-3-dodecene),
poly(8-(1-methylcyclohexyloxycarbonylmethyloxycarbonyl)-11,12-dioxy-tetracyclo[4.4.0.1$^{2,5}$.1$^{7,10}$]-3-dodecene),
poly(8-(1-ethylcyclohexyloxycarbonylmethyloxycarbonyl)-11,12-dioxy-tetracyclo[4.4.0.1$^{2,5}$.1$^{7,10}$]-3-dodecene),
poly(8-(1-(2-(1-adamantyl)-2-propoxycarbonyl)-ethoxycarbonyl)-11,12-dioxy-tetracyclo[4.4.0.1$^{2,5}$.1$^{7,10}$]-3-dodecene),
poly(8-(3-(2-(1-adamantyl)-2-propoxycarbonyl)-propoxycarbonyl)-11,12-dioxy-tetracyclo[4.4.0.1$^{2,5}$.1$^{7,10}$]-3-dodecene),
poly(8-(2-(2-(1-adamantyl)-2-propoxycarbonyl)-2-propoxycarbonyl)-11,12-dioxy-tetracyclo[4.4.0.1$^{2,5}$.1$^{7,10}$]-3-dodecene),
poly(8-(2-methyl-2-adamantyloxycarbonylmethyloxycarbonyl)-11,12-dioxy-tetracyclo[4.4.0.1$^{2,5}$.1$^{7,10}$]-3-dodecene),
poly(8-(3-(2-methyl-2-adamantyloxycarbonyl)propoxycarbonyl)-11,12-dioxy-tetracyclo[4.4.0.1$^{2,5}$.1$^{7,10}$]-3-dodecene),
poly(8-(2-(2-methyl-2-adamantyloxycarbonyl)-2-propoxycarbonyl)-11,12-dioxy-tetracyclo[4.4.0.1$^{2,5}$.1$^{7,10}$]-3-dodecene),
poly(8-(1-(2-methyl-2-adamantyloxycarbonyl)ethoxycarbonyl)-11,12-dioxy-tetracyclo[4.4.0.1$^{2,5}$.1$^{7,10}$]-3-dodecene),
poly(8-(2-ethyl-2-adamantyloxycarbonylmethyloxycarbonyl)-11,12-dioxy-tetracyclo[4.4.0.1$^{2,5}$.1$^{7,10}$]-3-dodecene),
poly(8-(2-isopropyl-2-adamantyloxycarbonylmethyloxycarbonyl)-11,12-dioxy-tetracyclo[4.4.0.1$^{2,5}$.1$^{7,10}$]-3-dodecene),
poly(8-(2-(1-adamantyl)-2-propoxycarbonylmethyloxycarbonyl)-11,12-dioxy-tetracyclo[4.4.0.1$^{2,5}$.1$^{7,10}$]-3-dodecene),
poly(8-(2-(1-adamantyl)-2-butoxycarbonylmethyloxycarbonyl)-11,12-dioxy-tetracyclo[4.4.0.1$^{2,5}$.1$^{7,10}$]-3-dodecene),
poly(8-(3-(1-adamantyl)-3-pentyloxycarbonylmethyloxycarbonyl)-11,12-dioxy-tetracyclo[4.4.0.1$^{2,5}$.1$^{7,10}$]-3-dodecene),
poly(8-(3-tert-butoxycarbonyl-1-cyclopentyloxycarbonyl)-11,12-dioxy-tetracyclo[4.4.0.1$^{2,5}$.1$^{7,10}$]-3-dodecene),
poly(8-(3-(1-methylcyclohexyloxycarbonyl)-1-cyclopentyloxycarbonyl)-11,12-dioxy-tetracyclo[4.4.0.1$^{2,5}$.1$^{7,10}$]-3-dodecene),
poly(8-(5-tert-butoxycarbonyl-2-norbornyloxycarbonyl)-11,12-dioxy-tetracyclo[4.4.0.1$^{2,5}$.1$^{7,10}$]-3-dodecene),
poly(8-(5-(1-methylcyclohexyloxycarbonyl)-2-norbornyloxycarbonyl-11,12-dioxy-tetracyclo[4.4.0.1$^{2,5}$.1$^{7,10}$]-3-dodecene),
poly(8-(5,5-di(tert-butoxycarbonyl)-2-norbornyloxycarbonyl)-11,12-dioxy-tetracyclo[4.4.0.1$^{2,5}$.1$^{7,10}$]-3-dodecene),
poly(8-(5,6-di(tert-butoxycarbonyl)-2-norbornyloxycarbonyl)-11,12-dioxy-tetracyclo[4.4.0.1$^{2,5}$.1$^{7,10}$]-3-dodecene),
poly(8-(1-(1-methylcyclohexyloxycarbonyl)-octahydro-4,7-methano-indene-5-yloxycarbonyl)-11,12-dioxy-tetracyclo[4.4.0.1$^{2,5}$.1$^{7,10}$]-3-dodecene),
poly(8-(6-tert-butoxycarbonyl-decahydronaphthalene-2-yloxycarbonyl)-11,12-dioxy-tetracyclo[4.4.0.1$^{2,5}$.1$^{7,10}$]-3-dodecene),
poly(8-(9-tert-butoxycarbonyl-11,12-dioxy-tetracyclo[6.2.1.1$^{3,6}$.0$^{2,7}$]-dodecane-4-yloxycarbonyl)-11,12-dioxy-tetracyclo[4.4.0.1$^{2,5}$.1$^{7,10}$]-3-dodecene), or
poly(8-(9-(1-methylcyclohexyloxycarbonyl)-11,12-dioxy-tetracyclo[6.2.1.1$^{3,6}$.0$^{2,7}$]-dodecane-4-yloxycarbonyl)-11,12-dioxy-tetracyclo[4.4.0.1$^{2,5}$.1$^{7,10}$]-3-dodecene) is more preferable.

Further, in the repeating structural unit [B] represented by Formula (2) according to the present embodiment, in a case where $R^5$ to $R^8$ are bonded to one another to form a ring structure, as the cyclic olefin polymer in which n represents 1, poly(4,14,15-trioxy-pentacyclo[9.2.1.1$^{1,7}$.0$^{2,6}$.0$^{8,13}$]-10-pentadecene-3-one),
poly(4,14,15-trioxy-pentacyclo[9.2.1.1$^{1,7}$.0$^{2,6}$.0$^{8,13}$]-10-pentadecene-3,5-dione),
poly(4-methyl-4-aza-14,15-dioxy-pentacyclo[9.2.1.1$^{1,7}$.0$^{2,6}$.0$^{8,13}$]-10-pentadecene-3,5-dione),
poly(4-ethyl-4-aza-14,15-dioxy-pentacyclo[9.2.1.1$^{1,7}$.0$^{2,6}$.0$^{8,13}$]-10-pentadecene-3,5-dione),
poly(4-(n-propyl)-4-aza-14,15-dioxy-pentacyclo[9.2.1.1$^{1,7}$.0$^{2,6}$.0$^{8,13}$]-10-pentadecene-3,5-dione),
poly(4-(n-butyl)-4-aza-14,15-dioxy-pentacyclo[9.2.1.1$^{1,7}$.0$^{2,6}$.0$^{8,13}$]-10-pentadecene-3,5-dione),
poly(4-(1-methylbutyl)-4-aza-14,15-dioxy-pentacyclo[9.2.1.1$^{1,7}$.0$^{2,6}$.0$^{8,13}$]-10-pentadecene-3,5-dione),
poly(4-cyclopentyl)-4-aza-14,15-dioxy-pentacyclo[9.2.1.1$^{1,7}$.0$^{2,6}$.0$^{8,13}$]-10-pentadecene-3,5-dione),
poly(4-cyclohexyl-4-aza-14,15-dioxy-pentacyclo[9.2.1.1$^{1,7}$.0$^{2,6}$.0$^{8,13}$]-10-pentadecene-3,5-dione), poly(4-phenyl-4-aza-14,15-dioxy-pentacyclo[9.2.1.1$^{1,7}$.0$^{2,6}$.0$^{8,13}$]-10-pentadecene-3,5-dione), or
poly(4-(4-hydroxyphenyl)-4-aza-14,15-dioxy-pentacyclo[9.2.1.1$^{1,7}$.0$^{2,6}$.0$^{8,13}$]-10-pentadecene-3,5-dione) is preferable.

The cyclic olefin polymer according to the present embodiment can be obtained by polymerizing, for example, a cyclic olefin monomer represented by Formula (3) shown below and a cyclic olefin monomer represented by formula (4) shown below through ring opening metathesis polymerization.

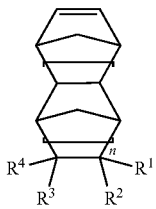

(3)

In Formula (3), $R^1$ to $R^4$ and n each have the same definition as that in Formula (1).

The cyclic olefin monomer according to the present embodiment may have two or more structural units in which at least one of $R^1$ to $R^4$ in the structural unit represented by Formula (3) is different from the rest.

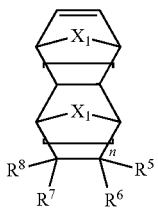

(4)

In Formula (4), $R^5$ to $R^8$, $X_1$, and n each have the same definition as that in Formula (2).

The cyclic olefin monomer according to the present embodiment may have two or more structural units in which at least one of $R^5$ to $R^8$ in the structural unit represented by Formula (4) is different from the rest.

The catalyst used at the time of polymerizing the cyclic olefin polymer according to the present embodiment is not particularly limited as long as the catalyst is capable of performing ring opening metathesis polymerization on the cyclic olefin monomer, and examples thereof include an organic transition metal alkylidene complex catalyst such as molybdenum (Mo), tungsten (W), or ruthenium (Ru); and a ring opening metathesis catalyst obtained by combining an organic transition metal catalyst and a Lewis acid serving as a co-catalyst. Further, it is preferable to use an organic transition metal alkylidene complex catalyst such as molybdenum (Mo), tungsten (W), or ruthenium (Ru).

In the present embodiment, particularly, a highly polar cyclic olefin monomer containing a heteroatom can be copolymerized. For example, a highly polar cyclic olefin monomer can be efficiently copolymerized in a case where an organic transition metal alkylidene complex such as molybdenum (Mo), tungsten (W), or ruthenium (Ru) is used.

Examples of the ring opening metathesis polymerization catalyst of the organic transition metal alkylidene catalyst include a tungsten-based alkylidene catalyst such as W(N-2,6-Pr$^i_2$C$_6$H$_3$)(CHBu$^t$)(OBu$^t$)$_2$, W(N-2,6-Pr$^i_2$C$_6$H$_3$)(CHBu$^t$)(OCMe$_2$CF$_3$)$_2$, W(N-2,6-Pr$^i_2$C$_6$H$_3$)(CHBu$^t$)(OCMe(CF$_3$)$_2$)$_2$, W(N-2,6-Pr$^i_2$C$_6$H$_3$)(CHCMe$_2$Ph)(OBu$^t$)$_2$, W(N-2,6-Pr$^i_2$C$_6$H$_3$)(CHCMe$_2$Ph)(OCMe$_2$CF$_3$)$_2$, W(N-2,6-Pr$^i_2$C$_6$H$_3$)(CHCMe$_2$Ph)(OCMe(CF$_3$)$_2$)$_2$, W(N-2,6-Pr$^i_2$C$_6$H$_3$)(CHCMe$_2$Ph)(OC(CF$_3$)$_3$)$_2$, or W(N-2,6-Me$_2$C$_6$H$_3$)(CHCMe$_2$Ph)(OC(CF$_3$)$_3$)$_2$ (in the formulae, Pr$^i$ represents an iso-propyl group, Bu$^t$ represents a tert-butyl group, Me represents a methyl group, and Ph represents a phenyl group); a tungsten-based alkylidene catalyst such as W(N-2,6-Me$_2$C$_6$H$_3$)(CHCHCMePh)(OBu$^t$)$_2$(PMe$_3$), W(N-2,6-Me$_2$C$_6$H$_3$)(CHCHCMe$_2$)(OBu$^t$)$_2$(PMe$_3$), W(N-2,6-Me$_2$C$_6$H$_3$)(CHCHCPh$_2$)(OBu$^t$)$_2$(PMe$_3$), W(N-2,6-Me$_2$C$_6$H$_3$)(CHCHCMePh)(OCMe$_2$(CF$_3$))$_2$(PMe$_3$), W(N-2,6-Me$_2$C$_6$H$_3$)(CHCHCMe$_2$)(OCMe$_2$(CF$_3$))$_2$(PMe$_3$), W(N-2,6-Me$_2$C$_6$H$_3$)(CHCHCPh$_2$)(OCMe$_2$(CF$_3$))$_2$(PMe$_3$), W(N-2,6-Me$_2$C$_6$H$_3$)(CHCHCMe$_2$)(OCMe(CF$_3$)$_2$)$_2$(PMe$_3$), W(N-2,6-Me$_2$C$_6$H$_3$)(CHCHCMe$_2$)(OCMe(CF$_3$)$_2$)$_2$(PMe$_3$), W(N-2,6-Me$_2$C$_6$H$_3$)(CHCHCPh$_2$)(OCMe(CF$_3$)$_2$)$_2$(PMe$_3$), W(N-2,6-Pr$^i_2$C$_6$H$_3$)(CHCHCMePh)(OCMe$_2$(CF$_3$))$_2$(PMe$_3$), W(N-2,6-Pr$^i_2$C$_6$H$_3$)(CHCHCMePh)(OCMe(CF$_3$)$_2$)$_2$(PMe$_3$), or W(N-2,6-Pr$^i_2$C$_6$H$_3$)(CHCHCMePh)(OPh)$_2$(PMe$_3$)(in the formulae, Pr$^i$ represents an iso-propyl group, Bu$^t$ represents a tert-butyl group, Me represents a methyl group, and Ph represents a phenyl group); a molybdenum-based alkylidene catalyst such as Mo(N-2,6-Pr$^i_2$C$_6$H$_3$)(CHBu$^t$)(OBu$^t$)$_2$, Mo(N-2,6-Pr$^i_2$C$_6$H$_3$)(CHBu$^t$)(OCMe$_2$CF$_3$)$_2$, Mo(N-2,6-Pr$^i_2$C$_6$H$_3$)(CHBu$^t$)(OCMe(CF$_3$)$_2$)$_2$, Mo(N-2,6-Pr$^i_2$C$_6$H$_3$)(CHBu$^t$)(OC(CF$_3$)$_3$)$_2$, Mo(N-2,6-Pr$^i_2$C$_6$H$_3$)(CHCMe$_2$Ph)(OBu$^t$)$_2$, Mo(N-2,6-Pr$^i_2$C$_6$H$_3$)(CHCMe$_2$Ph)(OCMe$_2$CF$_3$)$_2$, Mo(N-2,6-Pr$^i_2$C$_6$H$_3$)(CHCMe$_2$Ph)(OCMe(CF$_3$)$_2$)$_2$, Mo(N-2,6-Pr$^i_2$C$_6$H$_3$)(CHCMe$_2$Ph)(OC(CF$_3$)$_3$)$_2$, Mo(N-2,6-Me$_2$C$_6$H$_3$)(CHCMe$_2$Ph)(OBu$^t$)$_2$, Mo(N-2,6-Me$_2$C$_6$H$_3$)(CHCMe$_2$Ph)(OCMe$_2$CF$_3$)$_2$, Mo(N-2,6-Me$_2$C$_6$H$_3$)(CHCMe$_2$Ph)(OCMe(CF$_3$)$_2$)$_2$, or Mo(N-2,6-Me$_2$C$_6$H$_3$)(CHCMe$_2$Ph)(OC(CF$_3$)$_3$)$_2$ (in the formulae, Pr$^i$ represents an iso-propyl group, Bu$^t$ represents a tert-butyl group, Me represents a methyl group, and Ph represents a phenyl group); and a ruthenium-based alkylidene catalyst such as Ru(P(C$_6$H$_{11}$)$_3$)$_2$(CHPh)Cl$_2$ (in the formula, Ph represents a phenyl group). The ring opening metathesis polymerization catalyst may be used alone or in combination of two or more kinds thereof.

Examples of the polymerization catalyst metal component at the time of polymerizing the cyclic olefin polymer according to the present embodiment include transition metals such as molybdenum, tungsten, rhenium, iridium, tantalum, ruthenium, vanadium, titanium, palladium, and rhodium. Among these, molybdenum, tungsten, ruthenium, or rhodium is preferable, and molybdenum or tungsten is more preferable.

The molar ratio of the cyclic olefin monomer to the ring opening metathesis polymerization catalyst of the organic transition metal alkylidene catalyst in the polymerization reaction is in a range of 10 equivalents to 50000 equivalents, preferably in a range of 50 equivalents to 30000 equivalents, and more preferably in a range of 100 equivalents to 20000 equivalents with respect to 1 mol of the ring opening metathesis polymerization catalyst.

The polymerization reaction may be carried out with or without a solvent. Examples of the solvent include ethers such as tetrahydrofuran, diethyl ether, dibutyl ether, dimethoxyethane, and dioxane; an aromatic hydrocarbon such as benzene, toluene, xylene, or ethylbenzene; an aliphatic hydrocarbon such as pentane, hexane, or heptane; an aliphatic cyclic hydrocarbon such as cyclopentane, cyclohexane, methyl cyclohexane, dimethyl cyclohexane, or decalin; a halogenated hydrocarbon such as methylene dichloride, dichloroethane, dichloroethylene, tetrachloroethane, chlorobenzene, or trichlorobenzene; and an ester such as methyl acetate or ethyl acetate. These solvents may be used alone or in combination of two or more kinds thereof.

Further, the polymerization reaction may be carried out in the coexistence of a chain transfer agent such as olefins or dienes. Examples of the olefins used as a chain transfer agent include α-olefin such as ethylene, propylene, butene, pentene, hexene, or octene; and silicon-containing olefin such as vinyl trimethylsilane, allyl trimethylsilane, allyl triethylsilane, or allyl triisopropylsilane. Further, examples of the dienes include non-conjugated diene such as 1,4-pentadiene, 1,5-hexadiene, or 1,6-heptadiene. The chain transfer agent may be used alone or in combination of two or more kinds thereof.

The amount of the chain transfer agent which is allowed to coexist is preferably in a range of 0.001 equivalents to 1000 equivalents and more preferably in a range of 0.01 equivalents to 100 equivalents with respect to 1 mol of the cyclic olefin monomer. The amount of the chain transfer agent is more preferably in a range of 0.1 equivalents to 2000 equivalents and more preferably in a range of 1 equivalent to 1000 equivalents with respect to 1 mol of the ring opening metathesis polymerization catalyst. The size of the molecular weight can be adjusted by optionally setting these ratios.

The monomer concentration in the polymerization reaction is not particularly limited since the monomer concentration varies depending on the reactivity of the cyclic olefin monomer or the solubility in a polymerization solvent, but the concentration of the cyclic olefin monomer is, for example, in a range of 0.001 kg/kg to 3 kg/kg, preferably in a range of 0.01 kg/kg to 2 kg/kg, and more preferably in a range of 0.02 kg/kg to 1 kg/kg with respect to 1 kg of the solvent. The reaction temperature is not particularly limited since the reaction temperature varies depending on the kind or the amount of the cyclic olefin monomer and the ring opening metathesis catalyst, but is preferably in a range of −30° C. to 150° C., preferably in a range of 0° C. to 120° C., and still more preferably in a range of 15° C. to 100° C. The reaction time is, for example, in a range of 1 minute to 10 hours, preferably in a range of 5 minutes to 8 hours, and more preferably in a range of 10 minutes to 6 hours.

After the polymerization reaction, a cyclic olefin polymer solution can be obtained by stopping the reaction using aldehydes such as butyl aldehyde; ketones such as acetone; or alcohols such as methanol. At this time, from the viewpoint of further suppressing generation of volatile components (outgas) by reducing the amount of unpolymerized monomers in the obtained cyclic olefin polymer, the rate of polymerization of the cyclic olefin monomer is preferably 90% or greater, more preferably 95% or greater, and still more preferably 100%.

Further, the method of obtaining a polymer from the solution of the cyclic olefin polymer is not particularly limited, and examples thereof include a method of discharging the reaction solution to a poor solvent being stirred; a method of precipitating a polymer using a steam stripping method of blowing steam into the reaction solution; and a method of evaporating and removing a solvent from the reaction solution through heating.

Further, the cyclic olefin polymer represented by Formulae (1) and (2) according to the present embodiment may be in the form in which a double bond in the main chain is hydrogenated (also referred to as hydrogenation). In this manner, further excellent heat melt fluidity can be exhibited by releasing restriction on the movement of a polymer chain using a double bond in the main chain, for example, lowering the glass transition temperature of the polymer and adjusting the temperature of the intersection between a storage modulus (G') curve and a loss modulus (G") curve which are measured using a rheometer described below. As the result, an underlayer film in which defects such as voids are further suppressed and which has excellent flatness and exhibits an excellent embedding property can be formed.

The hydrogenation ratio during the hydrogenation reaction is preferably in a range of 0.1% to 100% by mole, more preferably in a range of 1.0% to 95% by mole, and still more preferably in a range of 5% to 90% by mole.

The catalyst for hydrogenating a double bond moiety in the main chain of the polymer obtained by the ring opening metathesis polymerization may be a homogeneous metal complex catalyst or a heterogeneous metal-supported catalyst as long as the catalyst is capable of carrying out hydrogenation. Among these, a heterogeneous metal-supported catalyst which can easily separate a catalyst is suitable, and preferred examples thereof include activated carbon-supported palladium, alumina-supported palladium, activated carbon-supported rhodium, alumina-supported rhodium, activated carbon-supported ruthenium, and alumina-supported ruthenium. These catalysts may be used alone or in combination of two or more kinds thereof.

The solvent used for hydrogenation is not particularly limited as long as the polymer is dissolved therein and the solvent itself is not hydrogenated, and examples thereof include ethers such as tetrahydrofuran, diethyl ether, dibutyl ether, dimethoxyethane, and dioxane; an aromatic hydrocarbon such as benzene, toluene, xylene, or ethylbenzene; an aliphatic hydrocarbon such as pentane, hexane, or heptane; an aliphatic cyclic hydrocarbon such as cyclopentane, cyclohexane, methyl cyclohexane, dimethyl cyclohexane, or decalin; a halogenated hydrocarbon such as methylene dichloride, dichloroethane, dichloroethylene, tetrachloroethane, chlorobenzene, or trichlorobenzene; and an ester such as methyl acetate or ethyl acetate. These solvents may be used alone or in combination of two or more kinds thereof. Further, it is preferable that a step which is suitable for productivity can be employed without carrying out a solvent substitution step by means of using the same kind of solvent as the solvent selected based on the polymerization reaction described above.

In the hydrogenation reaction of the olefin moiety in the main chain described above, the hydrogen pressure is preferably in a range of the normal pressure to 10 MPa, more preferably in a range of 0.5 to 8 MPa, and particularly preferably in a range of 2 to 5 MPa. Further, the reaction temperature is preferably in a range of 0° C. to 200° C., more preferably in a range of room temperature to 150° C., and particularly preferably in a range of 50° C. to 100° C. The mode in which the hydrogenation reaction is carried out is not particularly limited, and examples of the method of carrying out the hydrogenation reaction include a method of carrying out the reaction by dispersing or dissolving a catalyst in a solvent; and a method of carrying out the reaction by filling a column or the like with a catalyst and circulating a polymer solution as a stationary phase.

Further, the hydrogenation treatment of the olefin moiety in the main chain is not particularly limited. Hydrogenation treatment may be carried out to a polymer redissolved in a solvent, after the polymer is isolated by adding a poor solvent to a polymerization solution that contains the polymer before hydrogenation treatment. Further, hydrogenation treatment may be carried out using the above-described hydrogenation catalyst, without isolating the polymer from the polymerization solution.

Particularly, the method of obtaining a polymer from a polymer solution in a case of preferably using a heterogeneous metal-supported catalyst such as activated carbon rhodium or activated carbon ruthenium after the hydrogenation is not particularly limited, and examples thereof include a method of obtaining a polymer solution which does not contain a catalyst using a method of filtration, centrifugation, or decantation and discharging the reaction solution to a poor solvent being stirred; a method of precipitating a polymer using a steam stripping method of blowing steam into the reaction solution; and a method of evaporating and removing a solvent from the reaction solution through heating.

Further, in a case where the hydrogenation reaction is carried out using a heterogeneous metal-supported catalyst, the polymer can be obtained according to the above-described method after a synthetic solution is filtered and the metal-supported catalyst is separated by filtration. In order to obtain a polymer solution particularly free of a metal which is used in a semiconductor device manufacturing step, the polymer may be obtained according to the above-described method after a solution obtained by roughly removing a catalyst component is filtered. Particularly, it is suitable to perform microfiltration on the catalyst component, and the pore diameter of a filtration filter is preferably in a range of 10 μm to 0.05 μm, particularly preferably in a range of 10 μm to 0.10 μm, and still more preferably in a range of 5 μm to 0.10 μm.

In the cyclic olefin polymer according to the present embodiment, the weight-average molecular weight (Mw) thereof in terms of polystyrene which is measured by gel permeation chromatography (GPC) at a sample concentration of 3.0 to 9.0 mg/ml is preferably in a range of 1000 to 20000, more preferably in a range of 1500 to 19000, and still more preferably in a range of 2000 to 18000. In a case where the weight-average molecular weight (Mw) is set to be in the above-described range, further excellent heat melt fluidity can be exhibited at the time of heating the surface of the uneven structure of the substrate at a temperature of 200° C. to 250° C., which is applied in a typical semiconductor device manufacturing step, the heating thereof is performed in a baking step after the surface thereof is coated with the material for forming an underlayer film according to the present embodiment. As the result, an underlayer film in which defects such as voids are further suppressed and which has excellent flatness and exhibits an excellent embedding property can be formed.

The molecular weight distribution (Mw/Mn), which is a ratio between the weight-average molecular weight (Mw) and the number average molecular weight (Mn) in a case where the molecular weight (Mw) is in the above-described range, is preferably in a range of 1.3 to 5.0, more preferably in a range of 1.3 to 4.0, and still more preferably in a range of 1.3 to 3.0. In a case where the molecular weight distribution (Mw/Mn) is set to be in the above-described range, the melt unevenness with respect to the heating during the baking step can be further suppressed, and the resin is further uniformly melted. As the result, an underlayer film in which defects such as voids are further suppressed and which has excellent flatness and exhibits an excellent embedding property can be formed.

As a measure of showing the melt fluidity through the heating described above, for example, the temperature showing an intersection between a storage modulus (G') curve and a loss modulus (G") curve in measurement of the solid viscoelasticity of the cyclic olefin polymer or the material for forming an underlayer film according to the present embodiment can be used (see FIG. 1).

The intersection between the storage modulus (G') curve and the loss modulus (G") curve can be used as a measure of showing a change of rheology of a substance (also referred to as a resin). Typically, the substance in a temperature rising step up to the intersection shows characteristics as an elastic body, and the resin does not flow. Further, the substance shows characteristics as a viscous fluid by being heated to a higher temperature through the intersection, and thus the resin flows. In other words, in order to embed the uneven surface of the substrate in a further uniform state while suppressing defects such as voids, it is preferable that moderate fluidity is exhibited. In other words, in the cyclic olefin polymer or the material for forming an underlayer film according to the present embodiment, in a case where the intersection between the storage modulus (G') curve and the loss modulus (G") curve is preferably in a range of 40° C. to 200° C., more preferably in a range of 40° C. to 195° C., and still more preferably in a range of 40° C. to 190° C., the cyclic olefin polymer or the material for forming an underlayer film according to the present embodiment can exhibit moderate fluidity required to uniformly embed the uneven structure of the surface of the substrate under a heating condition of 200° C. to 250° C. which has been typically used in a semiconductor device manufacturing step.

The lower limit of the intersection between the storage modulus (G') curve and the loss modulus (G") curve is more preferably 80° C. or higher, still more preferably 90° C. or higher, and particularly preferably 100° C. or higher. Further, the upper limit of the intersection between the storage modulus (G') curve and the loss modulus (G") curve is preferably 200° C. or lower, more preferably 195° C. or higher, and particularly preferably 190° C. or lower.

Here, the solid viscoelasticity of the cyclic olefin polymer or the material for forming an underlayer film according to the present embodiment can be measured under conditions of a measurement temperature range of 30° C. to 300° C. (or in a range of 50° C. to 250° C.), a heating rate of 3° C./min, and a frequency of 1 Hz in a nitrogen atmosphere in a shear mode using a rheometer.

In a case where the intersection between the storage modulus (G') curve and the loss modulus (G") curve is less than or equal to the above-described upper limit, the cyclic olefin polymer or the material for forming an underlayer film according to the present embodiment shows the characteristics as a viscous fluid, the resin flows, and the uneven surface of the substrate can be embedded in a more uniform state while defects such as voids are further suppressed.

Further, in a case where the intersection between the storage modulus (G') curve and the loss modulus (G") curve is greater than or equal to the above-described lower limit, the fluidity of the cyclic olefin polymer or the material for forming an underlayer film according to the present embodiment can be suppressed. As the result, shrinkage in the uneven surface of the substrate can be further suppressed, and the uneven surface of the substrate can be embedded in a more uniform state while defects such as voids are further suppressed.

In addition, the amount of the volatile component in the cyclic olefin polymer according to the present embodiment which is measured using the following method 1 is preferably greater than or equal to 0.0% by mass and less than or equal to 1.0% by mass, more preferably greater than or equal to 0.0% by mass and less than or equal to 0.7% by mass, still more preferably greater than or equal to 0.0% by mass and less than or equal to 0.5% by mass, and particularly preferably greater than or equal to 0.0% by mass and less than or equal to 0.1% by mass.

In this manner, since generation of the volatile component (outgas) accompanied by decomposition of the polymer at the time of heating and melting can be suppressed, a resist underlayer film with further excellent flatness can be formed.

In other words, a resist underlayer film which is capable of suppressing intermixing of an intermediate layer provided as an upper layer with the material used as a resist layer and suppressing generation of voids or the like, and has an embedding property in a further excellent state and further excellent flatness can be formed.

The method 1: The cyclic olefin polymer according to the present embodiment is dissolved in tetrahydrofuran to prepare a solution having a solid content concentration (or a polymer concentration) of 20% by mass, the obtained solution is weighed using an aluminum plate, heated at 200° C. for 3 minutes in a nitrogen flow so that the tetrahydrofuran is removed, and cooled to room temperature so that the cyclic olefin polymer is solidified, the cyclic olefin polymer is heated in a temperature range of 30° C. to 300° C. at a heating rate of 10° C./min in a nitrogen atmosphere, and the amount of the volatile component in the cyclic olefin polymer is calculated based on a weight reduction amount in a temperature range of 100° C. to 250° C.

Further, it is preferable that the cyclic olefin polymer or the material for forming an underlayer film according to the present embodiment can be dissolved in any organic solvent (preferably propylene glycol-1-monomethylether-2-acetate (PGMEA)) used to prepare a varnish-like material for forming an underlayer film at least at a concentration of greater than or equal to 0.01% by mass and less than or equal to 50% by mass, and the residual film rate of the cyclic olefin polymer or the material for forming an underlayer film according to the present embodiment which is measured using the following method 4 is preferably greater than or equal to 50% and less than or equal to 100% and more preferably greater than or equal to 60% and less than or equal to 100%.

Method 4: A coating film which is formed of the cyclic olefin polymer or the material for forming an underlayer film according to the present embodiment and has a thickness ($\alpha$) of greater than or equal to 200 nm and less than or equal to 500 nm is formed on a silicon wafer. Next, the obtained coating film is treated at 200° C. for 10 minutes. Subsequently, the coating film is immersed in at least one organic solvent selected from the group consisting of an alcohol-based solvent, an ether-based solvent, a ketone-based solvent, an amide-based solvent, an ester-based solvent, and a hydrocarbon-based solvent (preferably propylene glycol-1-monomethyl ether-2-acetate (PGMEA)) at 23° C. for 10 minutes and dried under conditions of 150° C. for 3 minutes so that a remaining solvent in the coating film is removed. Next, a thickness ($\beta$) of the coating film obtained by removing the remaining solvent is measured, and the residual film rate ($=\beta/\alpha\times100$)(%) is calculated.

Examples of the alcohol-based solvent include an aliphatic monoalcohol-based solvent such as 4-methyl-2-pentanol or n-hexanol; an alicyclic monoalcohol-based solvent having 3 to 18 carbon atoms such as cyclohexanol; a polyhydric alcohol-based solvent having 2 to 18 carbon atoms such as 1,2-propylene glycol; and a polyhydric alcohol partial ether-based solvent having 3 to 19 carbon atoms such as propylene glycol monomethyl ether.

Examples of the ether-based solvent include a dialkyl ether-based solvent such as diethyl ether, dipropyl ether, or dibutyl ether; a cyclic ether-based solvent such as tetrahydrofuran or tetrahydropyran; and an aromatic ring-containing ether-based solvent such as diphenyl ether or anisole.

Examples of the ketone-based solvent include a chain-like ketone-based solvent such as acetone, methyl ethyl ketone, methyl-n-propyl ketone, methyl-n-butyl ketone, diethyl ketone, methyl-iso-butyl ketone, 2-heptanone, ethyl-n-butyl ketone, methyl-n-hexyl ketone, di-iso-butyl ketone, or trimethyl nonanone; a cyclic ketone-based solvent such as cyclopentanone, cyclohexanone, cycloheptanone, cyclooctanone, or methyl cyclohexanone; and 2,4-pentanedione, acetonylacetone, or acetophenone.

Examples of the amide-based solvent include a cyclic amide-based solvent such as N,N'-dimethylimidazolidinone or N-methylpyrrolidone; and a chain-like amide-based solvent such as N-methylformamide, N,N-dimethylformamide, N,N-diethylformamide, acetamide, N-methylacetamide, N,N-dimethylacetamide, or N-methylpropionamide.

Examples of the ester-based solvent include a monocarboxylic acid ester-based solvent such as n-butyl acetate or ethyl lactate; a polyhydric alcohol carboxylate-based solvent such as propylene glycol acetate; a polyhydric alcohol partial ether carboxylate-based solvent such as polyhydric alcohol partial alkyl ether acetate of propylene glycol-1-monomethyl ether-2-acetate or the like; a polyhydric carboxylic acid diester-based solvent such as diethyl oxalate; a lactone-based solvent such as γ-butyrolactone or δ-valerolactone; and a carbonate-based solvent such as diethyl carbonate, ethylene carbonate, or propylene carbonate.

Examples of the hydrocarbon-based solvent include a linear or branched hydrocarbon having 5 to 10 carbon atoms, an alicyclic hydrocarbon having 5 to 12 carbon atoms, and an aromatic hydrocarbon having 6 to 18 carbon atoms. Some or all hydrogen atoms on a ring of the alicyclic hydrocarbon and the aromatic hydrocarbon may be substituted with a linear or branched alkyl group having 1 to 5 carbon atoms.

Among these, from the viewpoint of the adaptability to the process or the like, at least one selected from the group consisting of an alcohol-based solvent and an ester-based solvent is preferable. Examples of the alcohol-based solvent include propylene glycol monomethyl ether (PGME) and propylene glycol monopropyl ether (PGPE). Examples of the ester-based solvent include propylene glycol-1-monomethyl ether-2-acetate (PGMEA). These solvents may be used alone or in the form of a mixture of two or more kinds thereof.

In a case where the residual film rate of the cyclic olefin polymer according to the present embodiment is greater than or equal to the lower limit, intermixing can be suppressed during the formation of an intermediate layer on the resist underlayer film. As the result, a laminate which has excellent adhesiveness between the intermediate layer and the resist underlayer film and excellent flatness can be realized.

Here, the residual film rate may be in the above-described range in a case where at least one organic solvent selected from the group consisting of an alcohol-based solvent, an ether-based solvent, a ketone-based solvent, an amide-based solvent, an ester-based solvent, and a hydrocarbon-based solvent is used as an organic solvent, and it is preferable that the residual film rate is in the above-described range in a case where propylene glycol-1-monomethyl ether-2-acetate (PGMEA) is used as an organic solvent.

The glass transition temperature of the cyclic olefin polymer according to the present embodiment based on the differential scanning calorimetry is preferably in a range of 40° C. to 220° C., more preferably in a range of 40° C. to 200° C., and still more preferably in a range of 40° C. to 180° C. Further, the glass transition temperature of the cyclic olefin polymer according to the present embodiment based on the differential scanning calorimetry is preferably 40° C. or higher, more preferably 50° C. or higher, still more preferably 60° C. or higher, and even still more preferably 70° C. or higher and preferably 220° C. or lower, more preferably 200° C. or lower, and still more preferably 180° C. or lower. In a case where the glass transition temperature thereof is in the above-described range, the temperature of the intersection between the storage modulus (G') curve and the loss modulus (G") curve is easily adjusted to be in the above-described range.

Further, for example, a method of performing SEM observation on a sample obtained by embedding the uneven surface of the substrate through formation of a coating film according to a spin coating method and cutting out the cross section of the sample after being baked is used for evaluation of the flatness of the resist underlayer film. In this case, it is preferable that the following flatness ($\Delta$FT) can be used as a measure of showing the degree of fluctuation of the atmospheric surface. First, ten heights from the bottoms of recesses to the atmospheric surface (a surface ($\alpha$) described below) in the uneven structure of the substrate are measured, and the average value (Hav) is set as the film thickness. Next, based on the result obtained by measuring the maximum value ($H_{max}$) and the minimum value ($H_{min}$) among the film thicknesses in fluctuation, a value ($[(H_{max}-H_{min})/H_{av}] \times 100(\%)$) obtained by dividing a difference ($H_{max}-H_{min}$) between the maximum value and the minimum value by the average value of the film thicknesses is set as the measure of the flatness ($\Delta$FT). Here, in a case where the substrate does not have an uneven structure, the "heights from the bottoms of recesses to the atmospheric surface" may be replaced by the "height from the surface of the substrate to the atmospheric surface".

Figure 2:
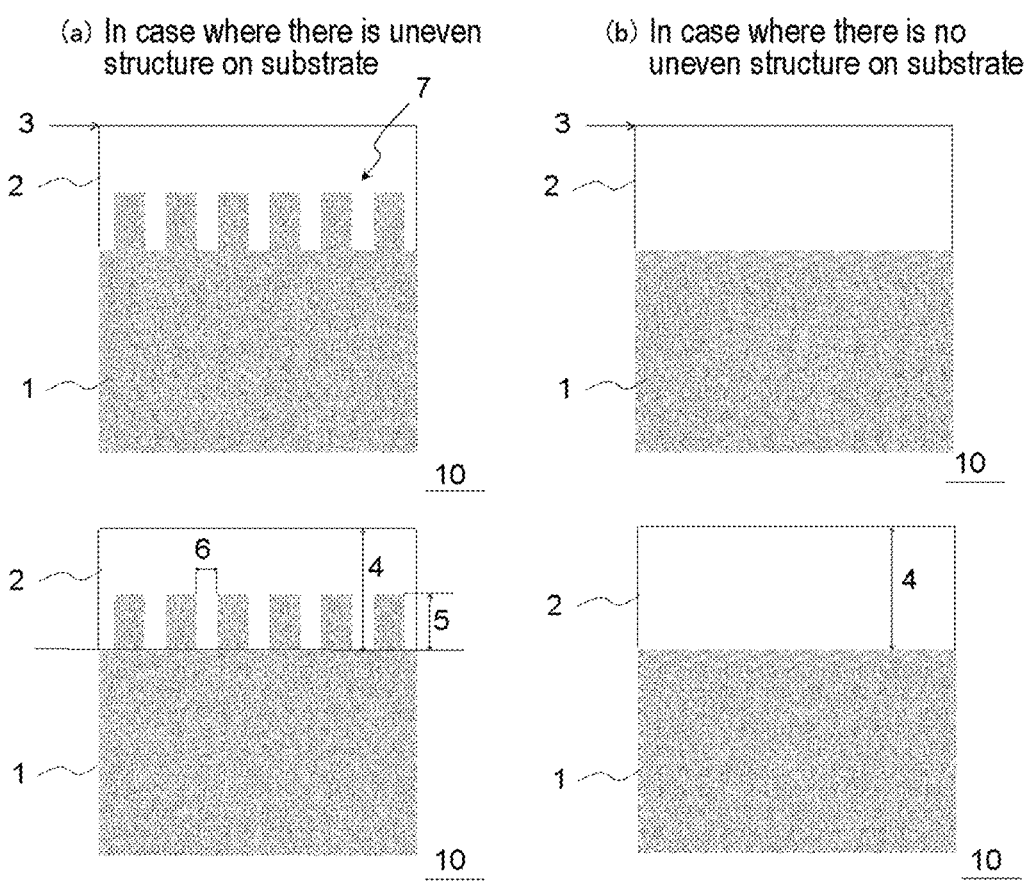
FIG. 2 is a schematic view for describing the thickness of a resist underlayer film, the height of an uneven structure, and an interval between a recess and a projection of the uneven structure in a laminate according to an embodiment of the present invention.

FIG. 2 are schematic views for describing a film thickness 4 of a resist underlayer film 2, a height 5 of an uneven structure 7, and an interval 6 between projections of the uneven structure 7 in a laminate 10 according to the embodiment of the present invention. As shown in FIG. 2, in a case where a substrate 1 has the uneven structure 7, the height from the bottom of a recess to a surface ($\alpha$) 3 is set as a film thickness 4 of the resist underlayer film 2. Further, in a case where the substrate 1 does not have the uneven structure 7, the height from the surface of the substrate 1 to the surface ($\alpha$) 3 is set as the film thickness 4 of the resist underlayer film 2.

The flatness ($\Delta$FT) is preferably in a range of 0% to 5%, more preferably in a range of 0% to 3%, and still more preferably in a range of 0% to 1%. In this manner, the thickness of the resist layer can be made more uniform regardless of the presence of the intermediate layer, and a desired pattern in lithography can be obtained with excellent reproducibility.

Figures 1, 3:
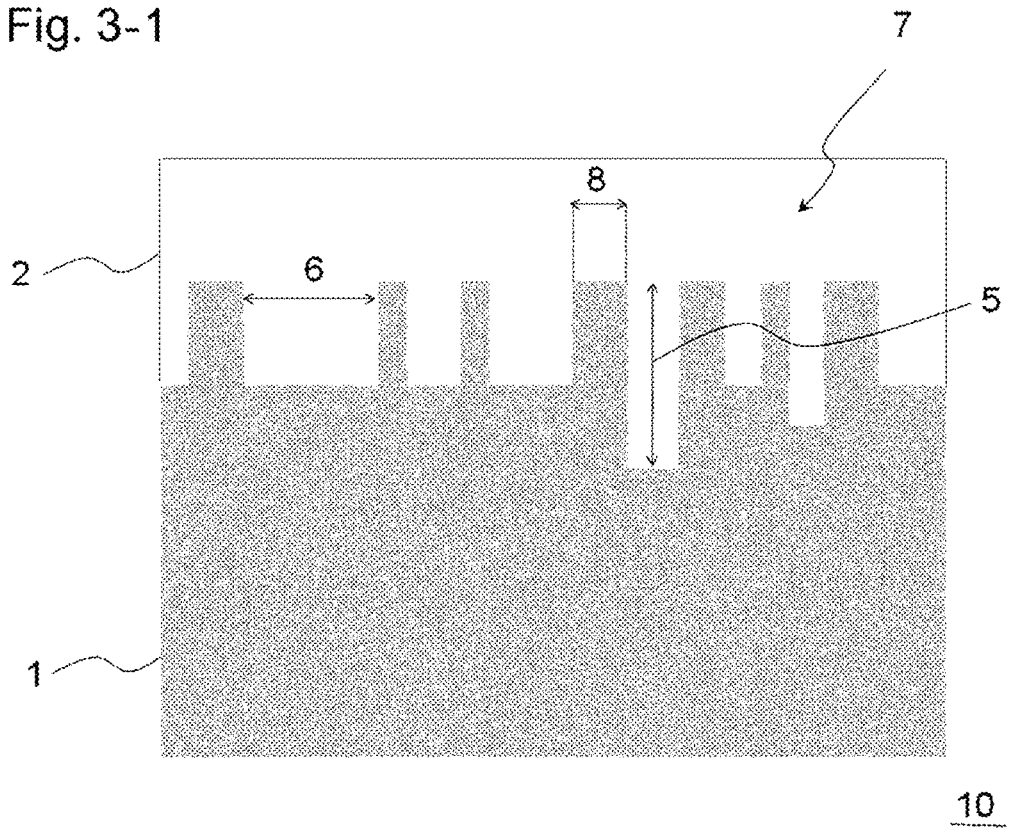
Figures 2, 3:
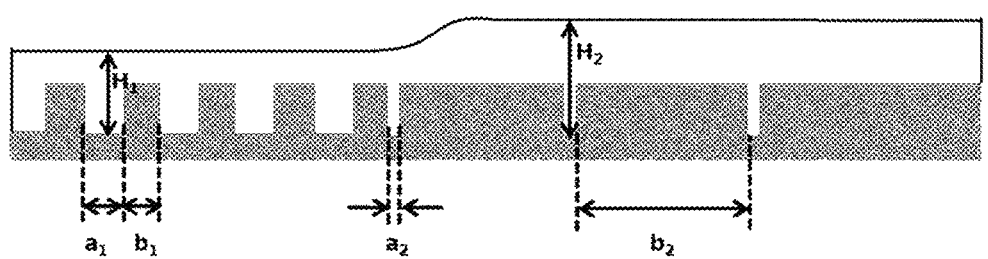

Further, for example, a method of performing SEM observation on a sample obtained by embedding the uneven surface of the substrate through formation of a coating film according to a spin coating method and cutting out the cross section of the sample after being baked is used for evaluation of the difference in film thickness in an isolated or dense pattern of the resist underlayer film. In this case, in a switching portion of the isolated and dense pattern, as shown in FIG. 3-2, in a case where the width between projections (recess width) in the uneven structure of the substrate is set as a and the projection width is set as b, the ratio [a/(a+b)] of the width between projections to the pattern pitch width represented by a+b is set as $\alpha$, and the $\alpha$ value, $\alpha_1$, and $\alpha_2$ for each of the pattern areas with different widths between projections and different projection widths on the same substrate are acquired. The switching portion of the isolated and dense pattern is obtained in a case where the absolute value of the difference between $\alpha 1$ and $\alpha 2$ is in a range of $0<|\alpha 1-\alpha 2|<1$. In the difference in film thickness in the switching portion of the isolated and dense pattern, ten film thicknesses from the bottoms of recesses to the atmospheric surface in each of the pattern regions on the same substrate with different a values are measured, an average value $H_1$, an average value $H_2$, and an average value $H_3$ of $H_1$ and $H_2$ are respectively acquired, and a value ($|H_1-H_2|/H_3 \times 100(\%)$) obtained by dividing the absolute value $H_1-H_2$ of the difference between the average film thicknesses from the bottoms of recesses to the atmospheric surface in two pattern regions by $H_3$ is set as the measure of the flatness ($\Delta$FT).

In FIG. 3-2, "$a_1/(a_1+b_1)=\alpha_1$" and "$a_2/(a_2+b_2)=\alpha_2$" are satisfied. $H_1$ and $H_2$ each indicate the average film thickness from the bottoms of recesses to the atmospheric surface in the regions of $\alpha_1$ and $\alpha_2$, and "$|H_1-H_2|/H_3 \times 100(\%)=\Delta$FT" is satisfied.

The flatness ($\Delta$FT) is preferably in a range of 0% to 5%, more preferably in a range of 0% to 3%, and still more preferably in a range of 0% to 1%. In this manner, the thickness of the resist layer can be made more uniform regardless of the presence of the intermediate layer, and a desired pattern in lithography can be obtained with excellent reproducibility.

In an ArF photolithography step of transferring a pattern of a photomask using an ArF excimer laser having a wavelength of 193 nm to a layer formed of a resist material formed over the underlayer film, light having passed through the underlayer film from the resist layer is reflected on the surface of the semiconductor substrate and is incident on the resist layer on the upper side from the underlayer film again. In other words, the roughness of the pattern may deteriorate because optical interference occurs due to the influence of a stationary wave and this result in non-uniform concentration of an acid generated inside the resist. Further, in a case where a substrate having a plurality of trenches particularly with aspect ratios different from one another, reflection of light causes irregular reflection on a stepped portion, and the irregular-reflected light is incident on the resist layer from the underlayer film again. Therefore, a phenomenon in which the transfer accuracy deteriorates due to the acid generated by the light which has been incident inside the resist layer that should be an unexposed portion occurs.

In order to prevent deterioration of pattern roughness or deterioration of transfer accuracy due to a stationary wave or irregular reflection on the resist layer from the underlayer film, the underlayer film is required to have a function as an anti-reflection film. Practically, it is considered that the reflectivity into the resist film from the underlayer film needs to be suppressed to less than or equal to 1%.

As a specific method of allowing the underlayer film to exhibit the function as an anti-reflection film, a method of controlling an optical constant of the material for forming an underlayer film has been known.

The reflectivity to the resist film from the underlayer film can be set to less than or equal to 1% by controlling a refractive index (n value) of the cyclic olefin polymer or the material for forming an underlayer film according to the present embodiment at a wavelength of 193 nm which is measured using the following method 2 and an extinction coefficient (k value) of the cyclic olefin polymer or the material for forming an underlayer film according to the present embodiment which is measured using the following method 3 such that the n value and the k value are preferably set to be in a range of 1.5 to 2.0 and 0.0001 to 0.5 respectively, more preferably set to be in a range of 1.55 to 1.95 and 0.0001 to 0.4 respectively, and still more preferably set to be in a range of 1.6 to 1.9 and 0.0001 to 0.3 respectively. Further, from the viewpoint of exhibiting the anti-reflection performance, it is preferable that the anti-reflection film has a flat shape. From the viewpoint of forming an anti-reflection film it is preferable that the present embodiment is employed since the surface of the base film can be made flat.

Method 2: A coating film which is formed of the cyclic olefin polymer or the material for forming an underlayer film and has a thickness of 250 nm is formed on a silicon wafer, and the refractive index (n value) of the obtained coating film at a wavelength of 193 nm is set as the refractive index (n value) of the material for forming an underlayer film.

Method 3: A coating film which is formed of the cyclic olefin polymer or the material for forming an underlayer film and has a thickness of 250 nm is formed on a silicon wafer, and the extinction coefficient (k value) of the obtained coating film is set as the extinction coefficient (k value) of the cyclic olefin polymer or the material for forming an underlayer film.

Further, the average value $H_{av}$ (the film thicknesses of the resist underlayer film at ten optional sites of the surface (α) of the resist underlayer film on a side opposite to the substrate are measured, and the average value of these is set as $H_{av}$) of the film thicknesses (the distances from the upper portion of the substrate to the surface of the underlayer film at several optional sites are measured in a case where the substrate that does not have an uneven structure is used, and the distances from the bottoms of recesses of the substrate to the surface of the underlayer film are measured in a case where a substrate having an uneven structure is used) of the underlayer film used here is preferably in a range of 5 to 1000 nm, more preferably in a range of 5 to 800 nm, still more preferably in a range of 5 to 600 nm, even still more preferably in a range of 5 to 500 nm, even still more preferably in a range of 7 to 450 nm, and even still more preferably in a range of 10 to 400 nm. Further, the lower limit of the average value $H_{av}$ of the film thicknesses of the resist underlayer film is preferably 5 nm or greater, more preferably 7 nm or greater, and still more preferably 10 nm or greater, and the upper limit thereof is preferably 1000 nm or less, more preferably 800 nm or less, still more preferably 600 nm or less, even still more preferably 500 nm or less, even still more preferably 450 nm or less, and even still more preferably 400 nm or less. In a case where the n value and the k value are respectively in the above-described range and the thickness of the underlayer film is in the above-described range, a processed substrate which is free of roughness in the pattern of the photomask and is transferred with high accuracy in the ArF photolithography step can be obtained.

<Preparation of Varnish-Like Material for Forming Underlayer Film>

The material for forming an underlayer film according to the present embodiment can be made into a varnish-like material for forming an underlayer film which is suitable for being applied to the substrate by dissolving or dispersing the cyclic olefin polymer according to the present embodiment in an organic solvent and removing foreign matter through a filter having pores according to the size of a desired pattern as necessary.

The organic solvent used here is not particularly limited as long as the cyclic olefin polymer according to the present embodiment can be dissolved or dispersed in the solvent.

Examples of the organic solvent include an alcohol-based solvent, an ether-based solvent, a ketone-based solvent, an amide-based solvent, an ester-based solvent, and a hydrocarbon-based solvent.

Examples of the alcohol-based solvent include an aliphatic monoalcohol-based solvent such as 4-methyl-2-pentanol or n-hexanol; an alicyclic monoalcohol-based solvent having 1 to 18 carbon atoms such as cyclohexanol; a polyhydric alcohol-based solvent having 2 to 18 carbon atoms such as 1,2-propylene glycol; and a polyhydric alcohol partial ether-based solvent having 3 to 19 carbon atoms such as propylene glycol monomethyl ether.

Examples of the ether-based solvent include a dialkyl ether-based solvent such as diethyl ether, dipropyl ether, or dibutyl ether; a cyclic ether-based solvent such as tetrahydrofuran or tetrahydropyran; and an aromatic ring-containing ether-based solvent such as diphenyl ether or anisole.

Examples of the ketone-based solvent include a chain-like ketone-based solvent such as acetone, methyl ethyl ketone, methyl-n-propyl ketone, methyl-n-butyl ketone, diethyl ketone, methyl-iso-butyl ketone, 2-heptanone, ethyl-n-butyl ketone, methyl-n-hexyl ketone, di-iso-butyl ketone, or trimethyl nonanone; a cyclic ketone-based solvent such as cyclopentanone, cyclohexanone, cycloheptanone, cyclooctanone, or methyl cyclohexanone; and 2,4-pentanedione, acetonylacetone, or acetophenone.

Examples of the amide-based solvent include a cyclic amide-based solvent such as N,N'-dimethylimidazolidinone or N-methylpyrrolidone; and a chain-like amide-based solvent such as N-methylformamide, N,N-dimethylformamide, N,N-diethylformamide, acetamide, N-methylacetamide, N,N-dimethylacetamide, or N-methylpropionamide.

Examples of the ester-based solvent include a monocarboxylic acid ester-based solvent such as n-butyl acetate or ethyl lactate; a polyhydric alcohol carboxylate-based solvent such as propylene glycol acetate; a polyhydric alcohol partial ether carboxylate-based solvent such as polyhydric alcohol partial alkyl ether acetate of propylene glycol-monomethyl ether-acetate or the like; a polyhydric carboxylic acid diester-based solvent such as diethyl oxalate; a lactone-based solvent such as γ-butyrolactone or δ-valerolactone; and a carbonate-based solvent such as diethyl carbonate, ethylene carbonate, or propylene carbonate.

Examples of the hydrocarbon-based solvent include a linear or branched hydrocarbon having 5 to 10 carbon atoms, an alicyclic hydrocarbon having 5 to 12 carbon atoms, and an aromatic hydrocarbon having 6 to 18 carbon atoms. Some or all hydrogen atoms on a ring of the alicyclic hydrocarbon and the aromatic hydrocarbon may be substituted with a linear or branched alkyl group having 1 to 5 carbon atoms.

Among these, the solvent is selected in consideration of the volatilization rate of the solvent at the time of application, the adaptability to the process, and the productivity, and it is preferable that an oxygen-containing solvent such as an alcohol-based solvent, a chain-like ketone-based solvent, a cyclic ether-based solvent, or an ester-based solvent is selected. The material for forming an underlayer film according to the present embodiment may contain one or two or more kinds of solvents.

Further, the concentration of the cyclic olefin polymer in the varnish-like material for forming an underlayer film according to the present embodiment is preferably in a range of 0.01% to 50.0% by mass, more preferably in a range of 0.1% to 45.0% by mass, and still more preferably in a range of 1.0% to 40.0% by mass. The concentration of the cyclic olefin polymer can be selected in consideration of the solubility of the polymer, the adaptability to the filtration process, the film forming property, the thickness of the underlayer film, and the like.

Further, for the purpose of adjusting the physical properties of the material as the underlayer film such as the etching resistance and optical characteristics, a resin such as an acrylic resin, an epoxy resin, a styrene resin, a hydroxystyrene resin, a hydroxynaphthylene resin, or a silicone resin; a monomer constituting the resin in a case of a combination of the resin and a polymerization initiator; a thermosetting monomer; a polymer material; and an oxide of a metal such as zirconium, hafnium, ruthenium, or titanium may be mixed into the material for forming an underlayer film according to the present embodiment within the range where the effects of the present invention are not impaired.

Further, in a case of providing the resist layer and the resist underlayer film or an intermediate layer between the resist layer and the resist underlayer film, the material for forming an underlayer film according to the present embodiment may contain a crosslinking agent within the range where the effects of the present invention are not impaired, for the purpose of suppressing intermixing of the intermediate layer with the resist underlayer film. Meanwhile, in a case where a crosslinking agent is used, the influence of reaction shrinkage at the time of curing may become significant. For example, in a case where the pattern of unevenness is irregular, the amount of the crosslinking agent is extremely large, and the distance between projections is long, the influence of the shrinkage cannot be ignored in some cases. Accordingly, the flatness may be degraded. Therefore, it is preferable that the content of the crosslinking agent in the material for forming an underlayer film according to the present embodiment is small. From this viewpoint, in a case where the total content of the polymer component contained in the material for forming an underlayer film is set as 100 parts by mass, the content of the crosslinking agent is preferably less than 5 parts by mass, more preferably less than 3 parts by mass, and still more preferably less than 1 part by mass.

A polyfunctional epoxy compound, an oxetane compound, or the like is suitably used as the crosslinking agent, but the crosslinking agent is not particularly limited to these compounds.

Examples of the polyfunctional epoxy compound include epoxy compounds, for example, alicyclic epoxy resins or glycidyl ether of hydrogenated bisphenol A, such as 1,7-octadiene diepoxide, limonene dioxide, 4-vinyl cyclohexene dioxide,
3,4-epoxycyclohexylmethyl-3',4'-epoxycyclohexane carboxylate, di(3,4-epoxycyclohexyl)adipate,
(3,4-epoxy-6-methylcyclohexyl)methyl-3,4-epoxy-6-methylcyclohexa ne carboxylate, ethylene 1,2-di(3,4-epoxycyclohexanecarboxylic acid) ester, 3',4'-epoxycyclohexylmethyl-3,4-epoxycyclohexane carboxylate, bis(3,4-epoxycyclohexylmethyl) adipate, a bisphenol A type epoxy resin, a halogenated bisphenol A type epoxy resin, a bisphenol F type epoxy resin, an o-, m-, or p-cresol novolak type epoxy resin, a phenol novolak type epoxy resin, polyglycidyl ether of polyhydric alcohol, and 3,4-epoxycyclohexenylmethyl-3',4'-epoxycyclohexene carboxylate.

Examples of the polyfunctional oxetane compound include bis(3-ethyl-3-oxetanylmethyl)ether,
1,2-bis[(3-ethyl-3-oxetanylmethoxy)]ethane,
1,3-bis[(3-ethyl-3-oxetanylmethoxy)]propane,
1,3-bis[(3-ethyl-3-oxetanylmethoxy)]-2,2-dimethyl-propane,
1,4-bis(3-ethyl-3-oxetanylmethoxy)butane,
1,6-bis(3-ethyl-3-oxetanylmethoxy)hexane,
1,4-bis[(3-methyl-3-oxetanyl)methoxy]benzene,
1,3-bis[(3-methyl-3-oxetanyl)methoxy]benzene,
1,4-bis{[(3-methyl-3-oxetanyl)methoxy]methyl}cyclohexane,
4,4'-bis{[3-methyl-3-oxetanyl]methoxy}methyl}biphenyl,
4,4'-bis{[(3-methyl-3-oxetanyl)methoxy]methyl}bicyclohexane,
2,3-bis[(3-methyl-3-oxetanyl)methoxy]bicyclo[2.2.1]heptane,
2,5-bis[(3-methyl-3-oxetanyl)methoxy]bicyclo[2.2.1]heptane,
2,6-bis[(3-methyl-3-oxetanyl)methoxy]bicyclo[2.2.1]heptane,
1,4-bis[(3-ethyl-3-oxetanyl)methoxy]benzene,
1,3-bis[(3-ethyl-3-oxetanyl)methoxy]benzene,
1,4-bis{[3-ethyl-3-oxetanyl]methoxy}methyl}benzene,
1,4-bis-{[(3-ethyl-3-oxetanyl)methoxy]methyl}cyclohexane,
4,4'-bis{[(3-ethyl-3-oxetanyl)methoxy]methyl}biphenyl,
4,4'-bis{[(3-ethyl-3-oxetanyl)methoxy]methyl}bicyclohexane,
2,3-bis[(3-ethyl-3-oxetanyl)methoxy]bicyclo[2.2.1]heptane,
2,5-bis[(3-ethyl-3-oxetanyl)methoxy]bicyclo[2.2.1]heptane, and
2,6-bis[(3-ethyl-3-oxetanyl)methoxy]bicyclo[2.2.1]heptane. Further, these crosslinking agents may be used alone or in combination of two or more kinds thereof.

Next, the varnish-like material for forming an underlayer film which has been prepared using the above-described method is filtered by being allowed to pass through a filter. In this manner, polymer insoluble, gels, or foreign matter can be removed from the varnish-like material for forming an underlayer film, and a uniform layer as an underlayer film can be formed between the resist film layer and the surface of the substrate.

The pore diameter of the filtration filter is preferably in a range of 1 μm to 0.001 μm, more preferably in a range of 0.5 μm to 0.001 μm, and still more preferably in a range of 0.1 μm to 0.001 μm. The filtration process may be carried out by performing a multi-stage process of sending the varnish from a filter having a large pore diameter to a filter having a small pore diameter or a single process of directly sending the varnish to a filter having a small pore diameter. Examples of the material of the filter include organic materials such as polytetrafluoroethylene (PTFE), polypropylene (PP), polyether sulfone (PES), and cellulose; and inorganic materials such as glass fibers and metals, and the material can be selected in consideration of the varnish characteristics and the process adaptability as long as the material does not affect the function as the underlayer film.

Further, examples of the method of sending the varnish to the filter include a method of using a pressure difference and a method of sending the varnish to the filter using mechanical drive through a screw or the like. In addition, the temperature for the filtration can be selected in consideration of the filter performance, the solution viscosity, and the solubility of the polymer, and the temperature thereof is preferably in a range of −10° C. to 200° C., more preferably in a range of 0° C. to 150° C., and still more preferably in a range of room temperature to 100° C. The temperature thereof can be selected in consideration of the varnish characteristics or the process adaptability unless precipitation or gelation of dissolved components and the like, or modification of the composition such as thermal decomposition or the like due to heating is found.

<Resist Underlayer Film and Method of Producing Resist Underlayer Film>

The resist underlayer film according to the present embodiment can be formed using the material for forming an underlayer film according to the present embodiment.

The method of producing the resist underlayer film according to the present embodiment includes a step of forming a coating film containing the material for forming an underlayer film according to the present embodiment on the substrate (hereinafter, also referred to as a "coating film forming step").

Further, the method may further include a step of heating the coating film (hereinafter, also referred to as a "baking step") as necessary.

According to the method of producing the resist underlayer film according to the present embodiment, since the material for forming an underlayer film according to the present embodiment is used, a resist underlayer film having sufficient optical characteristics, etching resistance, excellent flatness, and a suppressed generation of volatile components can be obtained.

Further, the material for forming an underlayer film according to the present embodiment has an excellent embedding property with respect to the substrate having a complicated shape. Therefore, according to the method of producing the resist underlayer film according to the present embodiment, a resist underlayer film having sufficient optical characteristics, etching resistance, excellent flatness, and a suppressed generation of volatile components can be prepared on a substrate having a complicated shape, such as a substrate having a stepped portion or a substrate having a plurality of trenches.

Hereinafter, each step will be described, but the present invention is not limited thereto.

[Coating Film Forming Step]

In the present step, a coating film containing the material for forming an underlayer film according to the present embodiment is formed on the substrate using the material for forming an underlayer film according to the present embodiment.

Examples of the substrate include a silicon wafer, an aluminum wafer, and a nickel wafer. An uneven structure may be imparted to a surface of the substrate. The uneven structure may be in a state in which a coating film is formed of a low dielectric material such as a silica ($SiO_2$) film, a SiCN film, a SiOC film obtained by doping silica ($SiO_2$) with carbon (C), a methylsiloxane-based organic film (SOG), or a silica insulating film in which minute holes having a diameter of several nanometers or less are uniformly distributed. As described above, according to the method of forming the resist underlayer film according to the present embodiment, a substrate having a stepped portion or a substrate having a plurality of trenches can be suitably used as the substrate. Therefore, a resist underlayer film having excellent flatness can be formed even in a case where a substrate having such a complicated shape is used.

As the substrate having a plurality of trenches, for example, a substrate having different aspect ratios can also be suitably used. A substrate having various aspect ratios can be used. For example, in the trenches of the substrate, the ratio between the maximum value and the minimum value among the aspect ratios is preferably in a range of 1 to 30, more preferably in a range of 1 to 25, and still more preferably in a range of 1 to 20.

The method of coating the substrate with the material for forming an underlayer film according to the present embodiment is not particularly limited, and examples thereof include a method of coating the substrate with the above-described varnish-like material for forming an underlayer film using a method such as spin coating, solution cast coating, roll coating, slit coating, or ink jet coating. As the film thicknesses of the resist underlayer film from the bottoms of recesses to the atmospheric surface, which is formed here, the average value Hav described above is preferably in a range of 5 to 2000 nm, more preferably in a range of 7 to 1000 nm, and still more preferably in a range of 10 to 500 nm. Further, the lower limit of the film thickness is preferably 15 nm or greater.

[Baking Step]

In the present step, the coating film formed in the coating film forming step is heated (baked). As a method of baking this coating film, a method of heating the coating film is exemplified. The temperature of heating the coating film is preferably in a range of 100° C. to 400° C., more preferably in a range of 150° C. to 300° C., and still more preferably in a range of 180° C. to 250° C. The heating time is preferably in a range of 5 seconds to 60 minutes, more preferably in a range of 10 seconds to 10 minutes, and still more preferably in a range of 30 seconds to 3 minutes. The coating film may be heated in an air atmosphere or an inert gas atmosphere such as nitrogen gas or argon gas.

Further, examples of the heating mode in the present step include a mode in which the coating film is heated for the purpose of removing a solvent in the coating film, the coating film is allowed to flow by being heated thereafter and the coating film is embedded in the uneven structure of the substrate; a mode in which a foreign substance such as a thermosetting material mixed for the purpose of compensating for the function while still achieving the object of the present invention is cured, the coating film is allowed to flow by being heated thereafter, and the coating film is embedded in the uneven structure of the substrate; and a mode in which the coating film is heated for the purpose of separating a leaving group in the material for forming an underlayer film, the coating film is allowed to flow by being heated thereafter, and the coating film is embedded in the uneven structure of the substrate.

The coating film may be heated in the baking step by performing a multi-stage process of increasing the temperature in a stepwise manner.

The average value $H_{av}$ of the film thicknesses of the formed resist underlayer film is preferably in a range of 5 to 1000 nm, more preferably in a range of 5 to 800 nm, still more preferably in a range of 5 to 600 nm, even still more preferably in a range of 5 to 500 nm, even still more preferably 7 to 450 nm, and even still more preferably in a range of 10 to 400 nm. Further, the lower limit of the average value $H_{av}$ of the film thicknesses of the resist underlayer film is preferably 5 nm or greater, more preferably 7 nm or greater, and still more preferably 10 nm or greater, and the upper limit thereof is preferably 1000 nm or less, more preferably 800 nm or less, still more preferably 600 nm or less, even still more preferably 500 nm or less, even still more preferably 450 nm or less, and even still more preferably 400 nm or less.

The resist underlayer film according to the present embodiment can be used as a step member for forming a pattern using photolithography.

<Laminate>

The laminate according to the present embodiment includes a substrate (a) and a resist underlayer film (b) containing the material for forming an underlayer film according to the present embodiment which has been formed on one surface of the substrate.

It is preferable that the laminate has a structure in which the substrate (a) is in contact with the resist underlayer film (b).

Here, the resist underlayer film (b) and the method of producing the resist underlayer film are the same as the resist underlayer film and the method of producing the resist underlayer film according to the present embodiment, and thus the description thereof will not be repeated.

FIG. 2 are schematic views for describing the film thickness 4 of the resist underlayer film 2, the height 5 of the uneven structure 7, and the interval 6 between projections of the uneven structure 7 in the laminate 10 according to the embodiment of the present invention.

The substrate (a) may be a structure having a flat surface, but it is preferable that one or both surfaces thereof have an uneven structure with a height of preferably 5 to 500 nm, more preferably 7 to 450 nm, and still more preferably 10 to 400 nm.

Here, the above-described height indicates the height 5 of the uneven structure 7 shown in FIG. 2. For example, optional ten heights 5 of the uneven structure 7 are measured, and the average value of these heights can be employed as the height.

Further, the interval between projections in the uneven structure is preferably greater than or equal to 1 nm and less than or equal to 10 mm. The lower limit of the interval between projections in the uneven structure is more preferably 3 nm or greater, more preferably 5 nm or greater, and particularly preferably 10 nm or greater.

Here, the interval between projections in the uneven structure indicates the interval 6 between projections in the uneven structure 7 shown in FIG. 2. For example, optional ten intervals 6 between projections in the uneven structure 7 are measured, and the average value of these intervals can be employed as the interval.

Further, the upper limit of the interval between projections in the uneven structure is more preferably 5 mm or less, more preferably 1 mm or less, and particularly preferably 0.5 mm or less.

From the viewpoint that the effects of the resist underlayer film (b) tend to be significantly exhibited, it is preferable that the substrate (a) has the above-described uneven structure.

The thickness of the substrate (a) is preferably in a range of 0.01 to 10000 μm. The lower limit of the thickness of the substrate (a) is more preferably 0.03 μm or greater, still more preferably 0.05 μm or greater, and particularly preferably 0.10 μm or greater.

The upper limit of the thickness of the substrate (a) is more preferably 5000 μm or less, still more preferably 3000 μm or less, and particularly preferably 1000 μm or less.

In the laminate according to the present embodiment, the flatness (ΔFT) of the surface (α) of the resist underlayer film (b) on a side opposite to the substrate (a) which is calculated by the following equation is preferably in a range of 0% to 5%, more preferably in a range of 0% to 3%, and still more preferably 0% to 1%.

$$\text{Flatness}(\Delta FT) = [(H_{max} - H_{min})/H_{av}] \times 100 (\%)$$

Here, the film thicknesses of the resist underlayer film (b) are measured in ten optional sites of the surface (α), the average value of these measured values is set as $H_{av}$, the maximum value in the film thicknesses of the resist underlayer film (b) is set as $H_{max}$, and the minimum value in the film thicknesses of the resist underlayer film (b) is set as $H_{min}$.

In this manner, the thickness of the resist layer can be made more uniform regardless of the presence of the intermediate layer, and a desired pattern in lithography can be obtained with excellent reproducibility.

<Pattern Formation Method>

A pattern formation method according to the present embodiment includes a step of forming a resist pattern on an upper surface side of the resist underlayer film according to the present embodiment (hereinafter, also referred to as a "resist pattern forming step"); and a step of sequentially etching the resist underlayer film and the substrate using the resist pattern as a mask (hereinafter, also referred to as an "etching step").

Further, the pattern formation method according to the present embodiment may be performed by forming an intermediate layer on an upper surface side of the resist underlayer film to form a resist pattern on an upper surface side of the intermediate layer in the resist pattern forming step and etching the intermediate layer in the etching step.

According to the pattern formation method according to the present embodiment, an excellent pattern can be formed because the resist underlayer film according to the present embodiment which has sufficient optical characteristics, etching resistance, excellent flatness, and a suppressed generation of volatile components is used.

Hereinafter, each step will be described, but the present invention is not limited thereto.

[Resist Pattern Forming Step]

In the present step, a resist pattern is formed on the upper surface side of the resist underlayer film. An intermediate layer is formed on the upper surface side of the resist underlayer film, and the resist pattern is formed on the upper surface side of this intermediate layer.

The intermediate layer indicates a layer that compensates for the functions of the resist underlayer film and/or the resist film or has these functions for imparting the functions that the resist underlayer film and/or the resist film does not have in the formation of the resist pattern or the like. For example, in a case where an anti-reflection film (also referred to as an anti-reflection layer) is formed as an intermediate layer, the intermediate layer can compensate for the anti-reflection function of the resist underlayer film. Further, in a case where a hard mask layer is formed as an intermediate layer, the influence on the resist underlayer film in case of using an alkali developer during a developing step is suppressed and/or the insufficient etching resistance of the resist pattern formation layer in case of etching the substrate formed of silicon, aluminum, nickel, and the like of the lower layer after etching the underlayer film according to the present embodiment can be compensated.

Further, the intermediate layer formed on the underlayer film according to the present embodiment may include one or both of the anti-reflection layer and the hard mask layer, and the layers may be configured such that the anti-reflection layer or the hard mask layer is formed directly on the underlayer film according to the present embodiment. The layer configuration is suitably selected in consideration of the characteristics of the resist material and the processed substrate material and the productivity.

The intermediate layer can be formed of an organic compound or an inorganic oxide. Examples of the organic compound include DUV-42, DUV-44, ARC-28, and ARC-29 (all manufactured by Brewer Science, Inc.); and AR-3 and AR-19 (both manufactured by Rohm and Haas Company). Further, as the inorganic oxide, NFC SOG Series (manufactured by JSR Corporation), and polysiloxane, titanium oxide, alumina oxide, and tungsten formed using a CVD method oxide can be used.

The method of forming the intermediate layer is not particularly limited, and examples thereof include a coating method and a CVD method. Among these, a coating method is preferable. In a case of using the coating method, the intermediate layer can be continuously formed after formation of the resist underlayer film.

Further, the film thickness of the intermediate layer is not particularly limited and can be appropriately selected depending on the function required for the intermediate layer, and the film thickness thereof is preferably in a range of 1 nm to 5 µm, more preferably in a range of 5 nm to 3 µm, and still more preferably in a range of 10 nm to 0.3 µm.

Examples of the method of forming the resist pattern on the upper surface side of the resist underlayer film or the intermediate layer include a method of using photolithography. This method will be described in detail layer, and the present invention is not limited thereto.

The method of using photolithography includes a step of forming a resist film on the upper surface side of the resist underlayer film using a resist composition or the like (hereinafter, also referred to as a "resist film forming step"); a step of exposing the resist film (hereinafter, also referred to as an "exposing step"), and a step of developing the exposed resist film (hereinafter, also referred to as a "developing step").

(Resist Film Forming Step)

In the present step, the resist film is formed on the upper surface side of the resist underlayer film.

Specifically, the resist film is formed by coating the surface with the resist composition such that the obtained resist film has a predetermined film thickness and allowing the solvent in the coating film to volatilize by performing pre-baking.

Examples of the resist composition include a positive type or negative type chemically amplified resist composition containing a photoacid generator; a positive type resist composition formed of an alkali-soluble resin and a quinone diazide-based photosensitive agent; and a negative type resist composition formed of an alkali-soluble resin and a crosslinking agent.

The solid content concentration of the resist composition is preferably in a range of 0.1% by mass to 50% by mass, more preferably in a range of 0.5% by mass to 50% by mass, and still more preferably in a range of 1.0% by mass to 50% by mass, and the solid content concentration thereof can be selected to be in an appropriate range in consideration of the target film thickness and the productivity.

Further, it is preferable that the resist composition is prepared by being filtered through a filter having a pore diameter of approximately 0.1 µm. Further, in this step, a commercially available resist composition can be used as it is. The method of coating the surface with the resist composition is not particularly limited and can be performed using a spin coating method, a cast coating method, or a roll coating method.

Further, the pre-baking temperature is appropriately selected depending on the kind of the resist composition to be used, but is preferably in a range of 30° C. to 200° C. and more preferably in a range of 50° C. to 150° C.

(Exposing Step)

In the present step, the resist film formed in the resist film forming step is exposed. The resist film is exposed through, for example, a predetermined mask pattern and liquid immersion as necessary.

The exposure light is appropriately selected from electromagnetic waves such as visible light, ultraviolet rays, deep ultraviolet rays, X rays, and γ rays; and particle beams such as electron beams, molecular beams, ion beams, and a rays depending on the kind of the photoacid generator used in the resist composition. In addition, deep ultraviolet rays are preferable; KrF excimer laser light (248 nm), ArF excimer laser light (193 nm), F2 excimer laser light (wavelength of 157 nm), Kr2 excimer laser light (wavelength of 147 nm), ArKr excimer laser light (wavelength of 134 nm), or extreme ultraviolet rays (wavelength of 13 nm and the like) are more preferable, and ArF excimer laser light is still more preferable.

After the exposure, post-baking can be performed in order to improve the resolution, the pattern profile, and the developability of the resist pattern to be formed.

The post-baking temperature is appropriately adjusted depending on the kind of the resist composition to be used, but is preferably in a range of 50° C. to 200° C. and more preferably in a range of 70° C. to 150° C.

(Developing Step)

In the present step, the resist film exposed in the exposing step is developed.

The developer used in the development is appropriately selected depending on the kind of the resist composition to be used. In a case of alkali development, examples of the developer include an alkaline aqueous solution such as sodium hydroxide, potassium hydroxide, sodium carbonate, sodium silicate, sodium metasilicate, ammonia, ethylamine, n-propylamine, diethylamine, di-n-propylamine, trimethylamine, methyl diethylamine, dimethyl ethanolamine, triethanolamine, tetramethyl ammonium hydroxide, tetraethyl ammonium hydroxide, pyrrole, piperidine, choline, 1,8-diazabicyclo[5.4.0]-7-undecene, or 1,5-diazabicyclo[4.3.0]-5-nonene. Further, in a case where the intermediate layer is formed by performing the intermediate layer forming step, the influence on the resist underlayer film of any of these alkaline aqueous solutions can be suppressed.

An appropriate amount of a surfactant or a water-soluble organic solvent such as methanol or ethanol can be added to these alkaline aqueous solutions.

Further, a developer containing an organic solvent can be used as the developer. Examples of the organic solvent include esters, ketones, ethers, alcohols, amides, and hydrocarbons. The solvent used in the organic solvent development is appropriately selected depending on the characteristics of the resist underlayer film.

After the development using the developer, a predetermined resist pattern is formed by performing washing and drying on the resist film.

Further, as the method of performing the resist pattern forming step, a method of using a nanoimprint method or a method of using a self-assembled composition can be used in addition to the method of using photolithography described above.

[Etching Step]

In this step, the resist underlayer film and the substrate are sequentially etched using the resist pattern as a mask. In this manner, the pattern is formed on the substrate. Further, in a case of forming an intermediate layer, the intermediate layer is also etched.

The above-described etching may be dry etching or wet etching. The dry etching can be performed using a known dry etching device. In addition, the source gas at the time of dry etching is not particularly limited because the source gas depends on the elemental composition of the material to be etched, and examples of the source gas include gas containing an oxygen element such as $O_2$, CO, or $CO_2$; inert gas such as $H_e$, $N_2$, or Ar; chlorine-based gas such as $Cl_2$ or $BCl_3$; fluorine-based gas such as $CHF_3$ or $CF_4$; and gas such as $H_2$ or $NH_3$. Further, these gases can be used by being mixed.

[Method of Removing Underlayer Film Material after Formation of Substrate Pattern]

In the present step, the resist underlayer film which becomes unnecessary is removed after the resist pattern is transferred to the substrate and formed thereon in the etching step.

The removal method may be a dry method or a wet method using a solvent or the like and is suitably selected in consideration of the physical properties of the material and the process adaptability. Further, a combination of the dry method and the wet method may be used as the removal method.

In a case of the dry method, a dry etching device used in the etching step can be used. Accordingly, the dry method is preferable used from the viewpoint of the productivity since there is no need to change the production line at the time of transition from the etching step to the step of removing the underlayer film material.

In the step of removing the underlayer film material, the source gas at the time of using a dry etching device is suitably selected depending on the elemental composition of the material to be etched, and examples of the source gas include gas containing an oxygen element such as $O_2$, CO, or $CO_2$; inert gas such as $H_e$, $N_2$, or Ar; chlorine-based gas such as $Cl_2$ or $BCl_3$; fluorine-based gas such as $CHF_3$ or $CF_4$; and gas such as $H_2$ or $NH_3$. The gas source is suitably selected depending on the substrate material or the low dielectric material applied to the surface of the substrate. Further, these gases can be used in the form of a mixture of two or more kinds thereof.

[Second Invention]

Hereinafter, an embodiment according to the second invention will be described.

<Material for Forming Underlayer Film>

A material for forming an underlayer film according to the present embodiment is a material for forming an underlayer film which is used to form a resist underlayer film used in a multi-layer resist process. Further, the material for forming an underlayer film contains a cyclic olefin polymer, and the residual film rate of the material for forming an underlayer film which is measured using the following method 4 is greater than or equal to 50% and less than or equal to 100% and preferably greater than or equal to 60% and less than or equal to 100%. The lower limit of the residual film rate of the material for forming an underlayer film is more preferably 70% or greater. In addition, the upper limit of the residual film rate of the material for forming an underlayer film is more preferably 99% or less and still more preferably 98% or less. As described above, in a case where the residual film rate is extremely low, defects caused by mixing with the intermediate layer may occur. Meanwhile, in a case where the residual film rate is slightly lower than 100%, a moderate degree of entanglement of polymers forming the intermediate layer and the base film occurs so that the peeling strength is increased in some cases.

Method 4: A coating film which is formed of the material for forming an underlayer film according to the present embodiment and has a thickness ($\alpha$) of greater than or equal to 200 nm and less than or equal to 500 nm is formed on a silicon wafer. Next, the obtained coating film is treated at 200° C. for 10 minutes. Next, the coating film is immersed in propylene glycol-1-monomethyl ether-2-acetate at 23° C. for 10 minutes and dried under conditions of 150° C. for 3 minutes so that a remaining solvent in the coating film is removed. Next, the thickness ($\beta$) of the coating film obtained by removing the remaining solvent is measured, and the residual film rate (=$\beta/\alpha \times 100$)(%) is calculated.

Further, the material for forming an underlayer film according to the present embodiment is a material for forming an underlayer film which is used to form a resist underlayer film used in a multi-layer resist process. Further, the material for forming an underlayer film is a material of a film containing a cyclic olefin polymer, the cyclic olefin polymer is soluble in an organic solvent at any concentration of at least greater than or equal to 0.01% by mass and less than or equal to 50% by mass, and a residual film rate of the cyclic olefin polymer in the film which is measured using the following method 4 is greater than or equal to 50% and less than or equal to 100% and preferably greater than or equal to 60% and less than or equal to 100%. The lower limit of the residual film rate of the cyclic olefin polymer is more preferably 70% or greater. In addition, the upper limit of the residual film rate of the cyclic olefin polymer is more preferably 99% or less and still more preferably 98% or less. As described above, in a case where the residual film rate is extremely low, defects caused by mixing with the intermediate layer may occur. Meanwhile, in a case where the residual film rate is slightly lower than 100%, a moderate degree of entanglement of polymers forming the intermediate layer and the base film occurs so that the peeling strength is increased in some cases.

Method 4: A coating film which is formed of the cyclic olefin polymer according to the present embodiment and has a thickness ($\alpha$) of greater than or equal to 200 nm and less than or equal to 500 nm is formed on a silicon wafer. Next, the obtained coating film is treated at 200° C. for 10 minutes. Next, the coating film is immersed in propylene glycol-1-monomethyl ether-2-acetate at 23° C. for 10 minutes and dried under conditions of 150° C. for 3 minutes so that a remaining solvent in the coating film is removed. Next, the thickness ($\beta$) of the coating film obtained by removing the remaining solvent is measured, and the residual film rate (=$\beta/\alpha \times 100$)(%) is calculated.

Here, as a condition for treating the peeled film at a high temperature, it is more preferable that the peeled film is treated at 200° C. for 30 minutes.

The residual film rate according to the method 4 indicates the solubility of the film in a solvent. There is a tendency that the film is unlikely to be dissolved in a solvent as the value increases.

As described above, in a case where a circuit diagram is drawn using the line width less than or equal to the wavelength of exposure light, a method of forming a plurality of uneven layers and combining the layers has been known. In order to realize such a mode, a method of forming an intermediate layer on a resist underlayer film for the purpose of smoothing the uneven layers and forming a new resist layer thereon can be exemplified.

According to the examination conducted by the present inventors, for example, in a case where this intermediate layer is formed according to a spin coating method or the like, a wrong choice of a solvent may lead to intermixing of the resist underlayer film with the intermediate film. As the result, it was found that the interface strength between the underlayer film and the intermediate layer may be degraded or the smoothness of the underlayer film may be lost.

The present inventors repeatedly conducted examination in order to solve the above-described problems. As the result, it was found that occurrence of intermixing of the resist underlayer film with the intermediate layer can be suppressed in a case where the resist underlayer film has a low affinity for the solvent used for formation of the intermediate layer.

The present inventors repeatedly conducted examination based on the above-described knowledge. As the result, it was found for the first time that dissolution of the resist underlayer film or mixing of the resist underlayer film with the intermediate layer more than necessary can be effectively suppressed by using the material for forming an underlayer film or the cyclic olefin polymer whose residual film rate at the time of being immersed in propylene glycol-1-monomethyl ether-2-acetate, which is measured according to the method 4, is in the above-described range.

In other words, in a case where the residual film rate of the material for forming an underlayer film or the cyclic olefin polymer according to the present embodiment which is measured according to the method 4 is greater than or equal to the above-described lower limit, dissolution of the resist underlayer film or mixing of the resist underlayer film with the intermediate layer more than necessary can be suppressed at the time of forming the intermediate layer on the resist underlayer film. As the result, a laminate having excellent adhesiveness between the intermediate layer and the resist underlayer film and excellent flatness can be realized.

The cyclic olefin polymer used in the second invention is not particularly limited as long as the polymer is dissolved in an organic solvent in a temperature range of room temperature to 50° C. and preferably at room temperature. As the organic solvent, a solvent selected from the group consisting of an alcohol-based solvent, an ether-based solvent, a ketone-based solvent, an amide-based solvent, an ester-based solvent, and a cyclic hydrocarbon-based solvent is preferable. Among these, an alcohol-based solvent, an ether-based solvent, a ketone-based solvent, an amide-based solvent, or an ester-based solvent is more preferable, and an ether-based solvent, a ketone-based solvent, an amide-based solvent, or an ester-based solvent is still more preferable. A solvent having a polyether monoester structure is particularly preferable.

More specific preferred examples of the cyclic olefin polymer of the second invention include a cyclic olefin polymer having a norbornane skeleton or a tetracyclododecane skeleton. Further, it is preferable that the cyclic olefin polymer has a substituent having heteroatoms contained in the above-described organic solvent. Preferred examples of the substituent having heteroatoms include an alkoxy group, an aryloxy group, an alkoxyalkyl group, an aryloxyalkyl group, an alkoxycarbonyl group, a dialkylaminocarbonyl group, an aryloxycarbonyl group, an alkylarylaminocarbonyl group, an alkoxycarbonylalkyl group, an alkoxycarbonylaryl group, an aryloxycarbonylalkyl group, an alkoxyalkyloxycarbonyl group, and an alkoxycarbonylalkyloxycarbonyl group. As the substituent, the above-described ester groups are particularly preferable.

Other specific preferred examples of the cyclic olefin polymer used in the second invention include a cyclic olefin polymer having the structural unit [A] and the structural unit [B] disclosed in the first invention. The preferable conditions such as the proportions of these structural units are the same as those disclosed in the first invention.

A known method can be used as the method of forming a film using the material for forming an underlayer film according to the present embodiment. Specific preferred examples thereof include a spin coating method. As the solvent that forms a polymer solution used for spin coating, the above-described solvent for spin coating can be exemplified. Particularly preferred examples thereof include polyether ester or polyether such as the above-described PGMEA, ketone, alcohol, and ester. In consideration of the solubility or the drying step after film formation, a mode of containing a solvent having a cyclic structure is preferable in some cases. Specifically, a cyclic ketone compound such as cycloalkanone is exemplified, and cyclohexanone is preferable.

It is desirable that the material for forming an underlayer film according to the present embodiment is treated at a high temperature for a predetermined time. Specifically, a temperature range of 100° C. to 400° C. can be exemplified as the temperature condition. The lower limit of the temperature is preferably 150° C. or higher and more preferably 180° C. or higher. Meanwhile, the upper limit of the temperature is preferably 300° C. or lower and more preferably 250° C. or lower. Based on this reason, the present inventors speculated as follows.

According to the examination conducted by the present inventors, the film formed using the cyclic olefin polymer containing a polar group according to the present embodiment is in the form in which a relatively uniform change in polarity occurs in the entire heated portion by the heat treatment. It is considered that the solubility in a solvent is greatly changed, in other words, the film is unlikely to be dissolved in the organic solvent due to the change of the polarity. According to the present inventors, it is considered that the above-described change may be caused by the change of properties of the polar group in the cyclic olefin polymer according to the present embodiment. The possibility that the change is caused by a pseudo-crosslinked structure or a crosslinked structure being employed. For example, the configuration having the structure represented by Formula (2) is a preferable aspect and the effects are high. Hereinafter, the description will be provided in more detail.

In order to change the polarity of the film containing the cyclic olefin polymer according to the present embodiment, it is important that the polymer contains one or two repeating structural units [B] represented by Formula (2) in some cases. In a case where the repeating structural unit [B] represented by Formula (2) is heated, this causes cleavage of an ether group and a thioether group so that the polarity of a molecule can be changed.

As another aspect, in a case where at least one of $R^1$ to $R^8$ contains an alkoxycarbonyl group, an alkoxycarbonylalkyl group, an alkoxycarbonylaryl group, or an alkoxycarbonylalkyloxycarbonyl group and preferably one or more of alkoxycarbonyl groups in which tertiary carbons are bonded to form an ester group, alkoxycarbonylalkyl groups, alkoxycarbonylaryl groups, alkoxycarbonylalkyloxycarbonyl groups, or alkoxyalkyloxycarbonyl groups, generation of a carboxyl group due to heating can be expected to be led to a large change in polarity of a molecule.

Since the aspect of the present invention has such characteristics, as described above, it is considered that a sufficiently high intermixing resistance effect can be exhibited even in a case where the content of the crosslinking agent is decreased.

The material for forming an underlayer film according to the present embodiment is a material for forming a layer disposed between an intermediate layer and a substrate (preferably a substrate having an uneven structure) in a step of manufacturing a semiconductor device. The layer disposed between the intermediate layer and the substrate is referred to as a resist underlayer film based on a resist layer formed of a resist material that typically transfers a mask pattern in a photolithography process. The surface of the substrate which comes into contact with the resist underlayer film may be in a state in which a coating film is formed of a low dielectric material, such as a silica ($SiO_2$) film, a SiCN film, a SiOC film obtained by doping silica ($SiO_2$) with carbon (C), a methylsiloxane-based organic film (SOG), or a silica insulating film in which minute holes having a size of several nanometers or less are uniformly distributed.

The intermediate layer indicates a layer that compensates for the functions of the resist underlayer film and/or the resist film or has these functions for imparting the functions that the resist underlayer film and/or the resist film does not have in the formation of the resist pattern or the like. For example, in a case where an anti-reflection film (also referred to as an anti-reflection layer) is formed as an intermediate layer, the intermediate layer can compensate for the anti-reflection function of the resist underlayer film. Further, in a case where a hard mask layer is formed as an intermediate layer, the influence on the resist underlayer film in case of using an alkali developer during a developing step is suppressed and/or the insufficient etching resistance of the resist pattern formation layer at the time of etching the substrate formed of silicon, aluminum, nickel, and the like of the lower layer after etching the underlayer film according to the present embodiment can be compensated.

Further, the intermediate layer formed on the underlayer film according to the present embodiment may include one or both of the anti-reflection layer and the hard mask layer, and the layers may be configured such that the anti-reflection layer or the hard mask layer is formed directly on the underlayer film according to the present embodiment. The layer configuration is suitably selected in consideration of the characteristics of the resist material and the processed substrate material and the productivity.

The intermediate layer can be formed of an organic compound or an inorganic oxide. Examples of the organic compound include DUV-42, DUV-44, ARC-28, and ARC-29 (all manufactured by Brewer Science, Inc.); and AR-3 and AR-19 (both manufactured by Rohm and Haas Company). Further, as the inorganic oxide, NFC SOG Series (manufactured by JSR Corporation), and polysiloxane, titanium oxide, alumina oxide, and tungsten formed using a CVD method oxide can be used.

As the method of forming the intermediate layer, a coating method is preferable. In a case of using the coating method, the intermediate layer can be continuously formed after formation of the resist underlayer film.

As the solvent used for forming the intermediate layer according to the coating method, those exemplified as the solvents for a spin coating solution are preferable. Among these, polyether or polyether ester such as PGMEA is preferable.

Further, the film thickness of the intermediate layer is not particularly limited and can be appropriately selected depending on the function required for the intermediate layer, and the film thickness thereof is preferably in a range of 1 nm to 5 µm, more preferably in a range of 5 nm to 3 µm, and still more preferably in a range of 10 nm to 0.3 µm.

As a preferable cyclic olefin polymer related to the material for forming an underlayer film according to the present embodiment, the same polymer as the cyclic olefin polymer according to the first invention as described above can be used.

Therefore, detailed description will not be provided.

The resist underlayer film, the method of forming a resist underlayer film, and the pattern formation method according to the present embodiment are based on the resist underlayer film, the method of forming a resist underlayer film, and the pattern formation method according to the first invention. Therefore, detailed description will not be provided.

Hereinbefore, the embodiments of each of the inventions have been described, but these are merely examples of the present invention and various other configurations can be employed.

Further, the present invention is not limited to the above-described embodiments, and modifications, improvements, and the like for achieving the purpose of the present invention are included in the present invention.

Further, the above-described present inventions can be combined as long as the contents do not contradict each other.

EXAMPLES

Hereinafter, the present embodiment will be described in detail with reference to examples and comparative examples. The present embodiment is not limited to the description of these examples.

The method of analyzing polymers in the examples and comparative examples and the methods of evaluating the embedding property and the flatness are as follows.

[Weight-Average Molecular Weight (Mw) and Molecular Weight Distribution (Mw/Mn)]

The weight-average molecular weight (Mw) and the number average molecular weight (Mn) of the polymer dissolved in tetrahydrofuran (THF) or trifluorotoluene (TFT) were measured using gel permeation chromatography (GPC) under the following conditions and calculated by calibrating the molecular weight based on polystyrene standards.

Detector: RI-2031 and 875-UV (manufactured by JASCO Corporation) or Model 270 (manufactured by Viscotec GmbH.), Serially connected column: Shodex K-806M, 804, 803, 802.5, Column temperature: 40° C., flow rate: 1.0 ml/min, sample concentration: 3.0 to 9.0 mg/ml

[Measurement of Hydrogenation Ratio]

A polymer sample was dissolved in deuterated chloroform, and the integral value of a peak belonging to hydrogen of double bond carbon in a range of a chemical shift δ of 5.0 to 7.0 ppm under conditions of 270 MHz and the $^1$H-NMR spectrum.

[Glass Transition Temperature]

The glass transition temperature was measured by heating a measurement sample at a heating rate of 10°/C in a nitrogen atmosphere using DSC-50 (manufactured by Shimadzu Corporation).

[Method of Evaluating Volatile Component]

A THF solution of a polymer with a concentration of 20% by mass was weighed using an aluminum plate having a diameter of 5 mm such that the weight thereof was adjusted to 30 mg to 50 mg, and baked at 200° C. for 3 minutes in a nitrogen flow to remove THF. Next, the resultant was cooled to room temperature, and the weight thereof ($W_0$) was measured. Using a sample in a state in which a resin was solidified, the sample was heated to 30° C. to 300° C. at a heating rate of 10° C./min using TGA-60 (manufactured by Shimadzu Corporation) in a nitrogen atmosphere, and the weight thereof was continuously measured along with an increase in temperature to obtain the temperature vs. weight chart. Here, a weight reduction amount ($W_1$) in a temperature range of 100° C. to 250° C. was read from the chart, and the amount of volatile components was calculated based on the following equation.

Amount of volatile components (% by mass)=$W_1$/$W_0$×100

[Measurement of Solid Viscoelasticity]

The solid viscoelasticity was measured under conditions of a measurement temperature range of 30° C. to 300° C., a heating rate of 3° C./min, and a frequency of 1 Hz in a nitrogen atmosphere in a shear mode using MCR302 (rheometer) (manufactured by Anton Paar GmbH). More specifically, the measurement was carried out according to the following method.

First, white powder (10 mg) of the cyclic olefin polymer according to the present embodiment was placed in the center of a parallel disk having a diameter of 8 mm which had been heated to 230° C. Next, the powder was interposed using the disk, melted in a nitrogen atmosphere, and cooled to 30° C.

Thereafter, the sample was heated to 300° C. at the above-described heating rate and a frequency of 1 Hz in a shear mode. A graph was prepared by plotting the relationship between the obtained heating temperature, the storage modulus (G'), and the loss modulus (G"), and the temperature of the intersection between the storage modulus (G') curve and the loss modulus (G") curve was confirmed (see FIG. 1).

[Measurement of Residual Film Rate]

A coating film having a thickness ($\alpha$) of nm which was formed of a cyclic olefin polymer was formed on a silicon wafer. Next, the obtained coating film was treated at 200° C. for 10 minutes or 30 minutes. After the sample was cooled to room temperature, the coating film was cut in a size of 20 mm×10 mm. This film was immersed in an organic solvent (propylene glycol-1-monomethyl ether-2-acetate (PGMEA), propylene glycol monomethyl ether (PGME), or a mixed solvent of PGME and PGMEA at a mass ratio (PGME/PGMEA) of 7/3) at 23° C. for 10 minutes and dried under conditions of 150° C. for 3 minutes so that the residual solvent in the coating film was removed. Next, the thickness ($\beta$) of the coating film from which the residual solvent had been removed was measured, and the residual film rate (=$\beta$/$\alpha$×100)(%) was calculated.

Here, the coating film was prepared according to the following method.

A solution obtained by dissolving the cyclic olefin polymer according to the present embodiment in an organic solvent (a solution containing propylene glycol-1-monomethyl ether-2-acetate (PGMEA) and cyclohexanone at a mass ratio (PGMEA/cyclohexanone) of 5/5) at a concentration of 10% by mass was prepared, and a 4 inch silicon wafer was spin-coated with 2.5 mL of the obtained solution. Next, the resulting sample was dried at 120° C. for 1 minute in a nitrogen atmosphere and then dried in a vacuum at 80° C. for 5 hours. Subsequently, the sample was cooled to room temperature and cut in a size of 20 mm×20 mm, thereby obtaining a coating film.

[Substrate Having Surface Provided with Uneven Structure for Evaluating Embedding Property]

Substrate A: A silicon substrate having a size of 3 cm×3 cm, in which a line and space pattern with a height of 200 nm, a projection width of 40 to 150 nm, and a width between projections of 40 to 150 nm was formed on the surface of the substrate was used.

Substrate B: A silicon substrate having a size of 3 cm×3 cm, in which a line and space pattern with a height of 200 nm, a projection width of 40 nm to 1000 μm, and a width between projections of 40 nm to 1000 μm was formed on the surface of the substrate was used.

[Evaluation of Embedding Property]

The steps up to the baking step were performed, and the sample obtained by forming the resist underlayer film on the uneven surface of the silicon substrate was divided to expose the surface for observing the cross section. Thereafter, the embedding property was evaluated by observing the cross section of the substrate A having a width between projections of 40 nm or the cross section of the substrate B having $a_1$ of 900 μm, $b_1$ of 1000 nm, $a_2$ of 40 nm, and $b_2$ of 1000 nm using a scanning electron microscope JSM-6701F (manufactured by JASCO Corporation) (hereinafter, also noted as a SEM).

[Evaluation of Flatness]

Ten heights from the bottoms of recesses to the atmospheric surface in an area with a projection width of 40 nm and a width between projections of 120 nm from the cross section of the substrate A whose embedding property was evaluated were measured, and the average value thereof was set as $H_{av}$. Next, the flatness showing the index of the flatness was calculated using the following equation based on each of the maximum height ($H_{max}$) and the minimum height ($H_{min}$) from the ten measured heights.

Flatness($\Delta FT$)=[($H_{max}$−$H_{min}$)/$H_{av}$]×100(%)

Further, ten heights from the bottoms of recesses to the atmospheric surface in each pattern region of an area having $a_1$ of 900 μm, $b_1$ of 900 μm, $a_2$ of 40 nm, and $b_2$ of 120 nm from the cross section of the substrate B whose embedding property was evaluated were measured, and the average value thereof was set as $H_{av}$, each of the average value $H_1$ ($a_1$ of 900 μm and $b_1$ of 900 μm), the average value $H_2$ ($a_2$ of 40 nm and $b_2$ of 120 nm), and the average value $H_3$ of $H_1$ and $H_2$ was acquired, and the flatness showing the index of the flatness was calculated using the following equation.

Flatness($\Delta FT$)=|$H_1$−$H_2$|/$H_3$×100(%)

[Measurement of n Value and k Value]

The n value and the k value were measured at optional three points of a measurement sample having a size of 20 mm×20 mm, obtained by being applied to a silicon wafer such that the thickness thereof was set to 250 nm, in an environment of a temperature of 23° C. to 25° C. and a humidity of 50% to 55% using a spectroscopic ellipsometer GES5E (manufactured by Semilab Inc.). Based on the measurement results, the refractive indices (n value) and the extinction coefficients (k value) at 193 nm were calculated, and the n value and the k value were respectively acquired from the three average values.

Here, the measurement sample was prepared according to the following method.

A solution obtained by dissolving the cyclic olefin polymer according to the present embodiment in a PGMEA at a concentration of 10% by mass was prepared, and a 4 inch silicon wafer was spin-coated with the obtained solution. Next, the resulting sample was baked at 200° C. for 3 minutes in a nitrogen atmosphere. Subsequently, the sample was cooled to room temperature and cut in a size of 20 mm×20 mm, thereby obtaining a sample for measurement.

[Evaluation of Plasma Etching Characteristics]

A parallel plate type plasma treatment device RIH1515Z (manufactured by ULVAC, Inc.) was used. First, the plasma etching treatment was performed by placing a sample in a chamber, reducing the pressure inside the chamber to 1 Pa or less, introducing 30 sccm of $CHF_3$ gas to the chamber, maintaining the pressure inside the chamber at 7 Pa, and applying a high frequency powder of 13.56 MHz for plasma discharge. The plasma etching treatment was performed for 30 seconds, 60 seconds, and 90 seconds.

[Method of Measuring Etching Rate]

The film thickness of the surface of the etched substrate was measured at three points using a spectroscopic ellipsometer GES5E (manufactured by Semilab Inc.), and the film thickness was calculated from the average value. Next, the amount of decrease in film thickness due to the etching was calculated from the film thicknesses before and after the etching, and the time (sec) was plotted on the horizontal axis and the amount (nm) of the reduced film thickness was plotted on the vertical axis. The etching rate (nm/sec) was calculated from the inclination of the obtained graph.

[Evaluation of Ashing Characteristics Using $O_2$ Etching]

The resist underlayer film was formed on a silicon substrate having a size of 3 cm×3 cm, in which a line and space pattern with a height of 200 nm, a projection width of 100 nm, and a width between projections of 100 nm was formed on the surface of the substrate.

The sample obtained by forming the resist underlayer film on the uneven surface of the silicon substrate was divided to perform observation using a SEM on the cross section of one of the sample pieces before ashing.

The ashing characteristics resulting from $O_2$ etching were evaluated using the other sample piece according to the following method.

The ashing characteristics were evaluated using the same plasma treatment device as the device used for evaluation of the plasma etching characteristics. First, the sample was placed in a chamber, the pressure inside the chamber was reduced to 1 Pa or less, 30 sccm of $O_2$ gas was introduced to the chamber, and the pressure inside the chamber was maintained at 7 Pa. Next, a high frequency powder of 13.56 MHz was applied thereto for plasma discharge. The plasma etching treatment was carried out in this manner. The plasma etching treatment was performed for 60 seconds.

After the plasma etching treatment, the ashing characteristics were evaluated by performing observation on the cross section of the sample after ashing using a SEM and comparing SEM observation images before and after the plasma etching.

[Formation of Intermediate Layer]

A silicon wafer having a size of 30 mm×30 mm was spin-coated with a solution containing PGMEA and cyclohexanone at a mass ratio of 5/5, which was obtained by dissolving the cyclic olefin polymer according to the present embodiment at a concentration of 10% by mass, in an environment of a temperature of 23° C. to 25° C. and a humidity of 50% to 55% such that the thickness thereof was set to 250 nm under conditions of 1000 rpm for 10 sec, and the coating film was baked at 200° C. for 1 minute in a nitrogen atmosphere. The coating film was cooled to room temperature, spin-coated with a PGMEA solution, in which 10% by mass of titanium isopropoxide was dissolved, under conditions of 1000 rpm for 10 sec, and baked at 200° C. for 1 minute in a nitrogen atmosphere to prepare a sample for evaluation, and the cross section thereof was observed using a TEM.

Example 1

In a 5 L autoclave equipped with a magnetic stirrer in a nitrogen atmosphere, 320 g (2 mol) of tetracyclo[4.4.0.1$^{2,5}$.1$^{7,10}$]-3-dodecene having the structural unit [A], 304 g (2 mol) of 4,10-dioxy-tricyclo[5.2.1.0$^{2,6}$]-8-decene-3-one having the structural unit [B], and 21 g (0.25 mol) of 1,5-hexadiene were dissolved in 3.4 kg of tetrahydrofuran (hereinafter, referred to as THF), and the solution was stirred.

As a ring opening metathesis polymerization catalyst, 612 mg (0.8 mmol) of $Mo(N-2,6-Pr^i_2C_6H_3)(CHCMe_2Ph)(OCMe(CF_3)_2)_2$ was added thereto to cause a reaction at 60° C. for 3 hours. Thereafter, 173 mg (2.4 mmol) of n-butylaldehyde was added thereto, and the solution was cooled, thereby obtaining 4.0 kg of a ring opening metathesis polymer solution. In the obtained polymer, the rate of polymerization thereof was 100%, the Mw was 5700, the ratio of Mw/Mn was 1.61, and the molar ratio ([A]/[B]) of the structural unit [A] to the structural unit [B] which was analyzed by $^1$HNMR was 50/50.

Next, the cyclic olefin polymer was precipitated from the obtained ring opening metathesis polymer solution using methanol and dried at 80° C. under reduced pressure, thereby obtaining a white powder solid (polymer 1).

The glass transition temperature of the polymer 1 was 151° C.

Further, the amount of the volatile components in the polymer 1 was 0.0% by mass.

In addition, the temperature showing the intersection between the storage modulus (G') curve and the loss modulus (G") curve which were calculated from the results obtained by measuring the solid viscoelasticity of the polymer 1 was 173° C. (see FIG. 1).

Next, a solution containing propylene glycol-1-monomethyl ether-2-acetate (hereinafter, noted as PGMEA) and cyclohexanone (hereinafter, also referred to as CH) at a mass ratio (PGMEA/cyclohexanone) of 5/5, in which the obtained polymer 1 was dissolved at a concentration of 10% by mass, was prepared, and a surface of a silicon substrate A in which a line and space pattern with a height of 200 nm, a projection width of 40 to 150 nm, and a width between projections of 40 to 150 nm was formed was coated with the prepared solution under conditions of 1000 rpm for 10 sec. Thereafter, the silicon substrate A was heated at 200° C. for 3 minutes in a nitrogen atmosphere.

The refractive index (n value) of the polymer 1 measured using an ellipsometer was 1.66 and the extinction coefficient (k value) was 0.08.

As the result of observation performed on the cross section of the substrate A using a SEM, the polymer 1 was uniformly embedded without defects such as voids with respect to grooves with a narrow line width of 40 nm (height of 200 nm) between projections. Further, the thickness ($H_{av}$) of the layer of the polymer 1 obtained by measuring ten distances between the bottoms of recesses to the atmospheric surface and averaging the obtained values was 300 nm, the maximum height ($H_{max}$) was 301 nm, the minimum height ($H_{min}$) was 300 nm, and the flatness (ΔFT) was 0.3%.

Example 2

2.5 kg of a ring opening metathesis polymer solution was obtained according to the same method as that in Example 1 except that the monomer having the structural unit [A] was changed to 8-methoxycarbonyl-tetracyclo[4.4.0.1$^{2,5}$.1$^{7,10}$]-3-dodecene. In the obtained polymer, the rate of polymerization thereof was 100%, the Mw was 6300, the ratio of Mw/Mn was 1.50, and the molar ratio ([A]/[B]) of the structural unit [A] to the structural unit [B] which was analyzed by $^1$HNMR was 50/50.

Next, the cyclic olefin polymer was precipitated and dried according to the same method as that in Example 1 to obtain a white powder solid (polymer 2).

The glass transition temperature of the polymer 2 was 150° C.

Further, the amount of the volatile components in the polymer 2 was 0.0% by mass.

In addition, the temperature showing the intersection between the storage modulus (G') curve and the loss modulus (G") curve which were calculated from the results obtained by measuring the solid viscoelasticity of the polymer 2 was 167° C.

Next, a sample obtained by coating the uneven surface of the silicon substrate A with the polymer 2 was prepared according to the same method as that in Example 1.

The refractive index (n value) of the polymer 2 measured using an ellipsometer was 1.66 and the extinction coefficient (k value) was 0.04.

As the result of observation performed on the cross section of the substrate A using a SEM, the polymer 2 was uniformly embedded without defects such as voids with respect to grooves with a narrow line width of 40 nm (height of 200 nm) between projections. Further, all measured values obtained by measuring ten distances between the bottoms of recesses to the atmospheric surface were 299 nm, and the flatness (ΔFT) was 0.0%.

Example 3

4.1 kg of a ring opening metathesis polymer solution was obtained according to the same method as that in Example 1 except that the monomer having the structural unit [A] was changed to 8-(1-ethylcyclopentyloxycarbonyl)-tetracyclo [4.4.0.1$^{2,5}$.1$^{7,10}$]-3-dodecene. In the obtained polymer, the rate of polymerization thereof was 100%, the Mw was 7200, the ratio of Mw/Mn was 1.50, and the molar ratio ([A]/[B]) of the structural unit [A] to the structural unit [B] which was analyzed by $^1$HNMR was 50/50.

Next, the cyclic olefin polymer was precipitated and dried according to the same method as that in Example 1 to obtain a white powder solid (polymer 3).

The glass transition temperature of the polymer 3 was 130° C.

Further, the amount of the volatile components in the polymer 3 was 0.0% by mass.

In addition, the temperature showing the intersection between the storage modulus (G') curve and the loss modulus (G") curve which were calculated from the results obtained by measuring the solid viscoelasticity of the polymer 3 was 151° C.

Next, a sample obtained by coating the uneven surface of the silicon substrate A with the polymer 3 was prepared according to the same method as that in Example 1.

The refractive index (n value) of the polymer 3 measured using an ellipsometer was 1.68 and the extinction coefficient (k value) was 0.02.

As the result of observation performed on the cross section of the substrate A using a SEM, the polymer 3 was uniformly embedded without defects such as voids with respect to grooves with a narrow line width of 40 nm (height of 200 nm) between projections. Further, the thickness of the layer of the polymer 3 obtained by measuring ten distances between the bottoms of recesses to the atmospheric surface and averaging the obtained values was 302 nm, the maximum height ($H_{max}$) was 303 nm, the minimum height ($H_{min}$) was 301 nm, and the flatness (ΔFT) was 0.7%.

Example 4

4.2 kg of a ring opening metathesis polymer solution was obtained by dissolving 437 g (2 mol) of 8-methoxycarbonyl-tetracyclo[4.4.0.1$^{2,5}$.1$^{7,10}$]-3-dodecene having the structural unit [A], 121 g (0.5 mol) of 4-phenyl-4-aza-10-oxy-tricyclo [5.2.1.0$^{2,6}$]-8-decene-3,5-dione having the structural unit [B], and 21 g (0.25 mol) of 1,5-hexadiene in 3.7 kg of THF and carrying out the rest of the process according to the same method as that in Example 1.

Next, 11.4 g (dry mass of 5.6 g) of 5% Rh carbon having a moisture content of 50.7% was added to the obtained ring opening metathesis polymer solution as a hydrogenation catalyst to cause a hydrogenation reaction at 100° C. and a hydrogen pressure of 5 MPa for 12 hours. In the obtained polymer, the hydrogenation ratio thereof was 100% by mole, the Mw was 7800, the ratio of Mw/Mn was 1.57, and the molar ratio ([A]/[B]) of the structural unit [A] to the structural unit [B] which was analyzed by $^1$HNMR was 80/20.

Next, the cyclic olefin polymer was precipitated and dried according to the same method as that in Example 1 to obtain a white powder solid (polymer 4).

The glass transition temperature of the polymer 4 was 172° C.

Further, the amount of the volatile components in the polymer 4 was 0.0% by mass.

In addition, the temperature showing the intersection between the storage modulus (G') curve and the loss modulus (G") curve which were calculated from the results obtained by measuring the solid viscoelasticity of the polymer 4 was 190° C.

Next, a sample obtained by coating the uneven surface of the silicon substrate A with the polymer 4 was prepared according to the same method as that in Example 1.

The refractive index (n value) of the polymer 4 measured using an ellipsometer was 1.71 and the extinction coefficient (k value) was 0.09.

As the result of observation performed on the cross section of the substrate A using a SEM, the polymer 4 was uniformly embedded without defects such as voids with respect to grooves with a narrow line width of 40 nm (height of 200 nm) between projections. Further, the thickness of the layer of the polymer 4 obtained by measuring ten distances between the bottoms of recesses to the atmospheric surface and averaging the obtained values was 310 nm, the maximum height ($H_{max}$) was 311 nm, the minimum height ($H_{min}$) was 309 nm, and the flatness (ΔFT) was 0.6%.

Example 5

3.7 kg of a ring opening metathesis polymer solution was obtained according to the same method as that in Example 1 except that the monomer having the structural unit [A] was changed to bicycle[2.2.1]hept-2-ene. In the obtained polymer, the rate of polymerization thereof was 100%, the Mw was 6800, the ratio of Mw/Mn was 2.84, and the molar ratio ([A]/[B]) of the structural unit [A] to the structural unit [B] which was analyzed by 4HNMR was 50/50.

Next, the cyclic olefin polymer was precipitated and dried according to the same method as that in Example 1 to obtain a white powder solid (polymer 5).

The glass transition temperature of the polymer 5 was 72° C.

Further, the amount of the volatile components in the polymer 5 was 0.0% by mass.

In addition, the temperature showing the intersection between the storage modulus (G') curve and the loss modulus (G") curve which were calculated from the results obtained by measuring the solid viscoelasticity of the polymer 5 was 84° C.

Next, a sample obtained by coating the uneven surface of the silicon substrate A with the polymer 5 was prepared according to the same method as that in Example 1.

The refractive index (n value) of the polymer 5 measured using an ellipsometer was 1.68 and the extinction coefficient (k value) was 0.01.

As the result of observation performed on the cross section of the substrate A using a SEM, the polymer 5 was uniformly embedded without defects such as voids with respect to grooves with a narrow line width of 40 nm (height of 200 nm) between projections. Further, all measured values obtained by measuring ten distances between the bottoms of recesses to the atmospheric surface were 315 nm, and the flatness (ΔFT1) was 0.0%.

Example 6

4.0 kg of a ring opening metathesis polymer solution was obtained according to the same method as that in Example 1 except that the monomer having the structural unit [A] was changed to 5-(1-ethylcyclopentyloxycarbonyl)-bicycle[2.2.1]hept-2-ene. In the obtained polymer, the rate of polymerization thereof was 100%, the Mw was 5600, the ratio of Mw/Mn was 1.92, and the molar ratio ([A]/[B]) of the structural unit [A] to the structural unit [B] which was analyzed by $^1$HNMR was 50/50.

Next, the cyclic olefin polymer was precipitated and dried according to the same method as that in Example 1 to obtain a white powder solid (polymer 6).

The glass transition temperature of the polymer 6 was 56° C.

Further, the amount of the volatile components in the polymer 6 was 0.0% by mass.

In addition, the temperature showing the intersection between the storage modulus (G') curve and the loss modulus (G") curve which were calculated from the results obtained by measuring the solid viscoelasticity of the polymer 6 was 76° C.

Next, a sample obtained by coating the uneven surface of the silicon substrate A with the polymer 6 was prepared according to the same method as that in Example 1.

The refractive index (n value) of the polymer 6 measured using an ellipsometer was 1.78 and the extinction coefficient (k value) was 0.02.

As the result of observation performed on the cross section of the substrate A using a SEM, the polymer 6 was uniformly embedded without defects such as voids with respect to grooves with a narrow line width of 40 nm (height of 200 nm) between projections. Further, all measured values obtained by measuring ten distances between the bottoms of recesses to the atmospheric surface were 311 nm, and the flatness (ΔFT1) was 0.0%.

Example 7

4.0 kg of a ring opening metathesis polymer solution was obtained according to the same method as that in Example 1 except that the monomer having the structural unit [A] was changed to 5-(1-methylcyclohexyloxycarbonyl)-bicycle[2.2.1]hept-2-ene. In the obtained polymer, the rate of polymerization thereof was 100%, the Mw was 7300, the ratio of Mw/Mn was 2.17, and the molar ratio ([A]/[B]) of the structural unit [A] to the structural unit [B] which was analyzed by $^1$HNMR was 50/50.

Next, the cyclic olefin polymer was precipitated and dried according to the same method as that in Example 1 to obtain a white powder solid (polymer 7).

The glass transition temperature of the polymer 7 was 58° C.

Further, the amount of the volatile components in the polymer 7 was 0.0% by mass.

In addition, the temperature showing the intersection between the storage modulus (G') curve and the loss modulus (G") curve which were calculated from the results obtained by measuring the solid viscoelasticity of the polymer 7 was 81° C.

Next, a sample obtained by coating the uneven surface of the silicon substrate A with the polymer 7 was prepared according to the same method as that in Example 1.

The refractive index (n value) of the polymer 7 measured using an ellipsometer was 1.78 and the extinction coefficient (k value) was 0.01.

As the result of observation performed on the cross section of the substrate A using a SEM, the polymer 7 was uniformly embedded without defects such as voids with respect to grooves with a narrow line width of 40 nm (height of 200 nm) between projections. Further, all measured values obtained by measuring ten distances between the bottoms of recesses to the atmospheric surface were 305 nm, and the flatness (ΔFT1) was 0.0%.

Example 8

4.1 kg of a ring opening metathesis polymer solution was obtained according to the same method as in Example 3. Next, 11.4 g (dry mass of 5.6 g) of 5% Rh carbon having a moisture content of 50.7% was added to the obtained ring opening metathesis polymer solution as a hydrogenation catalyst to cause a hydrogenation reaction at 100° C. and a hydrogen pressure of 5 MPa for 12 hours. In the obtained polymer, the hydrogenation ratio thereof was 100% by mole, the Mw was 9600, the ratio of Mw/Mn was 2.07, and the molar ratio ([A]/[B]) of the structural unit [A] to the structural unit [B] which was analyzed by $^1$HNMR was 50/50.

Next, the cyclic olefin polymer was precipitated and dried according to the same method as that in Example 1 to obtain a white powder solid (polymer 8).

The glass transition temperature of the polymer 8 was 91° C.

Further, the amount of the volatile components in the polymer 8 was 0.0% by mass.

In addition, the temperature showing the intersection between the storage modulus (G') curve and the loss modulus (G") curve which were calculated from the results obtained by measuring the solid viscoelasticity of the polymer 8 was 112° C.

Next, a sample obtained by coating the uneven surface of the silicon substrate A with the polymer 8 was prepared according to the same method as that in Example 1.

The refractive index (n value) of the polymer 8 measured using an ellipsometer was 1.66 and the extinction coefficient (k value) was 0.02.

As the result of observation performed on the cross section of the substrate A using a SEM, the polymer 8 was uniformly embedded without defects such as voids with respect to grooves with a narrow line width of 40 nm (height of 200 nm) between projections. Further, the thickness of the layer of the polymer 8 obtained by measuring ten distances between the bottoms of recesses to the atmospheric surface and averaging the obtained values was 310 nm, the maximum height ($H_{max}$) was 311 nm, the minimum height ($H_{min}$) was 309 nm, and the flatness ($\Delta FT$) was 0.6%.

Example 9

3.7 kg of a ring opening metathesis polymer solution was obtained according to the same method as in Example 5. Next, 11.4 g (dry mass of 5.6 g) of 5% Rh carbon having a moisture content of 50.7% was added to the obtained ring opening metathesis polymer solution as a hydrogenation catalyst to cause a hydrogenation reaction at 100° C. and a hydrogen pressure of 5 MPa for 12 hours. In the obtained polymer, the hydrogenation ratio thereof was 100% by mole, the Mw was 10400, the ratio of Mw/Mn was 3.18, and the molar ratio ([A]/[B]) of the structural unit [A] to the structural unit [B] which was analyzed by $^1$HNMR was 50/50.

Next, the cyclic olefin polymer was precipitated and dried according to the same method as that in Example 1 to obtain a white powder solid (polymer 9).

The glass transition temperature of the polymer 9 was 45° C.

Further, the amount of the volatile components in the polymer 9 was 0.0% by mass.

In addition, the temperature showing the intersection between the storage modulus (G') curve and the loss modulus (G") curve which were calculated from the results obtained by measuring the solid viscoelasticity of the polymer 9 was 50° C.

Next, a sample obtained by coating the uneven surface of the silicon substrate A with the polymer 9 was prepared according to the same method as that in Example 1.

The refractive index (n value) of the polymer 9 measured using an ellipsometer was 1.64 and the extinction coefficient (k value) was 0.01.

As the result of observation performed on the cross section of the substrate A using a SEM, the polymer 9 was uniformly embedded without defects such as voids with respect to grooves with a narrow line width of 40 nm (height of 200 nm) between projections. Further, all measured values obtained by measuring ten distances between the bottoms of recesses to the atmospheric surface were 316 nm, and the flatness ($\Delta FT$) was 0.0%.

Example 10

3.8 kg of a ring opening metathesis polymer solution was obtained according to the same method as that in Example 1 except that 75 g (0.8 mol) of bicycle[2.2.1]hept-2-ene having the structural unit [A] was changed to 487 g (3.2 mol) of 4,10-dioxy-tricyclo[5.2.1.0$^{2,6}$]-8-decene-3-one having the structural unit [B]. In the obtained polymer, the rate of polymerization thereof was 100%, the Mw was 5900, the ratio of Mw/Mn was 2.32, and the molar ratio ([A]/[B]) of the structural unit [A] to the structural unit [B] which was analyzed by $^1$HNMR was 20/80.

Next, the cyclic olefin polymer was precipitated and dried according to the same method as that in Example 1 to obtain a white powder solid (polymer 10).

The glass transition temperature of the polymer 10 was 68° C.

Further, the amount of the volatile components in the polymer 10 was 0.0% by mass.

In addition, the temperature showing the intersection between the storage modulus (G') curve and the loss modulus (G") curve which were calculated from the results obtained by measuring the solid viscoelasticity of the polymer 10 was 82° C.

Next, a sample obtained by coating the uneven surface of the silicon substrate A with the polymer 10 was prepared according to the same method as that in Example 1.

The refractive index (n value) of the polymer 10 measured using an ellipsometer was 1.67 and the extinction coefficient (k value) was 0.02.

As the result of observation performed on the cross section of the substrate A using a SEM, the polymer 10 was uniformly embedded without defects such as voids with respect to grooves with a narrow line width of 40 nm (height of 200 nm) between projections. Further, all measured values obtained by measuring ten distances between the bottoms of recesses to the atmospheric surface were 320 nm, and the flatness ($\Delta FT$) was 0.0%.

Example 11

A solution containing PGMEA and cyclohexanone at a mass ratio (PGMEA/cyclohexanone) of 5/5, in which the polymer 5 obtained in Example 5 was dissolved at a concentration of 7% by mass, was prepared, and a surface of a silicon substrate A in which a line and space pattern with a height of 200 nm, a projection width of 40 to 150 nm, and a width between projections of 40 to 150 nm was formed was coated with the prepared solution under conditions of 1000 rpm for 10 sec. Thereafter, the substrate A was heated at 200° C. for 3 minutes in a nitrogen atmosphere.

As the result of observation performed on the cross section of the substrate A using a SEM, the polymer 5 was uniformly embedded without defects such as voids with respect to grooves with a narrow line width of 40 nm (height of 200 nm) between projections. Further, all measured values obtained by measuring ten distances between the bottoms of recesses to the atmospheric surface were 208 nm, and the flatness ($\Delta FT$) was 0.0%.

Example 12

A solution containing PGMEA and cyclohexanone at a mass ratio (PGMEA/cyclohexanone) of 5/5, in which the polymer 5 obtained in Example 5 was dissolved at a concentration of 20% by mass, was prepared, and a surface of a silicon substrate A in which a line and space pattern with a height of 200 nm, a projection width of 40 to 150 nm, and a width between projections of 40 to 150 nm was formed was coated with the prepared solution under conditions of 600 rpm for 10 sec. Thereafter, the surface was heated at 200° C. for 3 minutes in a nitrogen atmosphere.

As the result of observation performed on the cross section of the substrate A using a SEM, the polymer 5 was uniformly embedded without defects such as voids with respect to grooves with a narrow line width of 40 nm (height of 200 nm) between projections. Further, all measured values obtained by measuring ten distances between the bottoms of recesses to the atmospheric surface were 1622 nm, and the flatness ($\Delta FT$) was 0.0%.

Example 13

A solution containing PGMEA and cyclohexanone at a mass ratio (PGMEA/cyclohexanone) of 5/5, in which 10% by mass of the polymer 8 obtained in Example 8 and 0.3% by mass of 3',4'-epoxycyclohexylmethyl-3,4-epoxycyclohexanecarboxylate (EEC) were dissolved as a crosslinking agent, was prepared, and a sample obtained by coating the uneven surface of the silicon substrate A with the solution was prepared according to the same method as that in Example 1.

The refractive index (n value) measured using an ellipsometer was 1.67 and the extinction coefficient (k value) was 0.02.

Since it was understood that the temperature at which the polarity of the cyclic olefin polymer changes is sufficiently higher than the temperature of the intersection between G' and G'', the temperature of the intersection between G' and G'' of the material for forming an underlayer film formed of the cyclic olefin and the crosslinking agent can be regarded as the same value as described above.

As the result of observation performed on the cross section of the substrate A using a SEM, the polymer was uniformly embedded without defects such as voids with respect to grooves with a narrow line width of 40 nm (height of 200 nm) between projections. Further, the thickness of the layer of the polymer 8 obtained by measuring ten distances between the bottoms of recesses to the atmospheric surface and averaging the obtained values was 313 nm, the maximum height ($H_{max}$) was 313 nm, the minimum height ($H_{min}$) was 312 nm, and the flatness ($\Delta FT$) was 0.3%.

Examples 14 to 16

Each sample obtained by coating the uneven surface of the silicon substrate B with the polymer 5 obtained in Example 5, the polymer 8 obtained in Example 8, and the polymer 9 obtained in Example 9 was prepared according to the same method as that in Example 1.

As the result of observation performed on the cross section of the substrate B using a SEM, all of the polymer 5, the polymer 8, and the polymer 9 were uniformly embedded without defects such as voids with respect to grooves with $a_1$ of 900 μm, $b_1$ of 900 μm, $a_2$ of 40 nm, and $b_2$ of 120 nm (height of 200 nm). Further, the thickness of the $H_1$ layer of the polymer 5 obtained by measuring ten distances between the bottoms of recesses to the atmospheric surface and averaging the obtained values was 306 nm, the thickness of the $H_2$ layer was 306 nm, and the flatness ($\Delta FT$) was 0.0%.

The thickness of the $H_1$ layer of the polymer 8 obtained by measuring ten distances between the bottoms of recesses to the atmospheric surface and averaging the obtained values was 301 nm, the thickness of the $H_2$ layer was 302 nm, and the flatness ($\Delta FT$) was 0.3%.

Further, the thickness of the $H_1$ layer of the polymer 9 obtained by measuring ten distances between the bottoms of recesses to the atmospheric surface and averaging the obtained values was 298 nm, the thickness of the $H_2$ layer was 298 nm, and the flatness ($\Delta FT$) was 0.0%.

[Evaluation of Plasma Etching Resistance]

Each silicon wafer was coated with each solution containing PGMEA and cyclohexanone at a mass ratio of 5/5 obtained by dissolving 10% by mass of each of the polymers 1 to 10 synthesized in Examples 1 to 10, and the resulting wafer was baked at 200° C. for 3 minutes. Next, each sample was dry-etched for 30 seconds, 60 seconds, and 90 seconds in a $CHF_3$ gas atmosphere. Next, the amount of decrease in film thickness due to the etching was calculated from the film thicknesses before and after the etching, and the time (sec) was plotted on the horizontal axis and the amount (nm) of the reduced film thickness was plotted on the vertical axis. The etching rate (nm/sec) was calculated from the inclination of the obtained graph.

The etching rate was measured using $SiO_2$ [formed using tetraethoxysilane (TEOS) as a raw material and baking the material on the surface of the silicon wafer] formed on the surface of the silicon wafer as a target substance, and the etching resistance was evaluated based on the value [$SiO_2$ (nm/sec)/each sample (nm/sec)]. As the value of [$SiO_2$ (nm/sec)/each sample (nm/sec)] increases, this indicates that the etching resistance is excellent.

The value of the polymer 1 was 4.5, the value of the polymer 2 was 5.0, the value of the polymer 3 was 5.0, the value of the polymer 4 was 5.5, the value of the polymer 5 was 4.5, the value of the polymer 6 was 5.0, the value of the polymer 7 was 5.0, the value of the polymer 8 was 5.0, the value of the polymer 9 was 5.0, and value of the polymer 9 was 4.5. As the result, all polymers showed high etching resistance to $SiO_2$.

[Evaluation of Ashing Characteristics Using $O_2$ Etching]

Each silicon substrate, in which a line and space pattern with a height of 200 nm, a projection width of 100 nm, and a width between projections of 100 nm was formed on the surface of the substrate, was coated with each solution containing PGMEA and cyclohexanone at a mass ratio (PGMEA/cyclohexanone) of 5/5 obtained by dissolving 10% by mass of each of the polymer 1, the polymer 2, the polymer 3, and the polymer 4 synthesized in Example 1, Example 2, Example 3 and Example 4 respectively, and the wafer was baked at 200° C. for 3 minutes in a nitrogen atmosphere. Each sample was divided to perform SEM observation before ashing using a piece therein, and dry etching was performed using the other piece for 60 seconds in an $O_2$ gas atmosphere for ashing. Next, SEM observation was performed after ashing.

Based on the comparison between SEM observation images before and after ashing, all of the polymer 1, the polymer 2, the polymer 3, and the polymer 4 were removed through ashing without polymer residues on the substrate.

For comparison, the ashing characteristic evaluation was performed according to the same method as described above using a siloxane resin in which a substituent on Si is propoxymethacrylate. As the result, polymer residues were found on the substrate by SEM observation, and the polymer was not able to be removed without polymer residues even in a case where the etching time was extended to 180 seconds.

Comparative Example 1

A cyclohexanone solution, in which 10% by mass of a novolak resin KA1165 (manufactured by DIC Corporation) whose temperature showing the intersection between the storage modulus (G') curve and the loss modulus (G'') curve calculated from the result of the solid viscoelasticity observation was 255° C. was dissolved, was prepared, and the uneven surface of the silicon substrate was spin-coated with the solution according to the same method as that in Example 1 and baked at 200° C. for 3 minutes.

As the result of observation performed on the cross section using a SEM, voids were generated in recess edge portions with respect to grooves with a narrow line width of 40 nm (height of 200 nm) between projections, and the same voids were generated in areas with a width between projections of 100 nm. Further, the thickness of the layer of the polymer 1 obtained by measuring ten distances between the bottoms of recesses to the atmospheric surface and averaging the obtained values was 300 nm, the maximum height ($H_{max}$) was 317 nm, the minimum height ($H_{min}$) was 285 nm, and the flatness (ΔFT) was 10.7%.

Comparative Example 2

A cyclohexanone solution containing 10% by mass of methyl methacrylate was prepared. In the cyclohexanone solution, 2% by mass with respect to the methyl methacrylate of 2-benzyl-2-dimethylamino-1-(4-morpholinophenyl)-butane-1-one as a photopolymerization initiator was dissolved, and a solution was obtained.

Next, a sample obtained by coating the uneven surface of the silicon substrate B with the solution was prepared according to the same method as that in Example 1.

Next, the coating film was cured by being irradiated with UV rays at an irradiation dose of 1000 mJ/cm².

Next, as the result of observation performed on the cross section using a SEM, voids were generated in areas with a width between projections of 900 μm with respect to grooves with $a_1$ of 900 μm, $b_1$ of 900 μm, $a_2$ of 40 nm, and $b_2$ of 120 nm (height of 200 nm), and the same voids were generated in areas with a width between projections of 40 nm. Further, the thickness of the $H_1$ layer obtained by measuring ten distances between the bottoms of recesses to the atmospheric surface and averaging the obtained values was 250 nm, the thickness of the $H_2$ layer was 264 nm, and the flatness (ΔFT) was 11.2%. Further, the atmospheric surface was distorted.

The above-described results are listed in Table 1 and Table 2.

TABLE 1

|  | Example 1 | Example 2 | Example 3 | Example 4 | Example 5 | Example 6 | Example 7 | Example 8 | Example 9 |
|---|---|---|---|---|---|---|---|---|---|
| Polymer | Polymer 1 | Polymer 2 | Polymer 3 | Polymer 4 | Polymer 5 | Polymer 6 | Polymer 7 | Polymer 8 | Polymer 9 |
| Mw | 5700 | 6300 | 7200 | 7800 | 6800 | 5600 | 7300 | 9600 | 10400 |
| Mw/Mn | 1.61 | 1.50 | 1.50 | 1.57 | 2.84 | 1.92 | 2.17 | 2.07 | 3.18 |
| A structure/B structure | 50/50 | 50/50 | 50/50 | 80/20 | 50/50 | 50/50 | 50/50 | 50/50 | 50/50 |
| Tg | 151° C. | 150° C. | 130° C. | 172° C. | 72° C. | 56° C. | 58° C. | 91° C. | 45° C. |
| Amount of volatile component to be generated | 0.0% | 0.0% | 0.0% | 0.0% | 0.0% | 0.0% | 0.0% | 0.0% | 0.0% |
| Intersection between G' and G" | 173° C. | 167° C. | 151° C. | 190° C. | 84° C. | 76° C. | 81° C. | 112° C. | 50° C. |
| Solution for measurement | PGMEA/CH of polymer 10 (%) = 50/50 | PGMEA/CH of polymer 10 (%) = 50/50 | PGMEA/CH of polymer 10 (%) = 50/50 | PGMEA/CH of polymer 10 (%) = 50/50 | PGMEA/CH of polymer 10 (%) = 50/50 | PGMEA/CH of polymer 10 (%) = 50/50 | PGMEA/CH of polymer 10 (%) = 50/50 | PGMEA/CH of polymer 10 (%) = 50/50 | PGMEA/CH of polymer 10 (%) = 50/50 |
| Refractive index (n value) | 1.66 | 1.66 | 1.68 | 1.71 | 1.68 | 1.78 | 1.78 | 1.66 | 1.64 |
| Extinction coefficient (k value) | 0.08 | 0.04 | 0.02 | 0.09 | 0.01 | 0.02 | 0.01 | 0.02 | 0.01 |
| Substrate | A | A | A | A | A | A | A | A | A |
| Embedding property | Uniform | Uniform | Uniform | Uniform | Uniform | Uniform | Uniform | Uniform | Uniform |
| Average value (Hav) of thicknesses of resist underlayer film applied to substrate A | 300 nm | 299 nm | 302 nm | 310 nm | 315 nm | 311 nm | 305 nm | 310 nm | 316 nm |
| Flatness (ΔFT) | 0.3% | 0.0% | 0.7% | 0.6% | 0.0% | 0.0% | 0.0% | 0.6% | 0.0% |

TABLE 2

|  | Example 10 | Example 11 | Example 12 | Example 13 | Example 14 | Example 15 | Example 16 | Comparative Example 1 | Comparative Example 2 |
|---|---|---|---|---|---|---|---|---|---|
| Polymer | Polymer 10 | Polymer 5 | Polymer 5 | 10 parts by mass of polymer 8 0.3 parts by mass of crosslinking agent (EEC) | Polymer 5 | Polymer 8 | Polymer 9 | Novolak resin | PMMA (photocuring) |
| Mw | 5900 | — | — | — | — | — | — | — | — |
| Mw/Mn | 2.32 | — | — | — | — | — | — | — | — |
| A structure/B structure | 20/80 | — | — | — | — | — | — | — | — |
| Tg | 68° C. | — | — | — | — | — | — | — | — |
| Amount of volatile component to be generated | 0.0% | — | — | — | — | — | — | — | — |
| Intersection between G' and G" | 82° C. | — | — | — | — | — | — | 255° C. | — |
| Solution for measurement | PGMEA/CH of polymer 10 (%) = 50/50 | — | — | PGMEA/CH of polymer 10 (%) = 50/50 | — | — | — | Novolak resin/CH = 10/90 | Methyl methacrylate/CH = 10/90 |

TABLE 2-continued

| | Example 10 | Example 11 | Example 12 | Example 13 | Example 14 | Example 15 | Example 16 | Comparative Example 1 | Comparative Example 2 |
|---|---|---|---|---|---|---|---|---|---|
| Refractive index (n value) | 1.67 | — | — | 1.67 | — | — | — | — | — |
| Extinction coefficient (k value) | 0.02 | — | — | 0.02 | — | — | — | — | — |
| Substrate | A | A | A | A | B | B | B | A | B |
| Embedding property | Uniform | Uniform | Uniform | Uniform | Uniform | Uniform | Uniform | Non-uniform | Non-uniform |
| Average value (Hav) of thicknesses of resist underlayer film applied to substrate A | 320 nm | 208 | 1622 | 313 nm | — | — | — | 300 nm | — |
| Average value (H3) of thicknesses of resist underlayer film applied to substrate B | — | — | — | — | 306 nm | 302 nm | 298 nm | — | 250 nm |
| Flatness (ΔFT) | 0.0% | 0.0% | 0.0% | 0.3% | 0.0% | 0.3% | 0.0% | 10.7% | 11.2% |

Example 17

In a 5 L autoclave equipped with a magnetic stirrer in a nitrogen atmosphere, 320 g (2 mol) of tetracyclo [4.4.0.1$^{2,5}$.1$^{7,10}$]-3-dodecene having the structural unit [A], 304 g (2 mol) of 4,10-dioxy-tricyclo[5.2.1.0$^{2,6}$]-8-decene-3-one having the structural unit [B], and 21 g (0.25 mol) of 1,5-hexadiene were dissolved in 3.4 kg of tetrahydrofuran (hereinafter, referred to as THF), and the solution was stirred.

As a ring opening metathesis polymerization catalyst, 612 mg (0.8 mmol) of Mo(N-2,6-Pr$^i_2$C$_6$H$_3$)(CHCMe$_2$Ph)(OCMe(CF$_3$)$_2$)$_2$ was added thereto to cause a reaction at 60° C. for 3 hours. Thereafter, 173 mg (2.4 mmol) of n-butylaldehyde was added thereto, and the solution was cooled, thereby obtaining 4.0 kg of a ring opening metathesis polymer solution. In the obtained polymer, the rate of polymerization thereof was 100%, the Mw was 5700, the ratio of Mw/Mn was 1.61, and the molar ratio ([A]/[B]) of the structural unit [A] to the structural unit [B] which was analyzed by $^1$HNMR was 50/50.

Next, the cyclic olefin polymer was precipitated from the obtained ring opening metathesis polymer solution using methanol and dried at 80° C. under reduced pressure, thereby obtaining a white powder solid (polymer 14).

The glass transition temperature of the polymer 14 was 151° C.

Next, a solution containing propylene glycol-1-monomethyl ether-2-acetate (hereinafter, noted as PGMEA) and cyclohexanone (hereinafter, also referred to as CH) at a mass ratio (PGMEA/cyclohexanone) of 5/5, in which the obtained polymer 14 was dissolved at a concentration of 10% by mass was prepared, and a surface of a silicon substrate A in which a line and space pattern with a height of 200 nm, a projection width of 40 to 150 nm, and a width between projections of 40 to 150 nm was formed was coated with the prepared solution under conditions of 1000 rpm for 10 sec. Thereafter, the silicon substrate A was heated at 200° C. for 3 minutes in a nitrogen atmosphere.

The refractive index (n value) of the polymer 14 measured using an ellipsometer was 1.66 and the extinction coefficient (k value) was 0.08.

As the result of observation performed on the cross section of the substrate A using a SEM, the polymer 14 was uniformly embedded without defects such as voids with respect to grooves with a narrow line width of 40 nm (height of 200 nm) between projections. Further, the thickness of the layer of the polymer 14 obtained by measuring ten distances between the bottoms of recesses to the atmospheric surface and averaging the obtained values was 300 nm, the maximum height (H$_{max}$) was 301 nm, the minimum height (H$_{min}$) was 300 nm, and the flatness (ΔFT) was 0.3%.

A solution containing PGMEA and cyclohexanone at a mass ratio (PGMEA/cyclohexanone) of 5/5, in which 10% by mass of the obtained polymer 14 was dissolved was prepared, and a 4 inch silicon wafer was spin-coated with the obtained solution under conditions of 1000 rpm for 10 sec. Next, the resulting sample was baked at 80° C. for 5 hours under reduced pressure (intermediate stage).

Next, the residual film rate of the polymer 14 with respect to PGMEA obtained by heating the film at 200° C. for 10 minutes in a nitrogen atmosphere was 88%. Further, the residual film rate of the polymer 14 with respect to PGMEA obtained by heating the film at 200° C. for 30 minutes in a nitrogen atmosphere was 96%.

Reference information: The residual film rate thereof was 9% in a case where the film in the intermediate stage was immersed in PGMEA without being treated at 200° C.

Further, the residual film rate of the polymer 14 with respect to PGME obtained by heating the film at 200° C. for 10 minutes in a nitrogen atmosphere was 99%. Further, the residual film rate of the polymer 14 with respect to PGME obtained by heating the film at 200° C. for 30 minutes in a nitrogen atmosphere was 99%.

Reference information: The residual film rate thereof was 2.4% in a case where the film in the intermediate stage was immersed in PGME without being treated at 200° C.

Further, the residual film rate of the polymer 14 with respect to PGME/PGMEA (7/3) obtained by heating the film at 200° C. for 10 minutes in a nitrogen atmosphere was 94%. Further, the residual film rate of the polymer 14 with respect to PGME/PGMEA (7/3) obtained by heating the film at 200° C. for 30 minutes in a nitrogen atmosphere was 98%.

Reference information: The residual film rate thereof was 3.7% in a case where the film in the intermediate stage was immersed in PGME/PGMEA (7/3) without being treated at 200° C.

Example 18

2.5 kg of a ring opening metathesis polymer solution was obtained according to the same method as that in Example 17 except that the monomer having the structural unit [A] was changed to 8-methoxycarbonyl-tetracyclo[4.4.0.1$^{2,5}$.1$^{7,10}$]-3-dodecene. In the obtained polymer, the rate of polymerization thereof was 100%, the Mw was 6300, the ratio of Mw/Mn was 1.50, and the molar ratio ([A]/[B]) of the structural unit [A] to the structural unit [B] which was analyzed by $^1$HNMR was 50/50.

Next, the cyclic olefin polymer was precipitated and dried according to the same method as that in Example 17 to obtain a white powder solid (polymer 15).

The glass transition temperature of the polymer 15 was 150° C.

Next, a sample obtained by coating the uneven surface of the silicon substrate A with the polymer 15 was prepared according to the same method as that in Example 17.

The refractive index (n value) of the polymer 15 measured using an ellipsometer was 1.66 and the extinction coefficient (k value) was 0.04.

As the result of observation performed on the cross section of the substrate A using a SEM, the polymer 15 was uniformly embedded without defects such as voids with respect to grooves with a narrow line width of 40 nm (height of 200 nm) between projections. Further, all measured values obtained by measuring ten distances between the bottoms of recesses to the atmospheric surface were 299 nm, and the flatness (ΔFT) was 0.0%.

A solution containing PGMEA and cyclohexanone at a mass ratio (PGMEA/cyclohexanone) of 5/5, in which 10% by mass of the obtained polymer 15 was dissolved was prepared, and a 4 inch silicon wafer was spin-coated with the obtained solution under conditions of 1000 rpm for 10 sec. Next, the resulting sample was baked at 80° C. for 5 hours under reduced pressure (intermediate stage).

Next, the residual film rate of the polymer 15 with respect to PGMEA obtained by heating the film at 200° C. for 10 minutes in a nitrogen atmosphere was 58%. Further, the residual film rate of the polymer 15 with respect to PGMEA obtained by heating the film at 200° C. for 30 minutes in a nitrogen atmosphere was 92%.

Reference information: The residual film rate thereof was 0.3% in a case where the film in the intermediate stage was immersed in PGMEA as it was.

Further, the residual film rate of the polymer 15 with respect to PGME obtained by heating the film at 200° C. for 10 minutes in a nitrogen atmosphere was 60%. Further, the residual film rate of the polymer 15 with respect to PGME obtained by heating the film at 200° C. for 30 minutes in a nitrogen atmosphere was 94%.

Reference information: The residual film rate thereof was 0.3% in a case where the film in the intermediate stage was immersed in PGME without being treated at 200° C.

Further, the residual film rate of the polymer 15 with respect to PGME/PGMEA (7/3) obtained by heating the film at 200° C. for 10 minutes in a nitrogen atmosphere was 60%. Further, the residual film rate of the polymer 15 with respect to PGME/PGMEA (7/3) obtained by heating the film at 200° C. for 30 minutes in a nitrogen atmosphere was 93%.

Reference information: The residual film rate thereof was 0.3% in a case where the film in the intermediate stage was immersed in PGME/PGMEA (7/3) without being treated at 200° C.

Example 19

4.1 kg of a ring opening metathesis polymer solution was obtained according to the same method as that in Example 17 except that the monomer having the structural unit [A] was changed to 8-(1-ethylcyclopentyloxycarbonyl)-tetracyclo[4.4.0.1$^{2,5}$.1$^{7,10}$]-3-dodecene. In the obtained polymer, the rate of polymerization thereof was 100%, the Mw was 7200, the ratio of Mw/Mn was 1.50, and the molar ratio ([A]/[B]) of the structural unit [A] to the structural unit [B] which was analyzed by $^1$HNMR was 50/50.

Next, the cyclic olefin polymer was precipitated and dried according to the same method as that in Example 17 to obtain a white powder solid (polymer 16).

The glass transition temperature of the polymer 16 was 130° C.

Next, a sample obtained by coating the uneven surface of the silicon substrate A with the polymer 16 was prepared according to the same method as that in Example 17.

The refractive index (n value) of the polymer 16 measured using an ellipsometer was 1.68 and the extinction coefficient (k value) was 0.02.

As the result of observation performed on the cross section of the substrate A using a SEM, the polymer 16 was uniformly embedded without defects such as voids with respect to grooves with a narrow line width of 40 nm (height of 200 nm) between projections. Further, the thickness of the layer of the polymer 16 obtained by measuring ten distances between the bottoms of recesses to the atmospheric surface and averaging the obtained values was 302 nm, the maximum height ($H_{max}$) was 303 nm, the minimum height ($H_{min}$) was 301 nm, and the flatness (ΔFT) was 0.7%.

A solution containing PGMEA and cyclohexanone at a mass ratio (PGMEA/cyclohexanone) of 5/5, in which 10% by mass of the obtained polymer 16 was dissolved was prepared, and a 4 inch silicon wafer was spin-coated with the obtained solution under conditions of 1000 rpm for 10 sec. Next, the resulting sample was baked at 80° C. for 5 hours under reduced pressure (intermediate stage).

Next, the residual film rate of the polymer 16 with respect to PGMEA obtained by heating the film at 200° C. for 10 minutes in a nitrogen atmosphere was 97%. Further, the residual film rate of the polymer 16 with respect to PGMEA obtained by heating the film at 200° C. for 30 minutes in a nitrogen atmosphere was 98%.

Reference information: The residual film rate thereof was 0.3% in a case where the film in the intermediate stage was immersed in PGMEA as it was.

Further, the residual film rate of the polymer 16 with respect to PGME obtained by heating the film at 200° C. for 10 minutes in a nitrogen atmosphere was 81%. Further, the residual film rate of the polymer 16 with respect to PGME obtained by heating the film at 200° C. for 30 minutes in a nitrogen atmosphere was 95%.

Reference information: The residual film rate thereof was 0.3% in a case where the film in the intermediate stage was immersed in PGME without being treated at 200° C.

Further, the residual film rate of the polymer 16 with respect to PGME/PGMEA (7/3) obtained by heating the film at 200° C. for 10 minutes in a nitrogen atmosphere was 88%. Further, the residual film rate of the polymer 16 with respect to PGME/PGMEA (7/3) obtained by heating the film at 200° C. for 30 minutes in a nitrogen atmosphere was 96%.

Reference information: The residual film rate thereof was 0.3% in a case where the film in the intermediate stage was immersed in PGME/PGMEA (7/3) without being treated at 200° C.

Example 20

4.1 kg of a ring opening metathesis polymer solution was obtained according to the same method as in Example 19. Next, 11.4 g (dry mass of 5.6 g) of 5% Rh carbon having a moisture content of 50.7% was added to the obtained ring opening metathesis polymer solution as a hydrogenation catalyst to cause a hydrogenation reaction at 100° C. and a hydrogen pressure of 5 MPa for 12. In the obtained polymer, the hydrogenation ratio thereof was 100% by mole, the Mw was 7800, the ratio of Mw/Mn was 1.57, and the molar ratio ([A]/[B]) of the structural unit [A] to the structural unit [B] which was analyzed by $^1$HNMR was 50/50.

Next, the cyclic olefin polymer was precipitated and dried according to the same method as that in Example 17 to obtain a white powder solid (polymer 17).

The glass transition temperature of the polymer 17 was 91° C.

Further, the amount of the volatile components in the polymer 17 was 0.0% by mass.

In addition, the temperature showing the intersection between the storage modulus (G') curve and the loss modulus (G") curve which were calculated from the results obtained by measuring the solid viscoelasticity of the polymer 17 was 112° C.

Next, a sample obtained by coating the uneven surface of the silicon substrate A with the polymer 17 was prepared according to the same method as that in Example 17.

The refractive index (n value) of the polymer 17 measured using an ellipsometer was 1.66 and the extinction coefficient (k value) was 0.02.

As the result of observation performed on the cross section of the substrate A using a SEM, the polymer 17 was uniformly embedded without defects such as voids with respect to grooves with a narrow line width of 40 nm (height of 200 nm) between projections. Further, the thickness of the layer of the polymer 17 obtained by measuring ten distances between the bottoms of recesses to the atmospheric surface and averaging the obtained values was 310 nm, the maximum height ($H_{max}$) was 311 nm, the minimum height ($H_{min}$) was 309 nm, and the flatness (ΔFT) was 0.6%.

A solution containing PGMEA and cyclohexanone at a mass ratio (PGMEA/cyclohexanone) of 5/5, in which 10% by mass of the obtained polymer 17 was dissolved was prepared, and a 4 inch silicon wafer was spin-coated with the obtained solution under conditions of 1000 rpm for 10 sec. Next, the resulting sample was baked at 80° C. for 5 hours under reduced pressure (intermediate stage).

Next, the residual film rate of the polymer 17 with respect to PGMEA obtained by heating the film at 200° C. for 10 minutes in a nitrogen atmosphere was 75%. Further, the residual film rate of the polymer 17 with respect to PGMEA obtained by heating the film at 200° C. for 30 minutes in a nitrogen atmosphere was 93%.

Reference information: The residual film rate thereof was 0.5% in a case where the film in the intermediate stage was immersed in PGMEA as it was.

Further, the residual film rate of the polymer 17 with respect to PGME obtained by heating the film at 200° C. for 10 minutes in a nitrogen atmosphere was 66%. Further, the residual film rate of the polymer 17 with respect to PGME obtained by heating the film at 200° C. for 30 minutes in a nitrogen atmosphere was 92%.

Reference information: The residual film rate thereof was 0.2% in a case where the film in the intermediate stage was immersed in PGME without being treated at 200° C.

Further, the residual film rate of the polymer 17 with respect to PGME/PGMEA (7/3) obtained by heating the film at 200° C. for 10 minutes in a nitrogen atmosphere was 69%. Further, the residual film rate of the polymer 17 with respect to PGME/PGMEA (7/3) obtained by heating the film at 200° C. for 30 minutes in a nitrogen atmosphere was 92%.

Reference information: The residual film rate thereof was 0.3% in a case where the film in the intermediate stage was immersed in PGME/PGMEA (7/3) without being treated at 200° C.

Example 21

3.7 kg of a ring opening metathesis polymer solution was obtained according to the same method as that in Example 17 except that the monomer having the structural unit [A] was changed to bicycle[2.2.1]hept-2-ene. In the obtained polymer, the rate of polymerization thereof was 100%, the Mw was 6800, the ratio of Mw/Mn was 2.84, and the molar ratio ([A]/[B]) of the structural unit [A] to the structural unit [B] which was analyzed by $^1$HNMR was 50/50.

Next, the cyclic olefin polymer was precipitated and dried according to the same method as that in Example 17 to obtain a white powder solid (polymer 18).

The glass transition temperature of the polymer 18 was 72° C.

Further, the amount of the volatile components in the polymer 18 was 0.0% by mass.

In addition, the temperature showing the intersection between the storage modulus (G') curve and the loss modulus (G") curve which were calculated from the results obtained by measuring the solid viscoelasticity of the polymer 18 was 84° C.

Next, a sample obtained by coating the uneven surface of the silicon substrate A with the polymer 18 was prepared according to the same method as that in Example 17.

The refractive index (n value) of the polymer 18 measured using an ellipsometer was 1.68 and the extinction coefficient (k value) was 0.01.

As the result of observation performed on the cross section of the substrate A using a SEM, the polymer 18 was uniformly embedded without defects such as voids with respect to grooves with a narrow line width of 40 nm (height of 200 nm) between projections. Further, the thickness of the layer of the polymer 18 obtained by measuring ten distances between the bottoms of recesses to the atmospheric surface and averaging the obtained values was 262 nm, the maximum height ($H_{max}$) was 262 nm, the minimum height ($H_{min}$) was 262 nm, and the flatness (ΔFT) was 0.0%.

A solution containing PGMEA and cyclohexanone at a mass ratio (PGMEA/cyclohexanone) of 5/5 in which 10% by mass of the obtained polymer 18 was dissolved was prepared, and a 4 inch silicon wafer was spin-coated with the obtained solution under conditions of 1000 rpm for 10 sec. Next, the resulting sample was baked at 80° C. for 5 hours under reduced pressure (intermediate stage).

Next, the residual film rate of the polymer 18 with respect to PGMEA obtained by heating the film at 200° C. for 10 minutes in a nitrogen atmosphere was 99%. Further, the residual film rate of the polymer 18 with respect to PGMEA obtained by heating the film at 200° C. for 30 minutes in a nitrogen atmosphere was 99%.

Reference information: The residual film rate thereof was 30% in a case where the film in the intermediate stage was immersed in PGMEA as it was.

Further, the residual film rate of the polymer 18 with respect to PGME obtained by heating the film at 200° C. for 10 minutes in a nitrogen atmosphere was 96%. Further, the residual film rate of the polymer 18 with respect to PGME obtained by heating the film at 200° C. for 30 minutes in a nitrogen atmosphere was 99%.

Reference information: The residual film rate thereof was 1.8% in a case where the film in the intermediate stage was immersed in PGME without being treated at 200° C.

Further, the residual film rate of the polymer 18 with respect to PGME/PGMEA (7/3) obtained by heating the film at 200° C. for 10 minutes in a nitrogen atmosphere was 71%. Further, the residual film rate of the polymer 18 with respect to PGME/PGMEA (7/3) obtained by heating the film at 200° C. for 30 minutes in a nitrogen atmosphere was 99%.

Reference information: The residual film rate thereof was 9.4% in a case where the film in the intermediate stage was immersed in PGME/PGMEA (7/3) without being treated at 200° C.

Example 22

4.0 kg of a ring opening metathesis polymer solution was obtained according to the same method as that in Example 17 except that the monomer having the structural unit [A] was changed to 5-(1-ethylcyclopentyloxycarbonyl)-bicyclo [2.2.1]hept-2-ene. In the obtained polymer, the rate of polymerization thereof was 100%, the Mw was 5600, the ratio of Mw/Mn was 1.92, and the molar ratio ([A]/[B]) of the structural unit [A] to the structural unit [B] which was analyzed by $^1$HNMR was 50/50.

Next, the cyclic olefin polymer was precipitated and dried according to the same method as that in Example 17 to obtain a white powder solid (polymer 19).

The glass transition temperature of the polymer 19 was 56° C.

Further, the amount of the volatile components in the polymer 19 was 0.0% by mass.

In addition, the temperature showing the intersection between the storage modulus (G') curve and the loss modulus (G") curve which were calculated from the results obtained by measuring the solid viscoelasticity of the polymer 19 was 76° C.

Next, a sample obtained by coating the uneven surface of the silicon substrate A with the polymer 19 was prepared according to the same method as that in Example 17.

The refractive index (n value) of the polymer 19 measured using an ellipsometer was 1.78 and the extinction coefficient (k value) was 0.02.

As the result of observation performed on the cross section of the substrate A using a SEM, the polymer 19 was uniformly embedded without defects such as voids with respect to grooves with a narrow line width of 40 nm (height of 200 nm) between projections. Further, the thickness of the layer of the polymer 19 obtained by measuring ten distances between the bottoms of recesses to the atmospheric surface and averaging the obtained values was 264 nm, the maximum height ($H_{max}$) was 266 nm, the minimum height ($H_{min}$) was 264 nm, and the flatness (ΔFT) was 0.8%.

A solution containing PGMEA and cyclohexanone at a mass ratio (PGMEA/cyclohexanone) of 5/5 in which 10% by mass of the obtained polymer 19 was dissolved was prepared, and a 4 inch silicon wafer was spin-coated with the obtained solution under conditions of 1000 rpm for 10 sec. Next, the resulting sample was baked at 80° C. for 5 hours under reduced pressure (intermediate stage).

Next, the residual film rate of the polymer 19 with respect to PGMEA obtained by heating the film at 200° C. for 10 minutes in a nitrogen atmosphere was 99%. Further, the residual film rate of the polymer 19 with respect to PGMEA obtained by heating the film at 200° C. for 30 minutes in a nitrogen atmosphere was 100%.

Reference information: The residual film rate thereof was 3.0% in a case where the film in the intermediate stage was immersed in PGMEA as it was.

Further, the residual film rate of the polymer 19 with respect to PGME obtained by heating the film at 200° C. for 10 minutes in a nitrogen atmosphere was 71%. Further, the residual film rate of the polymer 19 with respect to PGME obtained by heating the film at 200° C. for 30 minutes in a nitrogen atmosphere was 95%.

Reference information: The residual film rate thereof was 2.2% in a case where the film in the intermediate stage was immersed in PGME without being treated at 200° C.

Further, the residual film rate of the polymer 19 with respect to PGME/PGMEA (7/3) obtained by heating the film at 200° C. for 10 minutes in a nitrogen atmosphere was 76%. Further, the residual film rate of the polymer 19 with respect to PGME/PGMEA (7/3) obtained by heating the film at 200° C. for 30 minutes in a nitrogen atmosphere was 95%.

Reference information: The residual film rate thereof was 2.5% in a case where the film in the intermediate stage was immersed in PGME/PGMEA (7/3) without being treated at 200° C.

Example 23

4.0 kg of a ring opening metathesis polymer solution was obtained according to the same method as that in Example 17 except that the monomer having the structural unit [A] was changed to 5-(1-methylcyclohexyloxycarbonyl)-bicyclo [2.2.1]hept-2-ene. In the obtained polymer, the rate of polymerization thereof was 100%, the Mw was 7300, the ratio of Mw/Mn was 2.17, and the molar ratio ([A]/[B]) of the structural unit [A] to the structural unit [B] which was analyzed by $^1$HNMR was 50/50.

Next, the cyclic olefin polymer was precipitated and dried according to the same method as that in Example 17 to obtain a white powder solid (polymer 20).

The glass transition temperature of the polymer 20 was 58° C.

Further, the amount of the volatile components in the polymer 20 was 0.0% by mass.

In addition, the temperature showing the intersection between the storage modulus (G') curve and the loss modulus (G") curve which were calculated from the results obtained by measuring the solid viscoelasticity of the polymer 20 was 81° C.

Next, a sample obtained by coating the uneven surface of the silicon substrate A with the polymer 20 was prepared according to the same method as that in Example 17.

The refractive index (n value) of the polymer 20 measured using an ellipsometer was 1.78 and the extinction coefficient (k value) was 0.01.

As the result of observation performed on the cross section of the substrate A using a SEM, the polymer 20 was uniformly embedded without defects such as voids with respect to grooves with a narrow line width of 40 nm (height of 200 nm) between projections. Further, the thickness of the layer of the polymer 20 obtained by measuring ten distances between the bottoms of recesses to the atmospheric surface and averaging the obtained values was 263 nm, the maximum height ($H_{max}$) was 264 nm, the minimum height ($H_{min}$) was 262 nm, and the flatness (ΔFT) was 0.8%.

A solution containing PGMEA and cyclohexanone at a mass ratio (PGMEA/cyclohexanone) of 5/5 in which 10% by mass of the obtained polymer 20 was dissolved was prepared, and a 4 inch silicon wafer was spin-coated with the obtained solution under conditions of 1000 rpm for 10 sec.

Next, the resulting sample was baked at 80° C. for 5 hours under reduced pressure (intermediate stage).

Next, the residual film rate of the polymer 20 with respect to PGMEA obtained by heating the film at 200° C. for 10 minutes in a nitrogen atmosphere was 100%. Further, the residual film rate of the polymer 20 with respect to PGMEA obtained by heating the film at 200° C. for 30 minutes in a nitrogen atmosphere was 100%.

Reference information: The residual film rate thereof was 10% in a case where the film in the intermediate stage was immersed in PGMEA as it was.

Further, the residual film rate of the polymer 20 with respect to PGME obtained by heating the film at 200° C. for 10 minutes in a nitrogen atmosphere was 100%. Further, the residual film rate of the polymer 20 with respect to PGME obtained by heating the film at 200° C. for 30 minutes in a nitrogen atmosphere was 100%.

Reference information: The residual film rate thereof was 10% in a case where the film in the intermediate stage was immersed in PGME without being treated at 200° C.

Further, the residual film rate of the polymer 20 with respect to PGME/PGMEA (7/3) obtained by heating the film at 200° C. for 10 minutes in a nitrogen atmosphere was 98%. Further, the residual film rate of the polymer 20 with respect to PGME/PGMEA (7/3) obtained by heating the film at 200° C. for 30 minutes in a nitrogen atmosphere was 100%.

Reference information: The residual film rate thereof was 10% in a case where the film in the intermediate stage was immersed in PGME/PGMEA (7/3) without being treated at 200° C.

Example 24

3.7 kg of a ring opening metathesis polymer solution was obtained according to the same method as in Example 21. Next, 11.4 g (dry mass of 5.6 g) of 5% Rh carbon having a moisture content of 50.7% was added to the obtained ring opening metathesis polymer solution as a hydrogenation catalyst to cause a hydrogenation reaction at 100° C. and a hydrogen pressure of 5 MPa for 12 hours. In the obtained polymer, the hydrogenation ratio thereof was 100% by mole, the Mw was 10400, the ratio of Mw/Mn was 3.18, and the molar ratio ([A]/[B]) of the structural unit [A] to the structural unit [B] which was analyzed by $^1$HNMR was 50/50.

Next, the cyclic olefin polymer was precipitated and dried according to the same method as that in Example 17 to obtain a white powder solid (polymer 21).

The glass transition temperature of the polymer 21 was 45° C. Further, the amount of the volatile components in the polymer 21 was 0.0% by mass.

In addition, the temperature showing the intersection between the storage modulus (G') curve and the loss modulus (G") curve which were calculated from the results obtained by measuring the solid viscoelasticity of the polymer 21 was 50° C.

Next, a sample obtained by coating the uneven surface of the silicon substrate A with the polymer 21 was prepared according to the same method as that in Example 17.

The refractive index (n value) of the polymer 21 measured using an ellipsometer was 1.66 and the extinction coefficient (k value) was 0.02.

As the result of observation performed on the cross section of the substrate A using a SEM, the polymer 21 was uniformly embedded without defects such as voids with respect to grooves with a narrow line width of 40 nm (height of 200 nm) between projections. Further, the thickness of the layer of the polymer 21 obtained by measuring ten distances between the bottoms of recesses to the atmospheric surface and averaging the obtained values was 273 nm, the maximum height ($H_{max}$) was 273 nm, the minimum height ($H_{min}$) was 273 nm, and the flatness ($\Delta FT$) was 0.0%.

A solution containing PGMEA and cyclohexanone at a mass ratio (PGMEA/cyclohexanone) of 5/5 in which 10% by mass of the obtained polymer 21 was dissolved was prepared, and a 4 inch silicon wafer was spin-coated with the obtained solution under conditions of 1000 rpm for 10 sec. Next, the resulting sample was baked at 80° C. for 5 hours under reduced pressure (intermediate stage).

Next, the residual film rate of the polymer 21 with respect to PGMEA obtained by heating the film at 200° C. for 10 minutes in a nitrogen atmosphere was 79%. Further, the residual film rate of the polymer 21 with respect to PGMEA obtained by heating the film at 200° C. for 30 minutes in a nitrogen atmosphere was 97%.

Reference information: The residual film rate thereof was 0.8% in a case where the film in the intermediate stage was immersed in PGMEA as it was.

Further, the residual film rate of the polymer 21 with respect to PGME obtained by heating the film at 200° C. for 10 minutes in a nitrogen atmosphere was 74%. Further, the residual film rate of the polymer 21 with respect to PGME obtained by heating the film at 200° C. for 30 minutes in a nitrogen atmosphere was 93%.

Reference information: The residual film rate thereof was 6.2% in a case where the film in the intermediate stage was immersed in PGME without being treated at 200° C.

Further, the residual film rate of the polymer 21 with respect to PGME/PGMEA (7/3) obtained by heating the film at 200° C. for 10 minutes in a nitrogen atmosphere was 76%. Further, the residual film rate of the polymer 21 with respect to PGME/PGMEA (7/3) obtained by heating the film at 200° C. for 30 minutes in a nitrogen atmosphere was 94%.

Reference information: The residual film rate thereof was 6.0% in a case where the film in the intermediate stage was immersed in PGME/PGMEA (7/3) without being treated at 200° C.

Example 25

3.8 kg of a ring opening metathesis polymer solution was obtained according to the same method as that in Example 17 except that 75 g (0.8 mol) of bicycle[2.2.1]hept-2-ene having the structural unit [A] was changed to 487 g (3.2 mol) of 4,10-dioxy-tricyclo[5.2.1.0$^{2,6}$]-8-decene-3-one having the structural unit [B]. In the obtained polymer, the rate of polymerization thereof was 100%, the Mw was 5900, the ratio of Mw/Mn was 2.32, and the molar ratio ([A]/[B]) of the structural unit [A] to the structural unit [B] which was analyzed by 4HNMR was 20/80.

Next, the cyclic olefin polymer was precipitated and dried according to the same method as that in Example 17 to obtain a white powder solid (polymer 22).

The glass transition temperature of the polymer 22 was 68° C.

Further, the amount of the volatile components in the polymer 22 was 0.0% by mass.

In addition, the temperature showing the intersection between the storage modulus (G') curve and the loss modulus (G") curve which were calculated from the results obtained by measuring the solid viscoelasticity of the polymer 22 was 82° C.

Next, a sample obtained by coating the uneven surface of the silicon substrate A with the polymer 22 was prepared according to the same method as that in Example 17.

The refractive index (n value) of the polymer 22 measured using an ellipsometer was 1.67 and the extinction coefficient (k value) was 0.02.

As the result of observation performed on the cross section of the substrate A using a SEM, the polymer 22 was uniformly embedded without defects such as voids with respect to grooves with a narrow line width of 40 nm (height of 200 nm) between projections. Further, all measured values obtained by measuring ten distances between the bottoms of recesses to the atmospheric surface were 260 nm, and the flatness (ΔFT) was 0.0%. A solution containing PGMEA and cyclohexanone at a mass ratio (PGMEA/cyclohexanone) of 5/5 in which 10% by mass of the obtained polymer 22 was dissolved was prepared, and a 4 inch silicon wafer was spin-coated with the obtained solution under conditions of 1000 rpm for 10 sec. Next, the resulting sample was baked at 80° C. for 5 hours under reduced pressure (intermediate stage).

Next, the residual film rate of the polymer 22 with respect to PGMEA obtained by heating the film at 200° C. for 10 minutes in a nitrogen atmosphere was 99%. Further, the residual film rate of the polymer 20 with respect to PGMEA obtained by heating the film at 200° C. for 30 minutes in a nitrogen atmosphere was 100%.

Reference information: The residual film rate thereof was 31% in a case where the film in the intermediate stage was immersed in PGMEA as it was.

Further, the residual film rate of the polymer 22 with respect to PGME obtained by heating the film at 200° C. for 10 minutes in a nitrogen atmosphere was 98%. Further, the residual film rate of the polymer 22 with respect to PGME obtained by heating the film at 200° C. for 30 minutes in a nitrogen atmosphere was 100%.

Reference information: The residual film rate thereof was 26% in a case where the film in the intermediate stage was immersed in PGME without being treated at 200° C.

Further, the residual film rate of the polymer 22 with respect to PGME/PGMEA (7/3) obtained by heating the film at 200° C. for 10 minutes in a nitrogen atmosphere was 97%. Further, the residual film rate of the polymer 22 with respect to PGME/PGMEA (7/3) obtained by heating the film at 200° C. for 30 minutes in a nitrogen atmosphere was 100%.

Reference information: The residual film rate thereof was 27% in a case where the film in the intermediate stage was immersed in PGME/PGMEA (7/3) without being treated at 200° C.

Example 26

A solution containing PGMEA and cyclohexanone at a mass ratio (PGMEA/cyclohexanone) of 5/5, in which 10% by mass of the polymer 17 obtained in Example 20 and 0.3% by mass of 3',4'-epoxycyclohexylmethyl-3,4-epoxycyclohexanecarboxylate (EEC) were dissolved as a crosslinking agent was prepared, and a sample obtained by coating the uneven surface of the silicon substrate A with the solution was prepared according to the same method as that in Example 17.

The refractive index (n value) measured using an ellipsometer was 1.67 and the extinction coefficient (k value) was 0.02.

Since it was understood that the temperature at which the polarity of the cyclic olefin polymer changes is sufficiently higher than 112° C. which is the temperature of the intersection between G' and G", the temperature of the intersection between G" and G" of the material for forming an underlayer film formed of the cyclic olefin and the crosslinking agent can be regarded as the same value as described above.

As the result of observation performed on the cross section of the substrate A using a SEM, the polymer was uniformly embedded without defects such as voids with respect to grooves with a narrow line width of 40 nm (height of 200 nm) between projections.

Further, the thickness of the layer of the polymer 8 obtained by measuring ten distances between the bottoms of recesses to the atmospheric surface and averaging the obtained values was 313 nm, the maximum height ($H_{max}$) was 313 nm, the minimum height ($H_{min}$) was 312 nm, and the flatness (ΔFT) was 0.3%.

A solution containing PGMEA and cyclohexanone at a mass ratio (PGMEA/cyclohexanone) of 5/5, in which 10% by mass of the obtained polymer 17 and 0.3% by mass of 3',4'-epoxycyclohexylmethyl-3,4-epoxycyclohexanecarboxylate (EEC) were dissolved as a crosslinking agent was prepared, and a 4 inch silicon wafer was spin-coated with the obtained solution under conditions of 1000 rpm for 10 sec. Next, the resulting sample was baked at 80° C. for 5 hours under reduced pressure (intermediate stage).

Next, the residual film rate of the film with respect to PGMEA obtained by being heated at 200° C. for 10 minutes in a nitrogen atmosphere was 95%. Next, the residual film rate of the film with respect to PGMEA obtained by being heated at 200° C. for 30 minutes in a nitrogen atmosphere was 100%.

Reference information: The residual film rate thereof was 0.5% in a case where the film in the intermediate stage was immersed in PGMEA as it was.

Further, the residual film rate of the film with respect to PGME obtained by being heated at 200° C. for 10 minutes in a nitrogen atmosphere was 94%. Further, the residual film rate of the film with respect to PGME obtained by being heated at 200° C. for 30 minutes in a nitrogen atmosphere was 100%.

Reference information: The residual film rate thereof was 0.2% in a case where the film in the intermediate stage was immersed in PGME without being treated at 200° C.

Further, the residual film rate of the film obtained by being heated at 200° C. for 10 minutes in a nitrogen atmosphere to PGME/PGMEA (7/3) was 94%. Further, the residual film rate of the film with respect to PGME/PGMEA (7/3) obtained by being heated at 200° C. for 30 minutes in a nitrogen atmosphere was 100%.

Reference information: The residual film rate thereof was 0.3% in a case where the film in the intermediate stage was immersed in PGME/PGMEA (7/3) without being treated at 200° C.

Comparative Example 3

A solution in which 10% by mass of PGMEA was dissolved was prepared in the same manner as in Example 17 except that polyhydroxystyrene (hereinafter, noted as PHS, manufactured by Polysciences, Inc., Mw=5300, Mw/Mn=1.48) was used, and a 4 inch silicon wafer was spin-coated with this solution and baked at 200° C. for 10 minutes.

As the result of evaluation of the residual film rate in the same manner as in Example 17, the residual film rate of PHS with respect to PGMEA obtained by performing only drying at 80° C. for 5 hours under reduced pressure was 0.2%. The residual film rate of PHS obtained by performing heating at 200° C. for 10 minutes in a nitrogen atmosphere was 0.4%.

Further, the residual film rate of PHS obtained by performing heating at 200° C. for 30 minutes in a nitrogen atmosphere was 0.6%, and the mode of being insoluble in PGMEA during both heating times was not observed.

Further, the residual film rate of PHS with respect to PGME obtained by performing only drying at 80° C. for 5 hours under reduced pressure was 0.1%. The residual film rate of PHS obtained by performing heating at 200° C. for 10 minutes in a nitrogen atmosphere was 0.4%. Further, the residual film rate of PHS obtained by performing heating at 200° C. for 30 minutes in a nitrogen atmosphere was 0.5%, and the mode of being insoluble in PGME during both heating times was not observed. Further, the residual film rate of PHS with respect to PGME/PGMEA (7/3) obtained by performing only drying at 80° C. for 5 hours under reduced pressure was 0.1%. The residual film rate of PHS obtained by performing heating at 200° C. for 10 minutes in a nitrogen atmosphere was 0.4%. Further, the residual film rate of PHS obtained by performing heating at 200° C. for 30 minutes in a nitrogen atmosphere was 0.5%, and the mode of being insoluble in PGME/PGMEA (7/3) during both heating times was not observed.

Comparative Example 4

4.1 kg of a ring opening metathesis polymer solution was obtained according to the same method as that in Example 17 except that the monomer having the structural unit [A] was changed to 5,5,6-trifluoro-6-(trifluoromethyl)-bicyclo 8-[2.2.1]hept-2-ene and the monomer having the structural unit [B] was used.

Next, 51.7 g (dry mass of 24.8 g) of 5% Pd carbon having a moisture content of 52.0% was added to the obtained ring opening metathesis polymer solution as a hydrogenation catalyst to cause a hydrogenation reaction at 130° C. and a hydrogen pressure of 8.5 MPa for 20 hours. In the obtained polymer, the hydrogenation ratio thereof was 100% by mole, the Mw was 9300, and the ratio of Mw/Mn was 1.76.

Next, the cyclic olefin polymer was precipitated and dried according to the same method as that in Example 17 to obtain a white powder solid (polymer 23).

As the result of evaluation of the residual film rate in the same manner as in Example 17, the residual film rate of the polymer 23 with respect to PGMEA obtained by performing only drying at 80° C. for 5 hours under reduced pressure was 0.3%. The residual film rate of the polymer 23 obtained by performing heating at 200° C. for 10 minutes in a nitrogen atmosphere was 0.5%. Further, the residual film rate of the polymer 23 obtained by performing heating at 200° C. for 30 minutes in a nitrogen atmosphere was 0.8%, and the mode of being insoluble in PGMEA during both heating times was not observed.

Further, the residual film rate of the polymer 23 with respect to PGME obtained by performing only drying at 80° C. for 5 hours under reduced pressure was 25%. The residual film rate of the polymer 23 obtained by performing heating at 200° C. for 10 minutes in a nitrogen atmosphere was 27%. Further, the residual film rate of the polymer 23 obtained by performing heating at 200° C. for 30 minutes in a nitrogen atmosphere was 28%, and the mode of being insoluble in PGME during both heating times was not observed. Further, the residual film rate of the polymer 23 with respect to PGME/PGMEA (7/3) obtained by performing only drying at 80° C. for 5 hours under reduced pressure was 33%. The residual film rate of the polymer 23 obtained by performing heating at 200° C. for 10 minutes in a nitrogen atmosphere was 35%. Further, the residual film rate of the polymer 23 obtained by performing heating at 200° C. for 30 minutes in a nitrogen atmosphere was 35%, and the mode of being insoluble in PGME/PGMEA (7/3) during both heating times was not observed.

Comparative Example 5

4.2 kg of a ring opening metathesis polymer solution was obtained according to the same method as that in Example 17 except that the monomer having the structural unit [A] was changed to tetracyclo[4.4.0.1$^{2,5}$.1$^{7,10}$]-3-dodecene and the monomer having the structural unit [B] was not used. In the obtained polymer, the hydrogenation ratio thereof was 100% by mole, the Mw was 6800, and the ratio of Mw/Mn was 1.55.

Next, the cyclic olefin polymer was precipitated and dried according to the same method as that in Example 17 to obtain a white powder solid (polymer 24).

The residual film rate of the polymer 24 which had only been dried at 80° C. for 5 hours under reduced pressure was not able to be measured with an ellipsometer because the film was whitened due to a phenomenon in which the film was swollen at the time of being immersed in PGMEA. The residual film rate of the polymer 24 obtained by heating the film at 200° C. for 10 minutes or 30 minutes in a nitrogen atmosphere was not able to be measured with an ellipsometer due to the similar whitening. The residual film rate with respect to PGME and PGME/PGMEA (7/3) was not able to be measured with an ellipsometer because the film was whitened due to a phenomenon in which the film was swollen at the time of being immersed similar to PGMEA.

The results of the residual film rates described above are listed in Table 3 and Table 4.

TABLE 3

| | | | 80° C. for 5 hours under reduced pressure | | | 200° C. for 10 minutes in nitrogen atmosphere | | | 200° C. for 30 minutes in nitrogen atmosphere | | |
|---|---|---|---|---|---|---|---|---|---|---|---|
| | | Solvent | α (nm) | β (nm) | Residual film rate (%) * | α (nm) | β (nm) | Residual film rate (%) * | α (nm) | β (nm) | Residual film rate (%) * |
| Example 17 | Polymer 14 | PGMEA | 436 | 49 | 9 | 387 | 351 | 88 | 377 | 366 | 96 |
| | | | 436 | 35 | | 387 | 330 | | 375 | 357 | |
| | | | 442 | 39 | | 386 | 340 | | 374 | 357 | |
| | | PGME | 440 | 11 | 2.4 | 389 | 386 | 99 | 372 | 369 | 99 |
| | | | 437 | 10 | | 386 | 381 | | 368 | 363 | |
| | | | 438 | 11 | | 385 | 381 | | 374 | 371 | |
| | | PGME/PGMEA = 7/3 | 432 | 14 | 3.7 | 388 | 363 | 94 | 370 | 365 | 98 |
| | | | 433 | 16 | | 383 | 360 | | 369 | 360 | |
| | | | 439 | 18 | | 386 | 363 | | 375 | 366 | |

TABLE 3-continued

| | | | 80° C. for 5 hours under reduced pressure | | | 200° C. for 10 minutes in nitrogen atmosphere | | | 200° C. for 30 minutes in nitrogen atmosphere | | |
|---|---|---|---|---|---|---|---|---|---|---|---|
| | | Solvent | α (nm) | β (nm) | Residual film rate (%) * | α (nm) | β (nm) | Residual film rate (%) * | α (nm) | β (nm) | Residual film rate (%) * |
| Example 18 | Polymer 15 | PGMEA | 367 | 1.1 | 0.3 | 331 | 191 | 58 | 315 | 296 | 92 |
| | | | 369 | 1.2 | | 331 | 189 | | 322 | 290 | |
| | | | 368 | 1.5 | | 326 | 193 | | 318 | 293 | |
| | | PGME | 366 | 1.2 | 0.3 | 333 | 197 | 60 | 318 | 298 | 94 |
| | | | 366 | 1.1 | | 325 | 196 | | 312 | 292 | |
| | | | 363 | 1.2 | | 325 | 193 | | 320 | 299 | |
| | | PGME/PGMEA = 7/3 | 369 | 1.0 | 0.3 | 329 | 198 | 60 | 317 | 295 | 93 |
| | | | 366 | 1.1 | | 326 | 195 | | 315 | 291 | |
| | | | 365 | 1.1 | | 331 | 196 | | 322 | 298 | |
| Example 19 | Polymer 16 | PGMEA | 356 | 3.0 | 0.3 | 246 | 239 | 97 | 240 | 235 | 98 |
| | | | 357 | 0.2 | | 245 | 235 | | 241 | 234 | |
| | | | 345 | 0.2 | | 247 | 242 | | 239 | 233 | |
| | | PGME | 348 | 1.0 | 0.3 | 244 | 196 | 81 | 244 | 233 | 95 |
| | | | 352 | 1.1 | | 250 | 203 | | 240 | 225 | |
| | | | 355 | 1.1 | | 249 | 200 | | 242 | 229 | |
| | | PGME/PGMEA = 7/3 | 355 | 0.8 | 0.3 | 248 | 219 | 88 | 240 | 234 | 96 |
| | | | 349 | 1.0 | | 251 | 216 | | 236 | 227 | |
| | | | 351 | 1.0 | | 242 | 214 | | 243 | 230 | |
| Example 20 | Polymer 17 | PGMEA | 412 | 2.2 | 0.5 | 323 | 239 | 75 | 323 | 390 | 93 |
| | | | 413 | 2.0 | | 325 | 235 | | 325 | 383 | |
| | | | 411 | 2.1 | | 324 | 251 | | 324 | 373 | |
| | | PGME | 416 | 0.8 | 0.2 | 328 | 217 | 66 | 322 | 297 | 92 |
| | | | 417 | 0.9 | | 325 | 213 | | 318 | 292 | |
| | | | 411 | 0.8 | | 327 | 220 | | 326 | 300 | |
| | | PGME/PGMEA = 7/3 | 412 | 1.5 | 0.3 | 319 | 222 | 69 | 320 | 296 | 92 |
| | | | 419 | 1.2 | | 322 | 222 | | 327 | 299 | |
| | | | 413 | 1.1 | | 328 | 224 | | 322 | 296 | |
| Example 21 | Polymer 18 | PGMEA | 398 | 121 | 30 | 347 | 347 | 99 | 326 | 322 | 99 |
| | | | 395 | 143 | | 344 | 339 | | 325 | 322 | |
| | | | 390 | 93 | | 342 | 340 | | 322 | 318 | |
| | | PGME | 396 | 7.2 | 1.8 | 350 | 340 | 96 | 324 | 320 | 99 |
| | | | 396 | 8.3 | | 345 | 340 | | 326 | 322 | |
| | | | 390 | 6.1 | | 343 | 319 | | 329 | 327 | |
| | | PGME/PGMEA = 7/3 | 393 | 36 | 9.4 | 375 | 261 | 71 | 322 | 318 | 99 |
| | | | 399 | 39 | | 375 | 249 | | 325 | 322 | |
| | | | 390 | 36 | | 359 | 278 | | 323 | 321 | |
| Example 22 | Polymer 19 | PGMEA | 233 | 3.3 | 3.0 | 156 | 153 | 99 | 144 | 143 | 100 |
| | | | 235 | 9.6 | | 156 | 155 | | 140 | 142 | |
| | | | 231 | 7.8 | | 154 | 153 | | 139 | 138 | |
| | | PGME | 235 | 3.4 | 2.2 | 155 | 111 | 71 | 140 | 130 | 95 |
| | | | 232 | 7.8 | | 155 | 107 | | 141 | 135 | |
| | | | 230 | 4.4 | | 153 | 112 | | 145 | 138 | |
| | | PGME/PGMEA = 7/3 | 234 | 5.4 | 2.5 | 154 | 110 | 76 | 142 | 138 | 95 |
| | | | 236 | 5.9 | | 155 | 119 | | 142 | 136 | |
| | | | 230 | 6.0 | | 154 | 121 | | 140 | 130 | |

* Calculated from three points of average values

TABLE 4

| | | | 80° C. for 5 hours under reduced pressure | | | 200° C. for 10 minutes in nitrogen atmosphere | | | 200° C. for 30 minutes in nitrogen atmosphere | | |
|---|---|---|---|---|---|---|---|---|---|---|---|
| | | Solvent | α (nm) | β (nm) | Residual film rate (%)* | α (nm) | β (nm) | Residual film rate (%)* | α (nm) | β (nm) | Residual film rate (7)* |
| Example 23 | Polymer 20 | PGMEA | 392 | 59 | 10 | 251 | 248 | 100 | 230 | 231 | 100 |
| | | | 393 | 41 | | 251 | 249 | | 235 | 236 | |
| | | | 383 | 16 | | 242 | 250 | | 233 | 232 | |
| | | PGME | 387 | 38 | 10 | 240 | 238 | 100 | 234 | 235 | 100 |
| | | | 382 | 42 | | 240 | 241 | | 233 | 232 | |
| | | | 388 | 41 | | 248 | 247 | | 233 | 233 | |
| | | PGME/PGMEA = 7/3 | 390 | 36 | 10 | 241 | 234 | 98 | 232 | 231 | 100 |
| | | | 392 | 42 | | 240 | 238 | | 232 | 231 | |
| | | | 393 | 39 | | 246 | 240 | | 235 | 238 | |
| Example 24 | Polymer 21 | PGMEA | 406 | 2.2 | 0.8 | 320 | 260 | 79 | 318 | 303 | 97 |
| | | | 402 | 3.5 | | 316 | 245 | | 316 | 308 | |
| | | | 403 | 3.8 | | 315 | 248 | | 315 | 309 | |

TABLE 4-continued

| | | | 80° C. for 5 hours under reduced pressure | | | 200° C. for 10 minutes in nitrogen atmosphere | | | 200° C. for 30 minutes in nitrogen atmosphere | | |
|---|---|---|---|---|---|---|---|---|---|---|---|
| | | Solvent | α (nm) | β (nm) | Residual film rate (%)* | α (nm) | β (nm) | Residual film rate (%)* | α (nm) | β (nm) | Residual film rate (7)* |
| | | PGME | 410 | 29 | 6.2 | 318 | 230 | 74 | 317 | 297 | 93 |
| | | | 405 | 22 | | 319 | 238 | | 317 | 288 | |
| | | | 405 | 25 | | 320 | 240 | | 310 | 294 | |
| | | PGME/ PGMEA = 7/3 | 408 | 22.030 | 6.0 | 317 | 240 | 76 | 315 | 290 | 94 |
| | | | 407 | .021.0 | | 310 | 241 | | 314 | 300 | |
| | | | 402 | | | 313 | 231 | | 315 | 296 | |
| Example 25 | Polymer 22 | PGMEA | 358 | 102 | 31 | 307 | 303 | 99 | 296 | 296 | 100 |
| | | | 345 | 108 | | 304 | 301 | | 295 | 296 | |
| | | | 340 | 110 | | 302 | 299 | | 292 | 293 | |
| | | PGME | 346 | 84 | 26 | 310 | 302 | 98 | 294 | 296 | 100 |
| | | | 356 | 95 | | 305 | 299 | | 296 | 296 | |
| | | | 340 | 90 | | 303 | 297 | | 299 | 298 | |
| | | PGME/ PGMEA = 7/3 | 343 | 95 | 27 | 305 | 296 | 97 | 292 | 293 | 100 |
| | | | 349 | 90 | | 305 | 299 | | 295 | 295 | |
| | | | 340 | 93 | | 309 | 301 | | 293 | 291 | |
| Example 26 | 10 parts by mass of polymer 17 0.3 parts by mass of crosslinking agent (EEC) | PGMEA | 410 | 2.1 | 0.5 | 320 | 301 | 95 | 316 | 314 | 100 |
| | | | 408 | 2.1 | | 318 | 305 | | 309 | 312 | |
| | | | 411 | 1.9 | | 315 | 299 | | 312 | 311 | |
| | | PGME | 407 | 0.9 | 0.2 | 319 | 300 | 94 | 311 | 313 | 100 |
| | | | 409 | 0.7 | | 316 | 298 | | 314 | 314 | |
| | | | 405 | 0.7 | | 318 | 295 | | 308 | 309 | |
| | | PGME/ PGMEA = 7/3 | 412 | 1.3 | 0.3 | 316 | 299 | 94 | 312 | 314 | 100 |
| | | | 407 | 1.3 | | 319 | 301 | | 316 | 315 | |
| | | | 406 | 1.2 | | 315 | 297 | | 310 | 309 | |
| Comparative Example 3 | PHS | PGMEA | 395 | 0.2 | 0.2 | 364 | 1.7 | 0.4 | 359 | 2.0 | 0.6 |
| | | | 400 | 1.6 | | 375 | 1.8 | | 356 | 1.8 | |
| | | | 394 | 0.3 | | 372 | 1.4 | | 358 | 2.2 | |
| | | PGME | 396 | 0.4 | 0.1 | 370 | 1.3 | 0.4 | 355 | 1.8 | 0.5 |
| | | | 399 | 0.5 | | 374 | 1.2 | | 356 | 1.6 | |
| | | | 397 | 0.4 | | 375 | 1.6 | | 358 | 1.9 | |
| | | PGME/ PGMEA = 7/3 | 397 | 0.3 | 0.1 | 375 | 1.6 | 0.4 | 360 | 2.1 | 0.5 |
| | | | 396 | 0.8 | | 373 | 1.2 | | 358 | 1.6 | |
| | | | 398 | 0.4 | | 373 | 1.8 | | 355 | 2.0 | |
| Comparative Example 4 | Polymer 23 | PGMEA | 336 | 1.3 | 0.3 | 296 | 1.8 | 0.5 | 282 | 2.0 | 0.8 |
| | | | 335 | 1.0 | | 300 | 1.2 | | 283 | 2.8 | |
| | | | 340 | 1.0 | | 297 | 1.5 | | 279 | 2.2 | |
| | | PGME | 332 | 80 | 25 | 305 | 83 | 27 | 276 | 79 | 28 |
| | | | 339 | 86 | | 302 | 80 | | 274 | 73 | |
| | | | 330 | 86 | | 301 | 81 | | 276 | 76 | |
| | | PGME/ PGMEA = 7/3 | 333 | 109 | 33 | 298 | 106 | 35 | 280 | 98 | 35 |
| | | | 335 | 114 | | 301 | 102 | | 278 | 99 | |
| | | | 336 | 112 | | 300 | 105 | | 278 | 92 | |
| Comparative Example 5 | Polymer 24 | PGMEA | 365 | Impossible to measure due to whitening after immersion in PGMEA | | 325 | Impossible to measure due to whitening after immersion in PGMEA | | 314 | Impossible to measure due to whitening after immersion in PGMEA | |
| | | | 364 | | | 328 | | | 320 | | |
| | | | 368 | | | 331 | | | 320 | | |
| | | PGME | 366 | Impossible to measure due to whitening after immersion in PGME | | 324 | Impossible to measure due to whitening after immersion in PGME | | 316 | Impossible to measure due to whitening after immersion in PGME | |
| | | | 364 | | | 320 | | | 317 | | |
| | | | 363 | | | 323 | | | 314 | | |
| | | PGME/ PGMEA = 7/3 | 367 | Impossible to measure due to whitening after immersion in PGMEA/PGMEA (7/3) | | 324 | Impossible to measure due to whitening after immersion in PGMEA/PGMEA (7/3) | | 320 | Impossible to measure due to whitening after immersion in PGMEA/PGMEA (7/3) | |
| | | | 357 | | | 325 | | | 318 | | |
| | | | 365 | | | 325 | | | 215 | | |

* Calculated from three points of average values

Example 27

A solution containing PGMEA and cyclohexanone at a mass ratio (PGMEA/cyclohexanone) of 5/5 in which 10% by mass of the polymer 18 obtained in Example 21 was dissolved was prepared, and a 30 mm square silicon wafer was spin-coated with the obtained solution under conditions of 1000 rpm for 10 sec. Next, the resulting sample was heated at 200° C. for 1 minute in a nitrogen atmosphere. This wafer was spin-coated with a PGMEA solution in which 10% by mass of titanium tetraisopropoxide was dissolved after being cooled to room temperature under conditions of 1000 rpm for 10 sec. Next, a wafer formed by heating 200° C. for 1 minute in a nitrogen atmosphere and overcoating the layer of the polymer 18 with $TiO_2$ was obtained.

As the result of observation of the cross section thereof using a TEM, the interface between the polymer 18 and $TiO_2$ was clear and flat.

Example 28

A wafer formed by overcoating the layer of the polymer 19 with $TiO_2$ was obtained in the same manner as that in Example 27 except that the polymer 18 was changed to the polymer 19 obtained in Example 22.

Figure 4:
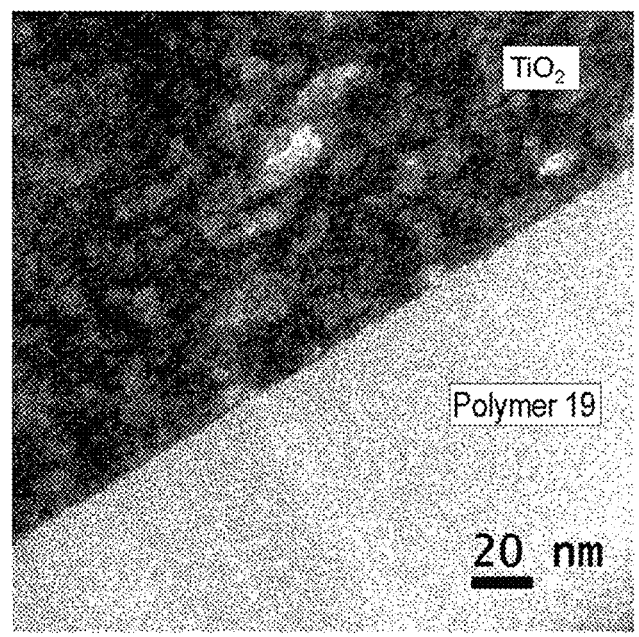
FIG. 4 is a TEM microphotograph showing a cross section of a wafer obtained by being overcoated with a polymer 19 described in Example 28 and $TiO_2$.

As the result of observation of the cross section thereof using a TEM, the interface between the polymer 19 and $TiO_2$ was clear and flat. The microphotograph of the cross section is shown in FIG. 4.

Comparative Example 6

A wafer formed by overcoating the layer of the PHS with $TiO_2$ was obtained in the same manner as that in Example 27 except that the polymer 18 was changed to polyhydroxystyrene (PHS).

As the result of observation of the cross section thereof using a TEM, the interface between PHS and $TiO_2$ was not clear. Therefore, it was considered that PHS was dissolved and completely mixed with $TiO_2$ at the time of spin-coating the layer with the PGMEA solution of titanium tetraisopropoxide.

Based on the results described above, in a case where the material of the present invention is used as a resist underlayer film, it was found that the uneven surface of the wafer can be made flat, and intermixing between the intermediate layer or the resist layer and the resist underlayer film does not occur at the time of spin-coating the resist underlayer film with the intermediate layer or the resist layer.

The material for forming an underlayer film according to the first present invention enables provision of a resist underlayer film having sufficient optical characteristics, etching resistance, excellent flatness, and a suppressed amount of volatile components. Accordingly, in a semiconductor device manufacturing step, it is possible to obtain a semiconductor circuit with high integration.

The material for forming an underlayer film according to the second present invention enables realization of a laminate having excellent adhesiveness between the intermediate layer and the resist underlayer film and excellent flatness. Accordingly, in the semiconductor device manufacturing step, it is possible to obtain a semiconductor circuit with high integration.

This application claims priority based on Japanese Patent Application No. 2017-108506 filed on May 31, 2017 and Japanese Patent Application No. 2017-196260 filed on Oct. 6, 2017, the entire disclosure of which is incorporated herein.

The present invention includes the following aspects.
1.
A material for forming an underlayer film which is used to form a resist underlayer film used in a multi-layer resist process, the material including:
a cyclic olefin polymer which has a repeating structural unit [A] represented by Formula (1) and a repeating structural unit [B] represented by Formula (2),
In which a molar ratio [A]/[B] of the structural unit [A] to the structural unit [B] in the cyclic olefin polymer is greater than or equal to 5/95 and less than or equal to 95/5.

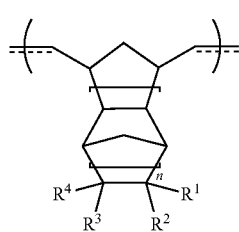

(1)

(In Formula (1), at least one of $R^1$ to $R^4$ is selected from hydrogen, an alkyl group having 1 to 10 carbon atoms, an aryl group having 6 to 20 carbon atoms, an alkoxy group having 1 to 10 carbon atoms, an aryloxy group having 6 to 20 carbon atoms, an alkoxyalkyl group having 2 to 10 carbon atoms, an aryloxyalkyl group having 7 to 20 carbon atoms, an alkoxycarbonyl group having 2 to 20 carbon atoms, a dialkylaminocarbonyl group having 3 to 10 carbon atoms, an aryloxycarbonyl group having 7 to 20 carbon atoms, an alkylarylaminocarbonyl group having 8 to 20 carbon atoms, an alkoxycarbonylalkyl group having 3 to 30 carbon atoms, an alkoxycarbonylaryl group having 8 to 30 carbon atoms, an aryloxycarbonylalkyl group having 8 to 20 carbon atoms, an alkoxyalkyloxycarbonyl group having 3 to 20 carbon atoms, and an alkoxycarbonylalkyloxycarbonyl group having 4 to 30 carbon atoms, $R^1$ to $R^4$ may be bonded to one another to form a ring structure, and n represents an integer of 0 to 2.)

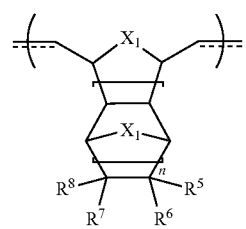

(2)

(In Formula (2), at least one of $R^5$ to $R^8$ is selected from hydrogen, an alkyl group having 1 to 10 carbon atoms, an aryl group having 6 to 20 carbon atoms, an alkoxy group having 1 to 10 carbon atoms, an aryloxy group having 6 to 20 carbon atoms, an alkoxyalkyl group having 2 to 10 carbon atoms, an aryloxyalkyl group having 7 to 20 carbon atoms, an alkoxycarbonyl group having 2 to 20 carbon atoms, a dialkylaminocarbonyl group having 3 to 10 carbon atoms, an aryloxycarbonyl group having 7 to 20 carbon atoms, an alkylarylaminocarbonyl group having 8 to 20 carbon atoms, an alkoxycarbonylalkyl group having 3 to 30 carbon atoms, an alkoxycarbonylaryl group having 8 to 30 carbon atoms, an aryloxycarbonylalkyl group having 8 to 20 carbon atoms, an alkoxyalkyloxycarbonyl group having 3 to 20 carbon atoms, and an alkoxycarbonylalkyloxycarbonyl group having 4 to 30 carbon atoms, $R^5$ to $R^8$ may be bonded to one another to form a ring structure, n represents an integer of 0 to 2, and $X_1$ represents —O— or —S—.)
2.
The material for forming an underlayer film according to 1.,
in which a temperature showing an intersection between a storage modulus (G') curve and a loss modulus (G") curve in a solid viscoelasticity of the cyclic olefin polymer which are measured under conditions of a measurement temperature range of 50° C. to 250° C., a heating rate of 3° C./min, and a frequency of 1 Hz in a nitrogen atmosphere in a shear mode using a rheometer is higher than or equal to 80° C. and lower than or equal to 200°.
3.
The material for forming an underlayer film according to 1. or 2.,
in which an amount of a volatile component in the cyclic olefin polymer which is measured using the following method 1 is greater than or equal to 0.0% by mass to 1.0% by mass in a case where a total amount of the cyclic olefin polymer is set to 100% by mass. (Method 1: the cyclic olefin polymer is dissolved in tetrahydrofuran to prepare a solution having a solid content concentration of 20% by mass, the obtained solution is weighed using an aluminum plate, heated at 200° C. for 3 minutes in a nitrogen flow so that the tetrahydrofuran is removed, and cooled to room temperature so that the cyclic olefin polymer is solidified, the cyclic olefin polymer is heated in a temperature range of 30° C. to 300° C. at a heating rate of 10° C./min in a nitrogen atmosphere, and the amount of the volatile component in the cyclic olefin polymer is calculated based on a weight reduction amount in a temperature range of 100° C. to 250° C.)

4.
The material for forming an underlayer film according to any one of 1. to 3.,
in which a weight-average molecular weight (Mw) of the cyclic olefin polymer in terms of polystyrene which is measured using gel permeation chromatography is greater than or equal to 1000 and less than or equal to 20000.

5.
The material for forming an underlayer film according to any one of 1. to 4.,
in which a refractive index (n value) of the cyclic olefin polymer at a wavelength of 193 nm which is measured using the following method 2 is greater than or equal to 1.5 and less than or equal to 2.0. (Method 2: a coating film which is formed of the cyclic olefin polymer and has a thickness of 250 nm is formed on a silicon wafer, and the refractive index (n value) of the obtained coating film at a wavelength of 193 nm is set as the refractive index (n value) of the cyclic olefin polymer)

6.
The material for forming an underlayer film according to any one of 1. to 5.,
in which an extinction coefficient (k value) of the cyclic olefin polymer which is measured using the following method 3 is greater than or equal to 0.0001 and less than or equal to 0.5.
(Method 3: a coating film which is formed of the cyclic olefin polymer and has a thickness of 250 nm is formed on a silicon wafer, and the extinction coefficient (k value) of the obtained coating film is set as the extinction coefficient (k value) of the cyclic olefin polymer)

7.
The material for forming an underlayer film according to any one of 1. to 6.,
which is formed on an uneven structure of a substrate having the uneven structure and is used for an underlayer film for embedding a recess in the uneven structure.

8.
A material for forming an underlayer film which is used to form a resist underlayer film used in a multi-layer resist process,
in which the material for forming an underlayer film is a material of a film containing a cyclic olefin polymer,
the cyclic olefin polymer is soluble in an organic solvent at any concentration of at least greater than or equal to 0.01% by mass and less than or equal to 50% by mass, and
a residual film rate of the cyclic olefin polymer in the film which is measured using the following method 4 is greater than or equal to 50% and less than or equal to 100%.
(method 4: a coating film which is formed of the cyclic olefin polymer and has a thickness ($\alpha$) of greater than or equal to 200 nm and less than or equal to 500 nm is formed on a silicon wafer, the obtained coating film is treated at 200° C. for 10 minutes, immersed in an organic solvent (propylene glycol-1-monomethyl ether-2-acetate (PG-MEA)) at 23° C. for 10 minutes, and dried under conditions of 150° C. for 3 minutes, and a remaining solvent in the coating film is removed, a thickness ($\beta$) of the coating film obtained by removing the remaining solvent is measured, and the residual film rate (=$\beta/\alpha\times100$)(%) is calculated)

9.
The material for forming an underlayer film according to 8.,
in which the cyclic olefin polymer has a repeating structural unit [A] represented by Formula (1) and a repeating structural unit [B] represented by Formula (2),
a molar ratio [A]/[B] of the structural unit [A] to the structural unit [B] in the cyclic olefin polymer is greater than or equal to 5/95 and less than or equal to 95/5.

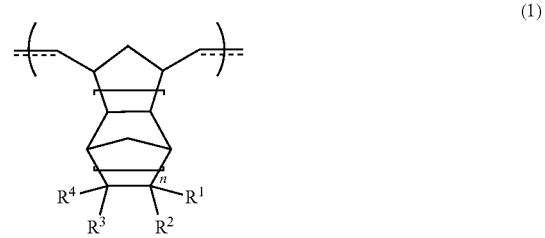

(1)

(In Formula (1), at least one of $R^1$ to $R^4$ is selected from hydrogen, an alkyl group having 1 to 10 carbon atoms, an aryl group having 6 to 20 carbon atoms, an alkoxy group having 1 to 10 carbon atoms, an aryloxy group having 6 to 20 carbon atoms, an alkoxyalkyl group having 2 to 10 carbon atoms, an aryloxyalkyl group having 7 to 20 carbon atoms, an alkoxycarbonyl group having 2 to 20 carbon atoms, a dialkylaminocarbonyl group having 3 to 10 carbon atoms, an aryloxycarbonyl group having 7 to 20 carbon atoms, an alkylarylaminocarbonyl group having 8 to 20 carbon atoms, an alkoxycarbonylalkyl group having 3 to 30 carbon atoms, an alkoxycarbonylaryl group having 8 to 30 carbon atoms, an aryloxycarbonylalkyl group having 8 to 20 carbon atoms, an alkoxyalkyloxycarbonyl group having 3 to 20 carbon atoms, and an alkoxycarbonylalkyloxycarbonyl group having 4 to 30 carbon atoms, $R^1$ to $R^4$ may be bonded to one another to form a ring structure, and n represents an integer of 0 to 2.)

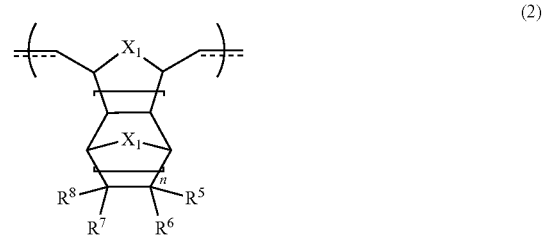

(2)

(In Formula (2), at least one of $R^5$ to $R^8$ is selected from hydrogen, an alkyl group having 1 to 10 carbon atoms, an aryl group having 6 to 20 carbon atoms, an alkoxy group having 1 to 10 carbon atoms, an aryloxy group having 6 to 20 carbon atoms, an alkoxyalkyl group having 2 to 10 carbon atoms, an aryloxyalkyl group having 7 to 20 carbon atoms, an alkoxycarbonyl group having 2 to 20 carbon atoms, a dialkylaminocarbonyl group having 3 to 10 carbon atoms, an aryloxycarbonyl group having 7 to 20 carbon atoms, an alkylarylaminocarbonyl group having 8 to 20 carbon atoms, an alkoxycarbonylalkyl group having 3 to 30 carbon atoms, an alkoxycarbonylaryl group having 8 to 30 carbon atoms, an aryloxycarbonylalkyl group having 8 to 20 carbon atoms, an alkoxyalkyloxycarbonyl group having 3 to 20 carbon atoms, and an alkoxycarbonylalkyloxycarbonyl group having 4 to 30 carbon atoms, $R^5$ to $R^8$ may be bonded to one another to form a ring structure, n represents an integer of 0 to 2, and $X_1$ represents —O— or —S—)

10.

The material for forming an underlayer film according to any one of 8. or 9.,
in which a weight-average molecular weight (Mw) of the cyclic olefin polymer in terms of polystyrene which is measured using gel permeation chromatography is greater than or equal to 1000 and less than or equal to 20000.

11.

The material for forming an underlayer film according to any one of 8. to 10.,
in which a refractive index (n value) of the cyclic olefin polymer at a wavelength of 193 nm which is measured using the following method 2 is greater than or equal to 1.5 and less than or equal to 2.0. (Method 2: a coating film which is formed of the cyclic olefin polymer and has a thickness of 250 nm is formed on a silicon wafer, and the refractive index (n value) of the obtained coating film at a wavelength of 193 nm is set as the refractive index (n value) of the cyclic olefin polymer)

12.

The material for forming an underlayer film according to any one of 8. to 11.,
in which an extinction coefficient (k value) of the cyclic olefin polymer which is measured using the following method 3 is greater than or equal to 0.0001 and less than or equal to 0.5.
(Method 3: a coating film which is formed of the cyclic olefin polymer and has a thickness of 250 nm is formed on a silicon wafer, and the extinction coefficient (k value) of the obtained coating film is set as the extinction coefficient (k value) of the cyclic olefin polymer)

13.

The material for forming an underlayer film according to any one of 8. to 12.,
which is formed on an uneven structure of a substrate having the uneven structure and is used for an underlayer film for embedding a recess in the uneven structure.

14.

A resist underlayer film including:
the material for forming an underlayer film according to any one of 1. to 13.

15.

A method of producing a resist underlayer film, including:
a step of forming a coating film which contains the material for forming an underlayer film according to any one of 1. to 13. on a substrate.

16.

The method of producing a resist underlayer film according to 15., further including:
a step of heating the coating film.

17.

A laminate including:
a substrate; and
the material for forming an underlayer film according to any one of 1. to 13., which is formed on one surface of the substrate.

18.

The laminate according to 17.,
in which a flatness ($\Delta FT$) of a surface ($\alpha$) of the resist underlayer film on a side opposite to the substrate which is calculated using the following equation is greater than or equal to 0% and less than or equal to 5%.

Flatness($\Delta FT$)=[($H_{max}-H_{min}$)/$H_{av}$]×100(%)

(Where film thicknesses of the resist underlayer film are measured in ten optional sites of the surface ($\alpha$), an average value of these measured values is set as $H_{av}$, a maximum value in the film thicknesses of the resist underlayer film is set as $H_{max}$, and a minimum value in the film thicknesses of the resist underlayer film is set as $H_{min}$)

19.

The laminate according to 17. or 18.,
in which the average value $H_{av}$ of the film thickness of the resist underlayer film is greater than or equal to 5 nm and less than or equal to 500 nm.
(Where film thicknesses of the resist underlayer film are measured in ten optional sites of the surface ($\alpha$) of the resist underlayer film on the side opposite to the substrate, and the average value of these measured values is set as $H_{av}$)

20.

The laminate according to any one of 17. to 19.,
in which the substrate has an uneven structure on at least one surface thereof,
the resist underlayer film is formed on the uneven structure,
the uneven structure has a height of greater than or equal to 5 nm and less than or equal to 500 nm, and
an interval between a projection and a recess is greater than or equal to 1 nm and less than or equal to 10 nm.

The invention claimed is:
1. A laminate comprising:
a substrate; and
a resist underlayer film containing a material for forming an underlayer film, which is
formed on one surface of the substrate,
wherein the material for forming an underlayer film which is used to form a resist underlayer film used in a multi-layer resist process, the material comprising:
a cyclic olefin polymer,
wherein a residual film rate of the material for forming an underlayer film which is
measured using the following method 4 is greater than or equal to 50% and less than or equal to 100%,
method 4: a coating film which is formed of the material for forming an underlayer film and has a thickness ($\alpha$) of greater than or equal to 200 nm and less than or equal to 500 nm is formed on a silicon wafer, the obtained coating film is treated at 200° C. for 10 minutes, immersed in propylene glycol-1-monomethyl ether-2-acetate at 23° C. for 10 minutes, and dried under conditions of 150° C. for 3 minutes, and a remaining solvent in the coating film is removed, and a thickness (β) of the coating film obtained by removing the remaining solvent is measured, and the residual film rate (=β/α×100)(%) is calculated, wherein a refractive index (n value) of the cyclic olefin polymer at a wavelength of 193 nm which is measured using the following method 2 is greater than or equal to 1.5 and less than or equal to 2.0, method 2: a coating film which is formed of the cyclic olefin polymer and has a thickness of 250 nm is formed on a silicon wafer, and the refractive index (n value) of the obtained coating film at a wavelength of 193 nm is set as the refractive index (n value) of the cyclic olefin polymer, wherein an extinction coefficient (k value) of the cyclic olefin polymer which is measured using the following method 3 is greater than or equal to 0.0001 and less than or equal to 0.5, method 3: a coating film which is formed of the cyclic olefin polymer and has a thickness of 250 nm is formed on a silicon wafer, and the extinction coefficient (k value) of the obtained coating film is set as the extinction coefficient (k value) of the cyclic olefin polymer, wherein a flatness ΔFT of a surface (α) of the resist underlayer film on a side opposite to the substrate which is calculated using the following equation is greater than or equal to 0% and less than or equal to 5%, flatness(ΔFT)=[($H_{max}$−$H_{min}$)/$H_{av}$]×100(%)

where film thicknesses of the resist underlayer film are measured in ten optional sites of the surface (α), an average value of these measured values is set as $H_{av}$, a maximum value in the film thicknesses of the resist underlayer film is set as $H_{max}$, and a minimum value in the film thicknesses of the resist underlayer film is set as $H_{min}$, wherein a content of a crosslinking agent in the material for forming an underlayer film is less than 5 parts by mass in a case where a total content of polymer components contained in the material for forming an underlayer film is set to 100 parts by mass.

2. The laminate according to claim 1,
wherein the cyclic olefin polymer has a repeating structural unit [A] represented by Formula (1) and a repeating structural unit [B] represented by Formula (2),
a molar ratio [A]/[B] of the structural unit [A] to the structural unit [B] in the cyclic olefin polymer is greater than or equal to 5/95 and less than or equal to 95/5,

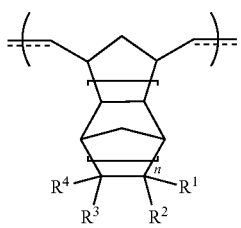

(1)

in Formula (1), at least one of $R^1$ to $R^4$ is selected from hydrogen, an alkyl group having 1 to 10 carbon atoms, an aryl group having 6 to 20 carbon atoms, an alkoxy group having 1 to 10 carbon atoms, an aryloxy group having 6 to 20 carbon atoms, an alkoxyalkyl group having 2 to 10 carbon atoms, an aryloxyalkyl group having 7 to 20 carbon atoms, an alkoxycarbonyl group having 2 to 20 carbon atoms, a dialkylaminocarbonyl group having 3 to 10 carbon atoms, an aryloxycarbonyl group having 7 to 20 carbon atoms, an alkylarylaminocarbonyl group having 8 to 20 carbon atoms, an alkoxycarbonylalkyl group having 3 to 30 carbon atoms, an alkoxycarbonylaryl group having 8 to 30 carbon atoms, an aryloxycarbonylalkyl group having 8 to 20 carbon atoms, an alkoxyalkyloxycarbonyl group having 3 to 20 carbon atoms, and an alkoxycarbonylalkyloxycarbonyl group having 4 to 30 carbon atoms, $R^1$ to $R^4$ may be bonded to one another to form a ring structure, and n represents an integer of 0 to 2, and

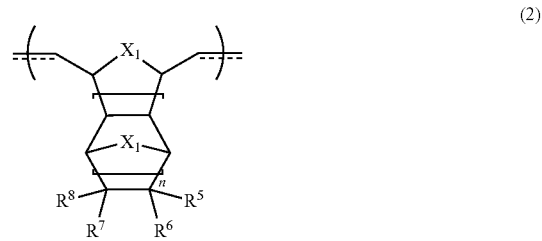

(2)

in Formula (2), at least one of $R^5$ to $R^8$ is selected from hydrogen, an alkyl group having 1 to 10 carbon atoms, an aryl group having 6 to 20 carbon atoms, an alkoxy group having 1 to 10 carbon atoms, an aryloxy group having 6 to 20 carbon atoms, an alkoxyalkyl group having 2 to 10 carbon atoms, an aryloxyalkyl group having 7 to 20 carbon atoms, an alkoxycarbonyl group having 2 to 20 carbon atoms, a dialkylaminocarbonyl group having 3 to 10 carbon atoms, an aryloxycarbonyl group having 7 to 20 carbon atoms, an alkylarylaminocarbonyl group having 8 to 20 carbon atoms, an alkoxycarbonylalkyl group having 3 to 30 carbon atoms, an alkoxycarbonylaryl group having 8 to 30 carbon atoms, an aryloxycarbonylalkyl group having 8 to 20 carbon atoms, an alkoxyalkyloxycarbonyl group having 3 to 20 carbon atoms, and an alkoxycarbonylalkyloxycarbonyl group having 4 to 30 carbon atoms, $R^5$ to $R^8$ may be bonded to one another to form a ring structure, n represents an integer of 0 to 2, and $X_1$ represents —O— or —S—.

3. The laminate according to claim 2,
wherein in Formula (1), n represents 0.

4. The laminate according to claim 1,
wherein a weight-average molecular weight (Mw) of the cyclic olefin polymer in terms of polystyrene which is measured using gel permeation chromatography is greater than or equal to 1000 and less than or equal to 20000.

5. The laminate according to claim 1,
wherein a content of the cyclic olefin polymer in the material for forming an underlayer film is greater than or equal to 50% by mass and less than or equal to 100% by mass in a case where a total content of the material for forming an underlayer film is set to 100% by mass.

* * * * *